(12) United States Patent
Endoh et al.

(10) Patent No.: US 9,466,363 B2
(45) Date of Patent: Oct. 11, 2016

(54) INTEGRATED CIRCUIT

(71) Applicant: TOHOKU UNIVERSITY, Sendai-shi, Miyagi (JP)

(72) Inventors: Tetsuo Endoh, Sendai (JP); Takashi Ohsawa, Sendai (JP); Hiroki Koike, Sendai (JP); Takahiro Hanyu, Sendai (JP); Hideo Ohno, Sendai (JP)

(73) Assignee: TOHOKU UNIVERSITY, Sendai-shi (JP)

(\*) Notice: Subject to any disclaimer, the term of this patent is extended or adjusted under 35 U.S.C. 154(b) by 156 days.

(21) Appl. No.: 14/369,974

(22) PCT Filed: Dec. 4, 2012

(86) PCT No.: PCT/JP2012/081423
§ 371 (c)(1),
(2) Date: Jun. 30, 2014

(87) PCT Pub. No.: WO2013/099536
PCT Pub. Date: Jul. 4, 2013

(65) Prior Publication Data
US 2014/0355330 A1    Dec. 4, 2014

(30) Foreign Application Priority Data

Jan. 1, 2012 (JP) ................. 2012-000002
Jan. 1, 2012 (JP) ................. 2012-000003

(51) Int. Cl.
| G11C 14/00 | (2006.01) |
| G11C 13/00 | (2006.01) |
| G11C 11/16 | (2006.01) |
| G11C 15/04 | (2006.01) |
| G11C 19/02 | (2006.01) |
| H03K 3/356 | (2006.01) |
| H03K 3/59 | (2006.01) |
| H03K 19/18 | (2006.01) |
| G11C 29/50 | (2006.01) |

(52) U.S. Cl.
CPC ......... *G11C 13/0038* (2013.01); *G11C 11/161* (2013.01); *G11C 11/1659* (2013.01); *G11C 11/1673* (2013.01); *G11C 11/1675* (2013.01); *G11C 13/0004* (2013.01); *G11C 13/0007* (2013.01); *G11C 13/0069* (2013.01); *G11C 14/00* (2013.01); *G11C 14/0081* (2013.01); *G11C 15/046* (2013.01); *G11C 19/02* (2013.01); *G11C 29/50012* (2013.01); *H03K 3/356139* (2013.01); *H03K 3/59* (2013.01); *H03K 19/18* (2013.01)

(58) Field of Classification Search
CPC .......................... G11C 11/1675; G11C 14/00
USPC ........................................ 365/148, 158, 228
See application file for complete search history.

(56) References Cited

U.S. PATENT DOCUMENTS

2011/0299330 A1\* 12/2011 Ong .................... G11C 11/1655
                                                             365/171

*Primary Examiner* — Hoai V Ho
*Assistant Examiner* — Jay Radke
(74) *Attorney, Agent, or Firm* — Westerman, Hattori, Daniels & Adrian, LLP

(57) ABSTRACT

An integrated circuit that does not involve increase in power consumption or decrease in switching probability during a write operation that occur when a latch circuit using STT-MTJ device, etc. of the prior art is operated at high speed is provided. The integrated circuit 1 includes: a memory element 1B where write occurs when a specified period τ has elapsed after a write signal is input; and a basic circuit element 1A, which is an elementary device constituting a circuit and has a data retaining function, and characterized in that an operation frequency $f_1$ in a first operation mode in the process of memory access of the basic circuit element 1A satisfies the following relation:

$$\tau > \lambda_1/f_1 (0 < \lambda_1 \le 1).$$

26 Claims, 134 Drawing Sheets

FIG.2
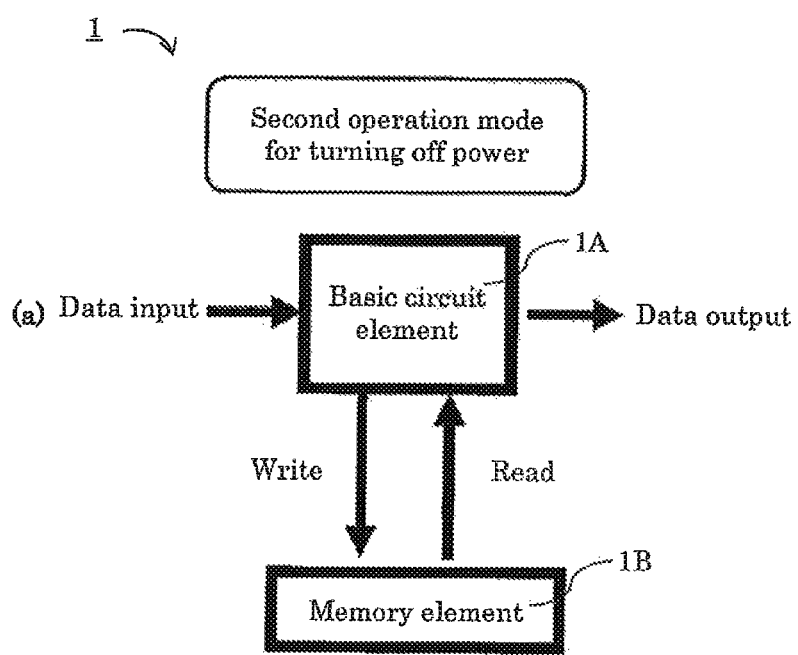
(a)
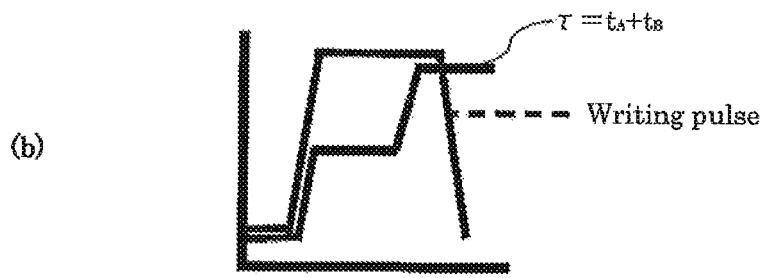
(b)
Writing pulse width $> t_A + t_B$

FIG.6
(a)
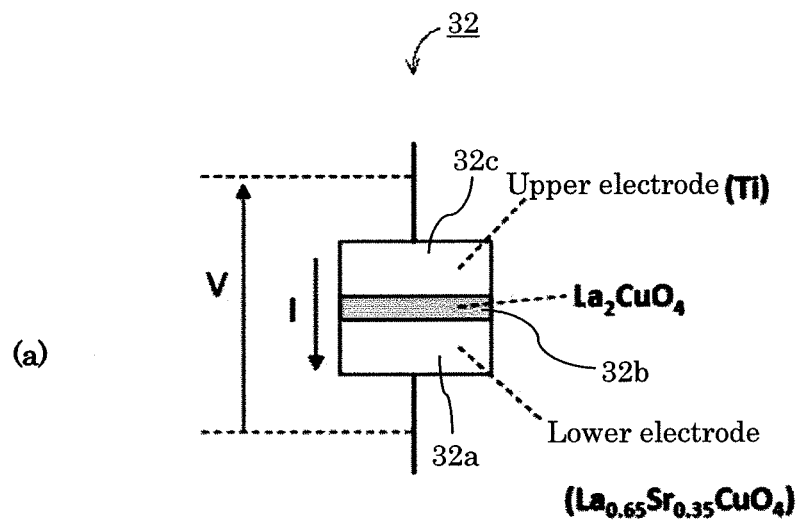
(b)
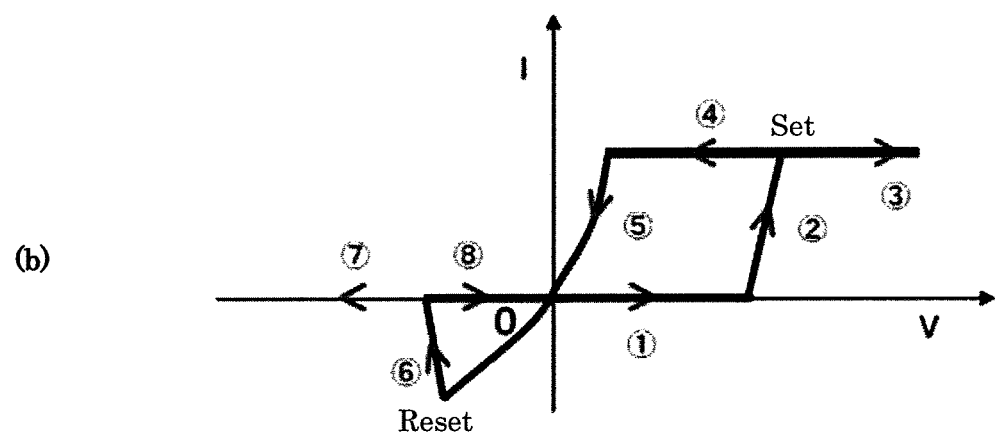

FIG.7
(a)
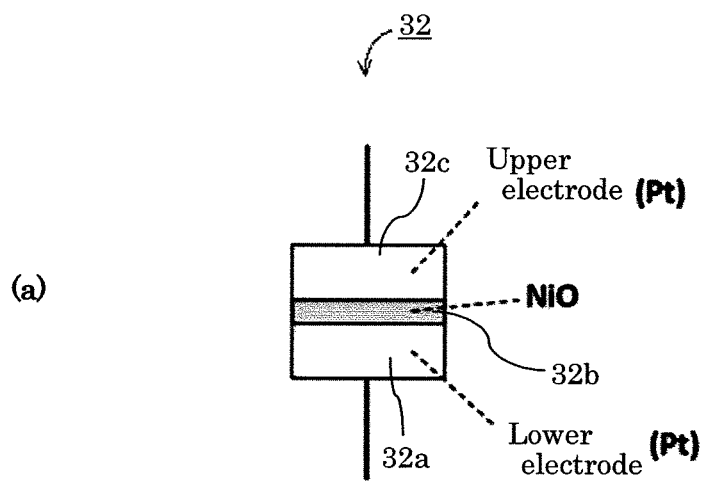
(b)
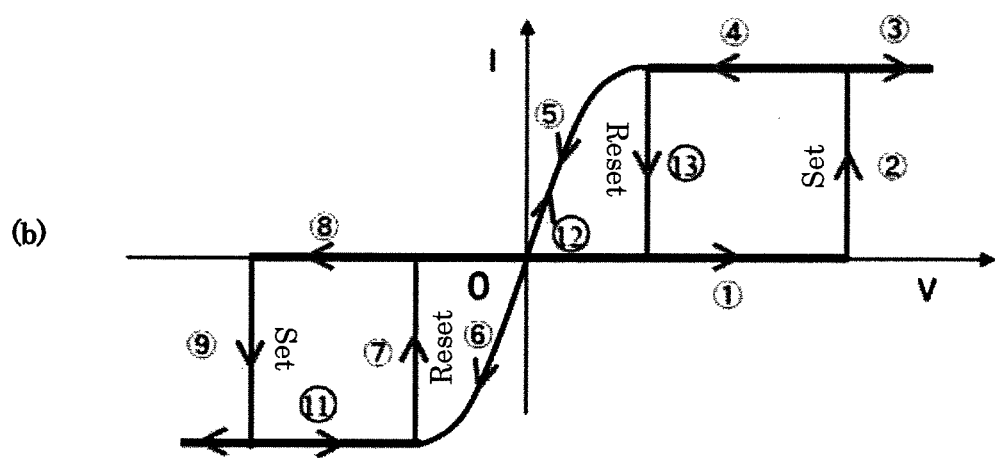

FIG.8
(a)
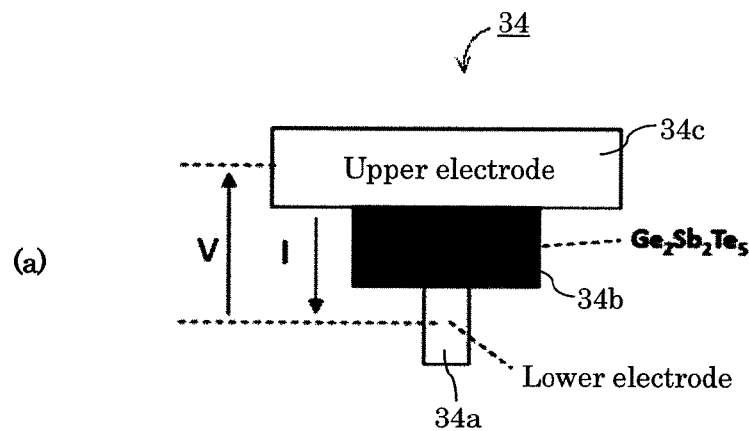
(b)
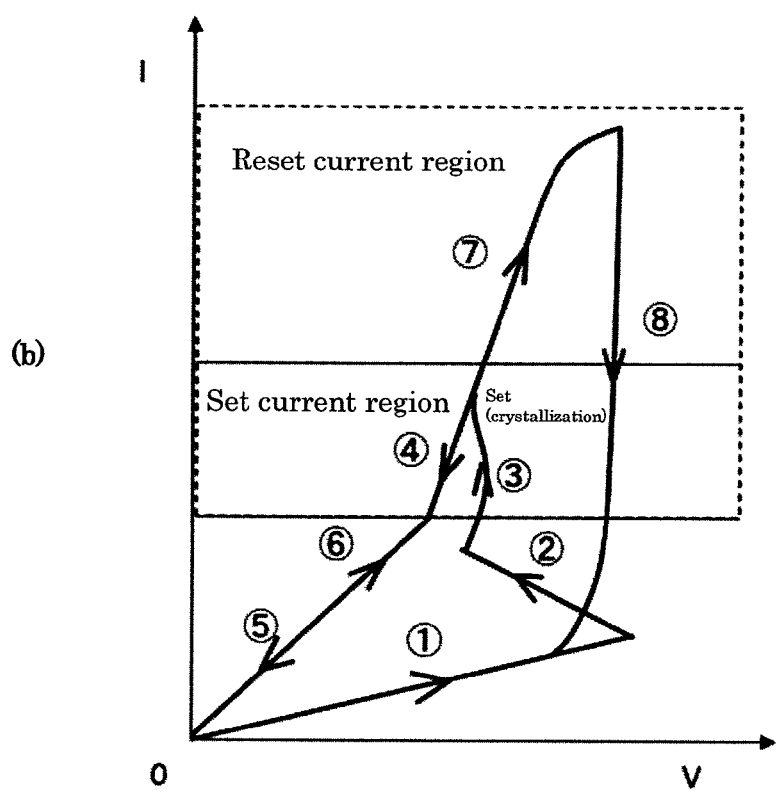

FIG.9
(a) 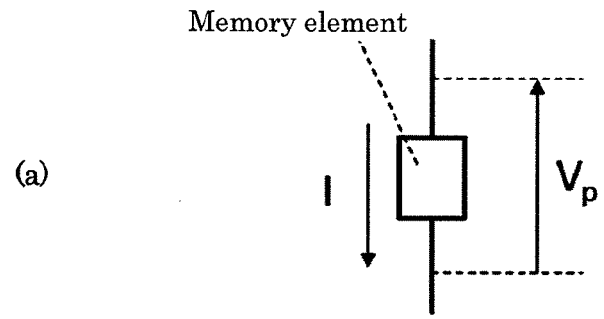
Memory element
(b) 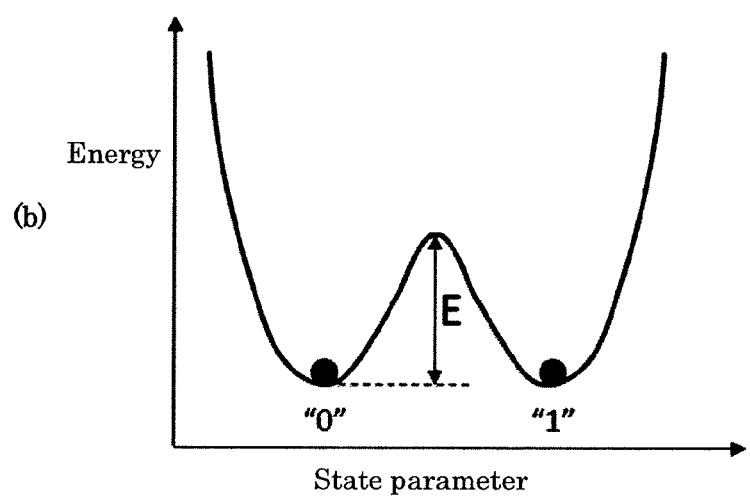
(c) 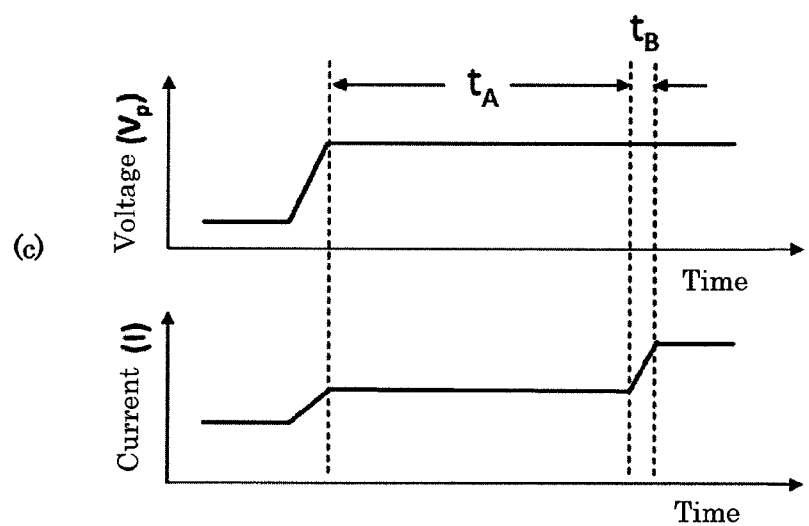

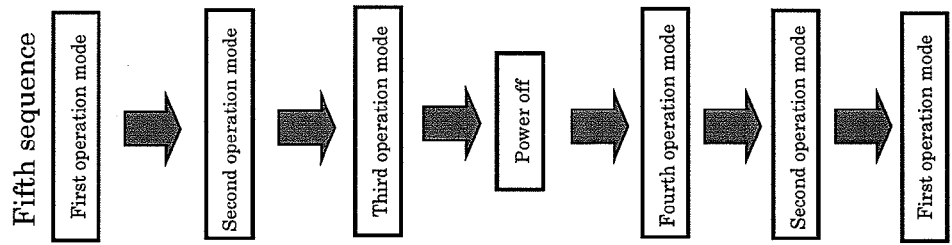
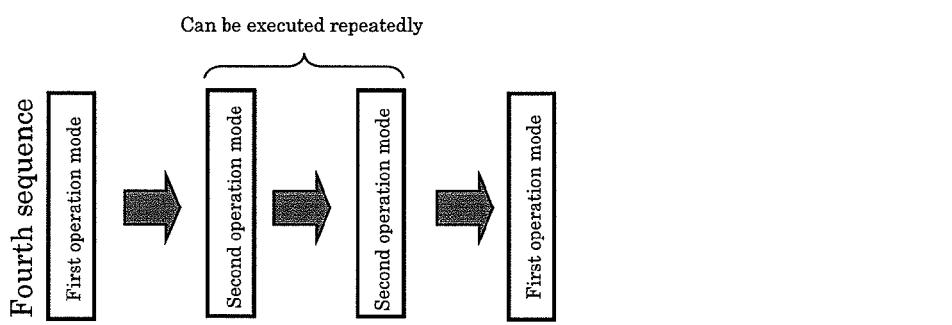
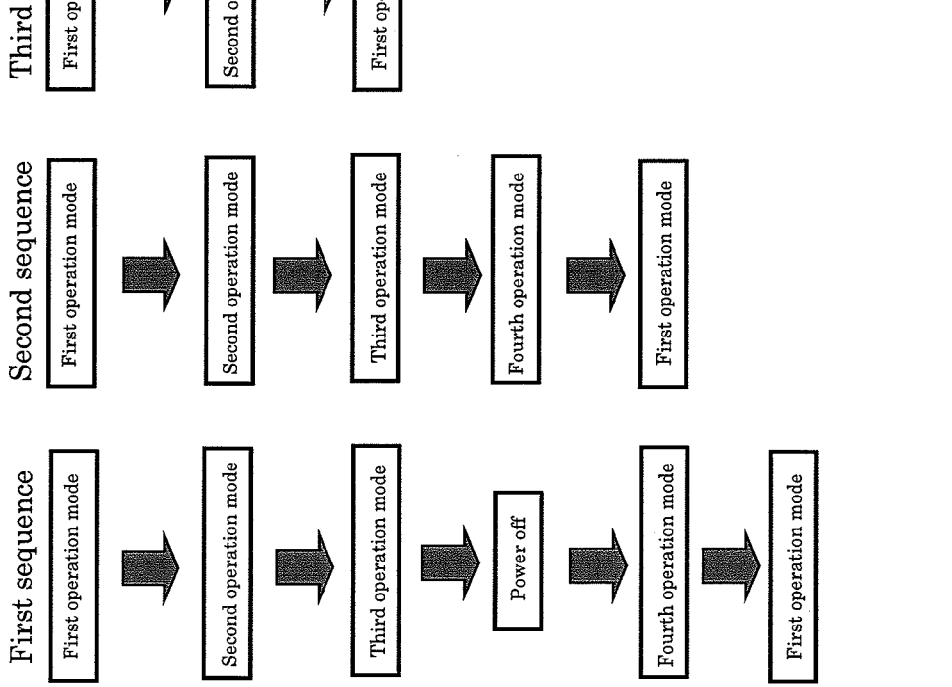

FIG.15
(a) 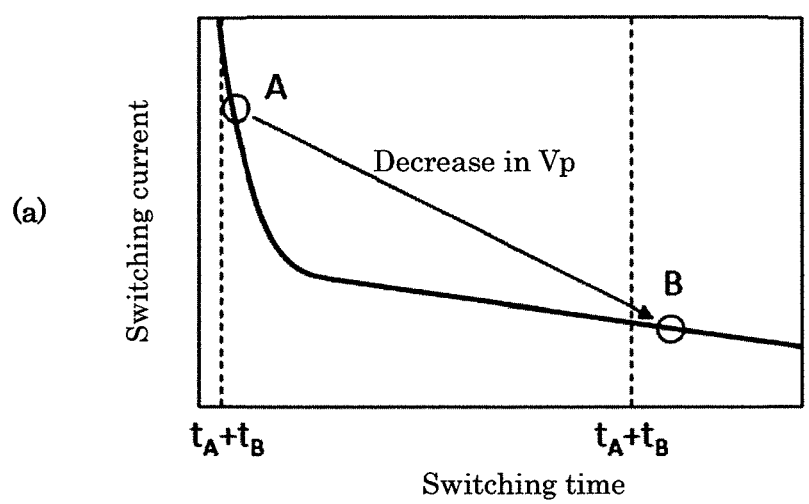
(b) 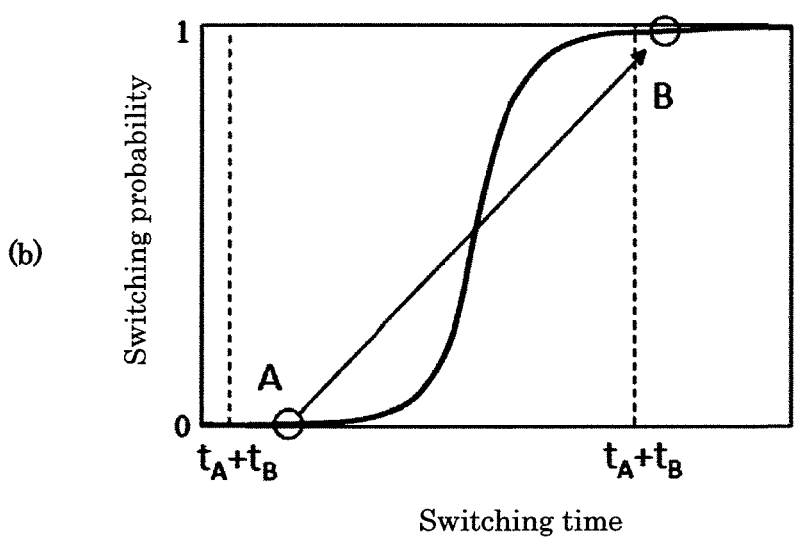

FIG.16
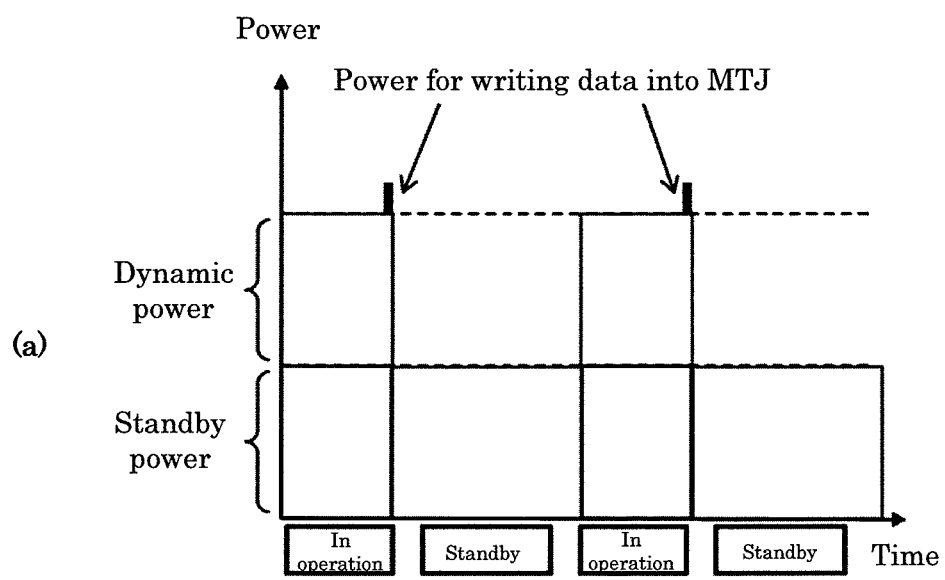
(a)
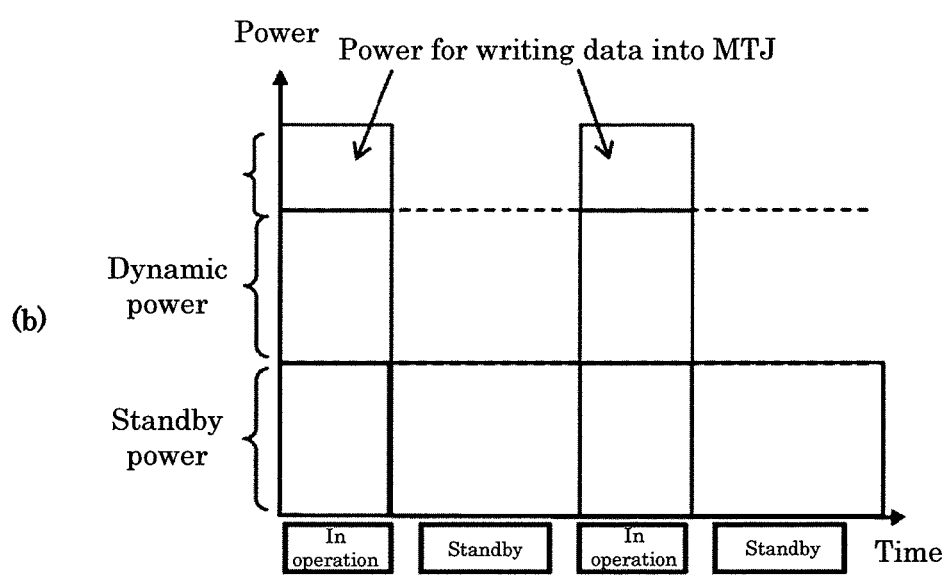
(b)

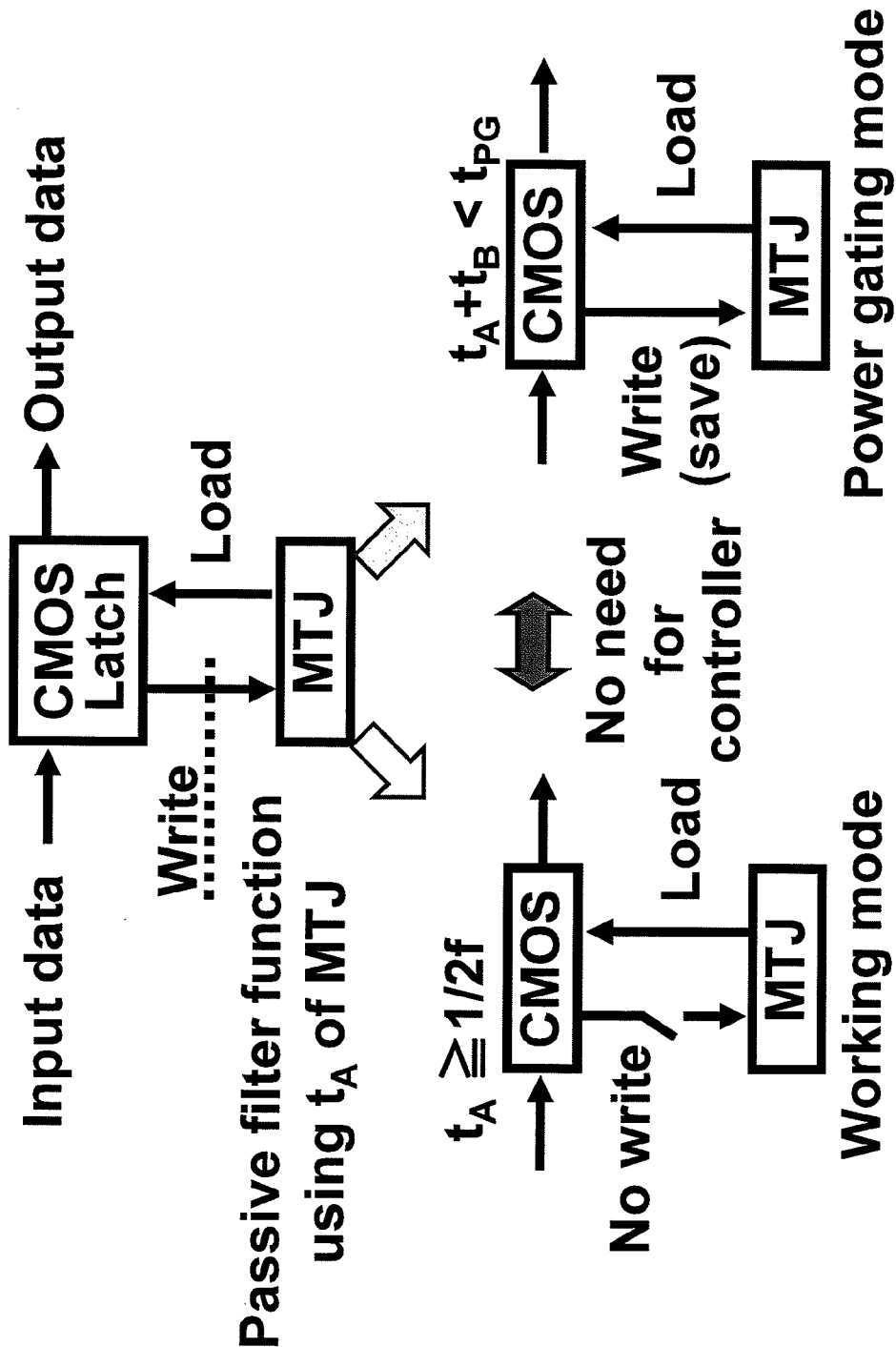

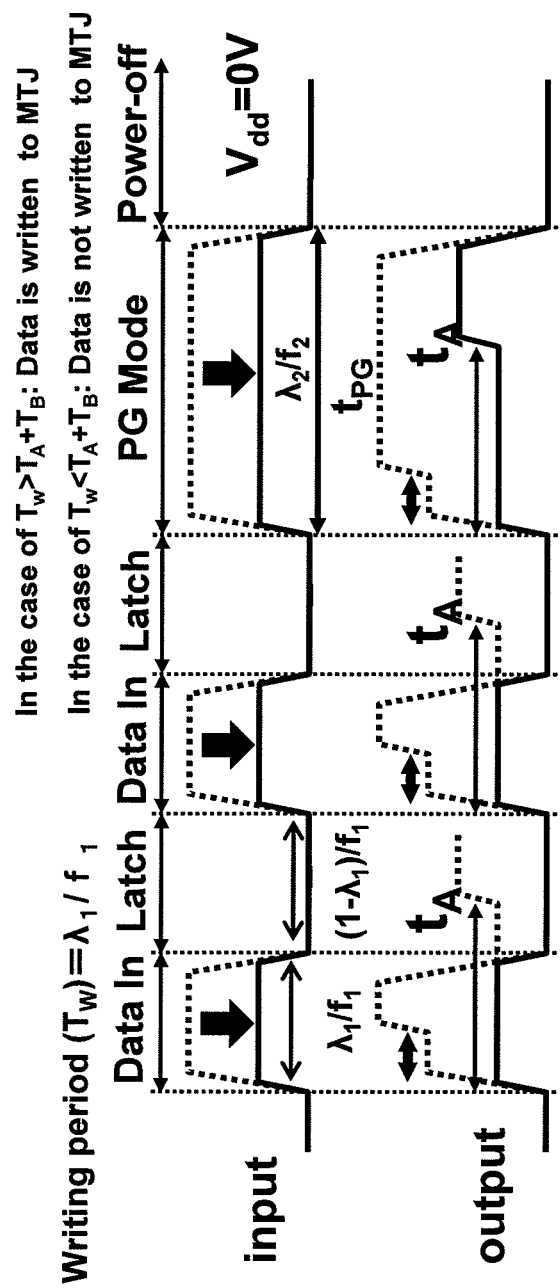

FIG.26
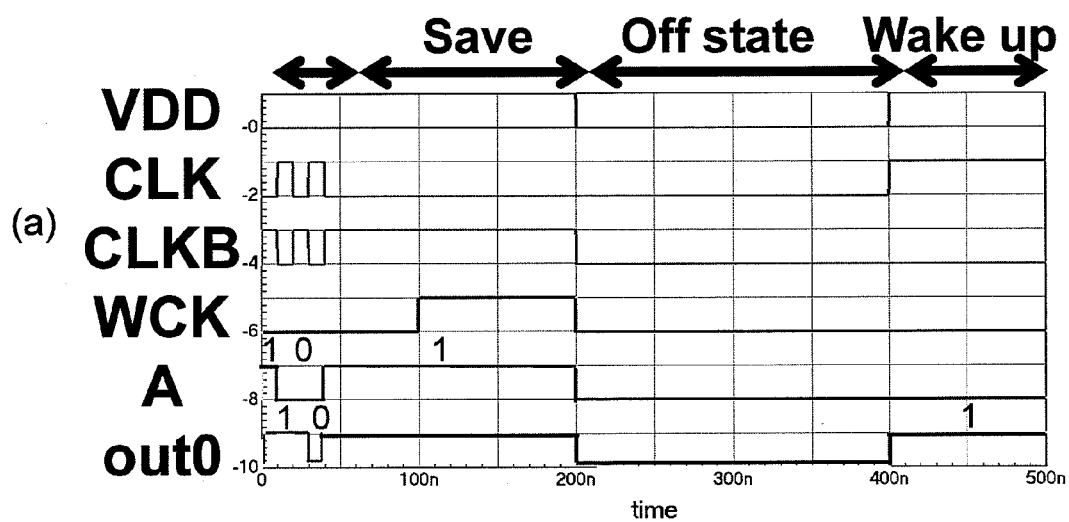
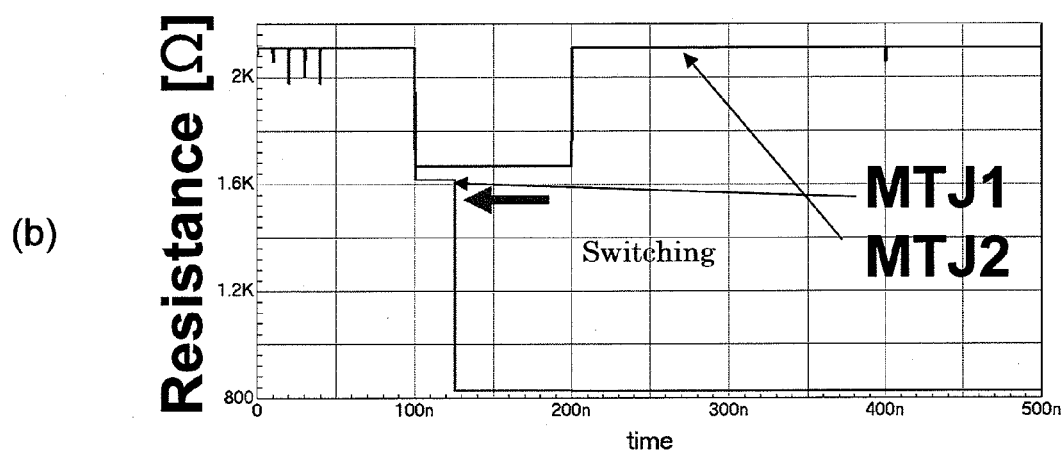

FIG.28
(a)
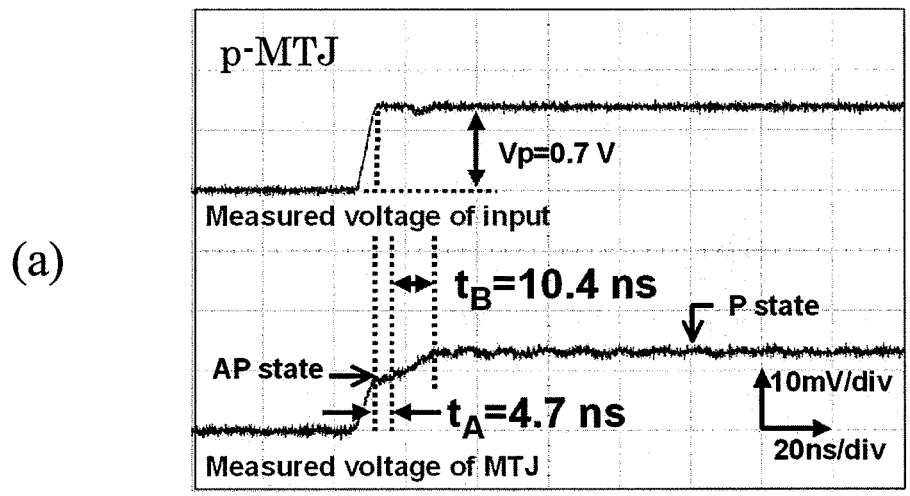
(b)
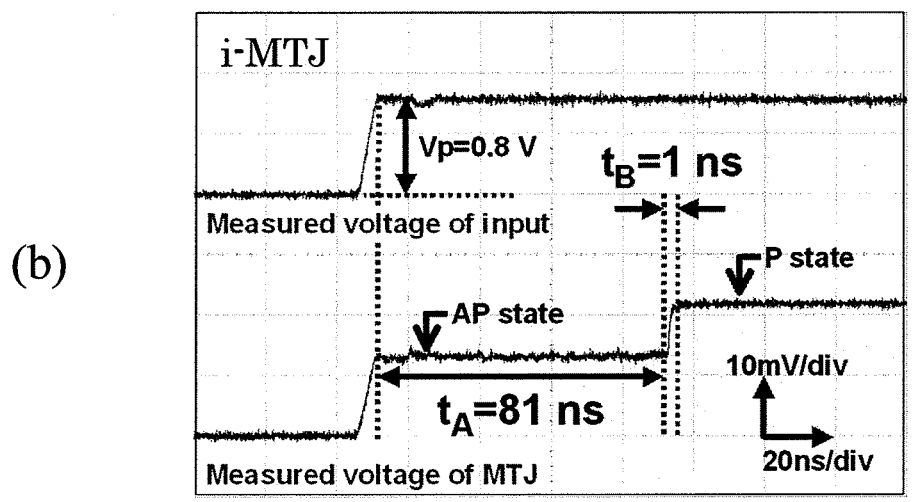

FIG.29
(a) 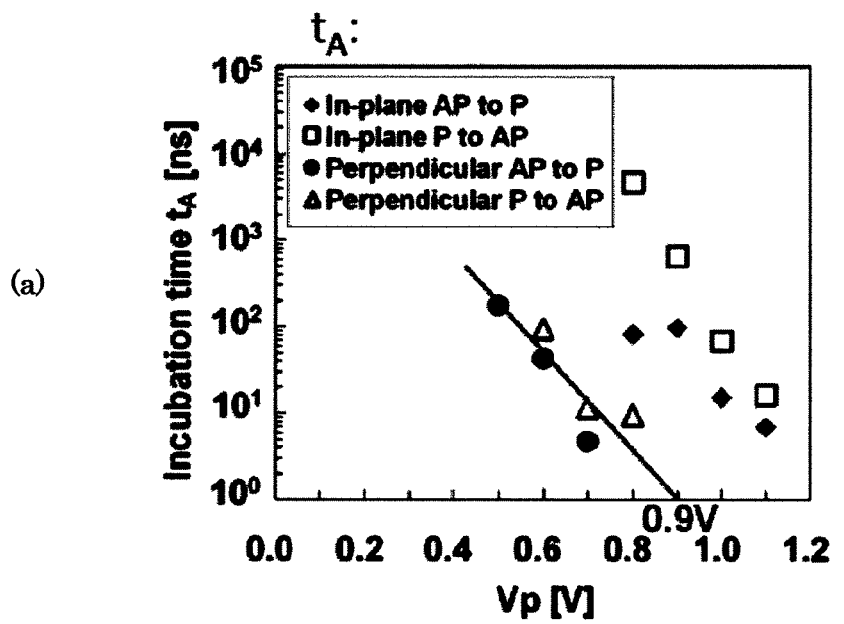
(b) 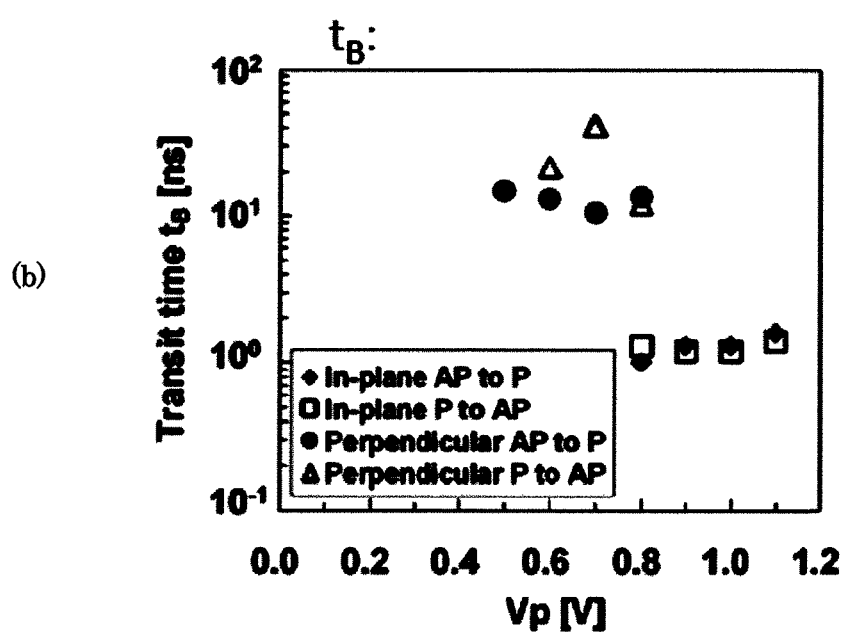

FIG.59
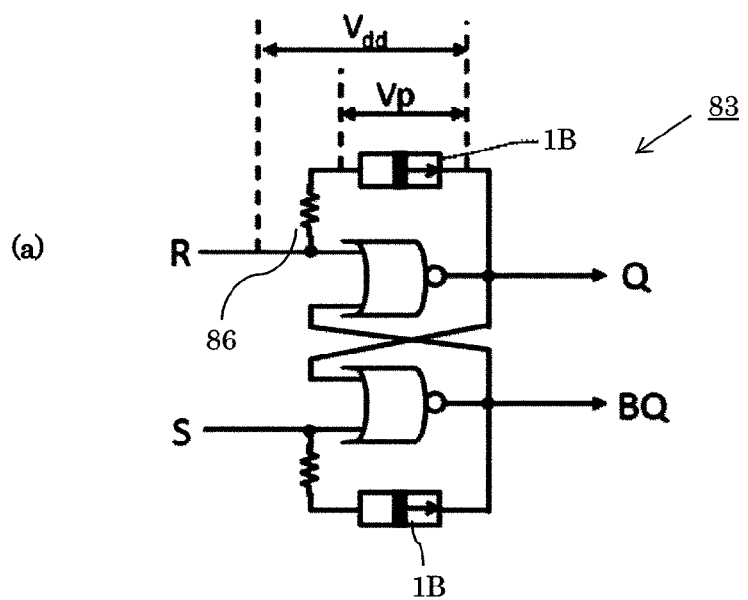
(a)
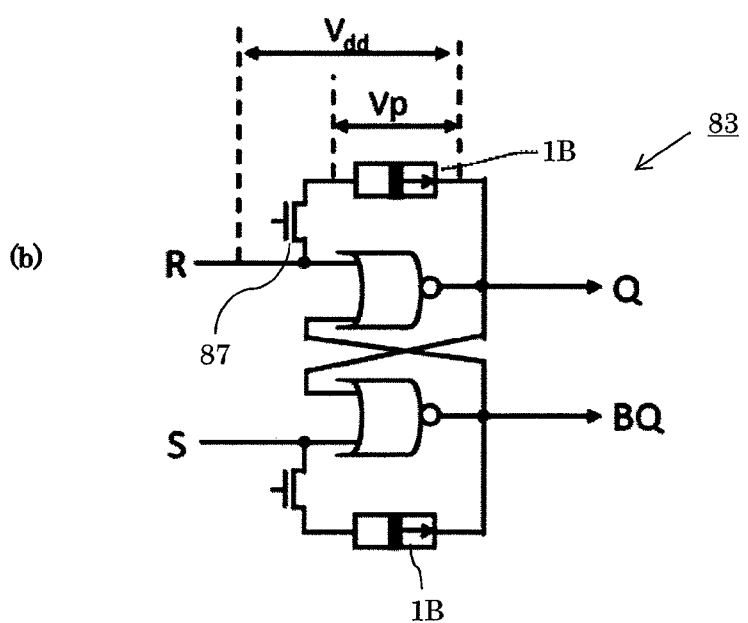
(b)

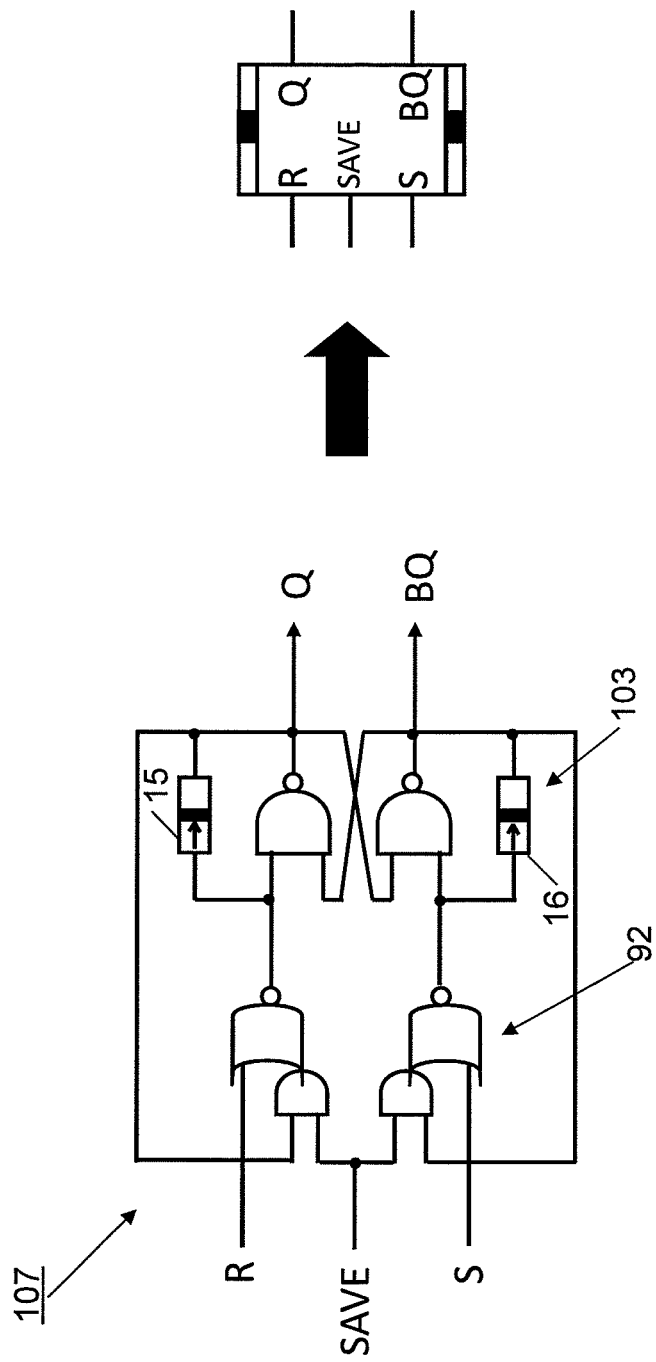

FIG.84
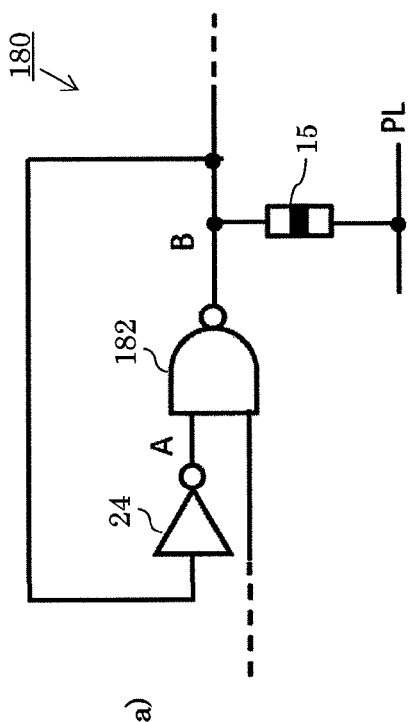
(a)
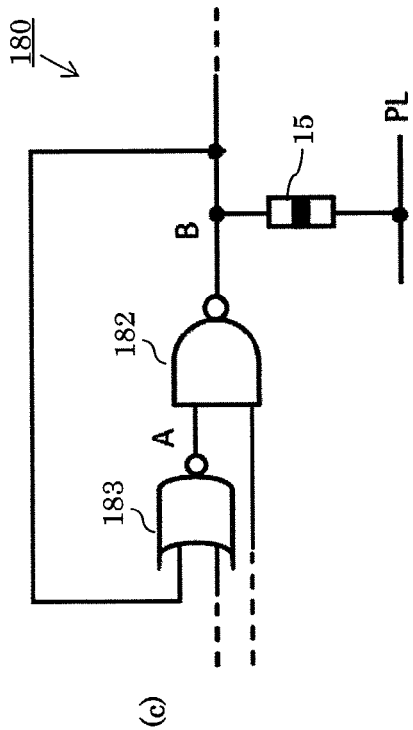
(c)
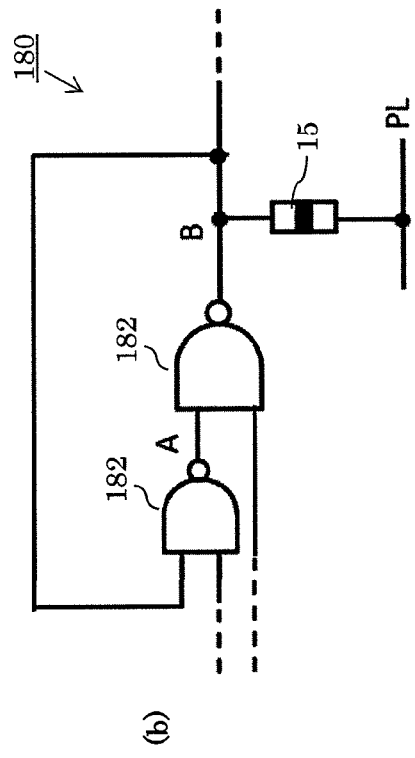
(b)

FIG.85
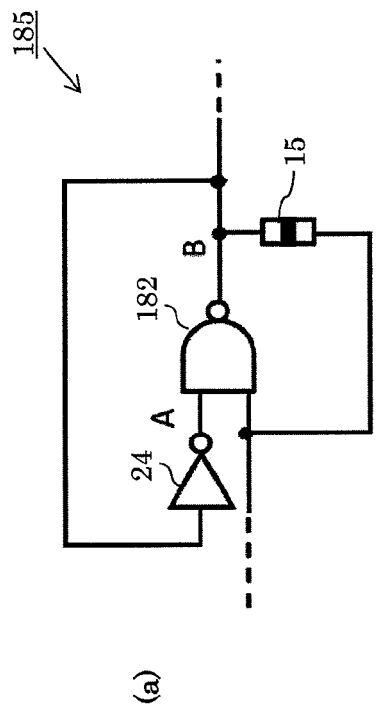
(a)
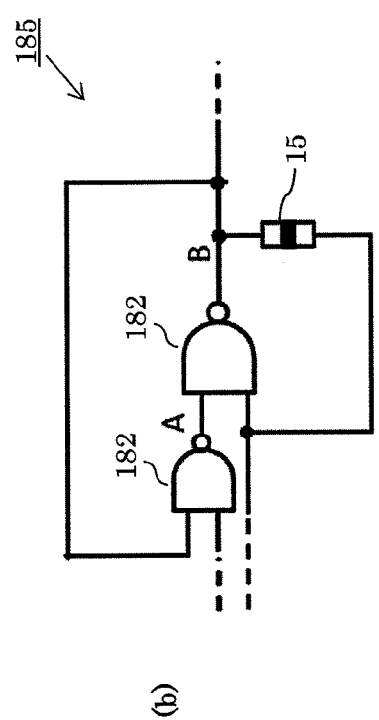
(b)
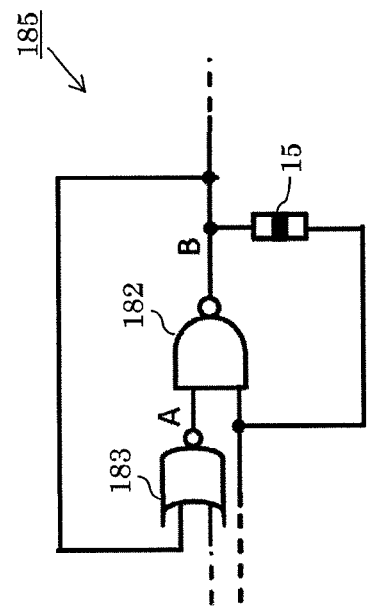
(c)

FIG.92
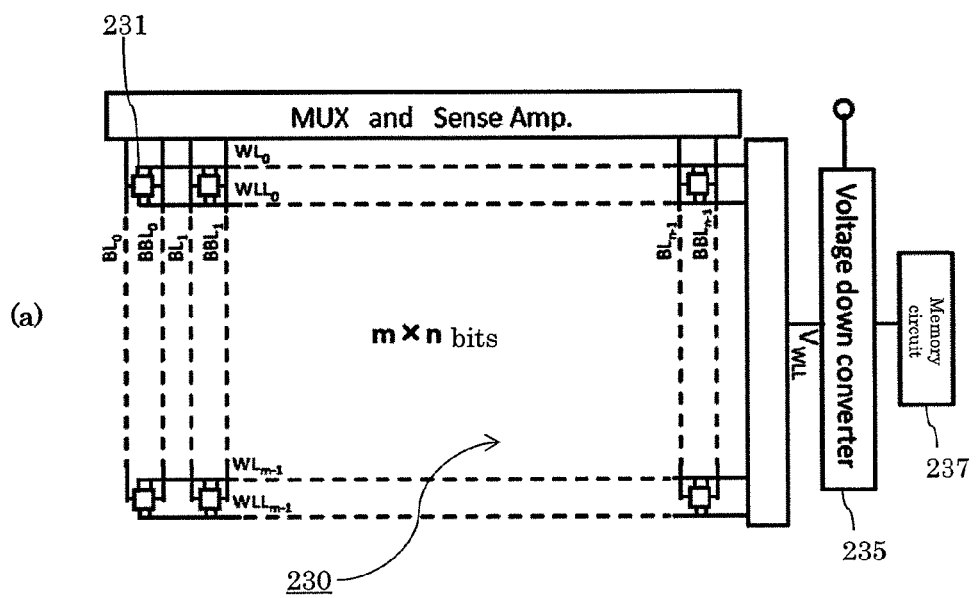
(a)
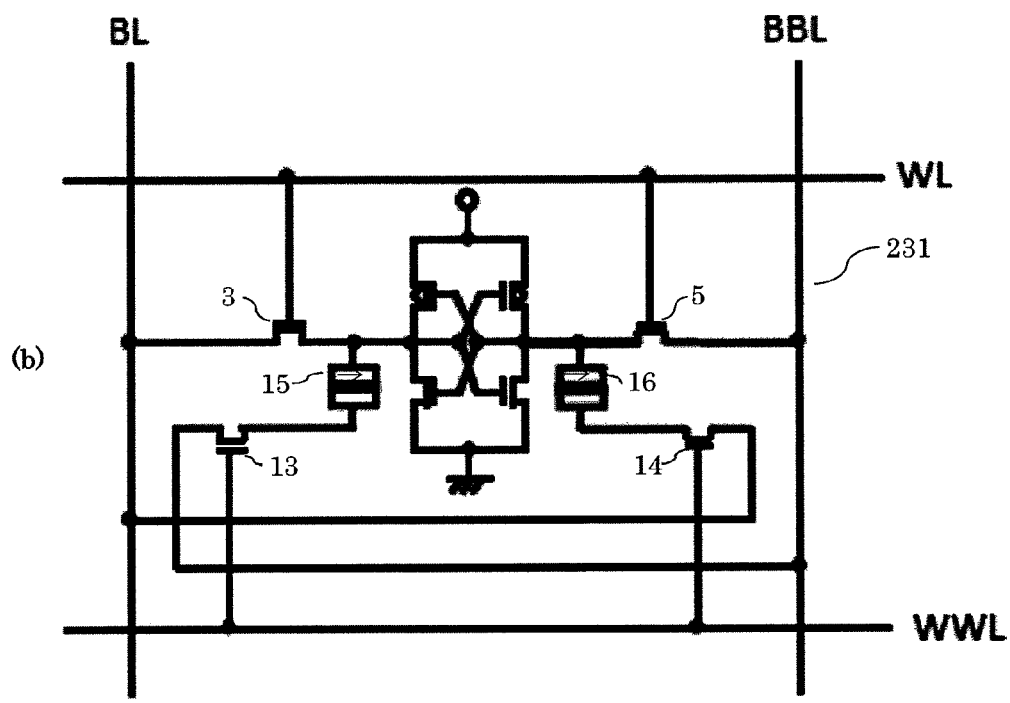
(b)

FIG.96
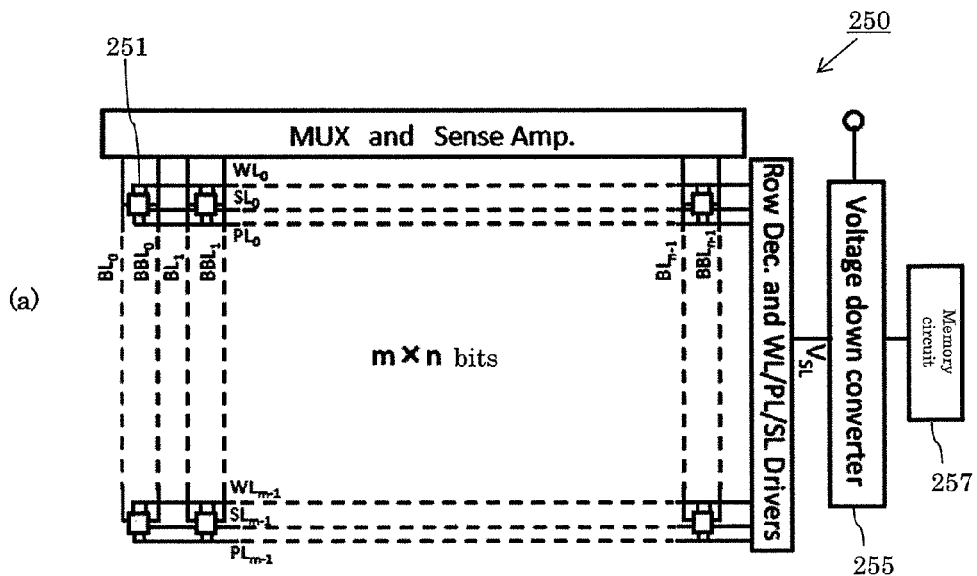
(a)
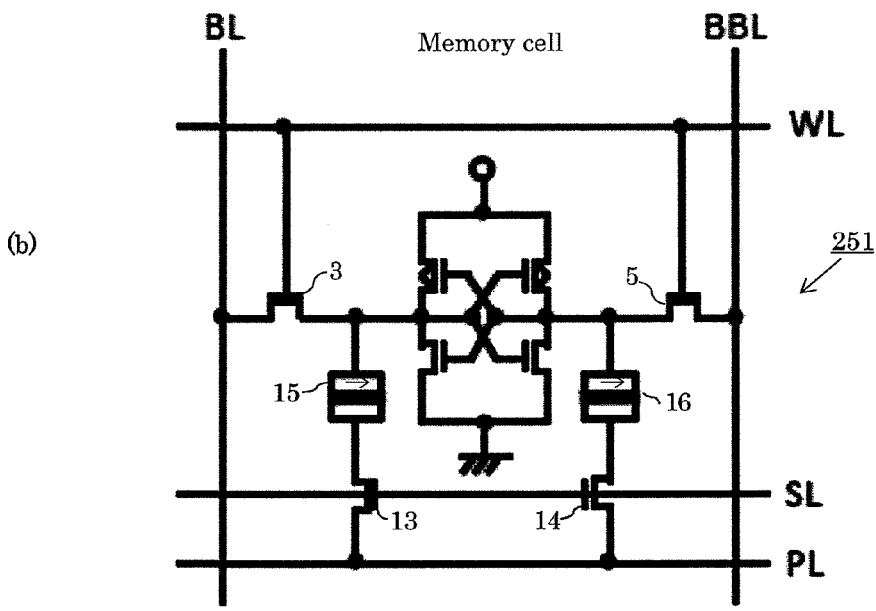
(b)

FIG.98
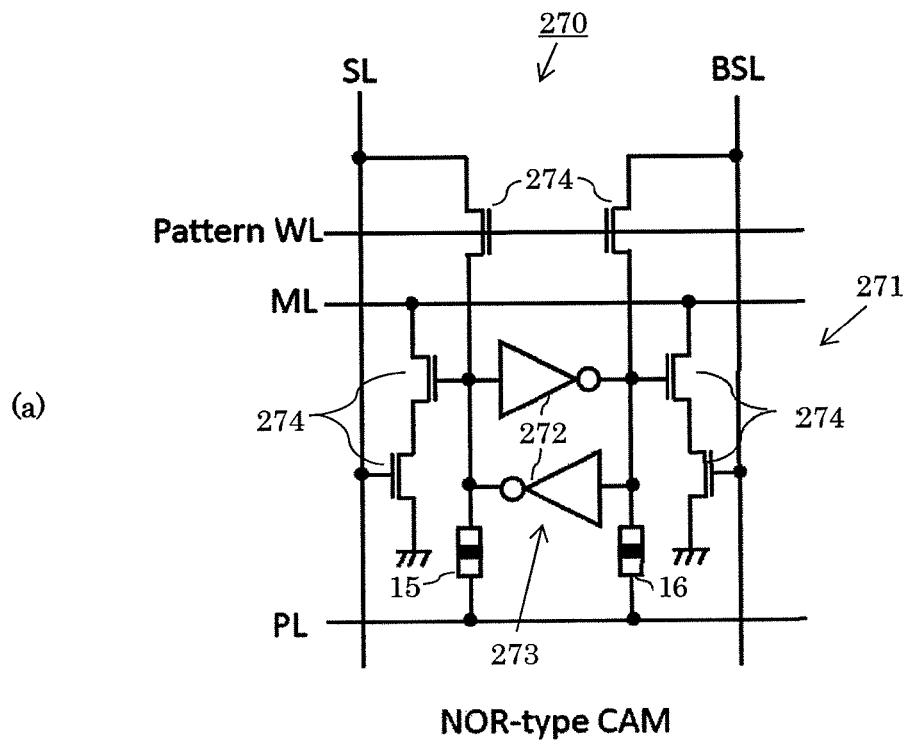
(a) NOR-type CAM
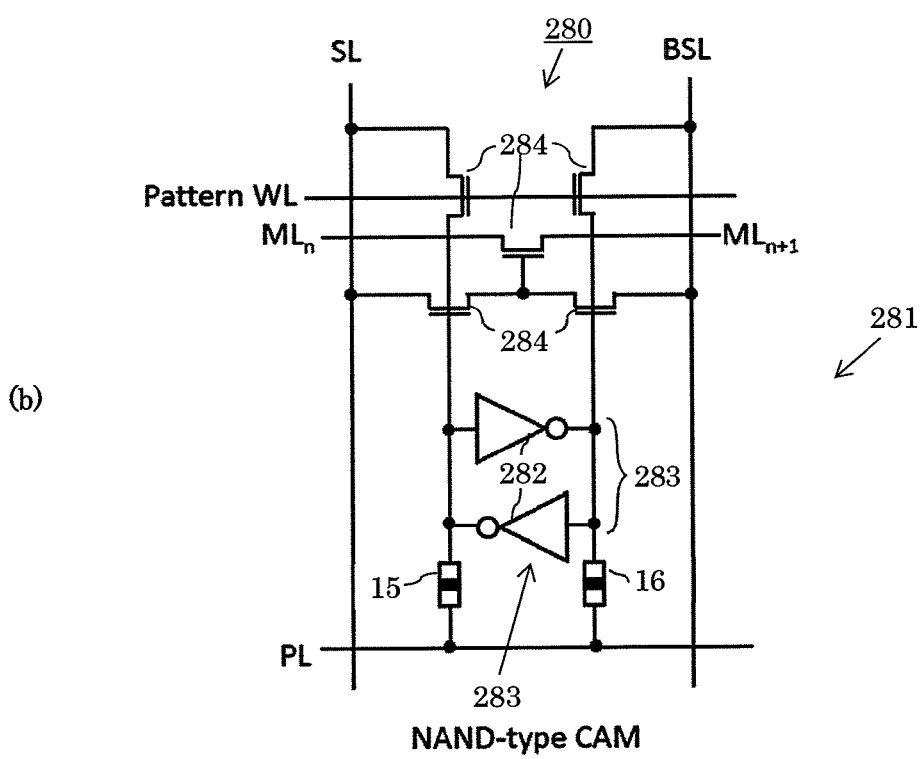
(b) NAND-type CAM

FIG.99
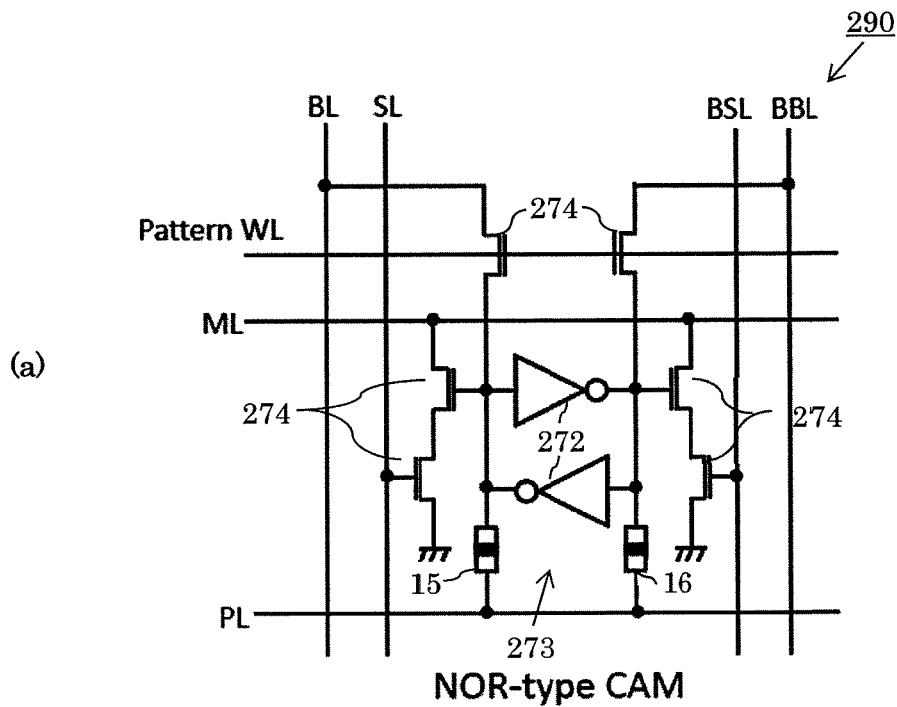
(a)
NOR-type CAM
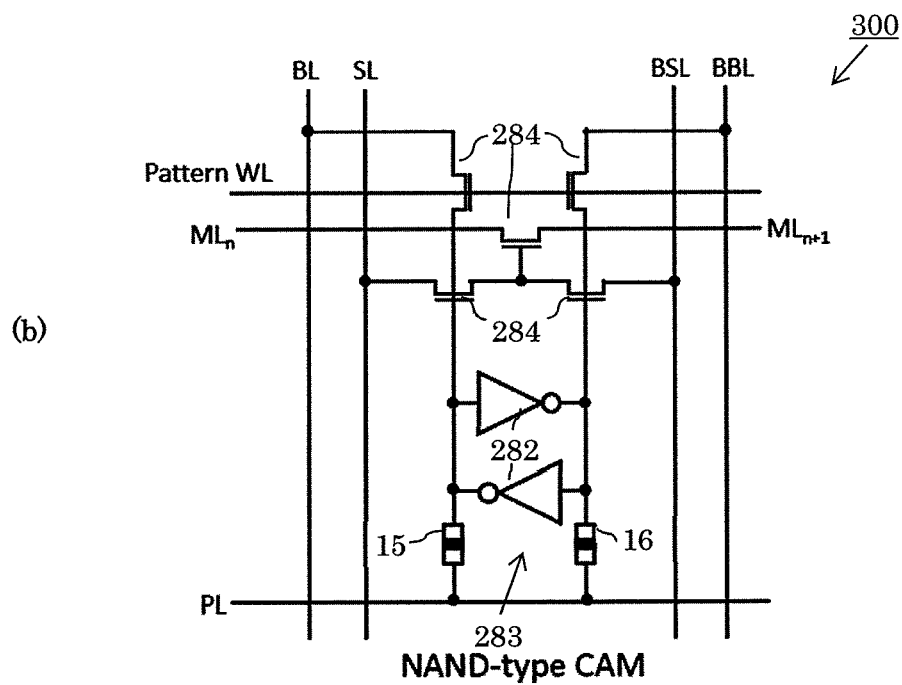
(b)
NAND-type CAM

NAND-type TCAM

FIG.104
(a)
Switch
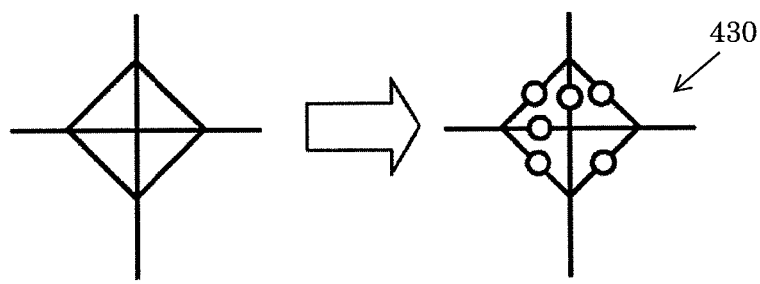
(b)
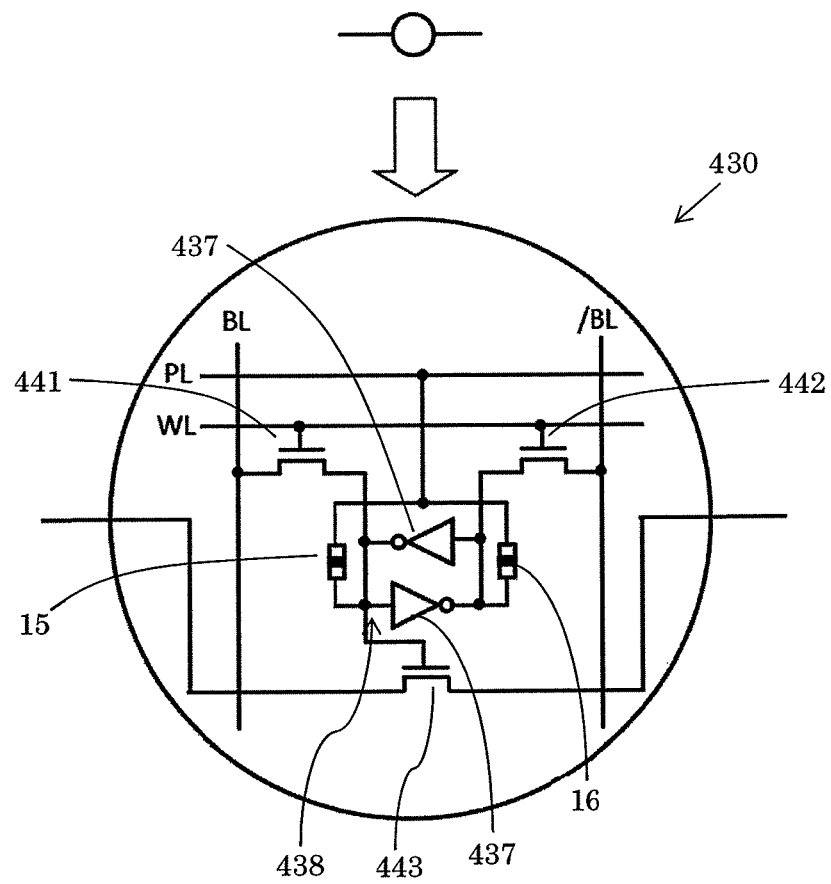

MUX (Another method of writing data into MTJ)

Configurable logic block
Another method of writing data into MTJ

FIG.109
Configurable logic block
Another method of writing data into MTJ
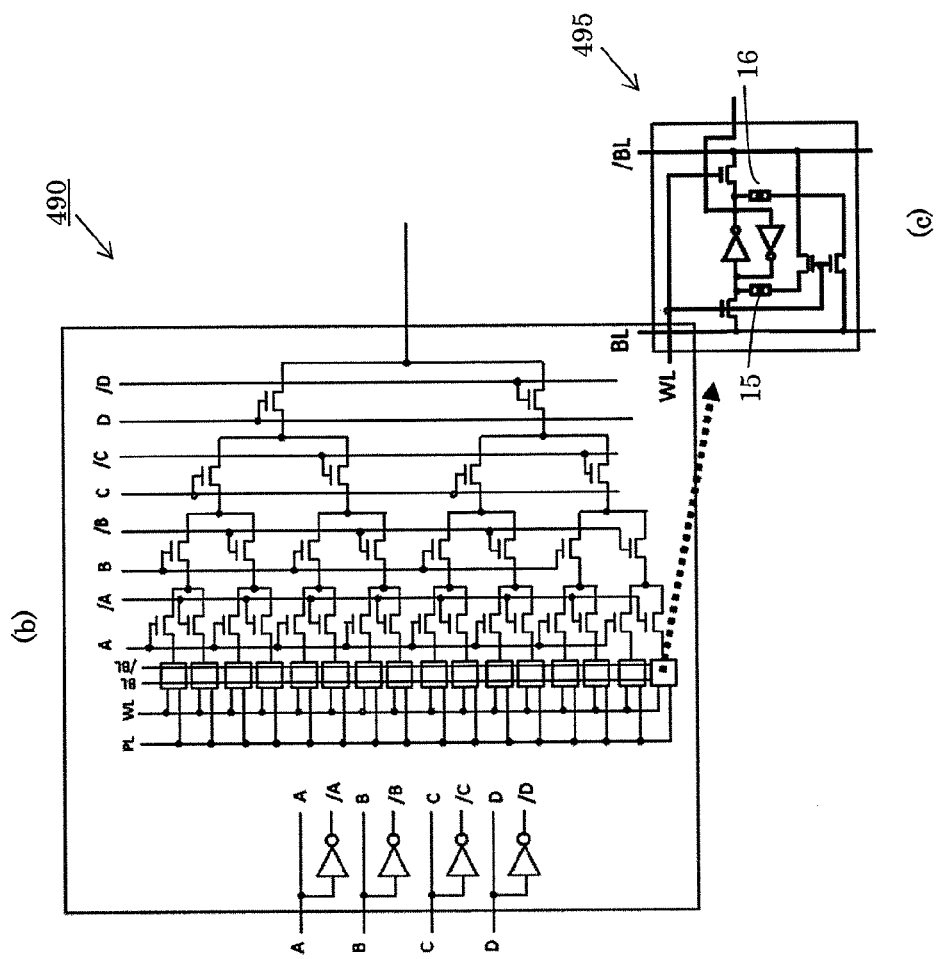
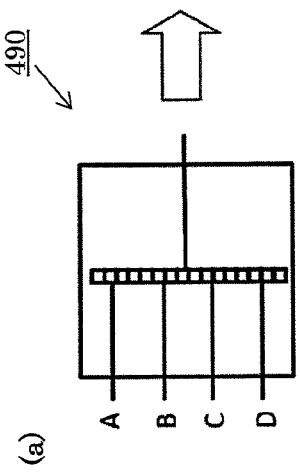

FIG.128
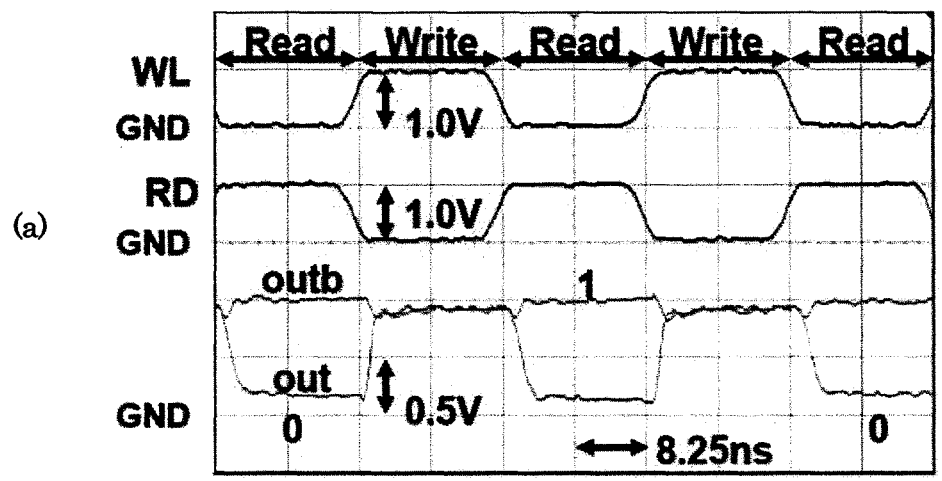
(a)
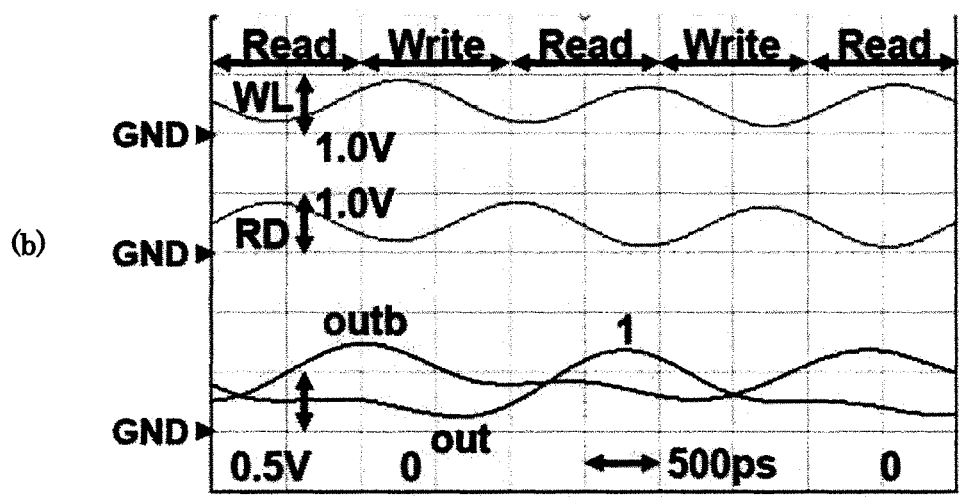
(b)

FIG.129
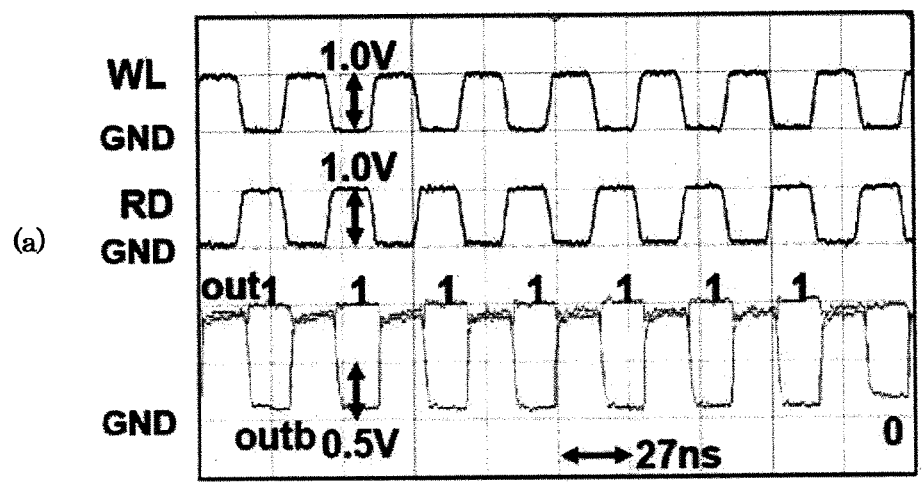
(a)
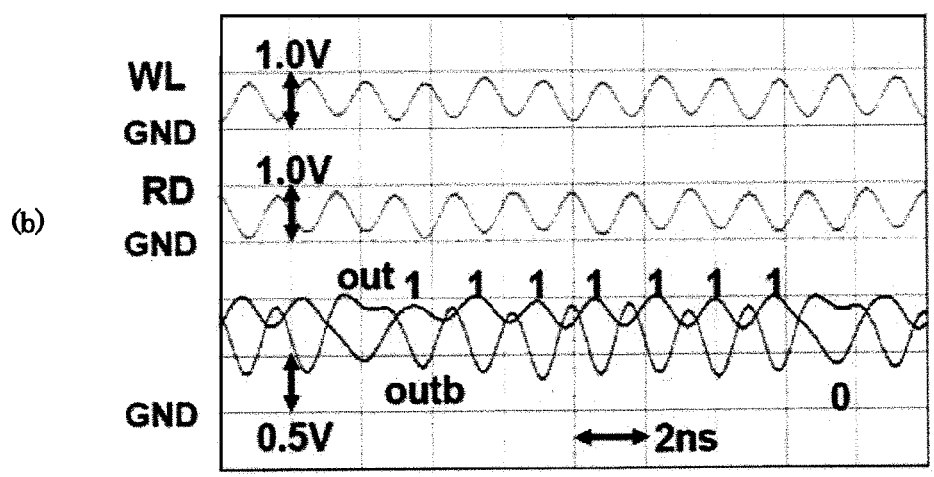
(b)

All data are written
into MTJ
in every cycle

Save/Load are
controlled by controller

INTEGRATED CIRCUIT

TECHNICAL FIELD

The present invention relates to an integrated circuit. More specifically, the present invention relates to the integrated circuit applicable to a nonvolatile memory etc. that uses a memory element for storing data based on change in resistance value.

BACKGROUND ART

The performance of integrated circuits has been increasing with the progress in scaling. Meanwhile, the leakage current increases while a transistor such as MOSFET, namely an elementary device forming integrated circuits, is at off state. Resulting increase in power consumption has recently been inhibiting further improvement in performance based on scaling. Under such circumstances, an attempt has been made intensively to eliminate or decrease off-leakage current by interrupting the power for a memory circuit while the memory circuit is not performing memory access. In this case, it is necessary to restore the state of the memory circuit after the power is turned on again. This is done by backing up (storing) the data of the memory circuit into another memory element, which has long data retention time before the power is turned off.

As the memory elements described above, various memories using the magnetic tunnel junction (MTJ), the resistance random access memory (ReRAM), the phase-change random access memory (PCRAM), etc. have been proposed.

A semiconductor memory device, which can store data without power supply and write and read data at high speed, will be used for on-chip cache memory in logic LSIs in future, and thus is attracting attention as a technology capable of decreasing the power for logic LSIs significantly.

In particular, the memory that uses the resistance change-type MTJ device as the memory element is the most promising candidate, since the stable memory operation is ensured even if the memory cell is downsized owing to its high endurance for switching and the future miniaturization of MTJ devices.

A spin-injection-type MTJ device (spin-transfer-torque (STT)-MTJ device), which can perform switching of a free layer by changing the direction of the current fed to the MTJ device without applying an external magnetic field, has been realized. A so-called MTJ/CMOS hybrid integrated circuit, which combines the MTJ device or STT-MTJ device with a CMOS integrated circuit, is one of the most promising candidates for ultra-low-power LSI.

However, the writing data at high speed to a memory device having long data retention time has not been put into practical use due to general problems described below.

Patent Literature 1 and Non-Patent Literature 1 disclose nonvolatile latch circuits.

FIG. 132 is a circuit diagram of a nonvolatile latch circuit 800 disclosed in Non-Patent Literature 1. As shown in this figure, the nonvolatile latch circuit 800 disclosed in Non-Patent Literature 1 includes: a bistable circuit 810 wherein two inverters 801, 802 are connected in a shape of a ring; and MTJ devices 803, 304 respectively connected to the input and the output of the bistable circuit 810. The nonvolatile latch circuit 800 in Non-Patent Literature 1 assumes the operation based on reversal of MTJ devices 803, 804. In addition, in this nonvolatile latch circuit 800, a latch made of a CMOS circuit and MTJ devices 803, 804 are connected via a MOSFET for switching, and by turning it on or off, the write to the MTJ devices 803, 304 is controlled (See Non-Patent Literature 1, FIG. 8).

FIG. 133 is a block diagram showing the structure of MTJ/CMOS hybrid integrated circuit of the conventional example 1. As shown in the figure, with the MTJ/CMOS hybrid integrated circuit in the conventional example 1, the data is written into the MTJ device in every cycle, which requires the MTJ device to have the operation frequency of the CMOS. Furthermore, in order to write data to the MTJ device at high speed, the write voltage must also be increased.

FIG. 134 is a block diagram showing the structure of an MTJ/CMOS hybrid integrated circuit in the conventional example 2. As shown in this figure, the MTJ/CMOS hybrid integrated circuit in the conventional example 2 uses CMOS only. However the conventional MTJ/CMOS hybrid integrated circuit can store data to the MTJ device before power control (called PG) is performed. In this case, low-power operation is allowed. Even if the operation is performed at high speed, the storage error of the MTJ device can be suppressed because this circuit does not require high-speed operation for the MTJ device. However, a peripheral circuit for control is required for the MTJ device to store data or reload the stored data.

However, the operation frequency of the disclosed MTJ/CMOS hybrid integrated circuit is not as fast as CMOS LSI (See Non-Patent Literatures 3, 4). With the MTJ device, when the switching speed increases to several hundred MHz, the increases of the switching error and the switching current of the MTJ device occur.

FIG. 135 is a circuit diagram showing the basic structure of a nonvolatile latch 850 disclosed by the present inventors et al. in Non-Patent Literature 2. As shown in FIG. 135, the nonvolatile latch 850 includes: a first latch 860; spin-injection-type MTJ devices 865, 866 connected to the first latch 860; and a second latch 870 connected to the spin-injection-type MTJ devices 865, 866. The data is written into the spin-injection-type MTJ devices 865, 866 at the operation frequency lower than that of the first and/or the second latch 860, 870.

CITATION LIST

Patent Literature

Patent Literature 1: WO 2009/028298

Non-Patent Literature

Non-Patent Literature 1: S. Yamamoto and S. Sugihara, Jpn. J. Appl. Phys. 48 (2009) 043001
Non-Patent Literature 2: T. Endoh, S. Togashi, F. Iga, Y. Yoshida, T. Ohsawa, H. Koike, S. Fukami, S. Ikeda, N. Kasai, T. Hanyu, and H. Ohno, "A 600 MHZ MTJ-Based Nonvolatile Latch Making Use of Incubation Time in MTJ Switching", IEEE, IEDM 2011,4-3
Non-Patent Literature 3: N. Sakimura et al., CICC 2008, p.355
Non-Patent Literature 4: K. Tsuchida et al., ISSCC 2010, p.258

SUMMARY OF INVENTION

Technical Problem

With the MTJ/CMOS hybrid integrated circuit in the conventional example 2 shown in FIG. 133, when the operating frequency increases, the power consumption increases drastically, and the occurrence of errors also increases at high-speed operation.

The MTJ/CMOS hybrid integrated circuit in the conventional example 2 shown in FIG. 134 requires a peripheral circuit, which increases the chip area, thus increasing the operating power. Consequently, in order to achieve the MTJ/CMOS hybrid integrated circuit, the system and the circuit design becomes complicated, thereby increasing the cost.

As described above, the latch circuit using conventional STT-MTJ devices has the problem that power consumption increases and the reversal probability during a write operation decreases when it is operated at high speed.

In view of such problems, the purpose of the present invention is to provide an integrated circuit that does not increase power consumption or decrease switching probability during a write operation, both of which occur when a latch circuit using conventional STT-MTJ devices, etc. is operated at high speed.

Solution to Problem

To solve the above problem, the present invention provides an integrated circuit, comprising: a memory element where write into the memory element occurs when specified period τ has elapsed after a write signal is input to the integrated circuit; and a basic circuit including elementary devices that constitute a circuit and having a data retaining function, wherein an operation frequency $f_1$ in a first operation mode of memory access of the basic circuit satisfies the following relation:

$$\tau > \lambda_1 / f_1 \, (0 < \lambda_1 \leq 1)$$

wherein, $\lambda_1$ represents the ratio of time when write into the basic circuit is being performed in a cycle of the first operation mode $(1/f_1)$ of memory access of the basic circuit.

In the above configuration, the memory element may have a second operation mode having a frequency $f_2$ that satisfies the relation $\tau < \lambda_2 / f_2 \, (0 < \lambda_2 \leq 1)$, wherein, $\lambda_2$ represents the ratio of time when write into the memory element is being performed in a cycle of the second operation mode $(1/f_2)$ of memory access of the basic circuit.

The integrated circuit may further have a control circuit, wherein, in the control circuit, operation frequency $f_1$ in the first operation mode of memory access of the basic circuit satisfies the relation $\tau > \lambda_1 / f_1$, and the second operation mode having frequency $f_2$ that satisfies the relation $\tau < \lambda_2 / f_2$ is started by inputting a signal for giving recognition that power supply voltage is to be interrupted into the control circuit.

A circuit configuration of the basic circuit may not be changed by the signal for starting the second operation mode.

A third operation mode where the power is turned off (interrupted) and a fourth operation mode where the power is turned on may be provided, and in the fourth operation mode, data stored in the memory element is read out into the data retaining function and retained.

The second operation mode is preferably before the third operation mode.

The second operation mode is preferably started when a decrease in a power supply voltage to below a predetermined value is detected.

The signal for the interrupting of the power supply voltage is preferably generated when the decrease in the power supply voltage to below a predetermined value is detected.

The integrated circuit is preferably divided into a plurality of blocks, a power supply voltage exclusive for each block is supplied, and an operation mode for each block is controlled independently.

The integrated circuit may comprise: an integrated circuit made up of a system including an integrated circuit or a plurality of integrated circuits, wherein, the system integrated circuit includes a basic circuit and a nonvolatile memory element for storing the data of the basic circuit; and a plurality of commands for operating the system integrated circuits are stored in the nonvolatile memory element, and these commands include a command for turning off and turning on the power for each integrated circuit.

The integrated circuit may comprise: an integrated circuit made up of a system including an integrated circuit or a plurality of integrated circuits, wherein the system integrated circuit includes a basic circuit and a nonvolatile memory element for storing the data of the basic circuit, and by detecting that each of the integrated circuits does not perform memory access for a certain period, the second operation mode for turning off the power of the integrated circuit is executed, and when a command for executing memory access of the integrated circuit whose power remains off is issued, the fourth operation mode is executed.

The integrated circuit may comprise: an integrated circuit made up of a system including an integrated circuit or a plurality of integrated circuits, wherein the system integrated circuit includes a basic circuit and a nonvolatile memory element for storing the data of the basic circuit; and each of the plurality of circuit blocks within a chip has a memory storing a plurality of commands including a command for turning off the power and a command for turning on the power, and a function of controlling the supply of power by each block.

The integrated circuit may comprise: an integrated circuit made up of a system including an integrated circuit or a plurality of integrated circuits, wherein the integrated circuit includes a basic circuit and a nonvolatile memory element for storing the data of the basic circuit; and each of the plurality of circuit blocks within a chip has a function of controlling the supply of power, and by detecting that each of the blocks does not perform memory access for longer than a certain period, the second operation mode for turning off the power for that block is executed, and when a command for executing memory access of the block whose power remains off is issued, the fourth operation mode is executed.

The integrated circuit may comprise: an integrated circuit made up of a system including an integrated circuit or a plurality of integrated circuits, wherein the integrated circuit includes a basic circuit, and a nonvolatile memory element for storing the data of the basic circuit; and by detecting that the power has decreased to below a predetermined value, the second operation mode for turning off the power for the integrated circuit is executed, and when a command for executing memory access of the integrated circuit whose power remains off is issued, the fourth operation mode is executed. The memory element may be a resistance random access memory or a spin-injection-type MTJ device.

The magnetization direction of the spin-injection-type may be mostly the direction of the plane on which the integrated circuit is formed. The magnetization direction of the spin-injection-type may be the direction mostly perpendicular to the plane on which the integrated circuit is formed.

The memory element may be a phase-change-type memory element.

Advantageous Effects of Invention

According to the present invention, the integrated circuit, which includes the basic circuit and the nonvolatile memory element for storing the data of the basic circuit, is capable of suppressing increase in power consumption while increasing the reversal probability of the memory element significantly during a write operation when the circuit is operated at high speed. According to the present invention, low-power-consumption and a high-reliability integrated circuit can be achieved, allowing low-power-consumption electronic devices to be realized.

BRIEF DESCRIPTION OF DRAWINGS

FIG. 2 is a diagram describing a second operation mode for turning off power in the basic circuit of the integrated circuit of the present invention, where (a) is a block diagram, and (b) is a time chart showing a write pulse.

FIG. 6 shows the structure of a memory cell of the ReRAM, where (a) is a cross-sectional view and (b) shows current-voltage characteristics.

FIG. 7 shows another structure of a memory cell of the ReRAM, where (a) is a cross-sectional view and (b) shows current-voltage characteristics.

FIG. 8 shows the structure of a memory cell of the PCRAM, where (a) is a cross-sectional view and (b) shows current-voltage characteristics.

FIG. 9 is a chart describing memory element, where (a) shows the relation between the applied voltage and the current, (b) is a chart showing the relation between the state parameter and energy, and (c) is a time chart showing switching waveforms.

FIG. 10 is a chart showing a first sequence of the integrated circuit of the present invention.

FIG. 11 is a chart showing a second sequence of the integrated circuit of the present invention.

FIG. 12 is a chart showing a third sequence of the integrated circuit of the present invention.

FIG. 13 is a chart showing a fourth sequence of the integrated circuit of the present invention.

FIG. 14 is a chart showing a fifth sequence of the integrated circuit of the present invention.

FIG. 15 is a chart showing the effect of the present invention, where (a) shows the relation between the switching time of the memory element and current, and (b) shows the switching time and switching probability of the memory element.

FIG. 16 is a chart showing the power consumption of the integrated circuit, wherein (a) shows the integrated circuit of the present invention, and (b) shows a nonvolatile latch circuit using a conventional STT-MTJ device.

FIG. 20A is a chart schematically showing the operation of the integrated circuit of the present invention.

FIG. 22B is a chart describing the relation among the sum of incubation time and transit time $t_A+t_B$, pulse width $\tau_1$ of the write pulse in the first operation mode, and the pulse width $\tau_2$ of the write pulse in the second operation mode in FIG. 22A.

FIG. 26 shows the simulation of the integrated circuit shown in FIG. 17, wherein (a) shows input waveforms, and (b) shows the resistance of the MTJ devices obtained by the simulation.

FIG. 28 shows the switching characteristics of the MTJ device, wherein (a) shows those of the p-MTJ device, and (b) shows those of the i-MTJ device.

FIG. 29 shows the dependency on write voltage Vp of switching characteristics of the MTJ device, wherein (a) shows the incubation time ($t_A$), and (b) shows the transit time ($t_B$).

FIG. 59 shows circuits capable of adjusting the incubation time of the current-driven memory element in the NOR-type RS flip-flop circuit 83, where (a) shows a circuit using resistance, (b) shows a circuit using MOSFET.

FIG. 71A is a circuit diagram of a NAND-type RS flip-flop circuit equipped with auto save function.

FIG. 84 (a) to (c) are circuit diagrams of NAND according to the fourth embodiment.

FIG. 85 (a) to (c) shows circuit diagrams of modification of NAND.

FIG. 92 shows an SRAM according to the modification example 2 of the fifth embodiment of the present invention, where (a) is a block diagram showing the structure of the SRAM, and (b) shows a memory cell.

FIG. 96 shows SRAM according to the modification example 4 of the fifth embodiment of the present invention, where (a) is a block diagram showing the structure, and (b) shows a circuit diagram of a memory cell.

FIG. 98 shows the structure of the binary CAM memory cell according to the sixth embodiment of the present invention, where (a) is a circuit diagram of a NOR-type CAM, and (b) is that of a NAND-type CAM.

FIG. 99 shows the structure of the modification example of the binary CAM memory cell according to the present invention, where (a) is a circuit diagram of a NOR-type CAM, and (b) is that of a NAND-type CAM.

FIG. 104 shows a specific structure of the switch within the FPGA, where (a) is a schematic diagram of the switch, and (b) is a circuit diagram of the switch.

FIG. 109 shows the structure of the modification example 5 of a switch within a logic block in the FPGA in the seventh embodiment of the present invention, where (a) is a block diagram of the logic block, (b) is a circuit diagram of the logic block, and (c) is a circuit diagram of switch.

FIG. 117 is a circuit diagram of modification example 5 of the integrated circuit system according to the ninth embodiment of the present invention.

FIG. 118 is a flow chart for specifying Write pulse width as a structure of modification example 6 of the integrated circuit system according to the ninth embodiment of the present invention.

FIG. 119 is a circuit diagram of the modification example 7 of the integrated circuit system according to the ninth embodiment of the present invention.

FIG. 120 is a circuit diagram of the modification example 8 of the integrated circuit system according to the ninth embodiment of the present invention.

FIG. 121 is a circuit diagram showing the latch as the basic structure of a semiconductor memory device of the present invention.

FIG. 122 is a chart showing the structure of an MTJ device, where (a) shows a case where the magnetization direction of a fixed layer and that of a free layer are in a parallel state in the MTJ device, (b) shows a case where they are in an antiparallel state in the MTJ device, and (c) is an equivalent circuit diagram.

FIG. 123 is a chart showing the change in resistance of the MTJ device.

FIG. 124 is a chart schematically showing the operation of the semiconductor memory device of the present invention.

FIG. 125 shows a scanning electron microscopic (SEM) image of the surface of the fabricated semiconductor memory device.

FIG. 126 is a TEM image of the cross section of the p-MTJ device.

FIG. 127 is a TEM image of the cross section of the i-MTJ device.

FIG. 128 shows input waveforms obtained by observing the operation of the fabricated semiconductor memory device using the oscilloscope, where (a) shows the case of 30 MHz, and (b) shows the case of 600 MHz.

FIG. 129 is a time chart showing the operation observed when the data to be input to the fabricated semiconductor memory device is changed, where (a) shows the case of 30 MHz, and (b) shows the case of 600 MHz.

Figure 130:
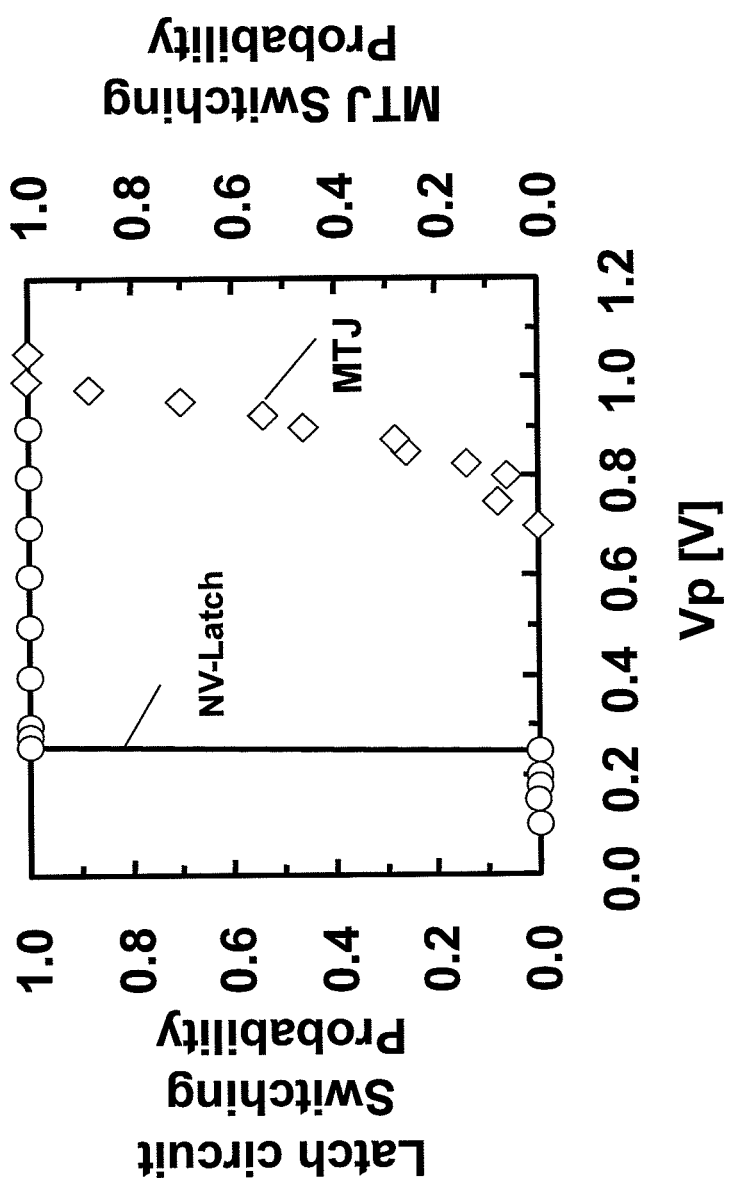

FIG. 130 is a chart showing the dependency on Vp of the latching probability and the switching probability of the prototype semiconductor memory device.

Figure 131:
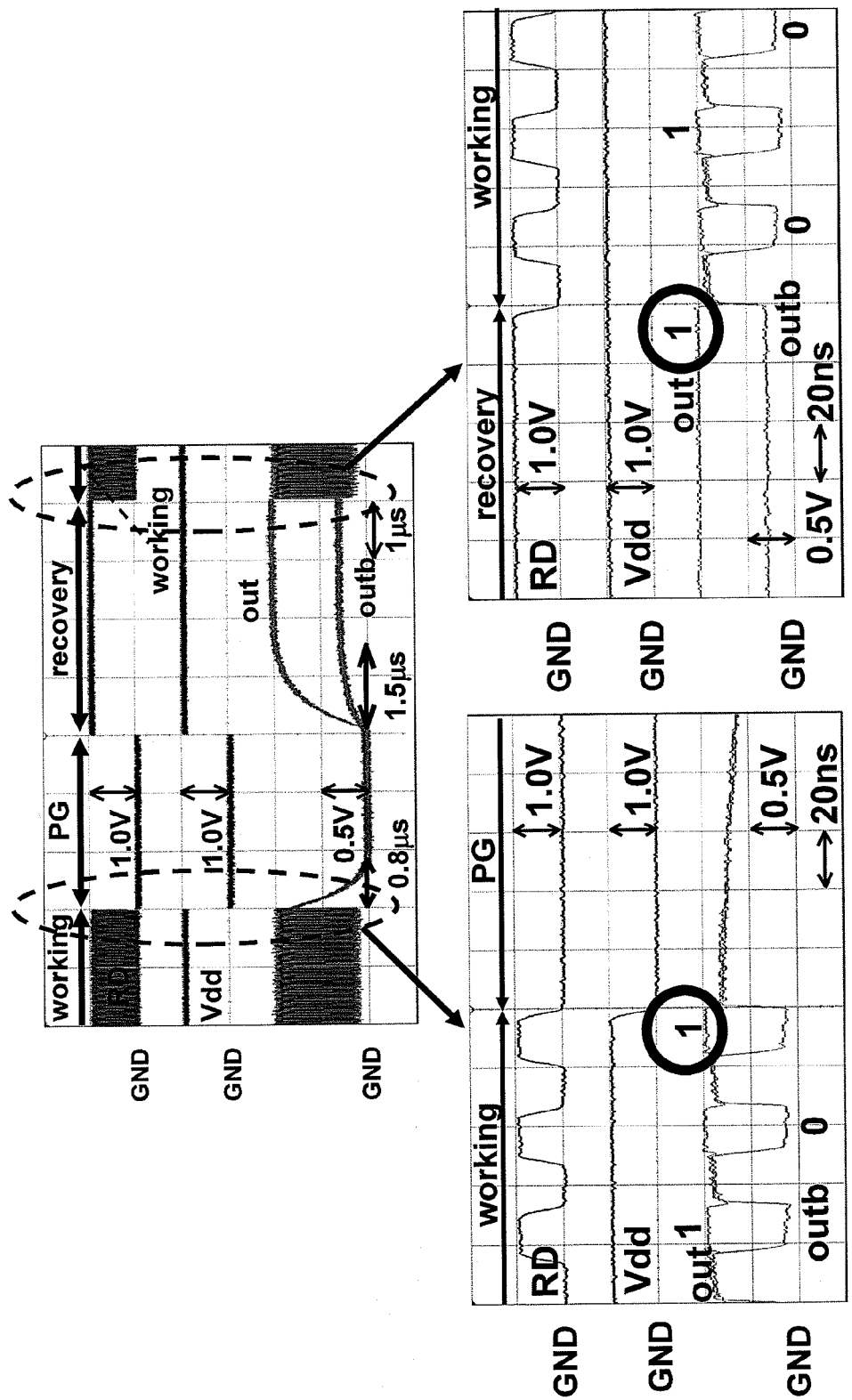

FIG. 131 provides time charts related to the power supply control of the prototype semiconductor memory device.

Figure 132:
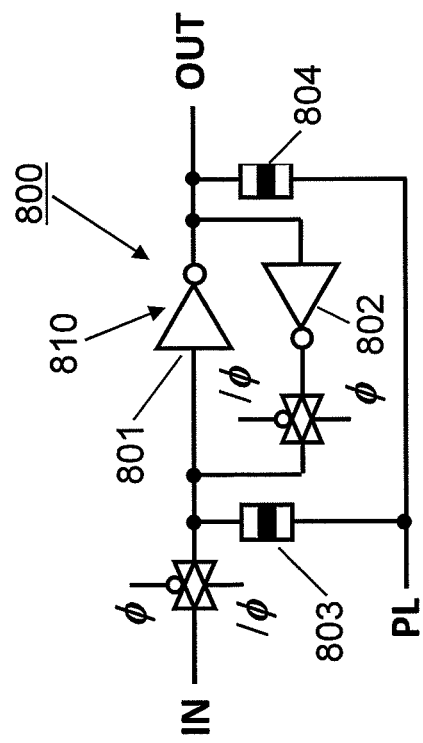

FIG. 132 is a circuit diagram of a nonvolatile latch circuit disclosed in Non-Patent Literature 1.

Figure 133:
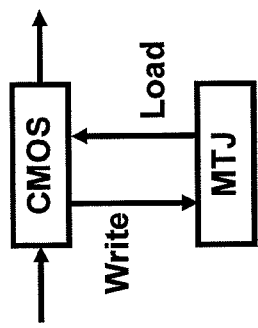

FIG. 133 is a block diagram showing the structure of MTJ/CMOS hybrid integrated circuit of the conventional example 1.

Figure 134:
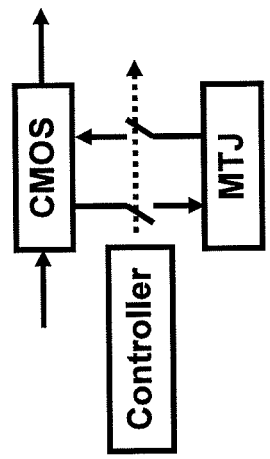

FIG. 134 is a block diagram showing the structure of an MTJ/CMOS hybrid integrated circuit in the conventional example 2.

Figure 135:
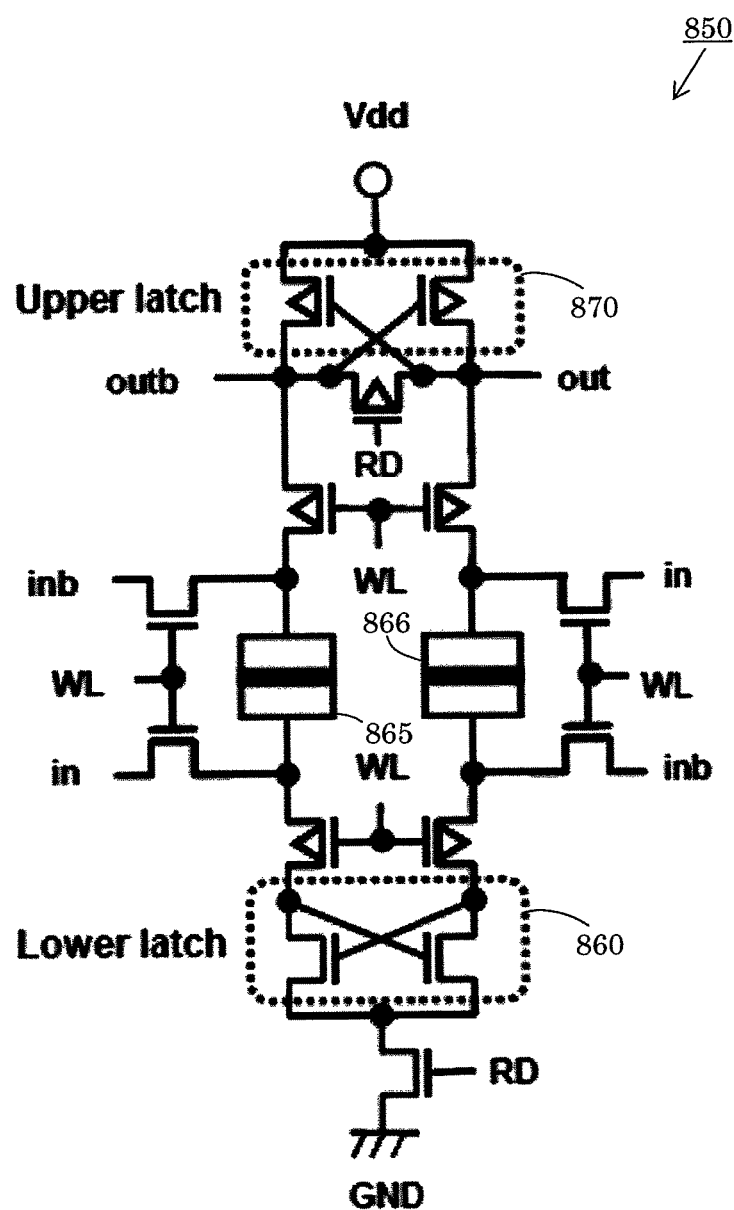

FIG. 135 is a circuit diagram showing the basic structure of nonvolatile latch disclosed by the present inventors et al. in Non-Patent Literature 2.

REFERENCE SIGNS LIST 1A, 1C, 1D: Integrated circuit
1B: Memory element
2: First circuit
2a: First n-type MOSFET for driving
2b: First p-type MOSFET
3: First n-type MOSFET for transfer
4: Second circuit
4a: Second n-type MOSFET for driving
4b: Second p-type MOSFET
5: Second n-type MOSFET for transfer
10: First latch
11: Third circuit
11a: First p-type MOSFET for driving
11b: Third p-type MOSFET
12: Fourth circuit
12a: Second p-type MOSFET for driving
12b: Fourth p-type MOSFET
13: Third n-type MOSFET for transfer
14: Fourth n-type MOSFET for transfer
15: First spin injection type MTJ device
16: Second spin injection type MTJ device
17: N-type MOSFET
18, 21: P-type MOSFET
20: Second latch
22: CMOS latch
23: Transfer gate consisting of n-type MOSFET
24: Inverter
25, 26, 27, 28: Load transistor
30: MTJ device
30a: Tunnel barrier layer
30b: Fixed layer
30c: Free layer
30d: Upper electrode
30e: Lower electrode
32: ReRAM
32a: Lower electrode
32b: Metal oxide layer
33c: Upper electrode
34: PCRAM
34a: Lower electrode
34b: Chalcogenide layer
34c: Upper electrode
38: Control circuit
40, 41, 42, 43, 44, 45, 46, 47, 50, 51, 52, 53, 54, 55, 60, 61, 65, 66, 67, 70, 71: Latch circuit of the second embodiment
83, 85, 95: NOR type RS flip-flop circuit
86: Resistance
87: MOSFET
88: Circuit for preventing through-current
90: RS flip-flop circuit equipped with auto save function
92: Circuit having auto save function
96: circuit from which the MTJ devices can be detached
97: Switch
98, 115: Inverter
99: 2-input OR
101: Input OR
103, 104, 107: NAND type RS flip-flop circuit
110: D latch
112: NOR type D latch
114: NOR
116, 118: NAND type D latch
117: AND
122, 124, 127: Nonvolatile D flip-flop
125: Conventional volatile D latch
130, 140: Asynchronous-type T flip-flop circuit
132, 142: Synchronous-type T flip-flop circuit
150: NOR type T flip-flop circuit equipped with auto save function
152: NAND type T flip-flop circuit equipped with auto save function
160: NOR type JK flip-flop circuit
154: JK flip-flop circuit
156: Asynchronous-type NAND type JK flip-flop circuit
158: Synchronous-type NAND type JK flip-flop circuit
170: Inverter
172, 173, 182: NAND
183: NOR
185: NAND
200, 220, 230, 240, 250: SRAM
201, 221, 231, 241, 251: Memory cell
202: A plural of memory cell
210: Peripheral circuit
212: MUX and sense circuit 214: Row decoder circuit, control circuit of word line (WL) plate line (PL) control circuit
235: Power conversion circuit for the WWL signal
237, 257: Memory circuit
255: Power conversion circuit for the SL signal
270, 290, 320, 330: NOR type CAM
271, 281: Memory cell
273: Bistable circuit
274: N-MOSFET for transfer
280: NAND type CAM
300, 350, 360: NAND type CAM
321, 351, 361: Memory cell
400: FPGA
410, 480, 490: Reconfigurable logic block
420: Switch box
430, 485, 495: Switch
437: Inverter
438: Bistable circuit
441, 442, 443, 452: N-MOSFET for transfer
460, 470: MUX
500, 530: Page buffer
510: Bistable circuit
515: Nonvolatile memory cell
540: Row address buffer
541: Memory cell
600, 610, 620, 630, 650, 670, 680, 690: Integrated circuit system
602: Central processing unit (PU)
603: Latch or flip-flop circuit
604: Write and read circuit
605: Save and load control unit
606: X'er gate
661, 662, 663, 664: Block
685: Power down detector

DESCRIPTION OF EMBODIMENTS

The embodiments of the present invention will hereinafter be described in detail by referring to drawings.

First Embodiment

Figure 1:
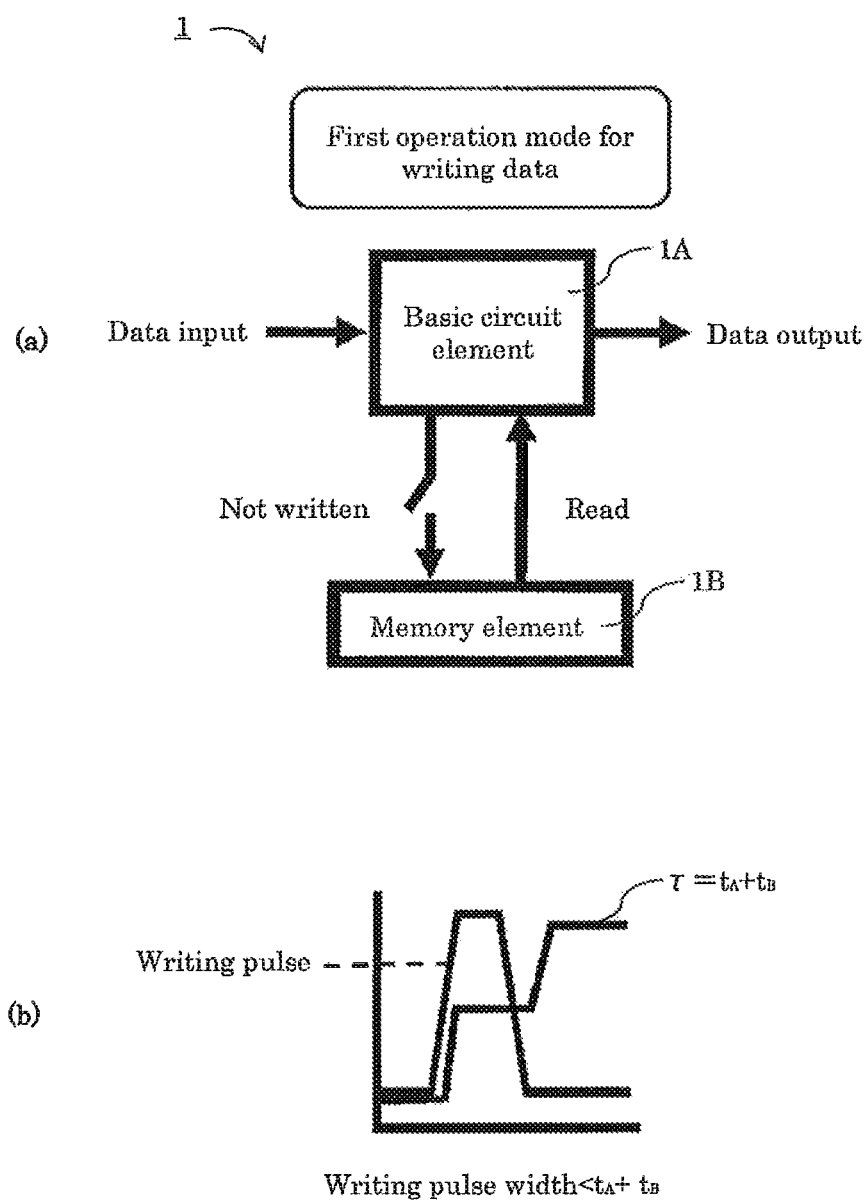
FIG. 1 is a diagram describing a first operation mode where memory access is performed in the basic circuit of the integrated circuit of the present invention, where (a) is a block diagram, and (b) is a time chart showing a write pulse compared to the switching timing of FIG. 9(c).
Figure 3:
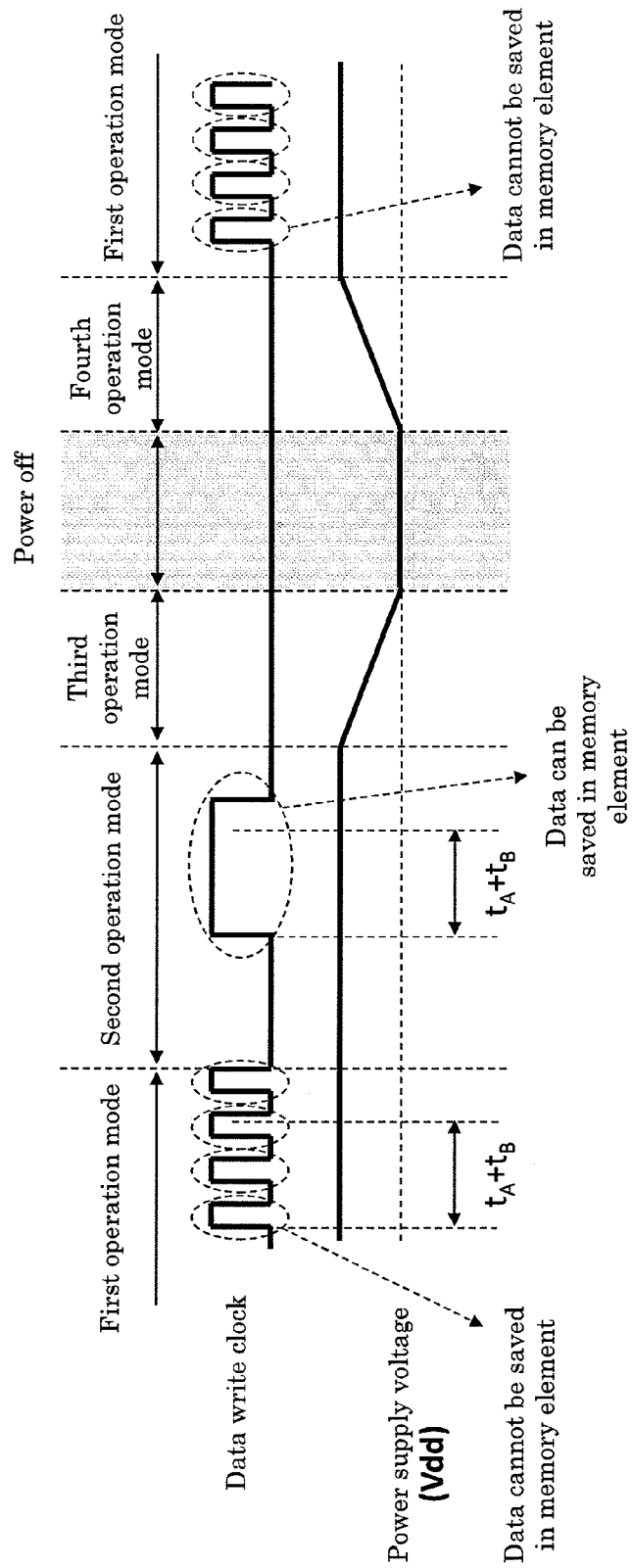
FIG. 3 is a time chart showing the first to the fourth modes of the integrated circuit of the present invention.

FIG. 1 is a diagram describing a first operation mode where memory access is performed in the basic circuit of the integrated circuit 1 of the present invention, where (a) is a block diagram, and (b) is a time chart showing a write pulse compared to the switching timing of FIG. 9(c). FIG. 2 is a diagram describing a second operation mode for turning off power in the basic circuit of the integrated circuit 1 of the present invention, where (a) is a block diagram, and (b) is a time chart showing a write pulse compared to the switching timing of FIG. 9(c). FIG. 3 is a time chart showing the first to the fourth modes of the integrated circuit 1 of the present invention.

As shown in FIG. 1, the integrated circuit 1 of the present invention includes: a basic circuit element 1A; and a memory element 1B capable of storing volatile data of the basic circuit element 1A. The basic circuit element 1A is a circuit for processing or retaining volatile data, and includes: logic circuits such as a latch circuit, D-latch circuit, flip-flop circuit (also called FF circuit), RS flip-flop circuit, JK flip-flop circuit, D flip-flop circuit, T flip-flop circuit, inverter, NAND, and NOR etc., integrated circuits such as static memory (hereinafter called SRAM) and field programmable gate array (FPGA), and integrated circuit systems including one or more of such integrated circuits. The present invention assumes that the integrated circuit system contains one or more integrated circuits having different functions.

As the memory element 1B, it may include: the magnetic tunnel junction (MTJ); the resistance random access memory (ReRAM); and the phase-change random access memory (PCRAM) etc.

Figure 4:
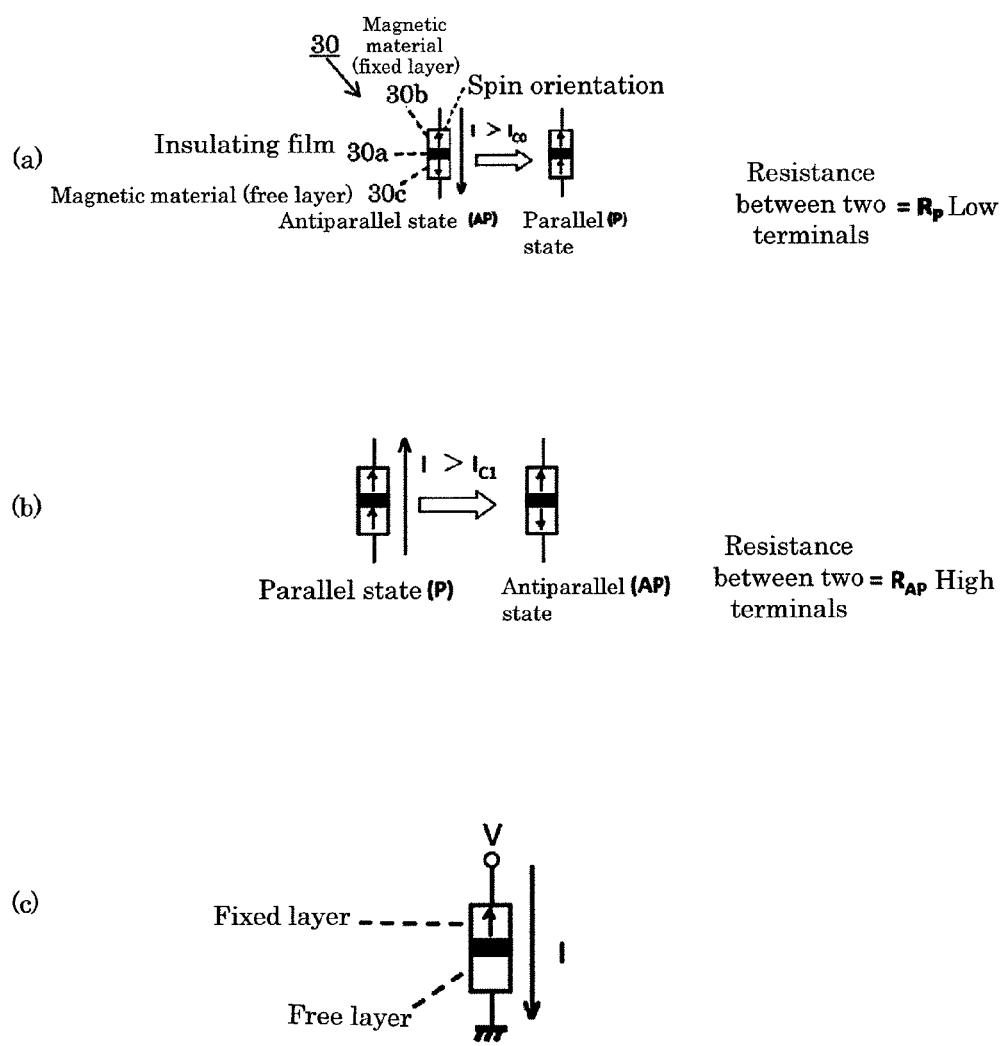
FIG. 4 is a chart showing the structure of an MTJ device, where (a) shows a case where the magnetization direction of a fixed layer and that of a free layer are in a parallel state in the MTJ device, (b) shows a case where they are in an antiparallel state in the MTJ device, and (c) is an equivalent circuit diagram.
Figure 5:
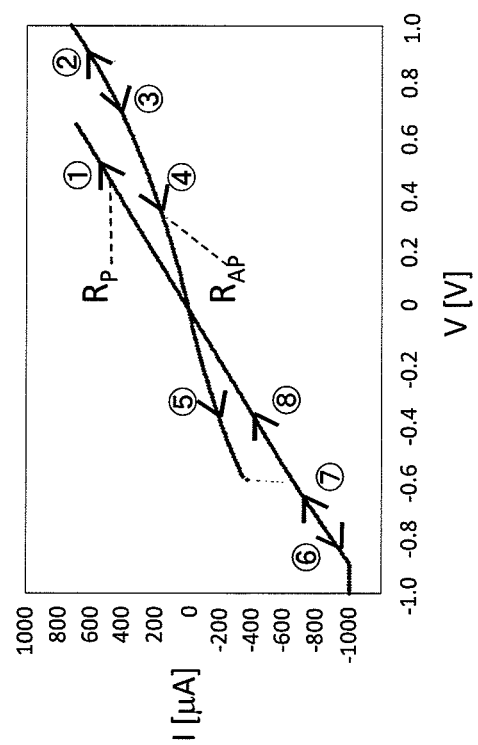
FIG. 5 is a chart showing IV characteristics showing the change in resistance of the MTJ device.

FIG. 4 is a chart showing the structure of an MTJ device 30, where (a) shows a case where the magnetization direction of a fixed layer 30b and that of a free layer 30c are in a parallel state in the MTJ device 30, (b) shows a case where they are in an antiparallel state in the MTJ device 30, and (c) is an equivalent circuit diagram. FIG. 5 is a chart showing current-voltage (IV) characteristics showing the change in resistance of the MTJ device.

As shown in FIGS. 4 (a) and (b), the MTJ device 30 includes: the ferromagnetic fixed layer 30b: and the ferromagnetic free layer 30c both of which are separated by a tunnel barrier layer 30a. The magnetization direction, namely the spin direction, of the fixed layer 30b is fixed to the direction shown by a downward arrow and this layer is also called the ferromagnetic fixed layer. The magnetization direction of the free layer 30c is not fixed, and this layer is also called the ferromagnetic free layer. The tunnel barrier layer 30a is formed with an MgO or $Al_2O_3$ thin film, and the fixed layer 30b and the free layer 30c are formed with one or more layers made of a ferromagnetic body such as iron (Fe) and cobalt (Co), or an alloy of such ferromagnetic bodies.

As shown in FIG. 4 (a), the state where the magnetization direction of the fixed layer 30b and that of the fixed layer 30c are identical is called the parallel state, where the resistance value of the MTJ device 30 becomes the minimum, which is represented as $R_p$ (See FIG. 5).

As shown in FIG. 4 (b), a state where the magnetization direction of the fixed layer 30b and that of the free layer 30c are in reverse is called the antiparallel state, where the resistance value of the MTJ device 30 becomes the maximum, which is represented as $R_{AP}$ (See FIG. 5). By controlling the magnetization state of the free layer 30c so that it becomes parallel or antiparallel with that of the fixed layer 30b, "0" or "1" can be recorded, or written. The method of changing the magnetization direction of the free layer 30c by feeding current to the MTJ device 30, which is called a spin-injection system or spin-injection magnetization reversal, does not require the external magnetic field for changing the magnetization direction of the free layer 30c.

Next, the ReRAM will be described.

FIGS. 6 and 7 are cross-sectional views showing the structure of a memory cell of the ReRAM.

As shown in FIG. 6 (a) and FIG. 7 (a), the memory cell 32 of the ReRAM includes: a lower electrode 32a; a metal oxide layer 32b; and an upper electrode 32c, which are deposited in these order.

In FIG. 6 (a), the perovskite-system composite oxide is used as the metal oxide layer 32b, and the current-voltage characteristics as shown in FIG. 6 (b) can be obtained.

In FIG. 7 (a), a binary-system oxide such as NiO, FeO, and $TiO_2$ is used as the metal oxide layer 32b, and the current-voltage characteristics as shown in FIG. 7 (b) can be obtained.

As shown in FIGS. 6 and 7, the ReRAM 32 uses a phenomenon that the resistance value of the metal oxide layer 32b changes when the voltage is applied between the lower electrode 32a and the upper electrode 32c. The high-resistance state and the low-resistance state of the metal oxide layer 32b of the ReRAM can be stored by relating them to "1" and "0".

Next, the phase-change random access memory (PCRAM) will be described.

FIG. 8 shows the structure of a memory cell 34 of the PCRAM, where (a) is a cross-sectional view and (b) shows current-voltage characteristics. As shown in FIG. 8 (a), the memory cell 34 of the PCRAM includes: a lower electrode 34a; a chalcogenide layer 34b; and an upper electrode 34c, which are deposited in these order. The material of the chalcogenide layer 34b is $Ge_2Sb_2Te_5$, for example.

As shown in FIG. 8 (b), the current-voltage characteristics of the memory cell 34 of the PCRAM changes depending on the state of the chalcogenide layer 34b. Specifically, the low-resistance state is maintained when the chalcogenide layer 34b is in a crystal state, whereas the high-resistance state is maintained when the chalcogenide layer 34b is in an amorphous state. The memory cell 34 of the PCRAM can store the high-resistance state and the low-resistance state of the above chalcogenide layer 34b by relating them to "1" and "0".

FIG. 9 is a chart describing memory element 1B, where (a) shows the relation between the applied voltage and the current, (b) is a chart showing the relation between the state parameter and the energy, and (c) is a time chart showing switching waveforms.

As shown in FIG. 9 (a), the resistance of the memory element 1B changes with the change in voltage, the state of resistance changing from high to low. For example, the high-resistance state can be stored as "1" and the low-resistance state as "0". In this case, the memory element generally has two states "0" and "1" where the energy is low, and due to the existence of the barrier having an energy E therebetween. The data can be retained stably. Since the rewriting data is defined as switching the state of the system to a reversed state by giving the system energy exceeding the barrier E, the switching time of $t_A+t_B$ is required as shown in FIG. 9 (c) from the time when the energy is started to be given until the state is switched. In this case $t_A$ is defined as an incubation time, and $t_B$ is defined as a transit time.

As shown in FIG. 1, the first operation mode of the integrated circuit 1 of the present invention shows a case where the write pulse width $\lambda_1/f_1$ is shorter than $\tau=t_A+t_B$ described in FIG. 9 (c) above. In the first operation mode, the information is written to the basic circuit element, but the data is not written into the memory element 1B because the switching duration is too short. The pulse width of the write pulse in the first operation mode is also called $\tau_1$.

As shown in FIG. 2, the second operation mode of the integrated circuit 1 of the present invention shows a case where the write pulse width $\lambda_2/f_2$ is longer than $\tau=t_A+t_B$ described in FIG. 9 (c) above. In the second operation mode, the data of the basic circuit element 1A having been written is now written into the memory element 1B. The write pulse width in the second operation mode is also called $\tau_2$.

In a third operation mode of the basic structure of the integrated circuit 1 of the present invention, the power applied to the integrated circuit is interrupted after the second mode. In this period, no special operation other than the power interruption is necessary.

In a fourth operation mode of the integrated circuit 1 of the present invention, the power is applied again. In this fourth operation mode, the data stored in the memory element 1B is written into the basic circuit element 1A of the integrated circuit 1, which allows the data before the power is turned off to be written into the basic circuit element 1A of the present invention again (restored).

From the above, with the integrated circuit 1 of the present invention, two operation modes can be achieved, namely, a first operation mode, wherein $\lambda_1/f_1$ is made to be shorter than $\tau=t_A+t_B$ ($0<\lambda_1\leq1$, $f_1$ is the operation frequency of the first operation mode), and a second operation mode, wherein $\lambda_2/f_2$ is made to be longer than $\tau=t_A+t_B$ ($0<\lambda_2\leq1$, $f_2$ is the operation frequency of the second operation mode), wherein $\tau$ is the write time into memory element 1B and the second operation mode occurs before the interruption of the power supply voltage to the integrated circuit 1.

Next, the combination of the above modes will be described.

FIGS. 10 to 14 are charts showing the sequence of the integrated circuit 1 of the present invention.

FIG. 10 is a chart showing a first sequence of the integrated circuit 1 of the preset invention. As shown in FIG. 10, in the first sequence, the mode changes as follows: the first operation mode, the second operation mode, the third operation mode, the power off, the fourth operation, and the first operation mode.

FIG. 11 is a chart showing a second sequence of the integrated circuit 1 of the present invention. As shown in FIG. 11, in the second sequence, the operation mode changes as follows: the first operation mode, the second operation mode, the third operation mode, the fourth operation mode, and the first operation mode.

FIG. 12 is a chart showing a third sequence of the integrated circuit 1 of the present invention. As shown in FIG. 12, in the second sequence, the operation mode changes as follows: the first operation mode, the second operation mode, and the first operation mode.

FIG. 13 is a chart showing a fourth sequence of the integrated circuit 1 of the present invention. As shown in FIG. 13, in the fourth sequence, the operation mode changes as follows: the first operation mode, the second operation mode, and the first operation mode. In this case, the second operation mode may be repeated two or more times.

FIG. 14 is a chart showing a fifth sequence of the integrated circuit 1 of the present invention. As shown in FIG. 14, in the fifth sequence, the operation mode changes as follows: the first operation mode, the second operation mode, the third operation mode, the power off, the fourth operation mode, the second operation mode, and the first operation mode.

As shown in above the first to the fifth sequences, when the data is written into the basic circuit element 1A and to the memory element 1B, the second operation mode is necessarily required before the third operation mode. Various other sequences are possible other than this sequence, but in such sequences also, the second operation mode is necessary before the third operation mode.

FIG. 15 is a chart showing the effect of the present invention, where (a) shows the relation between the switching time of the memory element 1B and current, and (b) shows the switching time and switching probability of the memory element 1B.

As shown in FIG. 15 (a), with the integrated circuit 1 of the present invention, it is only necessary that the memory element 1B performs switching only at very slow write time before the power interruption, and its operating point can be made to be B. Consequently, Vp to be applied to the memory element 1B is decreased to set $t_A$ to a large value, thus decreasing power consumption.

Furthermore, as shown in FIG. 15 (b), it is only necessary that the data is stored in the memory element 1B only at very slow write time before the power interruption, which eliminates decrease in switching probability. Meanwhile, since the integrated circuit using the memory element 1B of the prior art performs switching of the memory element 1B at the time of high-speed operation, its design point is the operating point A as shown in FIG. 15 (*a*), which consumes the large power, and also decreases the switching probability as shown by the operating point A in FIG. 15 (*b*).

FIG. 16 is a chart showing the power consumption of the integrated circuit, wherein (a) shows the integrated circuit 1 of the present invention, and (b) shows a nonvolatile latch circuit using a conventional STT-MTJ device.

As shown in FIG. 16 (*a*), with the integrated circuit 1 of the present invention, since the write into the memory element 1B is performed only once while the basic circuit element 1A is in operation, namely before the mode shifts from the operation mode to standby mode, the power consumption of the memory element 1B is extremely low. With the integrated circuit 1 of the present invention, since the power for write to allow standby power to become zero can be decreased to the utmost limit, the circuit has excellent features that the power consumption of the memory element 1B can be decreased and that the operation speed of the basic circuit element 1A can be increased at the same time.

Meanwhile, as shown in FIG. 16 (*b*), with the nonvolatile latch circuit using the STT-MTJ device of the prior art, since the data is written into the memory element 1B every time while the basic circuit element 1A is in operation, namely during operation, it is obvious that the power consumption of the memory element 1B is extremely high. With the nonvolatile latch circuit using the STT-MTJ device of the prior art, it is necessary to decrease the operation speed in order to decrease the power for write, which makes it difficult to achieve low power consumption of the memory element 1B and the high operation speed of the nonvolatile latch circuit, which is the basic circuit, at the same time.

Second Embodiment

Latch

Next, a latch will be described as a second embodiment.

Figure 17:
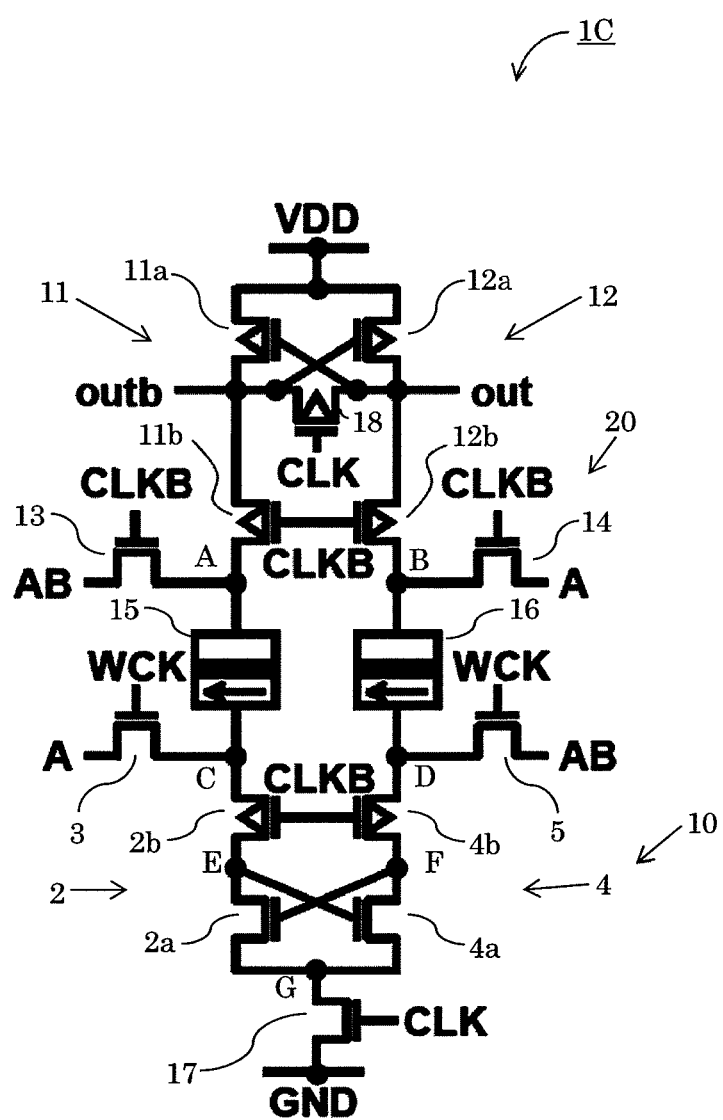
FIG. 17 is a circuit diagram showing the latch as the basic structure of the second embodiment of the integrated circuit of the present invention.
Figure 18:
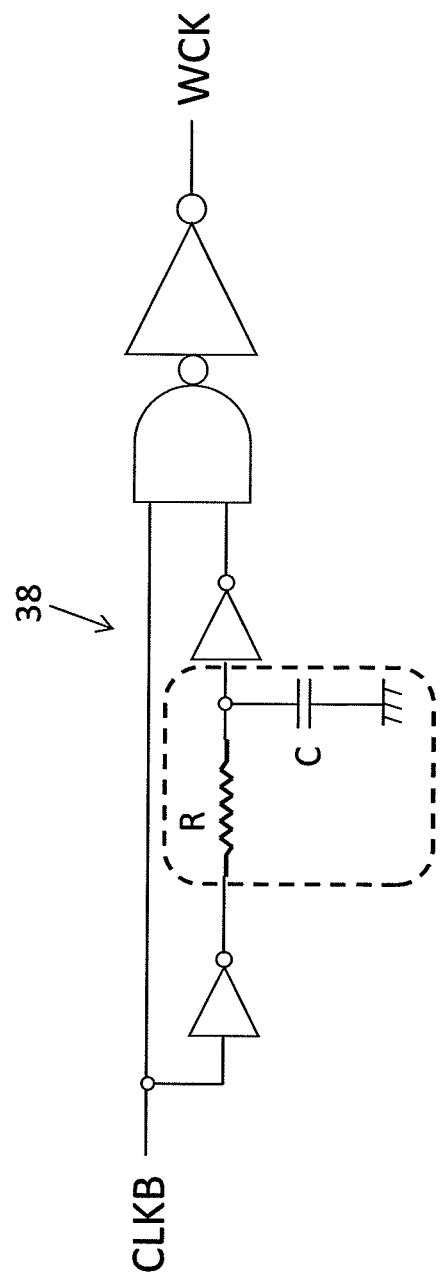
FIG. 18 is a diagram of a control circuit for generating input control signal WCK used in FIG. 17.

FIG. 17 is a circuit diagram showing a latch as the basic structure of the second embodiment of the integrated circuit 1C of the present invention. FIG. 18 is a diagram of a control circuit 38 for generating input control signal WCK used in FIG. 17.

As shown in FIG. 17, the integrated circuit 1C of the present invention includes: a first latch 10; the spin-injection-type MTJ devices 15, 16 connected to the first latch 10; and a second latch 20 connected to the spin-injection-type MTJ devices 15, 16. With the spin-injection-type MTJ devices 15, 16, the data is written at an operation frequency lower than that of the first latch 10 and/or the second latch 20. The first latch 10 is also called a lower latch, and the second latch 20 is also called an upper latch. In the following description, the spin-injection-type MTJ device is simply called an MTJ device.

The first latch 10 includes: a first circuit 2; a first n-type MOSFET 3 for transfer connected to the first circuit 2; a second circuit 4; and a second n-type MOSFET 5 for transfer connected to the second circuit 4. The first circuit 2 includes: a first n-type MOSFET 2*a* for driving; and a first p-type MOSFET 2*b*. The second circuit 4 includes: a second n-type MOSFET 4*a* for driving; and a second p-type MOSFET 4*b*.

The second latch 20 includes: a third circuit 11; a third n-type MOSFET 13 for transfer connected to the third circuit 11; a fourth circuit 12; and a fourth n-type MOSFET 14 for transfer connected to the fourth circuit 12. The third circuit 11 includes: a first p-type MOSFET 11*a* for driving; and a third p-type MOSFET 11*b*. The fourth circuit 12 includes: a second p-type MOSFET 12*a* for driving; and a fourth p-type MOSFET 12*b*.

An n-type MOSFET 17 is connected between the first latch 10 and the ground. The drain of the n-type MOSFET 17 is connected to the source of the n-type MOSFETs 2*a*, 4*b* for driving. The source of the n-type MOSFET 17 is connected to the ground. A CLK signal is applied to the gate of the n-type MOSFET 17.

A p-type MOSFET 18 is connected between the output terminal out and the output terminal outb of the second latch 20. The drain of the p-type MOSFET 18 is connected to the output terminal outb. The source of the p-type MOSFET 18 is connected to the output terminal out. The CLK signal is applied to the gate of the p-type MOSFET.

The first spin-injection-type MTJ device 15 is connected between the first p-type MOSFET 2*b* and the third p-type MOSFET 11*b*. The fixed layer, which is an end of the first spin-injection-type MTJ device 15, is connected to the drain of the first p-type MOSFET 2*b*. The free layer, which is the other end of the first spin-injection-type MTJ device 15, is connected to the source of the third p-type MOSFET 11*b*.

In the first spin-injection-type MTJ device 15, the layer between the fixed layer and the free layer is the tunnel barrier layer.

The second spin-injection-type MTJ device 16 is connected between the second p-type MOSFET 4*b* and the fourth p-type MOSFET 12*b*. The fixed layer, which is an end of the second spin-injection-type MTJ device 16, is connected to the drain of the fourth p-type MOSFET 12*b*. The free layer, which is the other end of the second spin-injection-type MTJ device 16, is connected to the source of the fourth p-type MOSFET 12*b*.

In the second spin-injection-type MTJ device 16, the layer between the fixed layer and the free layer is the tunnel barrier layer.

The drain of the first n-type MOSFET 2*a* for driving is connected to the gate of the second n-type MOSFET 4*b* for driving, which is an input terminal. The drain of the second n-type MOSFET 4*a* for driving is connected to the gate of the first n-type MOSFET 2*a* for driving, which is an input terminal. The connection between the drain and the gate of these first n-type MOSFETs 2*a*, 4*a* for driving is called cross-over or cross-coupled wiring.

The first circuit 2 and the second circuit 4 having the above structure form a so-called volatile latch circuit.

An in signal is applied to the output terminal of the first circuit 2 via the first n-type MOSFET 3 for transfer. An inb signal is applied to the output terminal of the second circuit 4 via the second n-type MOSFET 5 for transfer.

A WCK signal is applied to the gate of the first n-type MOSFET 3 for transfer, and an A signal is input to the source. The WCK signal is applied to the gate of the second n-type MOSFET 5 for transfer, and an AB signal is input to the source. A CLKB signal is applied to the gate of the third n-type MOSFET 13 for transfer, and the AB signal is input to the source. The CLKB signal is applied to the gate of the fourth n-type MOSFET 13 for transfer, and the A signal is input to the source.

(Operation of the Integrated Circuit)

First, the operation of integrated circuit 1C shown in FIGS. 17 and 18 will be described in detail.

Figure 19:
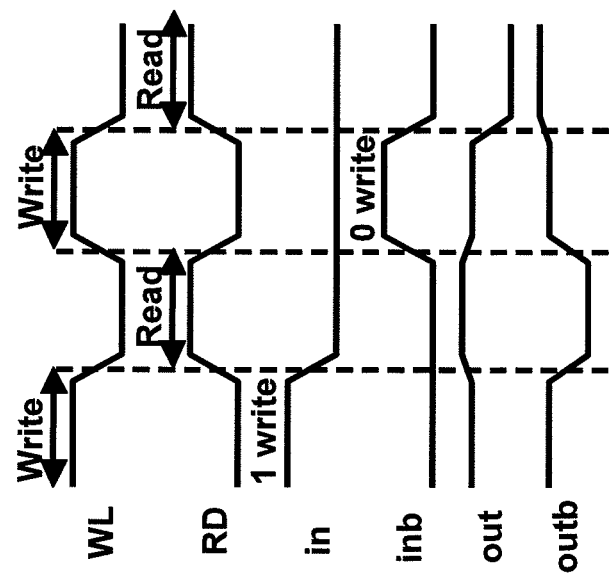
FIG. 19 is a time chart describing the operation of the integrated circuit of the present invention.
Figure 20B:
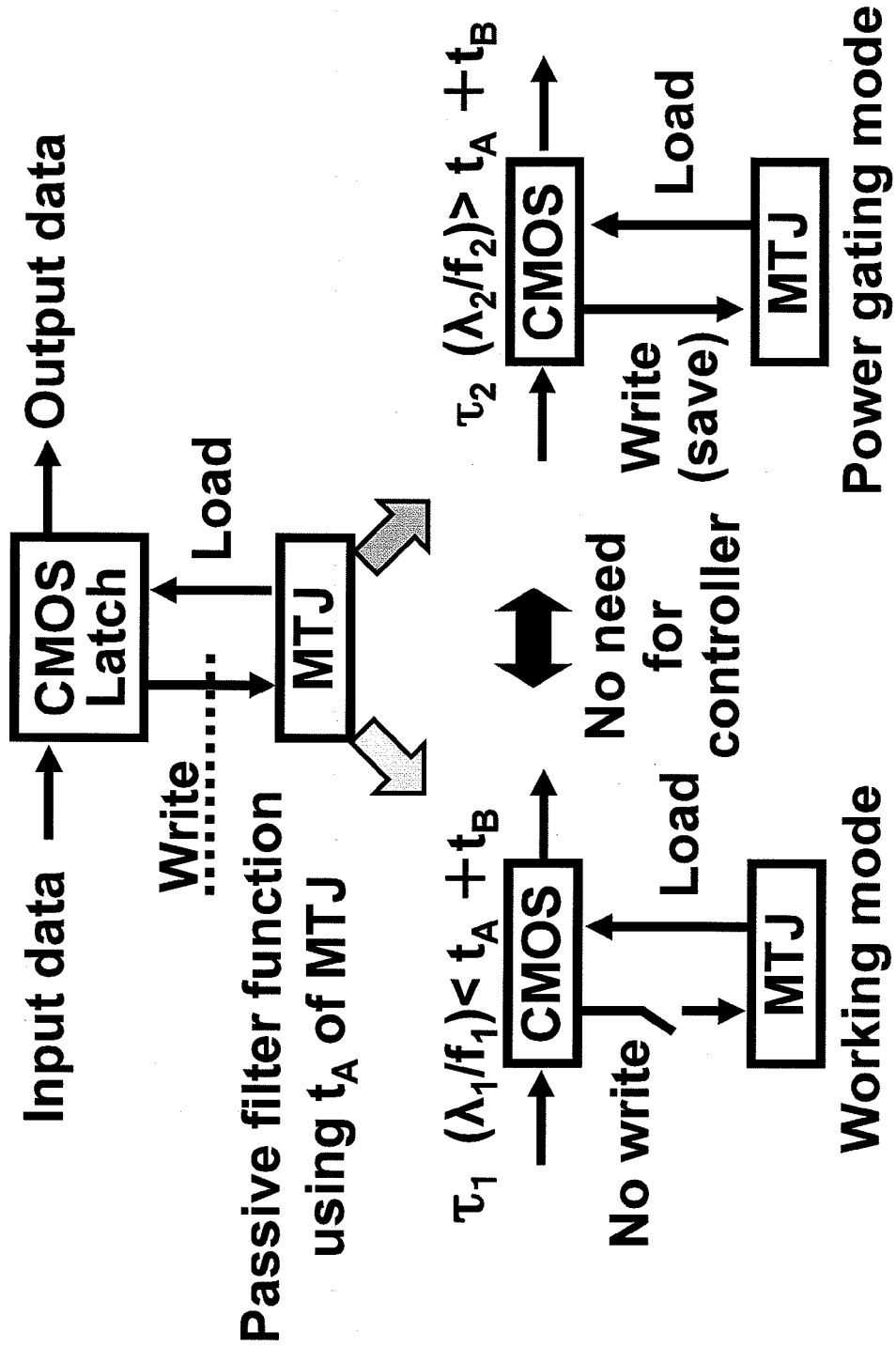
FIG. 20B is a chart describing the relation among the sum of incubation time and transit time $t_A+t_B$, pulse width $\tau_1$ of the write pulse in the first operation mode, and the pulse width $\tau_2$ of the write pulse in the second operation mode in FIG. 20A.
Figure 21:
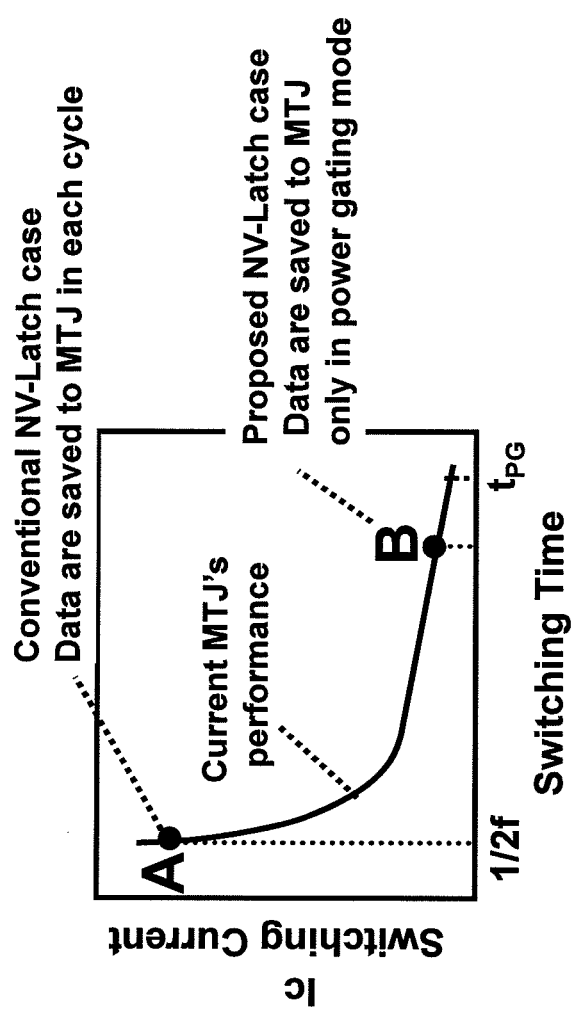
FIG. 21 is a chart schematically showing the relation between the operating point and current of the integrated circuit of the present invention.
Figure 22A:
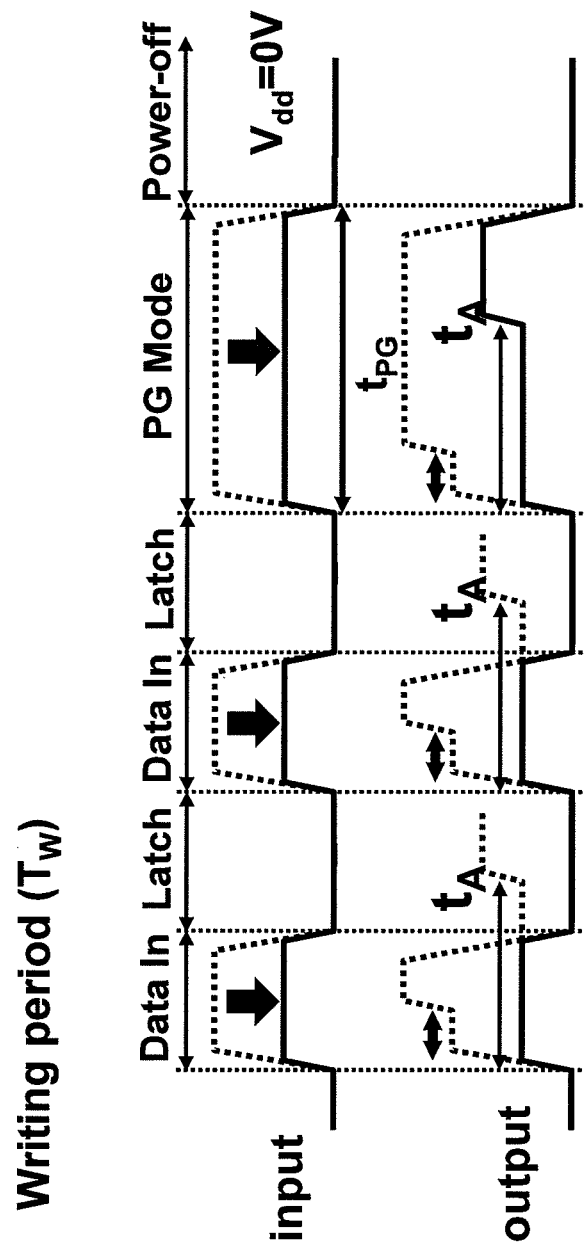
FIG. 22A is a time chart showing the operation mode of the integrated circuit of the present invention.

FIG. 19 is a time chart describing the operation of the integrated circuit 1C of the present invention. FIGS. 20A and 20B are charts schematically showing the operation of the integrated circuit 1C of the present invention. FIG. 21 is a chart schematically showing the relation between the operating point and current of the integrated circuit 1C of the present invention. FIG. 22A is a time chart showing the operation mode of the integrated circuit 1C of the present invention (See Non-Patent Literature 1). FIG. 22B is a chart describing the relation among the sum of the incubation time and the transit time ($t_A+t_B$), the pulse width $\tau_1$ of the write pulse in the first operation mode, and the pulse width $\tau_2$ of the write pulse in the second operation mode in FIG. 22A.

First, the case where the RD signal is used instead of the CLK signal, the WL signal is used instead of the CLKB and WCK signals, the in signal is used instead of the A signal, and the inb signal is used instead of the AB signal will be described.

(1) High frequency (write and read operations where the write time is shorter than the sum of the incubation time and the transit time of MTJ devices 15, 16 (during the first operation mode))

Figure 23:
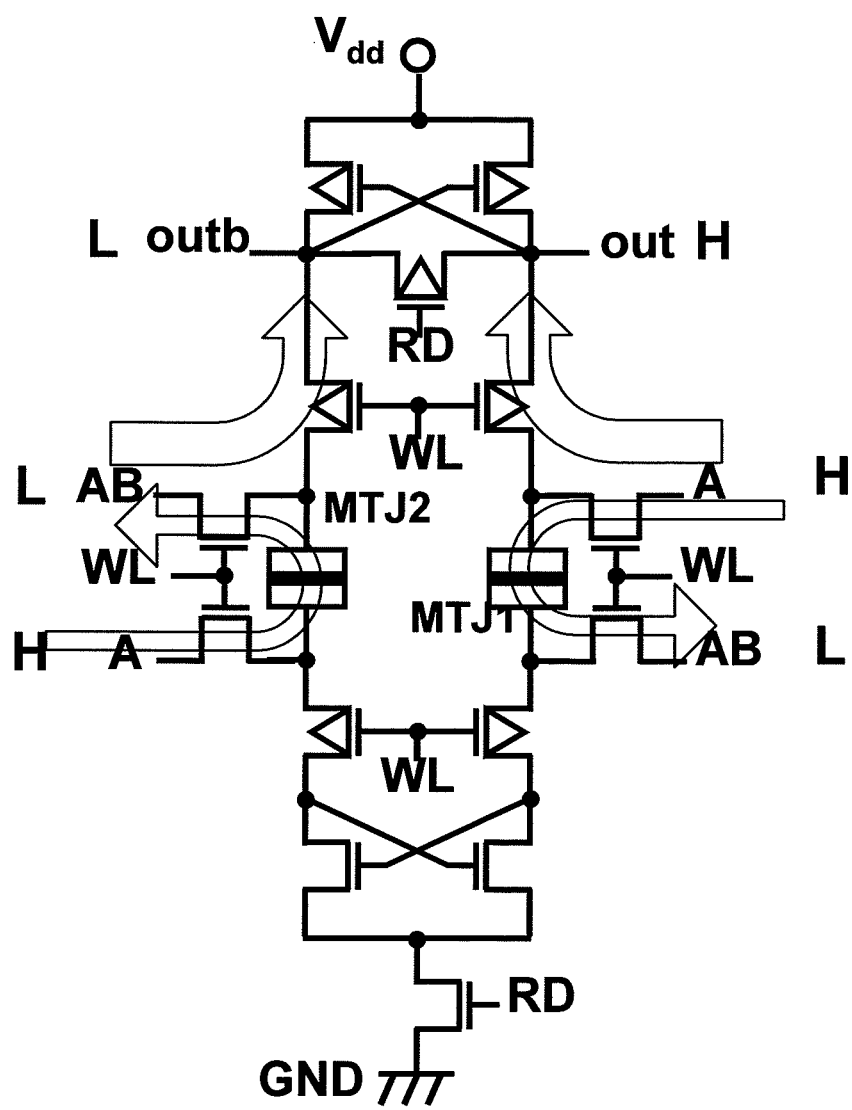
FIG. 23 is a circuit diagram describing the high-frequency operation of a semiconductor memory device of the present invention.

FIG. 23 is a circuit diagram describing the high-frequency operation of the semiconductor memory device 1 of the present invention. In the circuit diagram in FIG. 17, in the period where the WL is in high level and the RD is in low level, namely in the write period as shown in FIG. 19, four n-type MOSFETs 3, 5, 13, 15 are kept on, while four p-type MOSFETs 2b, 4b, 11b, 12b are kept off. At the same time, the p-type MOSFET 18 is turned on, thus setting the potential of out and that of outb of the node pair within the upper latch 20 to be equal, and the n-type MOSFET 17 is kept off, thus allowing the lower latch 10 to be in a non-active state.

In this state, the data inputs from in and inb are input into the MTJ device pair 15, 16. However, since the writing period is shorter than the sum of the incubation time ($t_A$) and the transit time ($t_B$), i.e. $t_A+t_B$, the data is not written into the MTJ devices 15, 16. Furthermore, since the p-type MOSFETs 2b, 4b, 11b, 12b are kept off as described above, the inputs data are not input into the two latches 10, 20 in the upper and the lower stages.

In the circuit diagram in FIG. 17, during the period where the WL is in the low level while the RD is in the high level, namely during the Read period in FIG. 19, the four n-type MOSFETs 3, 5, 13, 15 are turned off, and at the same time four p-type MOSFETs 2b, 4b, 11b, 12b are turned on. At the same time, since the p-type MOSFET 18 is turned off, the node pair out, outb of the upper latch 20 is separated. Consequently, the charge accumulated in the parasitic capacitances of the node A and the node B transfers to out and outb, and as a result, the minute data pair having the same polarity as that of in and inb appear to out and outb, and are amplified.

Meanwhile, the charge accumulated in the node C and the node D also transfers to the node pair E and F within the lower latch 10 via the p-type MOSFET 2b and the p-type MOSFET 4b, which generates minute potential difference between the node E and the node F, thus allowing the n-type MOSFET 17 to be turned on and the minute potential difference to be amplified. The amplification direction is opposite to the amplification direction of the upper latch 20. However, since the amplification of the upper latch 20 is performed slightly earlier, the direction of the upper latch 20 reverses the direction of the lower latch 10, eventually resulting in the polarity determined by the upper latch 20. Consequently, the polarity of the output data of out and outb becomes the same as the polarity of the input data of in and inb.

As a result, the complementary data pair input into in and inb in the Write cycle is output to out and outb in the same polarity in the next Read cycle. Since the write time in this case is shorter than the sum of the incubation time and the transit time ($t_A+t_B$), data is not written into the MTJ device pair 15, 16.

(2) Low Frequency (Write Operation where the Write Time is Longer than the Sum of the Incubation Time and the Transit Time of the MTJ Device (During the Second Operation Mode))

This is the case where the Write period is longer than $t_A+t_B$ in FIG. 19. The operation in this case is the same as the above, except that data is written in to MTJ devices 15, 16 in the second operation mode although the data is not rewritten into MTJ devices 15, 16 in the first operation mode described above. Specifically, when the second operation mode is executed while in=the high level and inb=the low level are maintained, the data is written into the right MTJ device 16 in FIG. 19 in parallel state (low resistance state) and into the left MTJ device 15 in the non-parallel state (the high resistance state) respectively.

Figure 24:
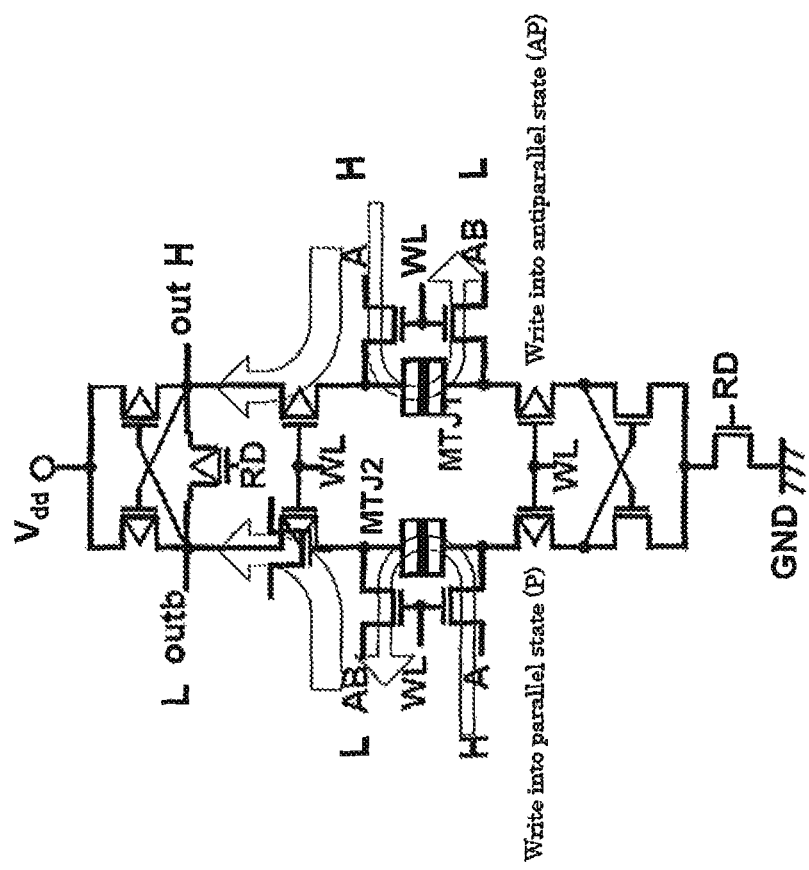
FIG. 24 is a circuit diagram describing data saving operation immediately before $V_{dd}$ of the semiconductor memory device 1 of the present invention is interrupted.

FIG. 24 is a circuit diagram describing the data saving operation immediately before $V_{dd}$ of the semiconductor memory device 1 of the present invention is interrupted. As shown in FIG. 24, the input data is written into the MTJ devices 15, 16.

(3) Power Off Operation (During the Third Operation Mode)

In this period, no other special operations are necessary except for turning off the power.

(4) Loading Data to the CMOS Latch Circuit from the MTJ Device Pair 15, 16 at the Time of Power on (During the Fourth Operation Mode)

Figure 25:
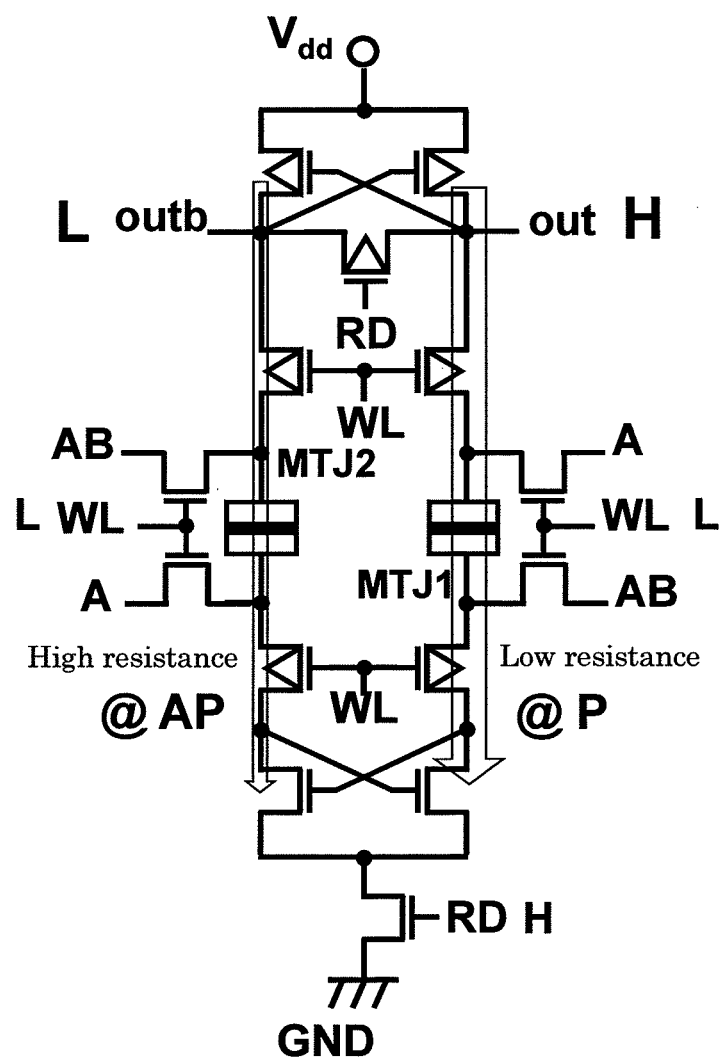
FIG. 25 is a circuit diagram describing the power on operation of the semiconductor memory device of the present invention.

FIG. 25 is a circuit diagram describing the power on operation of the semiconductor memory device 11 of the present invention.

During this period, the power shall be turned on in the Read mode shown in FIG. 19. In other words, the power shall be turned on while the RD is maintained at high level, and the WL at low level. In this case, the p-type MOSFET 18 is kept off, the n-type MOSFET 17 is kept on, p-type MOSFETs 2b, 4b, 11b, 12b are set to on, and n-type MOSFETs 3, 5, 13, 15 are set to off, meaning that the data from input terminals in and inb is interrupted, and that the power to the two latches 10, 20 in the lower and upper stages is gradually turned on in the active state.

By the way, the data in one of the MTJ device pair 15, 16 is stored in high-resistance state and the data in the other of the pair is stored in low-resistance state. Consequently, in the process of turning on the power, the current fed to the current paths penetrating the left and the right MTJ devices 15, 16 differs depending on the unbalance between these resistance values, with the output node corresponding to the path to which more current is fed having higher potential than the other output node.

Consequently, out and outb are amplified in the direction maintained before the power is interrupted. For example, assuming that data is written into the MTJ devices 15, 16 with in=the high level and inb=the low level before the power is interrupted, the MTJ device 16 on the right side in FIG. 24 shifts to the parallel state (the low resistance state) while the MTJ device 15 on the left side shifts to the non-parallel state (the high resistance state), and then the power is turned off.

In the subsequent fourth operation mode, as described above, more current is fed to the right current path than the left current path in FIG. 25, causing the potential of out to become higher than that of outb, and the power is turned on with the out maintained at the high level and the outb maintained at the low level, meaning that the polarity of data in this state is identical to the write state before the power is turned off.

As shown in FIG. 22A, with the integrated circuit 1C of the present invention, two operations can be achieved, namely $t_A+t_B$ can be made to be longer than $(\lambda_1/f_1)$, and $t_A+t_B$ can also be made to be shorter than the storage time $(\lambda_2/f_2)$ in PG mode.

Next, the operation of the integrated circuit 1C will be described.

The transistors constituting the integrated circuit 1C in FIG. 17 and the semiconductor memory device 850 in FIG. 135 are the same, but signals to be applied to the MOSFETs are different as shown below.

To the gate of MOSFET 17, the CLK signal is applied instead of the RD signal. To the gate of p-type MOSFETs 2b, 4b of the inverter, the CLKB signal is applied instead of the WL signal. To the gate of MOSFET 3 on the left side, the WCK signal is applied instead of the WL signal, and to the source, the A signal is applied instead of the in signal. To the gate of MOSFET 5 on the right side, the WCK signal is applied instead of the WL signal, and to the source, the AB signal is applied instead of the in signal. To the gate of MOSFET 13 on the left side, the CLKB signal is applied instead of the WL signal, and to the source, the AB signal is applied instead of the inb signal. To the gate of MOSFET 14 on the right side, the CLKB signal is applied instead of the WL signal, and to the source, the A signal is applied instead of the in signal. To p-type MOSFET 18 of the upper latch 20, the CLK signal is applied instead of the RD signal.

FIG. 26 shows the simulation of the integrated circuit 1C as shown in FIG. 17, wherein (a) shows input waveforms, and (b) shows the resistance of the MTJ devices obtained by the simulation.

In the control circuit 38 shown in FIG. 18, when the WCKB is maintained at high level for longer than the time constant of the resistance R and capacitor C enclosed by the dotted line, namely RC, the WCK is started to rise and the operation is performed that MTJ devices 15, 16 are rewritten by flowing current to the MTJ devices 15, 16.

The integrated circuit 1C in FIG. 17 is the same as the semiconductor memory device 850 in FIG. 135 as an equivalent circuit, but as a result of inserting the control circuit 38, the operation of the signal WCK for controlling the data input is different from that of the WL in FIG. 19. Since the through-current is prevented to flow from being fed to the MTJ devices 15, 16 during the high-speed operation, the power consumption is lower than that of the semiconductor memory device 850 in FIG. 135.

(Features of the Latch of the Present Invention)

With the integrated circuit 1C of the present invention, in order to increase the operation frequency (f) of the upper and lower latches 10, 20 to 100 MHz or higher, for example, a new structure is adopted, wherein the switching incubation time of the MTJ devices 15, 16 is used, and thus the low-pass filter function is provided between the CMOS integrated circuit 1C and the MTJ devices 15, 16 in a natural manner. As shown in FIG. 20A, with the integrated circuit 1C, the input data is latched to the CMOS integrated circuit during operation, and the latched data is written into the MTJ devices 15, 16 in the PG mode. This integrated circuit 1C does not require a switching control circuit between the two modes. FIG. 20B is a chart describing the relation among the sum of the incubation time and the transit time $(t_A+t_B)$, the pulse width $\tau_1$ of the write pulse in the first operation mode, and the pulse width $\tau_2$ of the write pulse in the second operation mode. The write pulse width $\tau_1$ in the first operation mode is shorter than the sum of the incubation time and the transit time $(t_A+t_B)$. The write pulse width $\tau_2$ in the second operation mode is longer than the sum of the incubation time and the transit time $(t_A+t_B)$.

Furthermore, as shown in FIG. 22B, the pulse width $\tau_1$ of the write pulse in the first operation mode is shorter than the sum of the incubation time and the transit time $(t_A+t_B)$, namely $\tau_1<(t_A+t_B)$. The pulse width $\tau_2$ of the write pulse in the second operation mode is longer than the sum of the incubation time and the transit time $(t_A+t_B)$, namely $\tau_2>(t_A+t_B)$.

When the write time $\tau_2$ is longer than the sum of the incubation time and the transit time $(t_A+t_B)$, the data is written into the MTJ devices. Reversely, when the write time $\tau_1$ is shorter than the sum of the incubation time and the transit time $(t_A+t_B)$, the data is not written into the MTJ devices.

The present inventors et al. found that the transit time of the p-MTJ devices 15, 16 performing the perpendicular magnetic recording is longer than that of i-MTJ devices 15, 16 performing the horizontal magnetic recording. Similar to the CMOS integrated circuit, the semiconductor memory device 1 of the present invention operates at high speed without overhead of the operating power, and the switching error of MTJ devices 15, 16 can be ignored.

The integrated circuit 1C of the present invention has the excellent characteristics as described below, compared to the circuit in the conventional example 1 (See FIG. 132) and the conventional example 2 (See FIG. 134).

(1) It is operated at the same operation frequency as a CMOS integrated circuit without being limited by the switching speed of the MTJ devices 15, 16.
(2) It is possible to switch modes at high speed by decreasing the turn-on time (wake-up time) for starting the circuit and the time to turn off the power supply (power-off time).
(3) The power consumption is low. This is because that the data is not written into MTJ devices 15, 16 at high speed in the operation synchronized with input data in operation mode (working mode).
(4) Since data is written into MTJ devices 15, 16 at low speed before the power is interrupted, the switching error of the JTJ devices 15, 16 can be suppressed significantly.
(5) By using the incubation time $(t_A)$ and the transit time $(t_B)$ of the MTJ devices 15, 16, the simple circuit can be achieved without controlling switching between the working mode and the mode of writing data into the MTJ devices 15, 16 before the power is interrupted.

Table 1 summarizes the above features. Table 1 represents the best state of items such as operation frequency etc. as 1, and semi-quantitative values in other states are shown as enclosed in the parentheses.

TABLE 1

|  | Present invention | Conventional Example 1 | Conventional Example 2 |
|---|---|---|---|
| Operation frequency | Good (~1.2) | No good (~10) | Good (1) |
| Wake-up time/ Power-off time | Good (1) | No good (~100) | No good (10~100) |
| Power consumption | Good (1) | No good (~5) | No good (~1.5) |
| MTJ switching error | Good (1) | No good (10~100) | Good (1) |
| Ease of design (low cost) | Good (1) | Good (1) | Difficult (~2) |

According to the integrated circuit 1C of the present invention, the so-called MTJ/CMOS hybrid integrated circuit, which operates at high speed, consumes low power, and causes negligible errors, can be achieved at low cost.

(Manufacturing Method)

Next, the manufacturing method of the integrated circuit 1C of the present invention will be described.

First, the circuits other than the MTJ devices 15, 16 of the integrated circuit 1C are formed on a substrate made of a semiconductor such as Si etc. by the CMOS process, and then the spin-injection-type MTJ devices 15, 16 are formed.

In particular, the spin-injection-type MTJ devices 15, 16 are formed as described below.

After the latch circuits etc. are formed by the CMOS process, the node C and node D of the latch circuit are exposed, and on the electrode of the node C and that of node D, fixed layers, the tunnel barrier layers, and free layers of the MTJ devices 15, 16 are formed sequentially. The uppermost layers of the MTJ devices 15, 16 are the free layer. The free layer may be formed by depositing a plurality of ferromagnetic layers.

Next, an interconnection insulating layer is deposited on the entire surface of the substrate, and holes are formed on the free layer of the MTJ devices 15, 16 and the node A and the node B of the semiconductor memory device 1 by a photolithography and an etching of interconnection insulation layer.

Then, a metal film of a specified thickness is deposited on the interconnection insulation layer by the sputtering method, etc., and materials other than the metal film that connects the free layer of the MTJ devices 15, 16 and the node A and the node B of the semiconductor memory device 1 are removed by the selective etching. In this process, the MTJ devices 15, 16 are connected to the node A and the node B of the integrated circuit 1C.

The manufacturing method of the integrated circuit 1C corresponding to the memory cell 1 in FIG. 17 is similar to the above method, and the circuit can be achieved by allowing the uppermost layer of the MTJ devices 15, 16 to be a fixed layer, or when the uppermost layer of the MTJ devices 15, 16 is a free layer, by supplying power line $V_{dd}$ to the electrode (fixed layer) on the bottom side of the MTJ devices using the bottom wiring.

Lastly, a protective film (passivation) is formed.

To deposit each material described above, normal thin film deposition methods such as the evaporation method, the MBE method, and the laser abrasion method can be used in addition to the sputtering and CVD methods. To the masking process for forming electrodes in a specified shape and the wiring of integrated circuit, the optical exposure and the EB exposure can be used.

Next, the MTJ devices used for the integrated circuit 1C will be described.

Since the write current of the MTJ devices 6, 8 can be decreased with the downsizing of the devices, the MTJ devices have an advantage that they can be formed on the same substrate of the CMOS integrated circuit formed on the Si substrate etc.

(Switching Speed of STT-MTJ Device)

An example where time-resolved switching characteristics of an i-MTJ device (in-plain magnetization-type MTJ device) and a p-MTJ device (perpendicular magnetization-type MTJ device) were measured will be described (See Non-Patent Literature 2).

Figure 27:
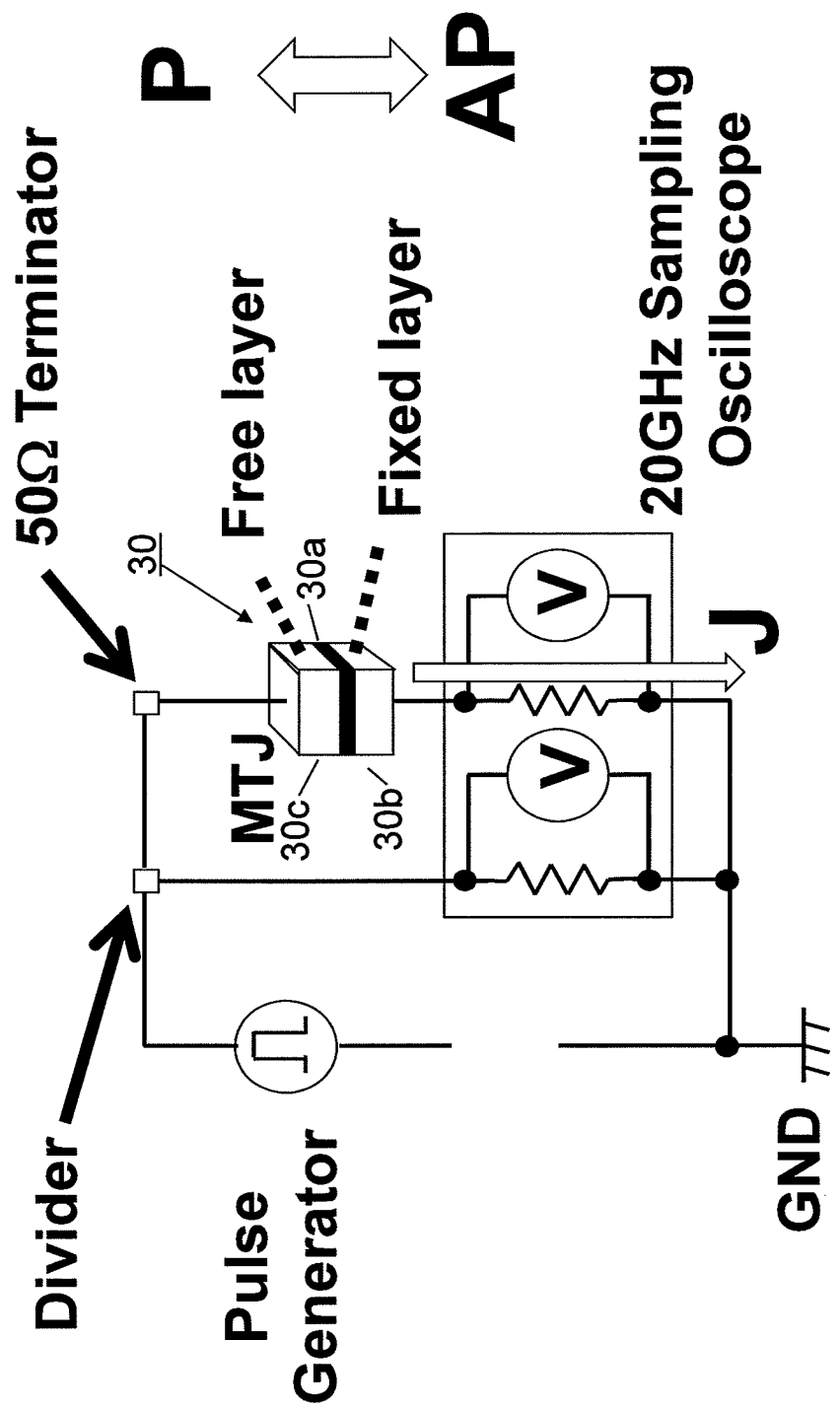
FIG. 27 is a circuit diagram for measuring switching time of the i-MTJ device and p-MTJ device.

FIG. 27 is a circuit diagram for measuring switching time of the i-MTJ device and the p-MTJ device. To measure the switching time, the 20-GHz sampling oscilloscope was used. In this case, in order to switch the MTJ device 15 from the non-parallel to the parallel state, a positive voltage pulse is applied to the free layer, and to switch the MTJ device 15 reversely, a negative voltage pulse is applied.

FIG. 28 shows the switching characteristics of the MTJ device 15, wherein (a) shows the p-MTJ device, and (b) shows the i-MTJ device.

As shown in FIGS. 28 (a) and (b), the attention was paid to the incubation time ($t_A$) and the transit time ($t_B$). The incubation time ($t_A$) is defined as a period from startup of a pulse to the start of switching. The transit time ($t_B$) is defined as a period from the start to the end of switching.

FIG. 29 shows the dependency on write voltage Vp of switching characteristics of the MTJ device 15, wherein (a) shows the incubation time ($t_A$), and (b) shows the transit time ($t_B$).

As shown in FIGS. 29 (a) and (b), $t_A$ of the p-MTJ can be made to be shorter than 1 ns for the write voltage (Vp) exceeding 0.9 V, and over the entire Vp, it is shorter than that of i-MTJ device by at least two orders. However, $t_B$ of the p-MTJ device remains constant at approximately 10 ns, and does not decrease even if Vp increases. Meanwhile, $t_B$ of the i-MTJ remains constant at approximately 1 ns.

As described above, this 100-nm MTJ device 15 cannot be shorter than 10 ns, which is the $t_B$ of the p-MTJ device. This means that the operation frequency of the MTJ device 15 is limited to 100 MHz.

Modification Example 1 of the Second Embodiment

Figure 30:
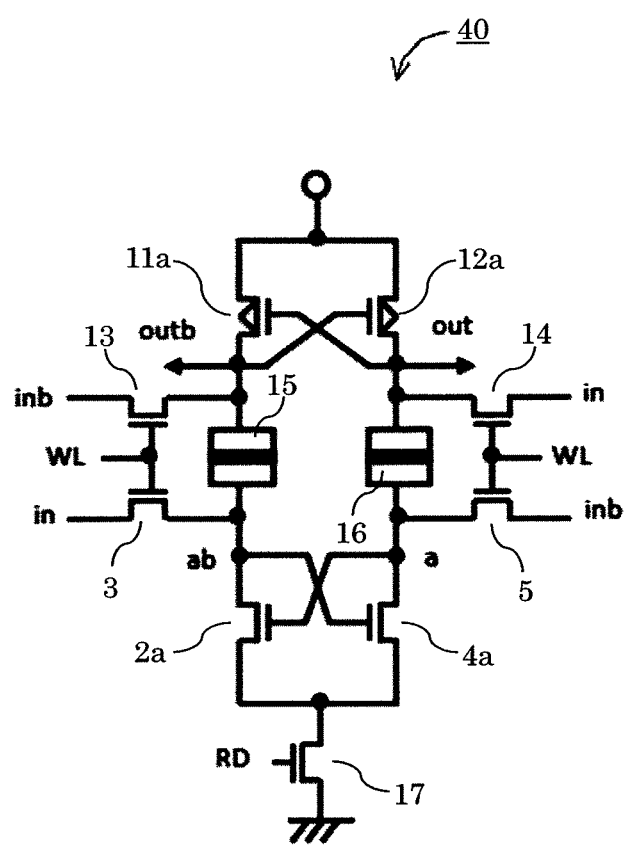
FIG. 30 is a circuit diagram of integrated circuit of the modification example 1 of the second embodiment of the present invention.

FIG. 30 is a circuit diagram of an integrated circuit 40 of the modification example 1 of the second embodiment of the present invention.

As shown in the figure, the integrated circuit 40 according to the modification example 1 of the second embodiment has a structure where the p-type MOSFETs 2b, 4b connected to the MTJ devices 15, 16 within the first latch 10 and the p-type MOSFET 11b, 12b connected to the MTJ devices 15, 16 within the second latch 20 in the integrated circuit 1 of FIG. 1 are omitted. Since other structures are the same with the integrated circuit 1 in FIG. 1, the description will be omitted. The integrated circuit 40 according to the second embodiment is operated at the lower power consumption because the quantity of the p-type MOSFETs is smaller by four pieces and thus the number of devices is lower.

As signals to be applied to the integrated circuit, the RD signal is used instead of the CLK signal, the WL signal is used instead of CLKB and WCK signals, the in signal is used instead of the A signal, and the inb signal is used instead of the AB signal, unlike the case as shown in FIG. 17.

Modification Example 2 of the Second Embodiment

Figure 31:
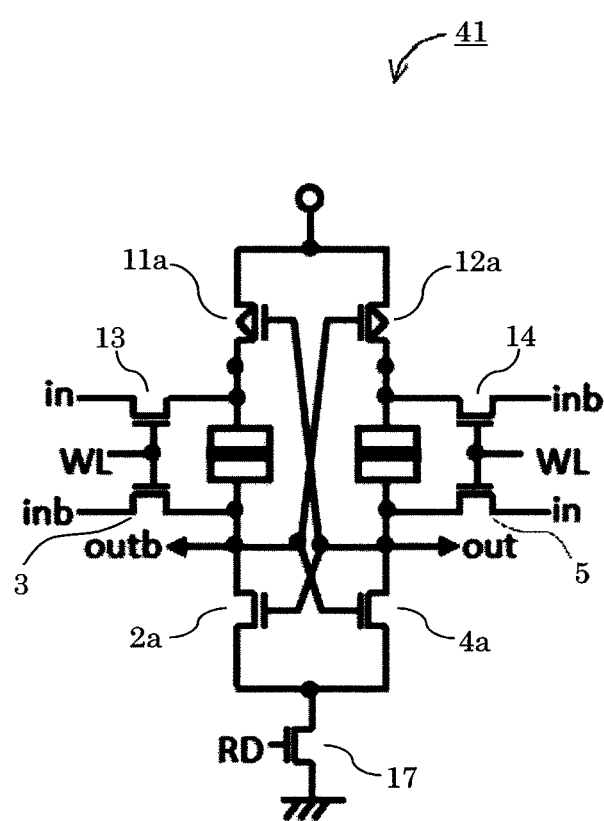
FIG. 31 is a circuit diagram of the modification example 2 of the integrated circuit according to the second embodiment of the present invention.

FIG. 31 is a circuit diagram of the modification example 2 of the integrated circuit according to the second embodiment of the present invention. As shown in FIG. 31, with an integrated circuit 41 according to modification example 2 of the second embodiment of the present invention, the connection of the gate of the upper latch 20 is different from that of the integrated circuit 40 in FIG. 30. Specifically, the gate of the left p-type MOSFET 11a within the second latch 20 is connected to the gate of the left n-type MOSFET 2a within the first latch 10. The gate of the right p-type MOSFET 12a within the second latch 20 is connected to the gate of the right n-type MOSFET 4a within the first latch 10.

Furthermore, with these changes, the input terminal pair in, inb is switched, and the output terminal pair out, outb is changed from the output terminal pair of the first latch 10 to that of the second latch 20. According to this embodiment, the state of the first latch 10 and that of the second latch 20 are not interfered with each other, and thus the integrated circuit 41 where input signals are stably amplified can be provided.

Modification Example 3 of the Second Embodiment

Figure 32:
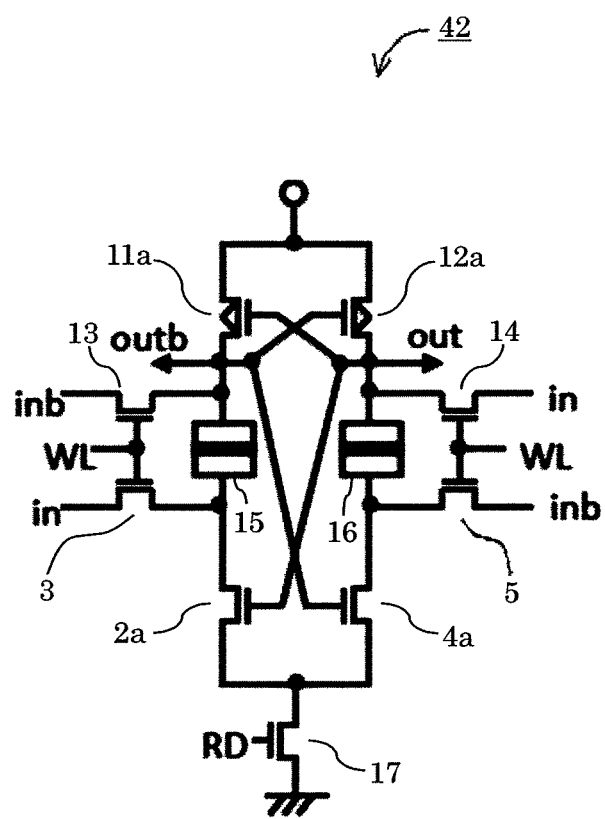
FIG. 32 is a circuit diagram of the modification example 3 of the integrated circuit according to the second embodiment of the present invention.

FIG. 32 is a circuit diagram of the modification example 3 of the integrated circuit according to the second embodiment of the present invention. With an integrated circuit 42 according to the modification example 3 of the second embodiment of the present invention, the connection of the gate of the upper latch 20 and the lower latch 10 is different from that of the integrated circuit 40 in FIG. 30. Specifically, the gate of the left n-type MOSFET 11a within the second latch 20 is connected to the gate of the left p-type MOSFET 2a within the first latch 10. The gate of the right n-type MOSFET 12a within the second latch 20 is connected to the gate of the right p-type MOSFET 4a within the first latch 10. Furthermore, the connection of the drain and gate of the lower latch 10 is not configured as the cross coupling type. The effect according to this embodiment is as same as the integrated circuit 41 in FIG. 24.

Modification Example 4 of the Second Embodiment

Figure 33:
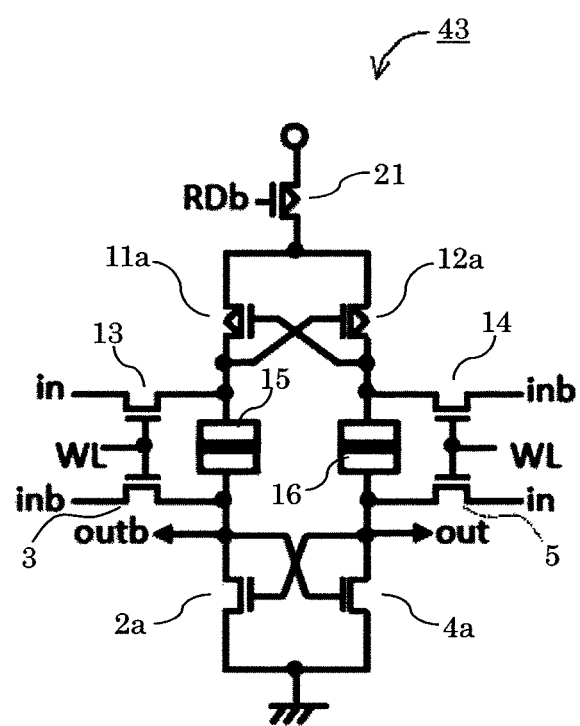
FIG. 33 is a circuit diagram of the modification example 4 of the integrated circuit according to the second embodiment of the present invention.

FIG. 33 is a circuit diagram of the modification example 4 of the integrated circuit according to the second embodiment of the present invention. With an integrated circuit 43 according to the modification example 4 in comparison with the integrated circuit 40 in FIG. 30, the n-type MOSFET 17 of the integrated circuit 40 in FIG. 30 is replaced by the p-type MOSFET 21 which is connected to the power supply side of the upper latch 20. Further, with these changes, the input terminal pair in, inb is switched, and the output terminal pair out, outb is changed from the output terminal pair of the first latch 10 to that of the second latch 20.

Modification Example 5 of the Second Embodiment

Figure 34:
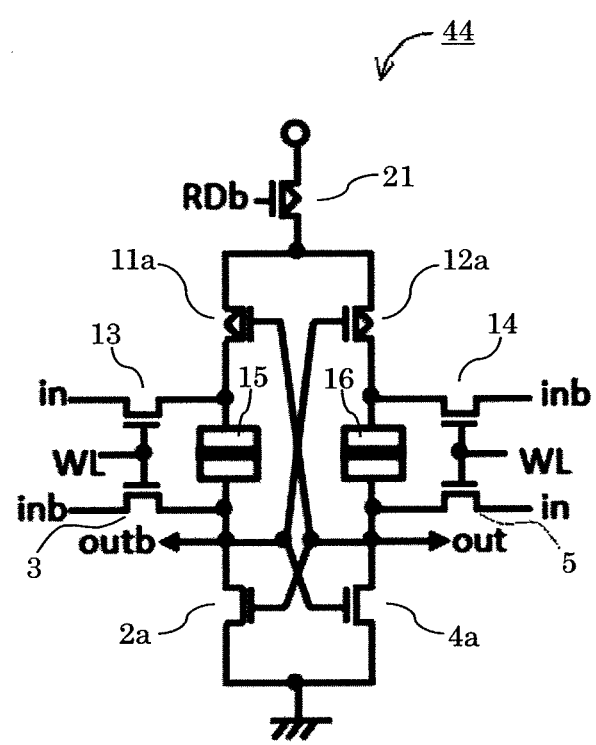
FIG. 34 is a circuit diagram of the modification example 5 of the integrated circuit according to the second embodiment of the present invention.

FIG. 34 is a circuit diagram of the modification example 5 of the integrated circuit according to the second embodiment of the present invention. With an integrated circuit 44 according to the modification example 5 in comparison with the integrated circuit 41 in FIG. 31, the n-type MOSFET 17 of the integrated circuit 41 in FIG. 31 is replaced by the p-type MOSFET 21 which is connected to the power supply side of the upper latch 20. Further, with these changes, the input terminal pair in, inb is switched, and the output terminal pair out, outb is changed from the output terminal pair of the first latch 10 to that of the second latch 20.

Modification Example 6 of the Second Embodiment

Figure 35:
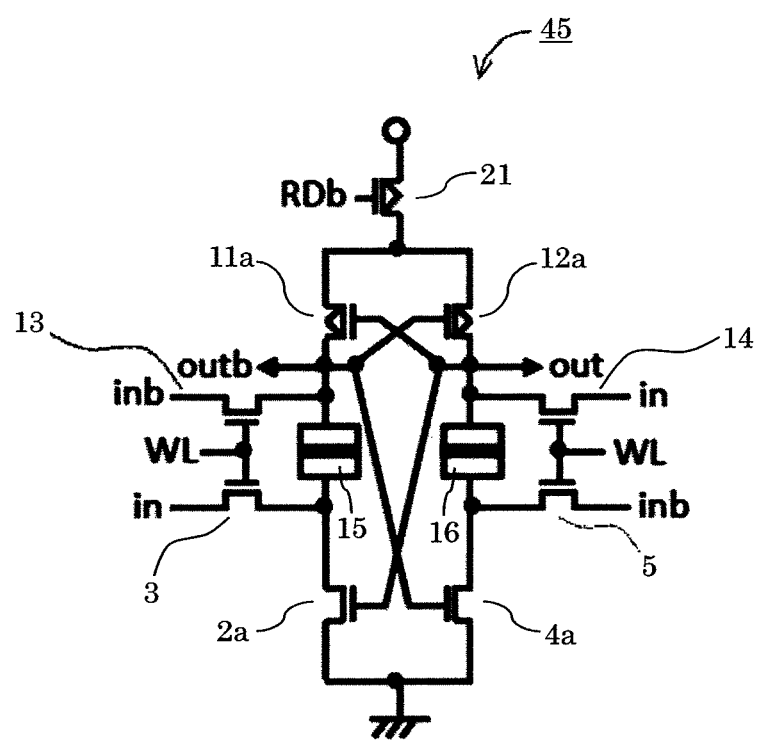
FIG. 35 is a circuit diagram of the modification example 6 of the integrated circuit according to the second embodiment of the present invention.

FIG. 35 is a circuit diagram of the modification example 6 of the integrated circuit according to the second embodiment of the present invention. In an integrated circuit 45 according to the modification example 6 in comparison with the integrated circuit 42 in FIG. 32, the n-type MOSFET 17 of the integrated circuit 42 in FIG. 32 is replaced by the p-type MOSFET 21 which is connected to the power supply side of the upper latch 20.

Modification Example 7 of the Second Embodiment

Figure 36:
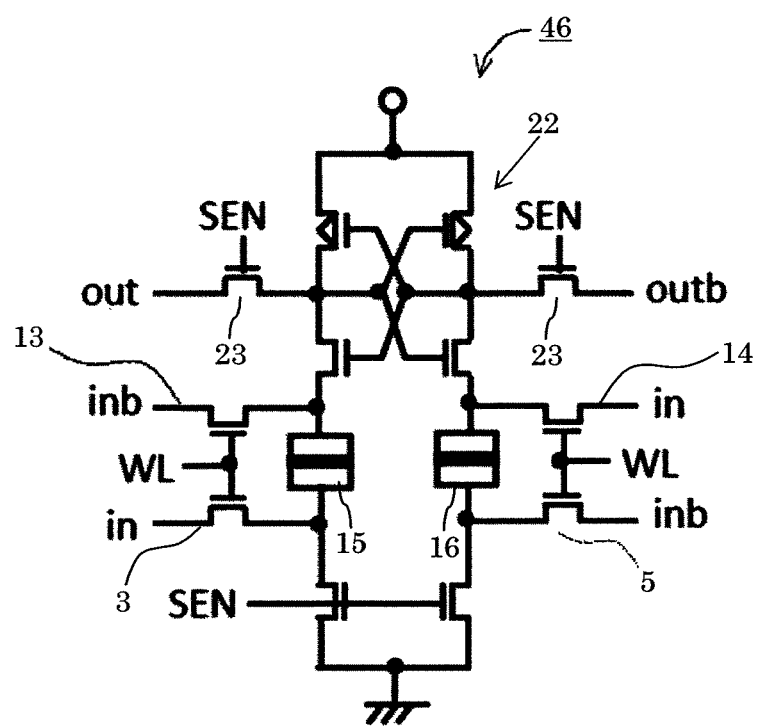
FIG. 36 is a circuit diagram of the modification example 7 of the integrated circuit according to the second embodiment of the present invention.

FIG. 36 is a circuit diagram of the modification example 7 of the integrated circuit according to the second embodiment of the present invention. As show in FIG. 36, in an integrated circuit 46, the upper latch 20 consisting of p-type MOSFET and the lower latch 10 consisting of n-type MOSFET, both of which are separated to both sides of MTJ device 15,16 as in the embodiment mentioned above, are integrated to CMOS latch 22 in the direction to upper portion. The output terminal pair out, outb are provided from the sense-node pair of CMOS latch 22 via the transfer gate 23 consisting of n-type MOSFET. The transfer gate consisting of n-type MOSFET may be replaced by p-type MOSFET. Further, the transfer gate consisting of n-type MOSFET may be omitted. That is, the sense-node pair of CMOS latch may be used as the output terminal pair out, outb.

Modification Example 8 of the Second Embodiment

Figure 37:
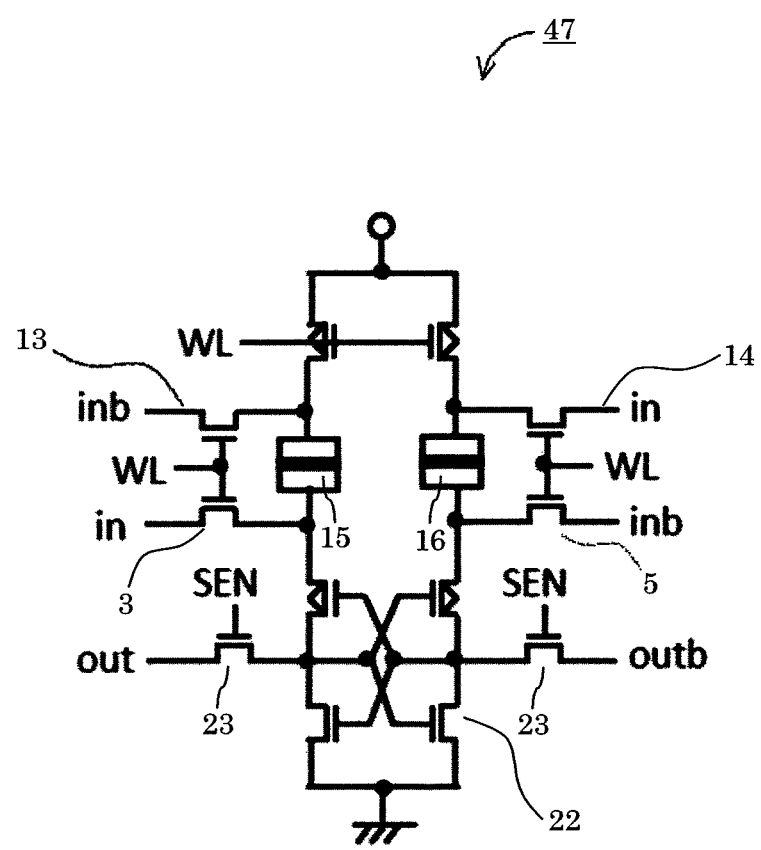
FIG. 37 is a circuit diagram of the modification example 8 of the integrated circuit according to the second embodiment of the present invention.

FIG. 37 is a circuit diagram of the modification example 8 of the integrated circuit according to the second embodiment of the present invention. As show in FIG. 37, in an integrated circuit 47, the upper latch 20 consisting of p-type MOSFET and the lower latch 10 consisting of n-type MOSFET, both of which are separated to both sides of MTJ device 15,16 as in the embodiment mentioned above, are integrated to CMOS latch 22 in the direction to upper portion. The output terminal pair out, outb are provided from the sense-node pair of the CMOS latch 22 via the transfer gate 23 consisting of n-type MOSFET. The transfer gate consisting of n-type MOSFET may be replaced by p-type MOSFET. Further, the transfer gate consisting of n-type MOSFET may be omitted. That is, the sense-node pair of CMOS latch may be used as the output terminal pair out, outb.

Modification Example 9 of the Second Embodiment

Figure 38:
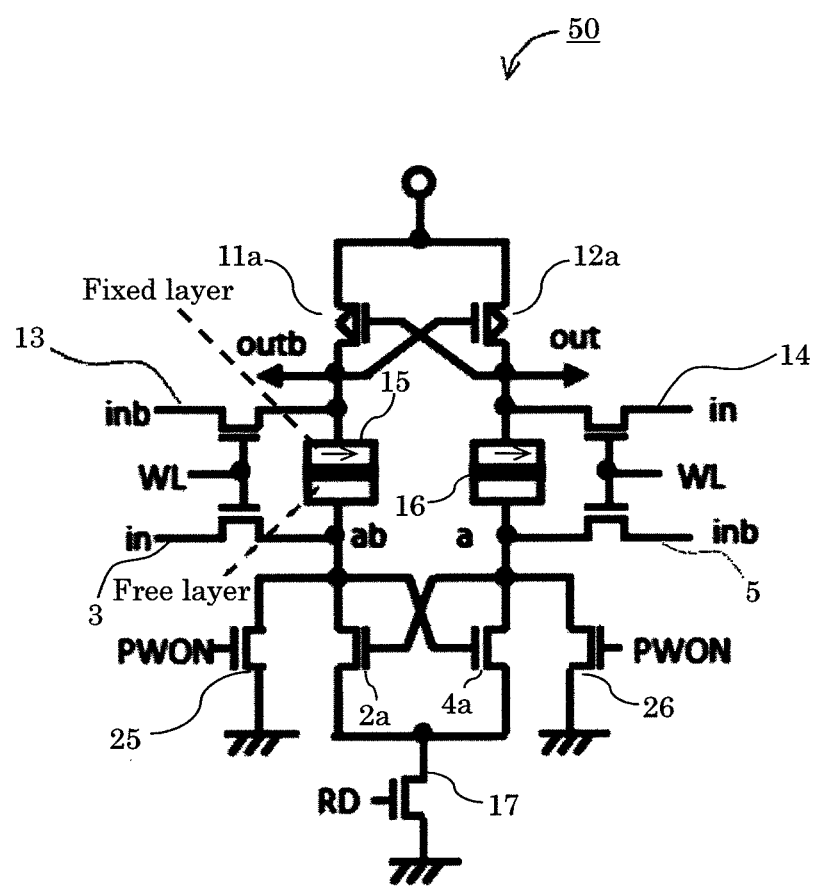
FIG. 38 is a circuit diagram of the modification example 9 of the integrated circuit according to the second embodiment of the present invention.
Figure 39:
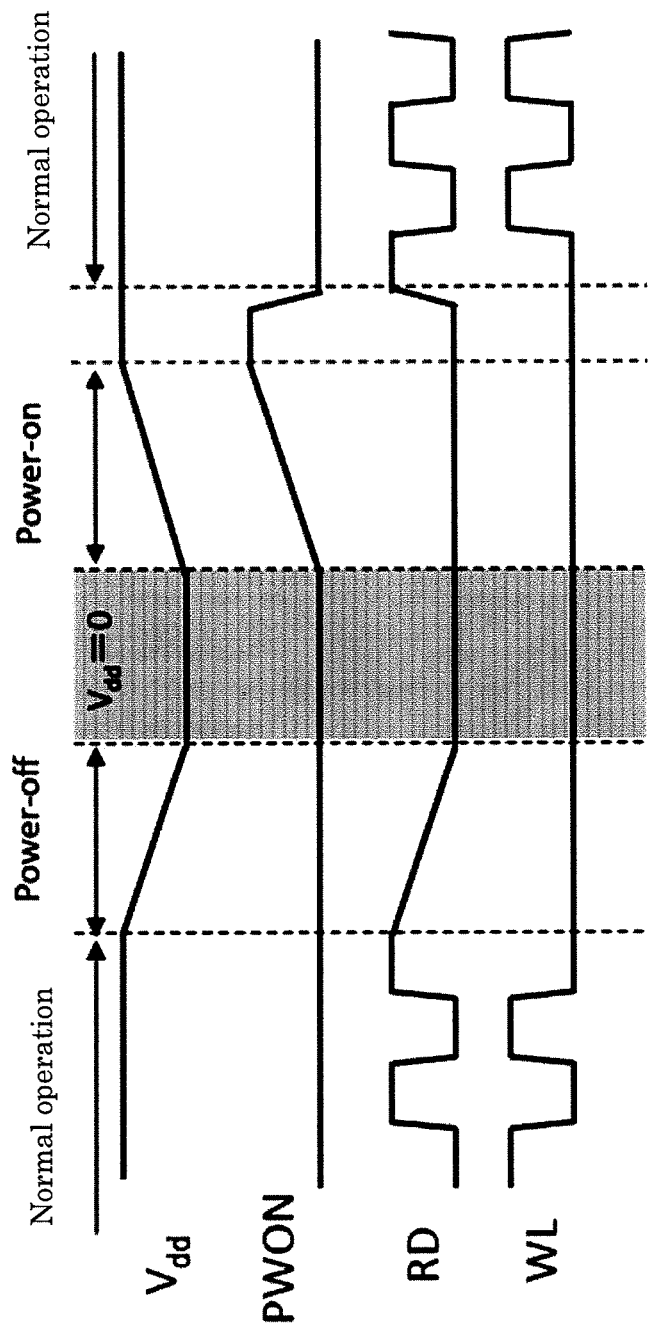
FIG. 39 is a time chart showing the operation of the integrated circuit as shown in FIG. 38.

FIG. 38 is a circuit diagram of the modification example 9 of an integrated circuit 50 according to the second embodiment of the present invention. FIG. 39 is a time chart showing the operation of the integrated circuit 50 as shown in FIG. 38.

As shown in FIG. 38, according to the integrated circuit 50 of the modification example 9, n-type MOSFETs 25, 26 are further connected as the load transistors to n-type MOSFET's 2a, 4a in the first latch 10 of the integrated circuit 40 of the second embodiment as shown in FIG. 30.

In particular, the drain of the left load transistor 25 is connected to the drain of the n-type MOSFET 2a, the source of the load transistor 25 is grounded, and the PWON signal is applied to the gate of the load transistor 25. The drain of the right load transistor 26 is connected to the drain of the n-type MOSFET 4a, the source of the load transistor is grounded, and the PWON signal is applied to the gate of the load transistor.

The role of the added two n-type MOSFETs 25, 26 is to prevent the antagonistic of the amplification direction at the turn-on of the power supply between the upper latch 20 and the lower latch 10 in the first embodiment. At the turn-on of the power supply, the lower latch 10 is non-active and the data stored in the MTJ devices 15, 16 are recovered to the upper latch 20 by using the upper latch 20 and added load transistor pair consisting of n-type MOSFET 25, 26. After the power-on, the PWON signal becomes the low level and the RD becomes the high level. Then, the data is also amplified and stabilized by the lower latch 10.

As shown in FIG. 39, in the integrated circuit 50, when the power is turned on again, the data having been written into the integrated circuit 50 immediately before the power is turned on is read.

According to the integrated circuit 50 in the modification example 9 of the second embodiment, when the power of the integrated circuit 50 is turned off and then turned on again, the data in the MTJ devices 15, 16 can be stored in the latch circuit again, namely the data can be restored. Accordingly, while the integrated circuit 50 is in standby state, the power to be applied to the integrated circuit 50 can be turned off, meaning that standby power can be decreased significantly.

Modification Example 10 of the Second Embodiment

Figure 40:
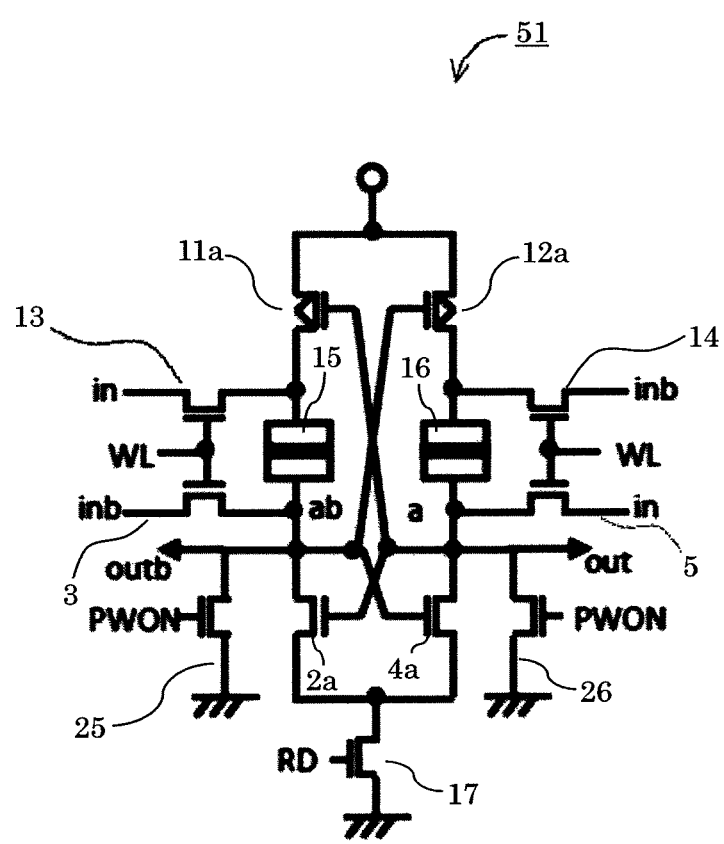
FIG. 40 is a circuit diagram of the modification example 10 of the integrated circuit according to the second embodiment of the present invention.

FIG. 40 is a circuit diagram of the modification example 10 of the integrated circuit according to the second embodiment of the present invention. As shown in FIG. 40, an integrated circuit 51 differs from the one shown in FIG. 31 in that the two n-type MOSFETs 25, 26, to whose gate the PWON signal is input, are additionally connected in parallel to the two n-type MOSFETs 2a, 4a in the lower latch 10. The role of these two n-type MOSFETs 2a, 4a is to maintain the lower latch 10 in the non-active state by allowing the RD signal to remain at the low level and thus operate as load transistors for the upper latch 20 when the PWON signal is at the high level. Consequently, the data stored in the MTJ devices 15, 16 can be read into the upper latch 20 stably. Then, when the PWON decreases to the low level and the RD turns to the high level, the data is latched to the lower latch 10.

Modification Example 11 of the Second Embodiment

Figure 41:
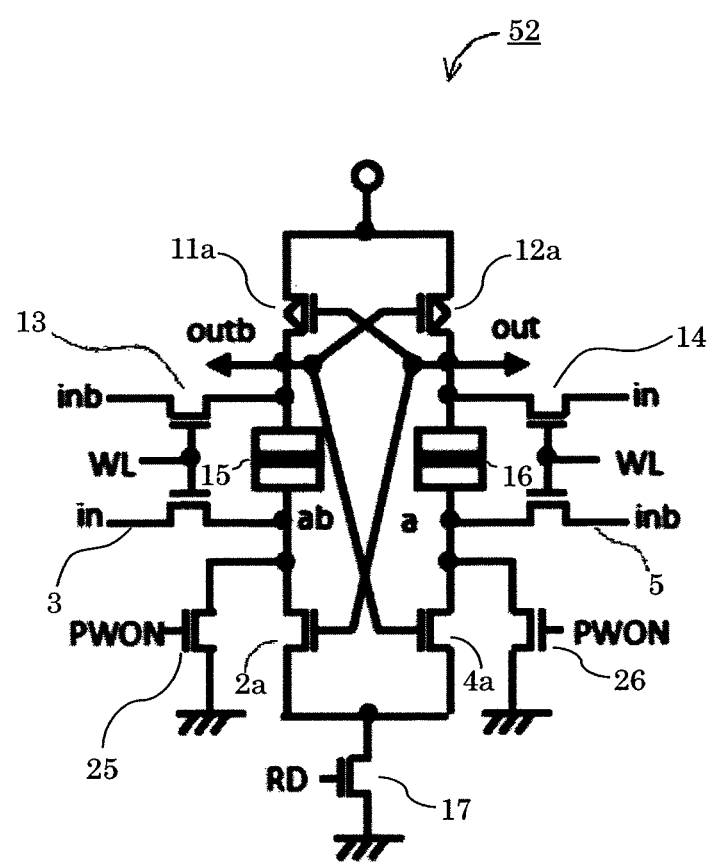
FIG. 41 is a circuit diagram of the modification example 11 of the integrated circuit according to the second embodiment of the present invention.

FIG. 41 is a circuit diagram of the modification example 11 of the integrated circuit according to the second embodiment of the present invention. As shown in FIG. 41, an integrated circuit 52 differs from the one as shown in FIG. 32 in that the two n-type MOSFETs 25, 26, to whose gate the PWON signal is input, are additionally connected in parallel to the two n-type MOSFETs 2a, 4a in the lower latch 10. The role of these two n-type MOSFETs 2a, 4a is to maintain the lower latch 10 in the non-active state by allowing the RD signal to remain at the low level and thus to operate as load transistors for the upper latch 20 when the PWON signal is at the high level. Consequently, the data stored in the MTJ devices 15, 16 can be read into the upper latch 20 stably. Then, when the PWON decreases to the low level and the RD turns to the high level, the data is latched to the lower latch 10.

Modification Example 12 of the Second Embodiment

Figure 42:
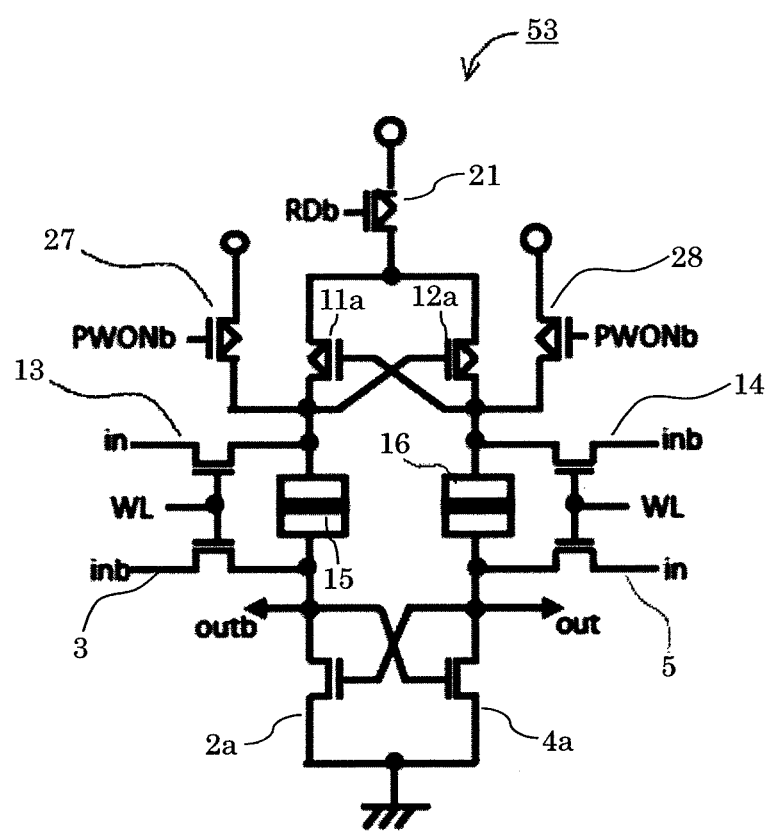
FIG. 42 is a circuit diagram of the modification example 12 of the integrated circuit according to the second embodiment of the present invention.

FIG. 42 is a circuit diagram of the modification example 12 of the integrated circuit according to the second embodiment of the present invention. As shown in FIG. 42, an integrated circuit 53 differs from the one shown in FIG. 33 in that two p-type MOSFETs 27, 28, to whose gate the PWONb signal is input, are additionally connected in parallel to the two p-type MOSFETs 11a, 12a in the upper latch 20. The role of these two p-type MOSFETs 27, 28 is to maintain the upper latch 20 in the non-active state by allowing the RDb signal to remain at the high level and thus to operate as load transistors for the lower latch 10 when the PWONb signal is at low level. Consequently, the data stored in the MTJ devices 15, 16 can be read into the lower latch 10 stably. Then, when the PWONb increases to the high level and the RDb turns to the low level, the data is latched to the upper latch 20.

Modification Example 13 of the Second Embodiment

Figure 43:
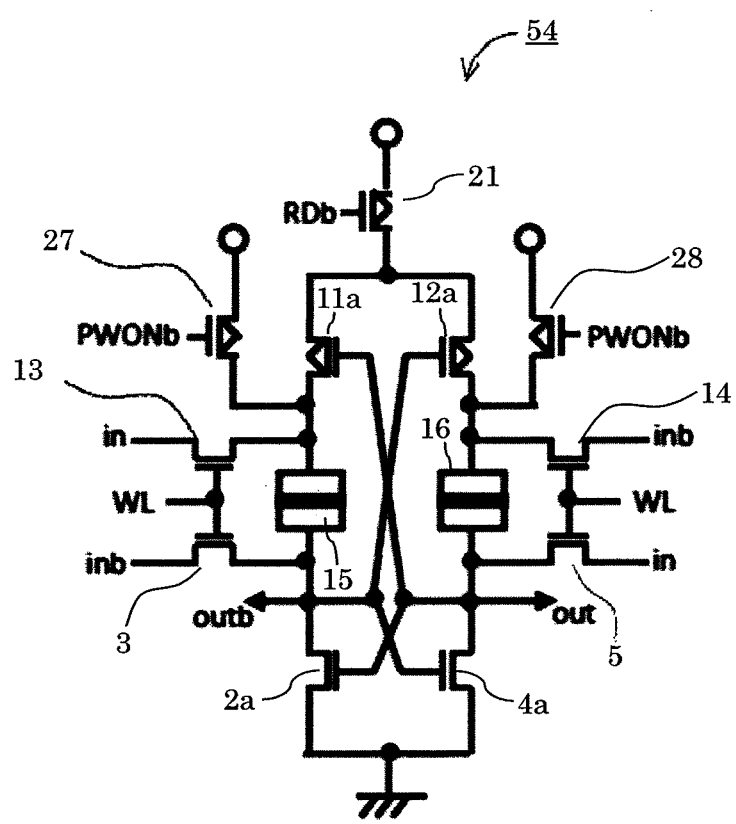
FIG. 43 is a circuit diagram of the modification example 13 of the integrated circuit according to the second embodiment of the present invention.

FIG. 43 is a circuit diagram of the modification example 13 of the integrated circuit according to the second embodiment of the present invention. As shown in FIG. 43, an integrated circuit 54 differs from the one shown in FIG. 34 in that the two p-type MOSFETS 27, 28, to whose gate PWONb signal is input, are additionally connected in parallel to the two p-type MOSFETs 11a, 12a in the upper latch 20. The role of these two p-type MOSFETs 27, 28 is to maintain the upper latch 20 in the non-active state by allowing the RDb signal to remain at the high level and thus to operate as load transistors for the lower latch 10 when the PWONb signal is at the low level. Consequently, the data stored in the MTJ devices 15, 16 can be read into the lower latch 10 stably. Then, when the PWONb increases to the high level and RDb turns to the low level, the data is latched to the upper latch 20.

Modification Example 14 of the Second Embodiment

Figure 44:
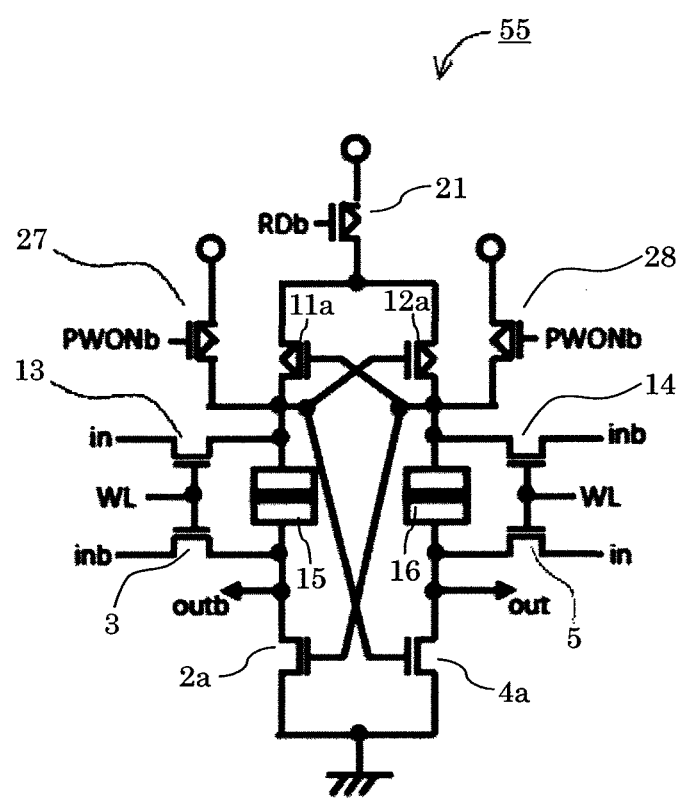
FIG. 44 is a circuit diagram of the modification example 14 of the integrated circuit according to the second embodiment of the present invention.

FIG. 44 is a circuit diagram of the modification example 14 of the integrated circuit according to the second embodiment of the present invention. As shown in FIG. 44, an integrated circuit 55 differs from the one shown in FIG. 35 in that the two p-type MOSFETs 27, 28, to whose gate the PWONb signal is input, are additionally connected in parallel to the two p-type MOSFETs 11a, 12a in the upper latch 20. The role of these two p-type MOSFETs 27, 28 is to maintain the upper latch 20 in the non-active state by allowing the RDb signal to remain at the high level and thus to operate as load transistors for the lower latch 10 when the PWONb signal is at the low level. Consequently, the data stored in the MTJ devices 15, 16 can be read into the lower latch 10 stably. Then, when the PWONb increases to the high level and the RDb turns to the low level, the data is latched to the upper latch 20.

Modification Example 15 of the Second Embodiment

Figure 45:
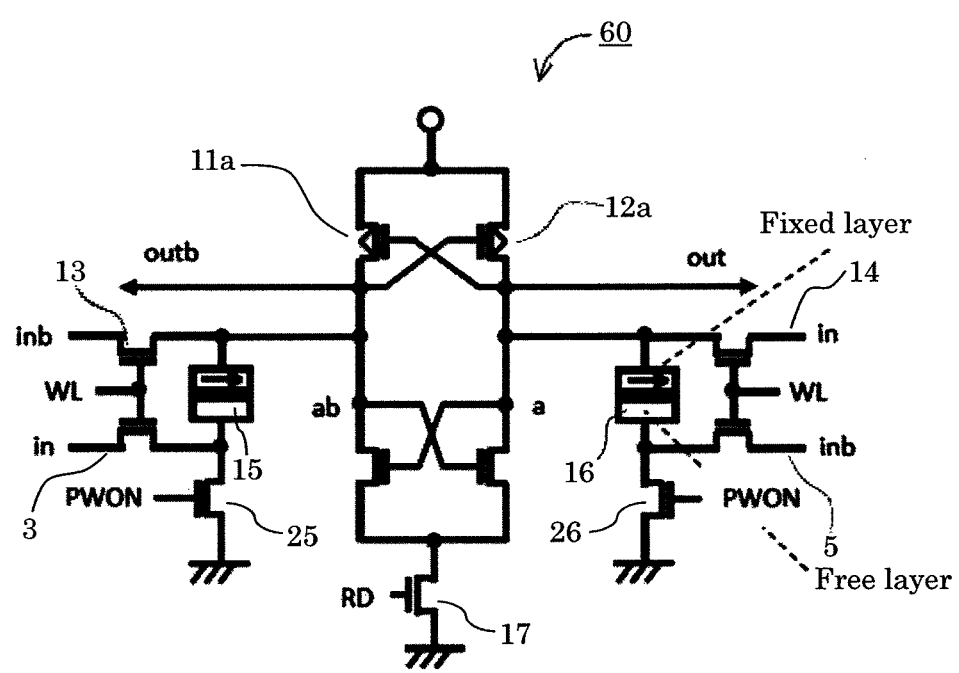
FIG. 45 is a circuit diagram of the modification example 15 of the integrated circuit according to the second embodiment of the present invention.
Figure 46:
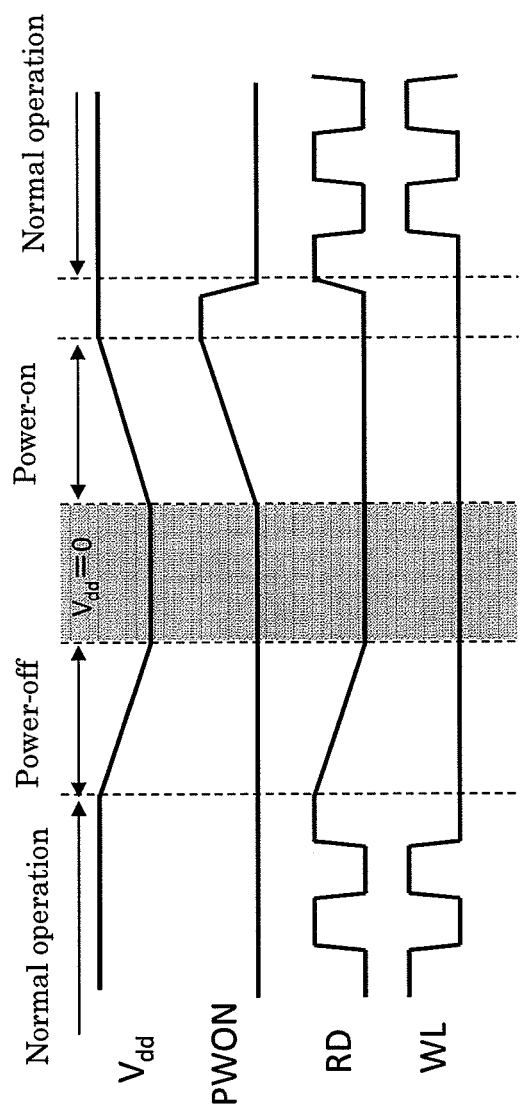
FIG. 46 is a time chart showing the operation of the integrated circuit as shown in FIG. 45.

FIG. 45 is a circuit diagram of the modification example 15 of an integrated circuit 60 according to the second embodiment of the present invention, and FIG. 46 is a time chart showing the operation of the integrated circuit 60 as shown in FIG. 45.

As shown in FIG. 45, the integrated circuit 60 according to the modification example 15 of the second embodiment has a structure where the integrated circuit 50 in the third embodiment shown in FIG. 38 is changed to a parallel type.

Specifically, the free layer of the MTJ device 15 connected to the drain of the left n-type MOSFET 2a is connected to the drain of the load transistor 25. The source of the load transistor 25 is grounded, and the PWON signal is applied to the gate. The free layer of the MTJ device 16 connected to the right n-type MOSFET 4*a* is connected to the drain of the load transistor 26. The source of the load transistor 26 is grounded, and the PWON signal is applied to the gate.

In this case, by connecting the fixed layer of the MTJ devices 15, 16 to the side of the power supply $V_{dd}$, namely by connecting the fixed layer of the spin-injection-type MTJ devices 15, 16 to a node having higher potential than the free layer, the disturb current generated within the MTJ devices 15, 16 can be avoided.

As shown in FIG. 46, when the power of the integrated circuit 60 is turned on again, the data, which has been written into the integrated circuit 60 immediately before the power is turned on, is read.

According to the integrated circuit 60 of the fourth embodiment, the interference between the n-type latch 10 in the lower stage and the p-type latch 20 in the upper stage does not occur owing to the parallel arrangement described above, and consequently the operation of the integrated circuit 50 in the third embodiment can be stabilized further, which is an advantage.

Modification Example 16 of the Second Embodiment

Figure 47:
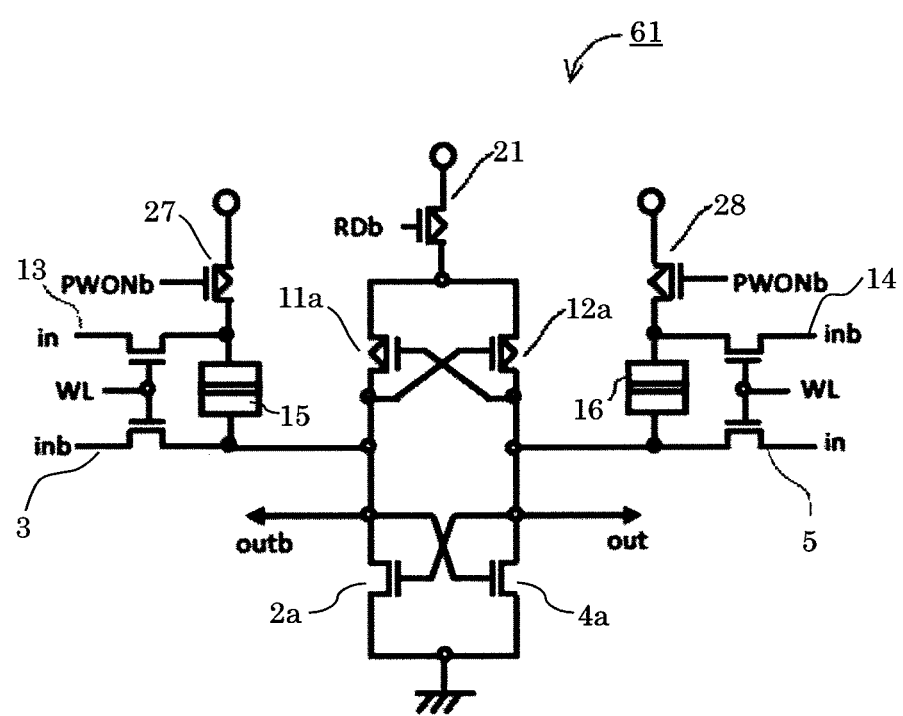
FIG. 47 is a circuit diagram of the modification example 16 of the integrated circuit according to the second embodiment of the present invention.

FIG. 47 is a circuit diagram of the modification example 16 of the integrated circuit according to the second embodiment of the present invention. As shown in FIG. 47, in an integrated circuit 61 according to the modification example 16 of the second embodiment in comparison with the integrated circuit 60 of FIG. 45, the n-type MOSFET 17 and two load transistors 25, 26 in the integrated circuit 60 of FIG. 45 are replaced by the p-type MOSFETs 21, 27, 28.

Modification Example 17 of the Second Embodiment

Static Series-Type

Figure 48:
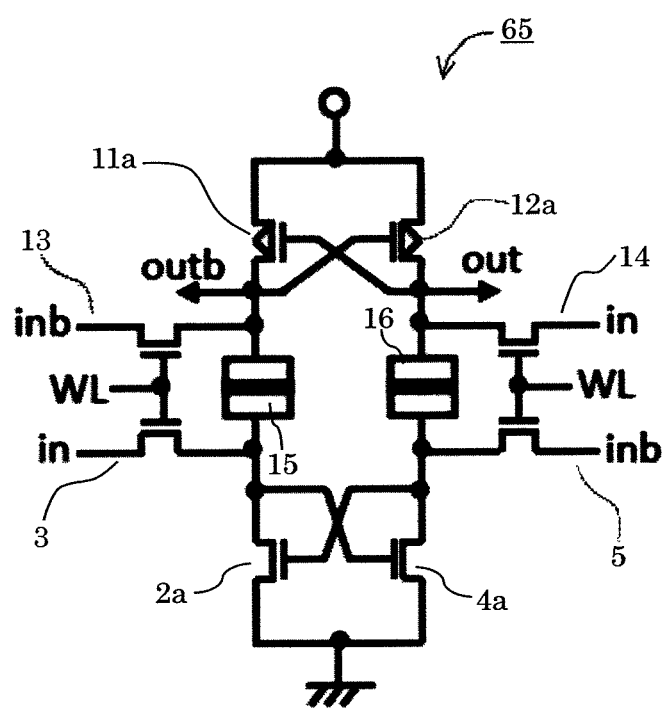
FIG. 48 is a circuit diagram of the modification example 17 of the integrated circuit according to the second embodiment of the present invention.

FIG. 48 is a circuit diagram of the modification example 17 of an integrated circuit 65 according to the second embodiment of the present invention. As shown in FIG. 48, the integrated circuit 65 according to the fifth embodiment of the present invention has a lower latch 10 whose structure is different from that of the integrated circuit 40 in the third embodiment. Specifically, the n-type MOSFET 17 connected to the ground of the first latch 10 of the integrated circuit 40 in the second embodiment as shown in FIG. 30 is omitted to form a so-called static series-type integrated circuit.

According to the integrated circuit 65 of the present invention, control signals are unnecessary, there are effects that the number of circuit devices is small, and both the necessary chip area and the power are decreased.

Modification Example 18 of the Second Embodiment

Figure 49:
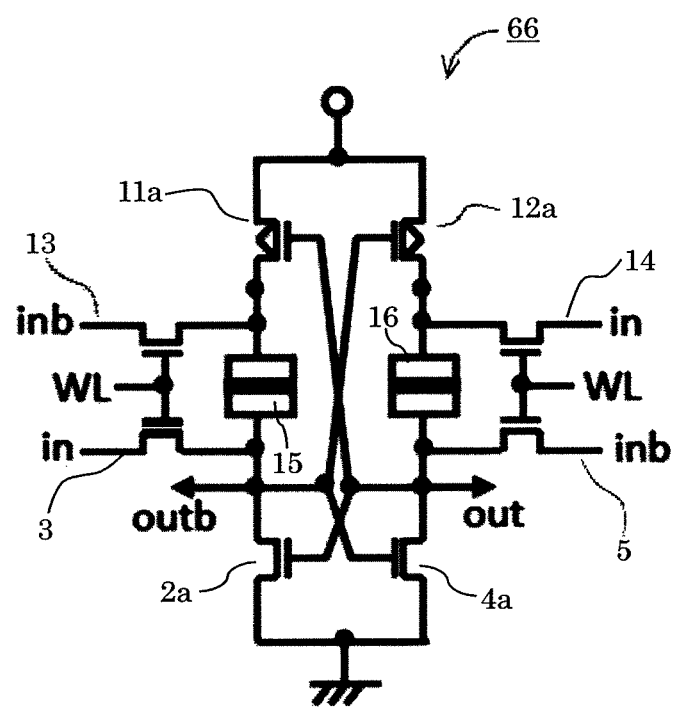
FIG. 49 is a circuit diagram of the modification example 18 of the integrated circuit according to the second embodiment of the present invention.

FIG. 49 is a circuit diagram of the modification example 18 of the integrated circuit according to the second embodiment of the present invention. As shown in FIG. 49, an integrated circuit 66 of the present invention is a static latch-type integrated circuit where the n-type MOSFET or the p-type MOSFET connected to the ground or the power voltage as shown in FIG. 31 or FIG. 34 is omitted. According to the integrated circuit 66 of the modification example 1 of the fifth embodiment of the present invention, since the control signals are unnecessary, there are effects that the number of circuit devices is small, and both of the necessary area and the power are decreased.

Modification Example 19 of the Second Embodiment

Figure 50:
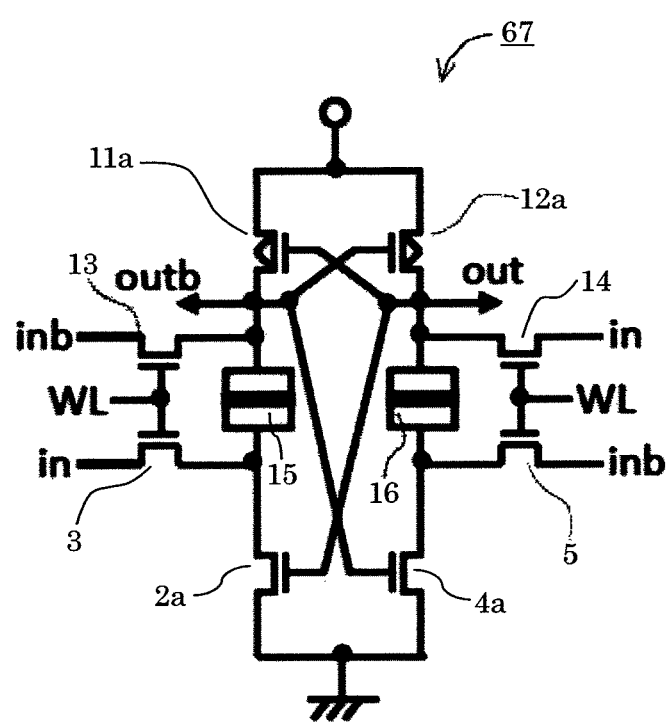
FIG. 50 is a circuit diagram of the modification example 19 of the integrated circuit according to the second embodiment of the present invention.

FIG. 50 is a circuit diagram of the modification example 19 of the integrated circuit according to the second embodiment of the present invention. As shown in FIG. 50, an integrated circuit 67 of the present invention is a static latch-type integrated circuit where the n-type 17 MOSFET or the p-type MOSFET 21 connected to the ground or the power voltage as shown in FIG. 32 or FIG. 35 is omitted. According to the integrated circuit 67 of the modification example 17 of the second embodiment of the present invention, since the control signals are unnecessary, there are effects that the number of circuit devices is small, and both of the necessary area and the power are decreased.

Modification Example 20 of the Second Embodiment

Figure 51:
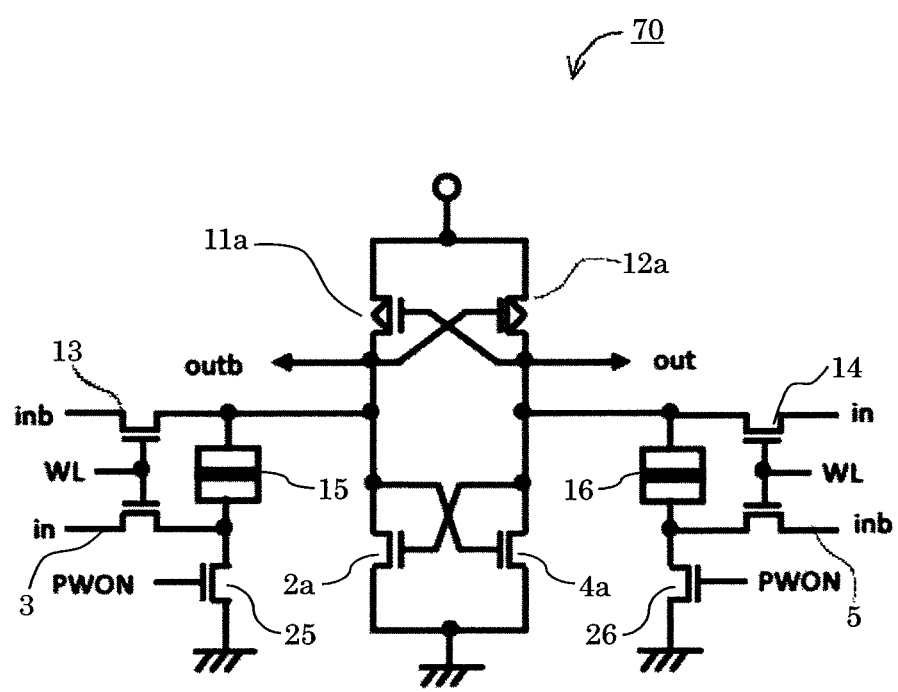
FIG. 51 is a circuit diagram of the modification example 20 of the integrated circuit according to the second embodiment of the present invention.

FIG. 51 is a circuit diagram of the modification example 20 of the integrated circuit according to the second embodiment of the present invention. As shown in FIG. 51, in an integrated circuit 70 according to the modification example 20 according to the second embodiment in comparison with the integrated circuit 60 of FIG. 45, the configuration of the lower latch 10 is different. Specifically, in the integrated circuit 60 of the fourth embodiment of the present invention shown in FIG. 45, the n-type MOSFET 17, which is connected to the ground in the first latch 10, is omitted. The integrated circuit 70 is so-called the static parallel-type integrated circuit.

According to the integrated circuit 70 of the modification example 18 of the sixth embodiment of the present invention, since the control signals are unnecessary, there are effects that the number of circuit devices is small, and both of the necessary area and the power are decreased.

Modification Example 21 of the Second Embodiment

Figure 52:
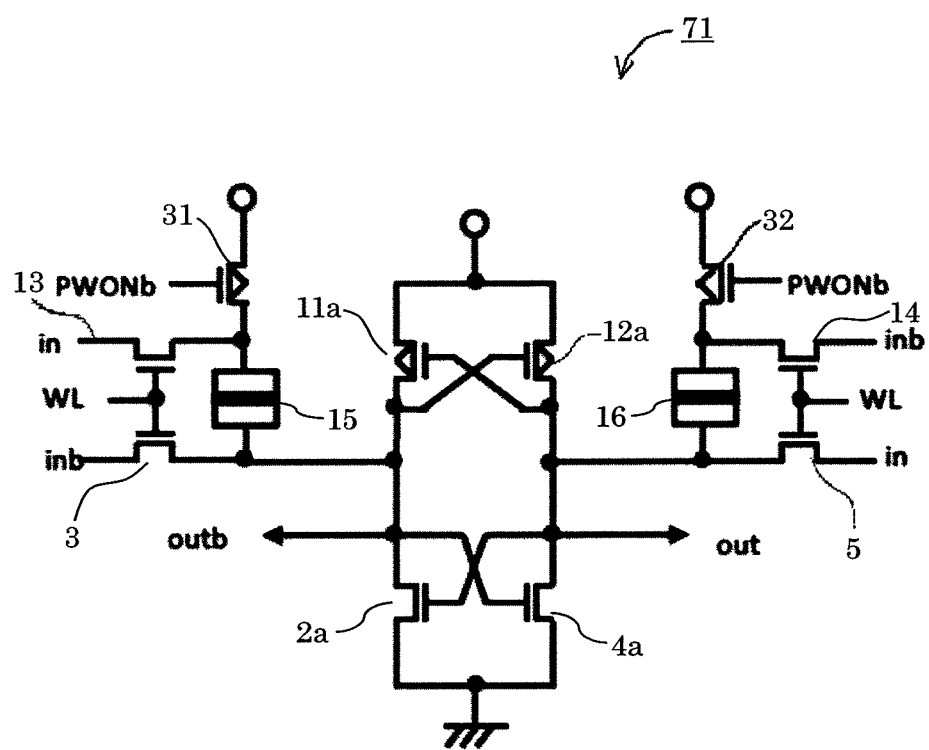
FIG. 52 is a circuit diagram of the modification example 21 of the integrated circuit according to the second embodiment of the present invention.

FIG. 52 is a circuit diagram of the modification example 21 of the integrated circuit according to the second embodiment of the present invention. As shown in FIG. 52, in an integrated circuit 71 according to the modification example 21 of the second embodiment of the present invention, the two load transistors 25, 26 are replaced by p-type MOSFETs 31, 32, unlike the integrated circuit 70 according to the modification example 20 of the second embodiment as shown in FIG. 51.

A flip-flop circuit will hereinafter be described as an integrated circuit of the present invention.

Third Embodiment

Flip-Flop Circuit

Figure 53:
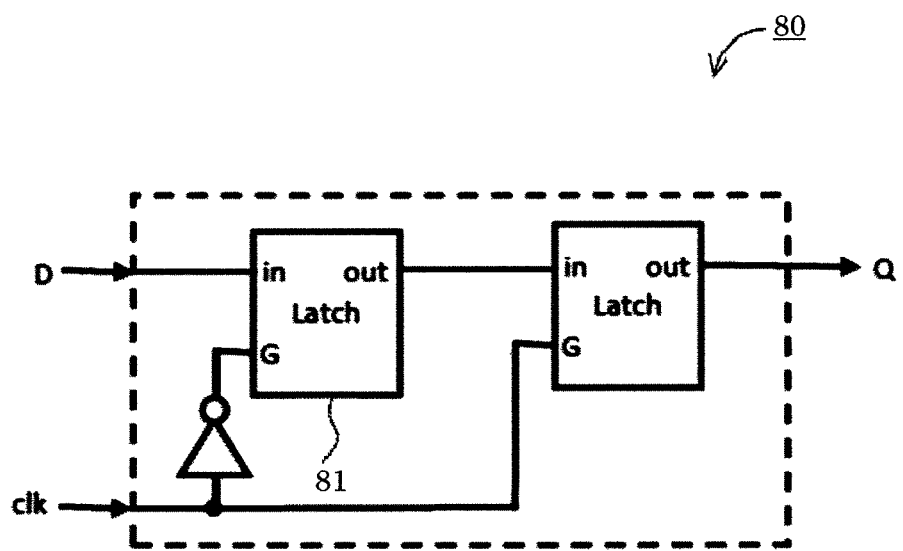
FIG. 53 is a block diagram of flip-flop circuit of the integrated circuit according to the third embodiment of the present invention.
Figure 54:
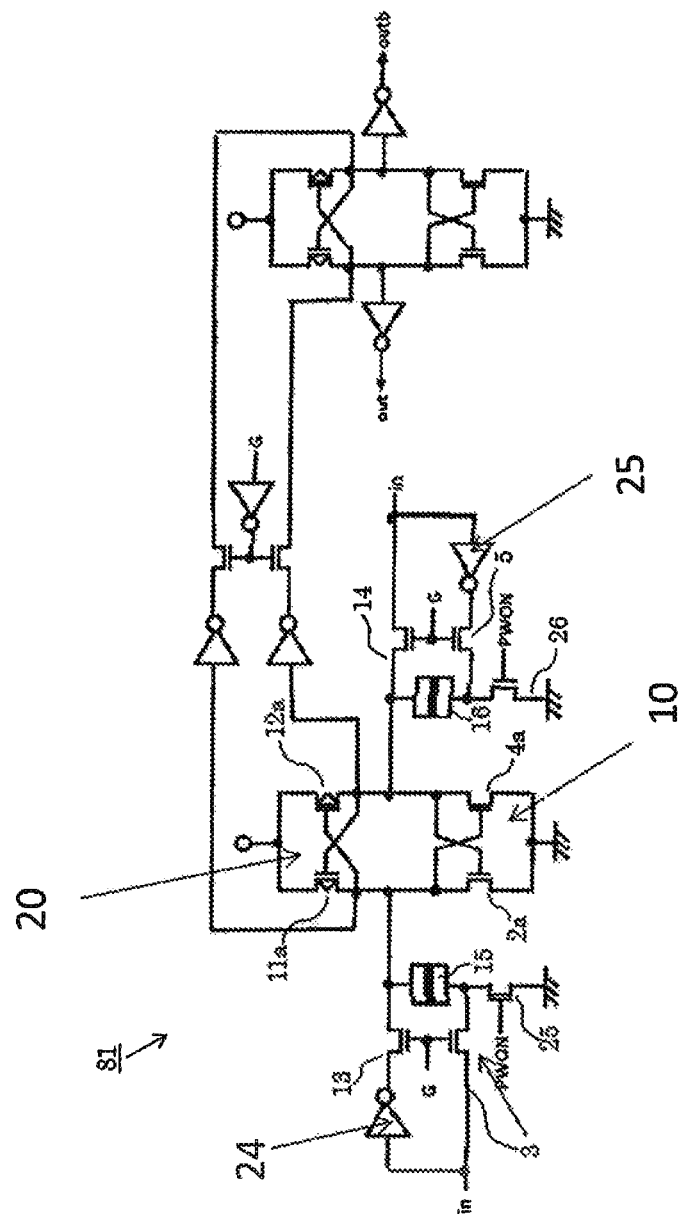
FIG. 54 is a circuit diagram of the latch circuit.

FIG. 53 is a block diagram of a flip-flop circuit 80 of the integrated circuit according to the third embodiment of the present invention, and FIG. 54 is a circuit diagram of the latch circuit 81.

As shown in FIG. 53, the flip-flop circuit 80 according to the third embodiment of the present invention uses a parallel-type latch circuit 81. Either one of the first stage and the second stage is, or both the first stage and the second stage are made of the basic circuit consisting of the memory element and the latch circuit 81.

As shown in FIG. 53, the integrated circuit 80 is the flip-flop circuit including: a first stage, which is the integrated circuit 81 of the present invention; and a latch circuit in a second stage, which is a conventional volatile latch circuit.

As shown in FIG. 54, the integrated circuit 81 in the first stage of the present invention includes: the first latch 10; the spin-injection-type MTJ devices 15, 16 connected to the first latch 10, and the second latch 20 connected to the spin-injection-type MTJ devices 15, 16. The data is written into the spin-injection-type MTJ devices 15, 16 at a lower operation frequency than that of the first latch 10 and/or the second latch 20.

The first latch 10 is made of two n-type MOSFETs 2a, 4a which are wired cross-sectional to each other. The second latch 20 is provided in the upper part of the first latch 10 and it is made of two p-type MOSFETs 11a, 12a which are wired cross-sectional to each other.

The fixed layer of the first spin-injection-type MTJ device 15 is connected to the drain of the n-type MOSFET 2a of the first latch 10, and the free layer of the first spin-injection-type MTJ device 15 is connected to the drain of an n-type MOSFET 25, which is a load transistor. The source of the n-type MOSFET 25 is grounded. To the gate of the n-type MOSFET 25, the PEON signal is applied.

An n-type MOSFET 13, which is a transfer gate, is connected to the fixed layer of the first spin-injection-type MTJ device 15. The output of inverter 24 is connected to this n-type MOSFET 13, and the in signal is applied to the input of this inverter 24. The G signal is applied to the gate of the n-type MOSFET 23. The n-type MOSFET 13, which is a transfer gate, is connected to the free layer of the first spin-injection-type MTJ device 15. The output of inverter 24 is connected to this n-type MOSFET 13, and the in signal is applied to the input of this inverter 24. The G signal is applied to the gate of the n-type MOSFET 13.

The fixed layer of the second spin-injection-type MTJ device 16 is connected to the drain of n-type MOSFET 4a of the first latch 10, and the free layer of the second injection-type MTJ device 16 is connected to the drain of an n-type MOSFET 26, which is a load transistor. The source of the n-type MOSFET 26 is grounded. The PWON signal is applied to the gate of the n-type MOSFET 26.

The n-type MOSFET 14, which is the transfer gate, is connected to the fixed layer 16 of the second spin-injection-type MTJ device. The input of the inverter 24 is connected to this n-type MOSFET 14, and the in signal is applied to the input of this inverter 24. The G signal is applied to the gate of the n-type MOSFET 14. The n-type MOSFET 5, which is a transfer gate, is connected to the free layer of the second spin-injection-type MTJ device 16. The output of the inverter 24 is connected to this n-type MOSFET 5, and the in signal is applied to the input of this inverter 24. The G signal is applied to the gate of the n-type MOSFET 5.

The second spin-injection-type MTJ device 16 is connected between the second p-type MOSFET 4a and the fourth p-type MOSFET 12a.

The fixed layer, which is one end of the second spin-injection-type MTJ device 16, is connected to the drain of the fourth p-type MOSFET 12a. The fixed layer of the second spin-injection-type MTJ device 16 is connected to the power line via the fourth p-type MOSFET 12a. As described above, the fixed layer of the second spin-injection-type MTJ device 16 is connected to the node having higher potential with respect to the free layer.

Note that in the second spin-injection-type MTJ device 16, the layer between the fixed layer and the free layer is the tunnel barrier layer.

The drain of the first n-type MOSFET 2a for driving is connected to the gate of the second n-type MOSFET 4a for driving. The drain of the second n-type MOSFET 4a for driving is connected to the gate of the first n-type MOSFET 2a for driving. The connection between the drain and the gate of the first n-type MOSFETs 2a, 4a for driving is also called cross-coupled wiring.

The first latch 10 and the second latch 20 having the structures described above constitute a so-called volatile latch circuit.

The in signal is applied to the output terminal of the first latch 10 via the n-type MOSFET 14, which is the transfer gate. The in signal is applied to the output terminal of the second latch 20 via the n-type MOSFET 14, which is the transfer gate.

(NOR-Type RS Flip-Flop)

Figure 55:
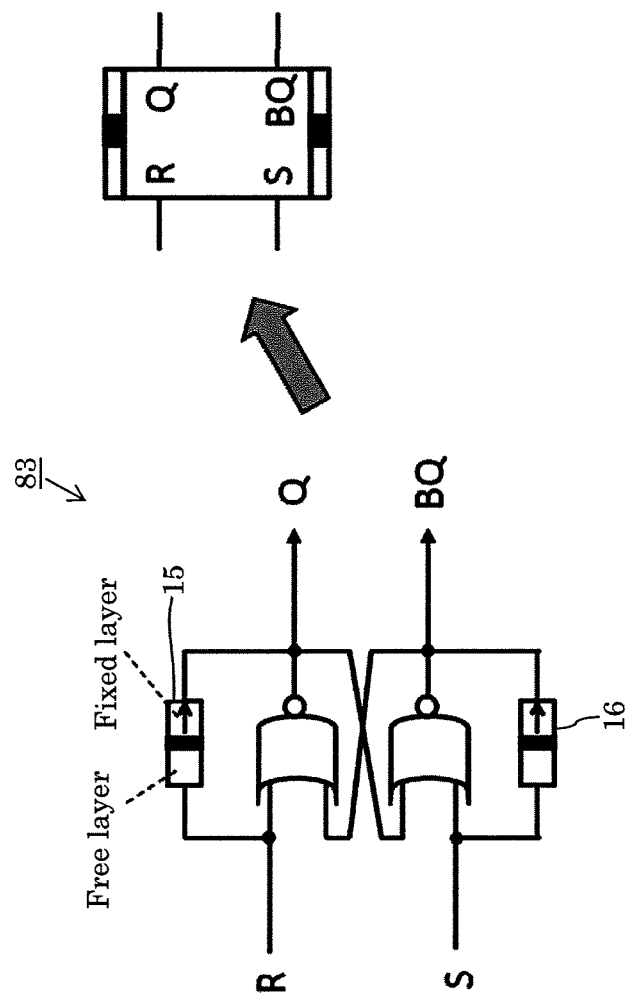
FIG. 55 is a block diagram of an integrated circuit according to the third embodiment of the present invention.

FIG. 55 is a block diagram of an integrated circuit 83 according to the third embodiment of the present invention.

As shown in FIG. 55, the integrated circuit 83 according to the third embodiment of the present invention is a NOR-type RS flip-flop circuit. In the NOR-type RS flip-flop circuit 83, the first MTJ device 15 is connected in parallel to the R terminal and the Q terminal of the conventional RS flip-flop circuit. The second MTJ device 16 is connected in parallel to the S terminal and the BQ terminal of the NOR-type RS flip-flop circuit 83. Both of the fixed layers of the first MTJ device 15 and the second MTJ device 16 are connected to the output side.

Figure 56:
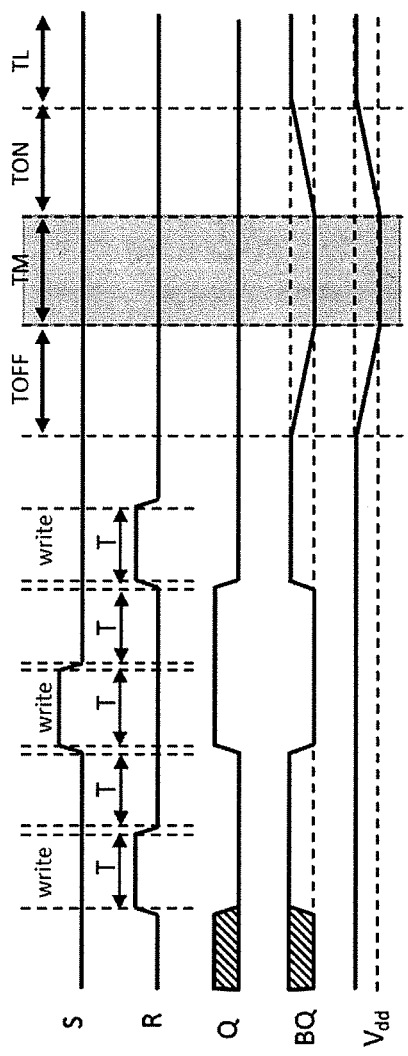
FIG. 56 is a chart showing the waveforms used to simulate the NOR-type flip-flop circuit as shown in FIG. 55.
Figure 57:
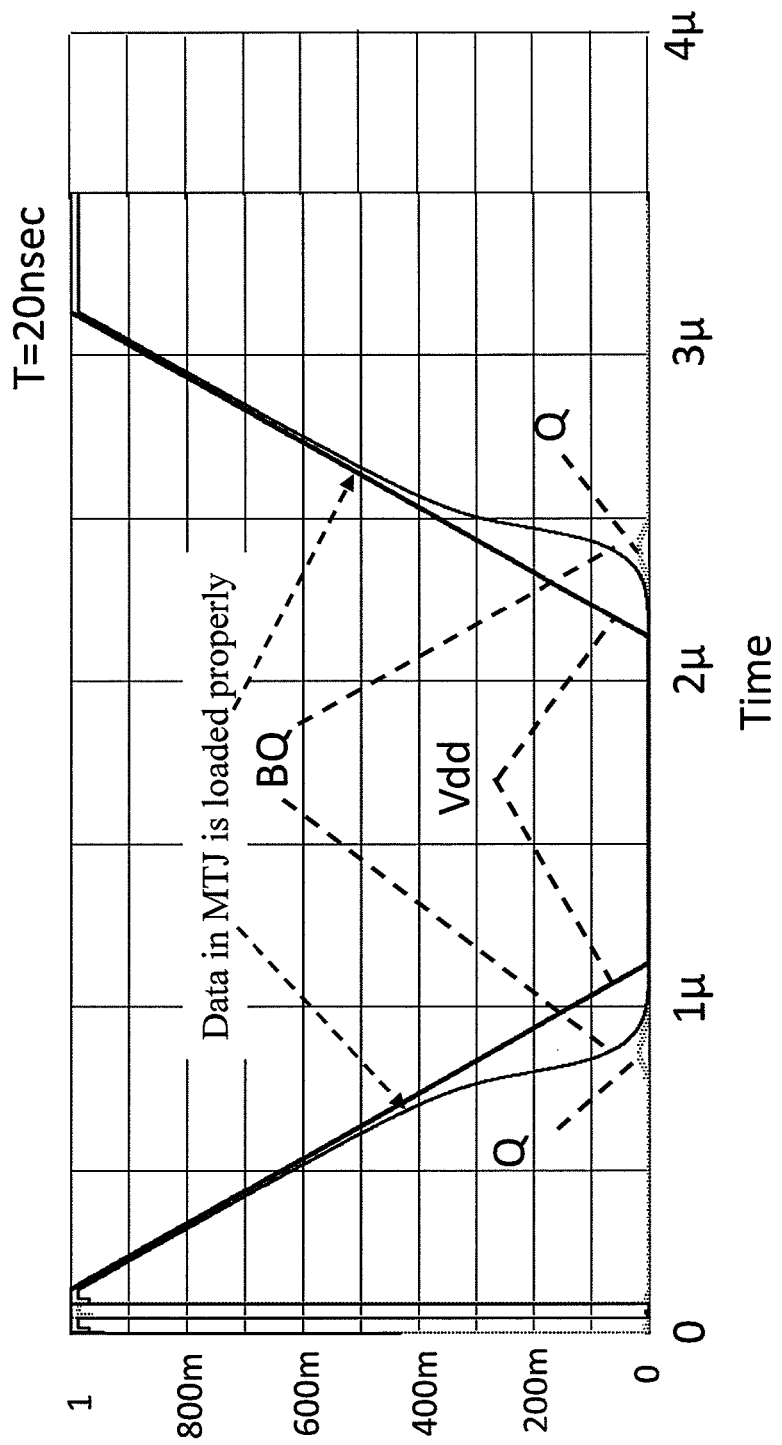
FIG. 57 is a chart showing typical simulation waveforms.

FIG. 56 is a chart showing the waveforms used to simulate the NOR-type flip-flop circuit 83 in FIG. 55, and FIG. 57 is a chart showing typical simulation waveforms.

As a result of the simulation performed, the flip-flop circuit was operated at 20 ns, for example. In addition, as shown in FIG. 57, by the simulation waveforms at the time of restoration of data with flip-flop circuit 83, the data can be restored even if the power for the flip-flop circuit 83 is interrupted, meaning that the power for the flip-flop circuit 83 can be turned off during standby mode. That is, the power in standby mode is zero (0).

Modification Example of NOR-Type Flip-Flop Circuit

Figure 58:
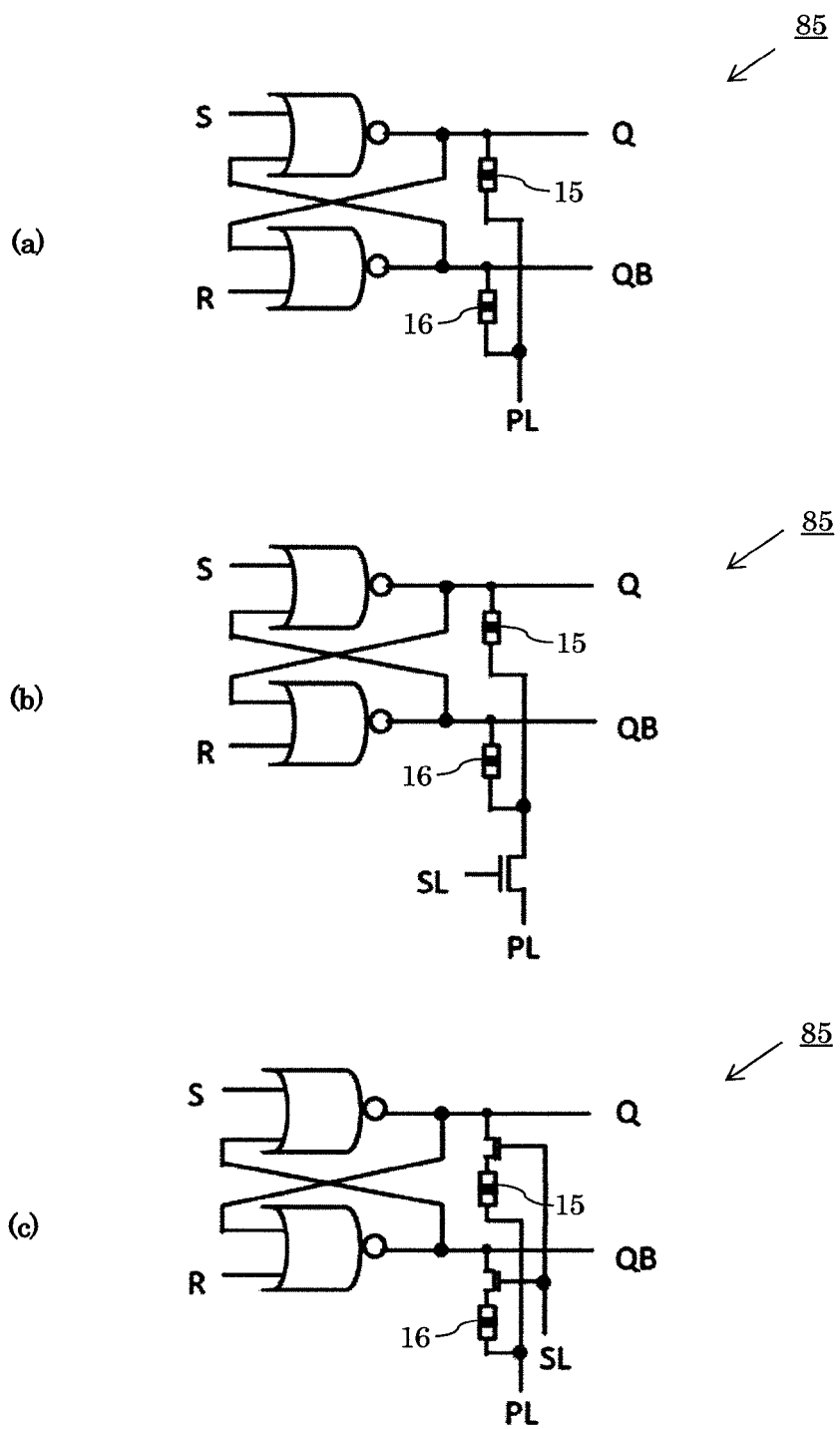
FIG. 58 shows modification examples of the NOR-type flip-flop circuit of the present invention, wherein (a) shows a first circuit, (b) shows a second circuit, and (c) shows a third circuit.

FIG. 58 shows the modification examples of a NOR-type flip-flop circuit 85 of the present invention, wherein (a) shows a first circuit, (b) shows a second circuit, and (c) shows a third circuit.

As shown in FIGS. 58 (a) to (c), in each one of the modification examples of the NOR-type flip-flop circuit, the first MTJ device 15 is connected to Q terminal in series, and the second MTJ device 16 is connected to the QB terminal in series, unlike the NOR-type RS flip-flop circuit in FIG. 55. The fixed layer of both of the first and the second MTJ devices 15, 16 is connected to the output side. The free layer of both of the first and the second MTJ devices 15, 16 is connected to the PL signal.

(How to Adjust the Incubation Time)

In order to decrease the power consumption of the memory element, it is only necessary to adjust the voltage to be applied to the memory element and increase the incubation time.

FIG. 59 shows circuits capable of adjusting the incubation time of the current-driven memory element 1B in the NOR-type RS flip-flop circuit 83, where (a) shows a circuit using a resistance 86, (b) shows a circuit using a MOSFET 87.

Figure 60:
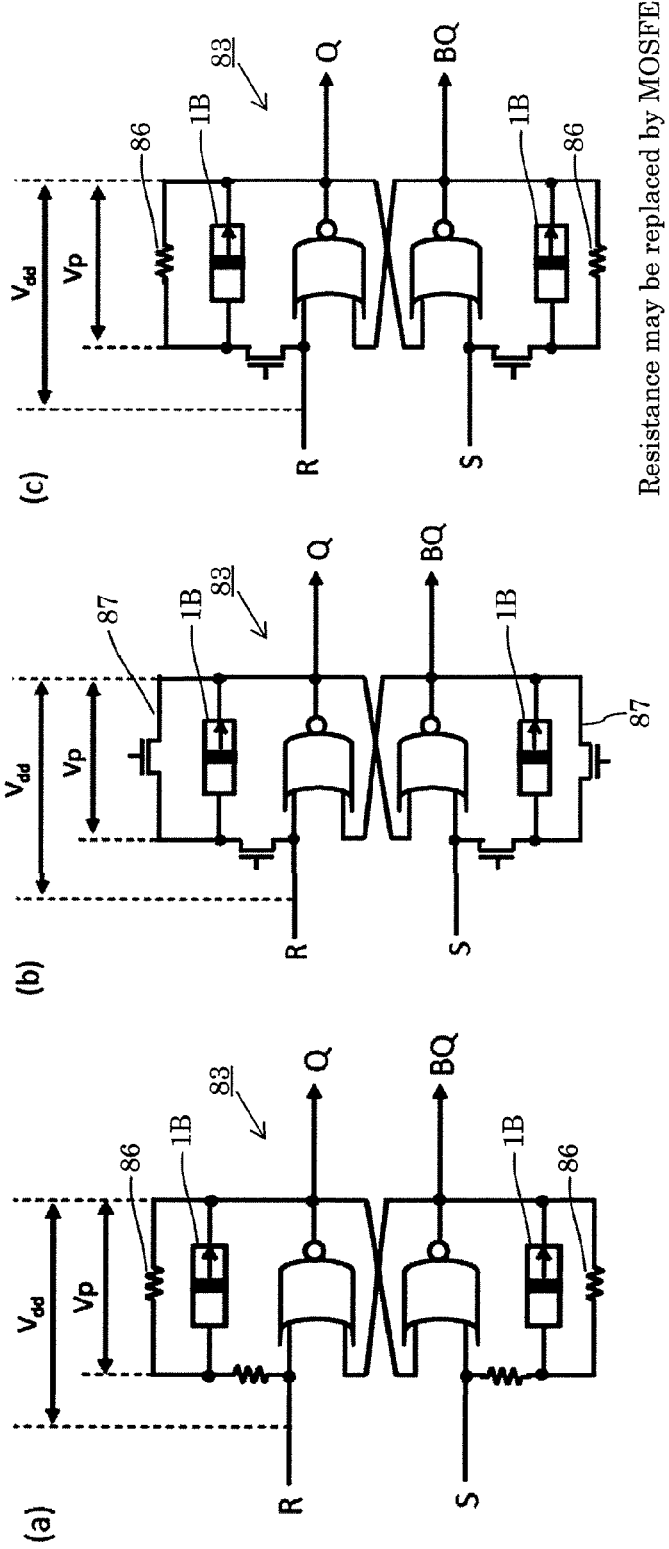
FIG. 60 shows circuits capable of adjusting the incubation time of the voltage-driven memory element in the NOR-type RS flip-flop circuit, where (a) shows a circuit using resistance, (b) shows a circuit using MOSFET, and (c) shows a circuit using resistance and MOSFET.

FIG. 60 shows circuits capable of adjusting the incubation time of the voltage-driven memory element 1B in the NOR-type RS flip-flop circuit 83, where (a) shows a circuit using the resistance 86, (b) shows a circuit using the MOSFET 87, and (c) shows a circuit using the resistance 86 and the MOSFET 87. In (c), the resistance 86 and the MOSFET 87 may be interchanged.

(Circuit for Preventing the Through-Current in Standby Mode)

Figure 61:
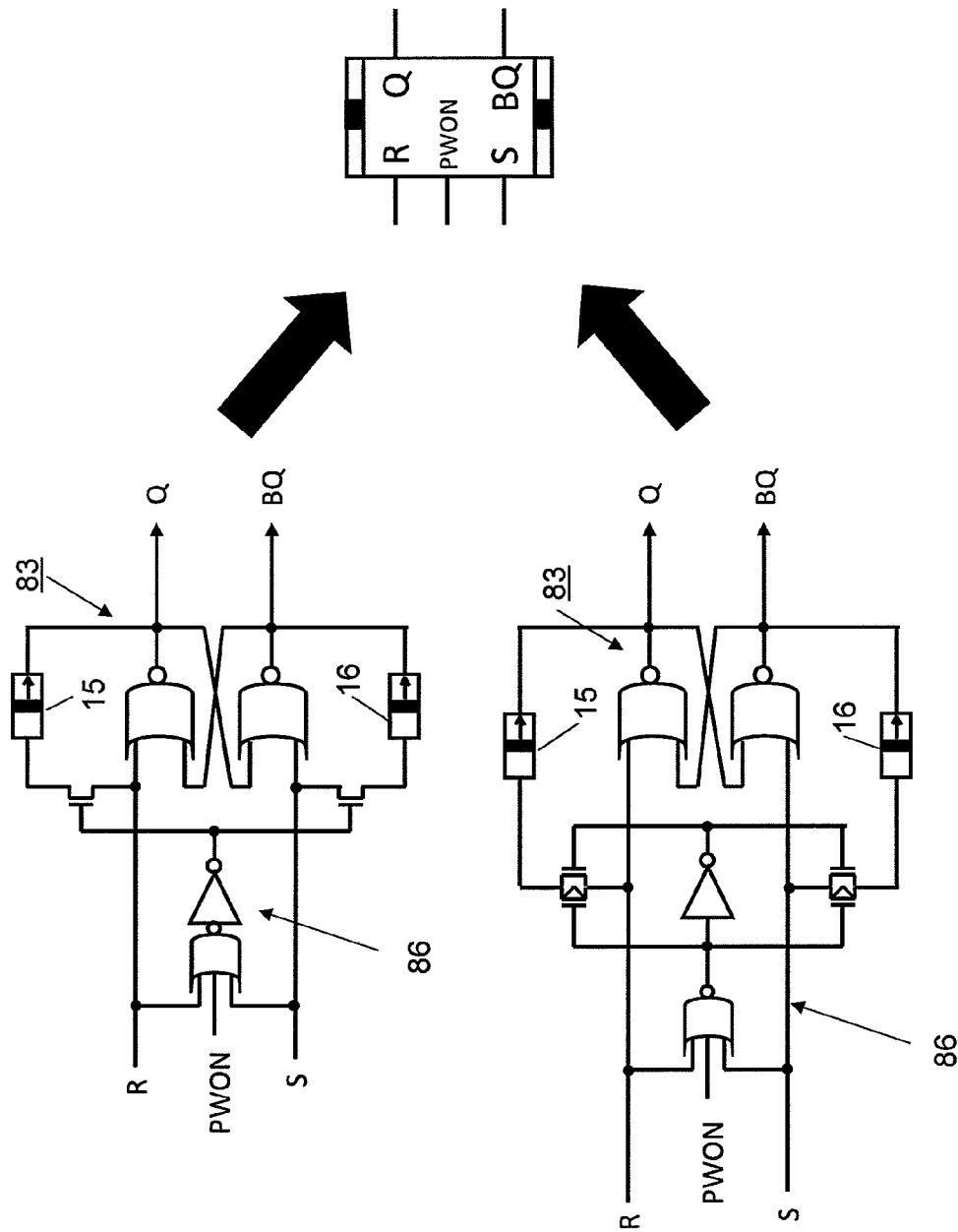
FIG. 61 shows circuits for preventing through-current that may occur while the memory element is in standby mode in NOR-type RS flip-flop circuit, where (a) shows a first circuit, and (b) shows a second circuit.

FIG. 61 shows circuits for preventing a through-current that may occur while the memory element 1B is in standby mode in the NOR-type RS flip-flop circuit 83, where (a) shows a first circuit, and (b) shows a second circuit. In FIG. 61, both circuits are provided with a circuit for preventing the through-current 88 at R, S terminals of the NOR-type RS flip-flop circuit 83 as shown in FIG. 55.

(Simulation)

Figure 62:
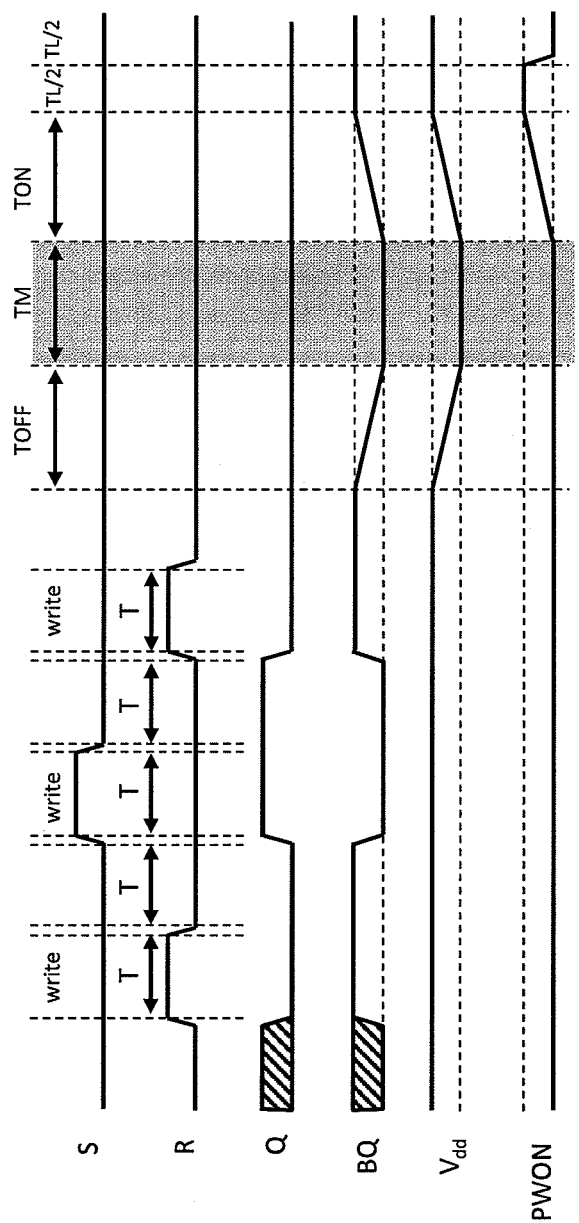
FIG. 62 is a chart showing the waveforms used to simulate the circuit for preventing through-current in standby mode by using MTJ devices in the circuit shown in FIG. 61 (b) as memory elements.
Figure 63:
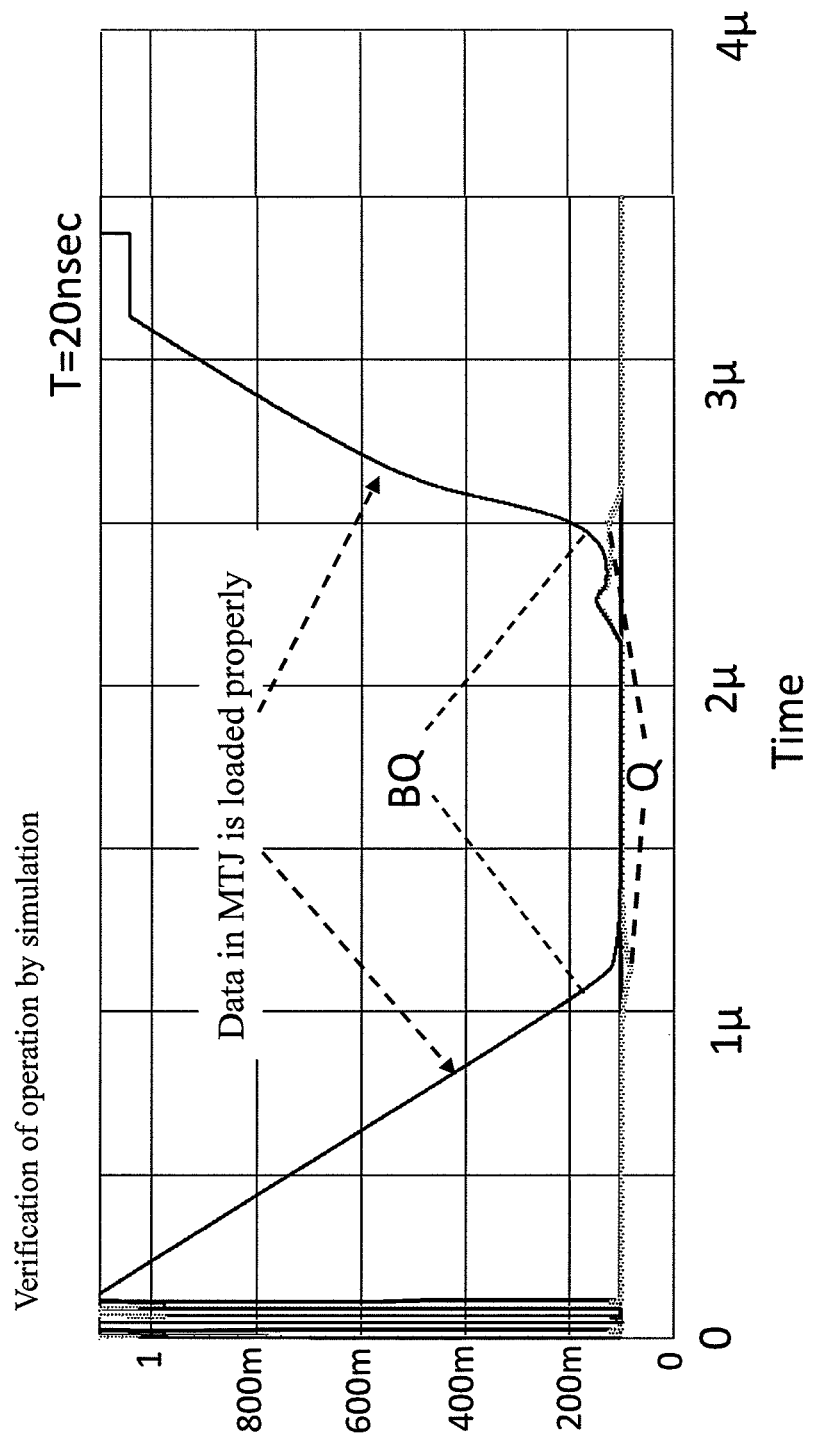
FIG. 63 is a chart showing simulation waveforms at the time of restoration of data when the waveform in FIG. 62 is input to the flip-flop circuit.
Figure 64:
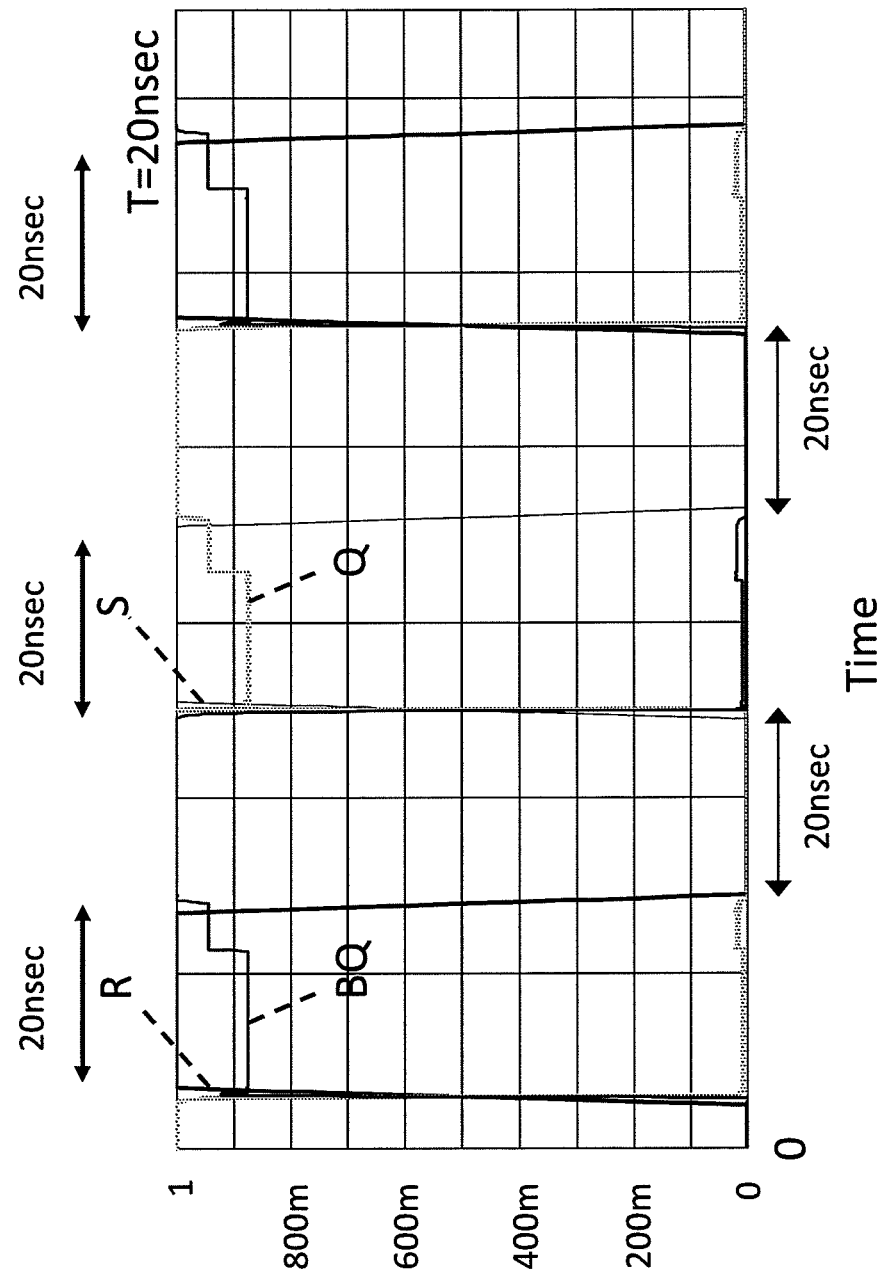
FIG. 64 is a chart showing the simulation waveforms obtained while the flip-flop circuit is in operation.
Figure 65:
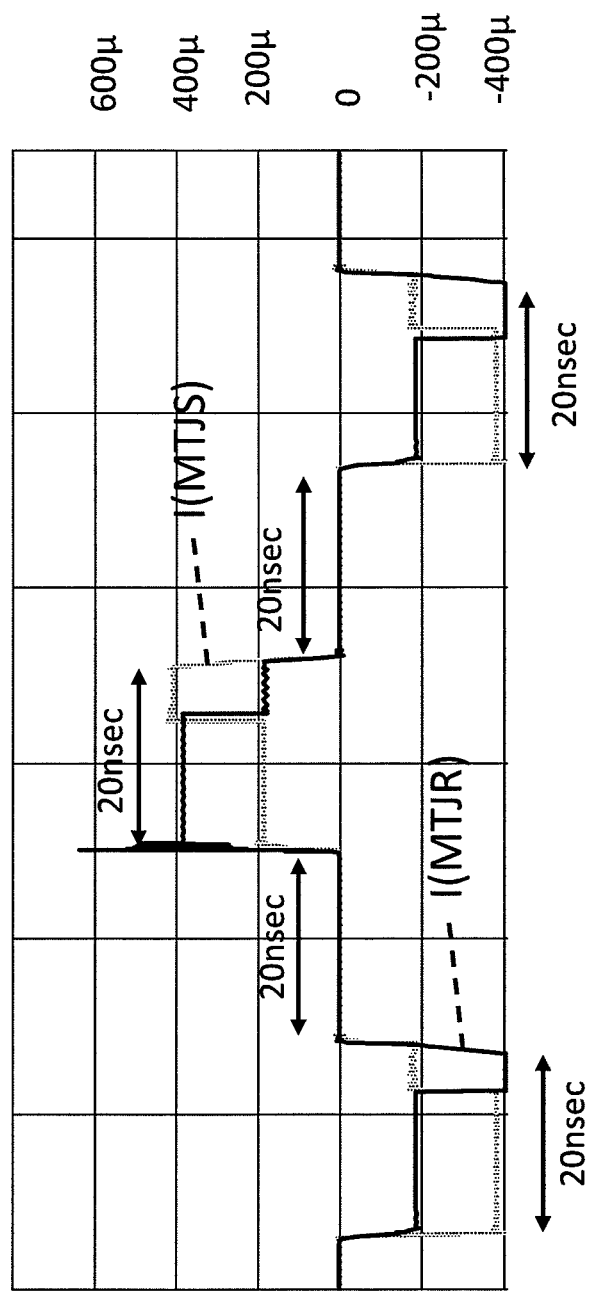
FIG. 65 is a chart showing the simulation waveforms of the current fed to the MTJ devices.

FIG. 62 is a chart showing the waveforms used to simulate the circuit for preventing the through-current in standby mode by using MTJ devices 15, 16 in the circuit shown in FIG. 61 (b) as memory elements, and FIGS. 63 to 65 are charts showing simulation waveforms.

FIG. 63 is the chart showing simulation waveforms at the time of restoration of the data when the waveform in FIG. 62 is input to the flip-flop circuit (FIG. 61 (b)). As shown in FIG. 63, since the data can be restored with the flip-flop circuit 83 even if the power is interrupted, the power can be turned off while the flip-flop circuit 83 is in standby mode, and thus the standby power can be made to be 0 (zero).

FIG. 64 is the chart showing the simulation waveforms obtained while the flip-flop circuit is in operation. It is obvious in FIG. 64 that the normal operation is ensured while the flip-flop circuit is in operation.

FIG. 65 is the chart showing the simulation waveforms of the current fed to the MTJ devices 15, 16. As shown in FIG. 65, while the MTJ devices 15, 16 are switched properly, R or S is at low level, and the data is not written into the MTJ devices 15, 16, the current passing through the MTJ devices 15, 16, namely the through-current in standby mode, is found to be 0.

(NOR-Type Flip-Flop Circuit Equipped with Auto Save Function)

Figure 66:
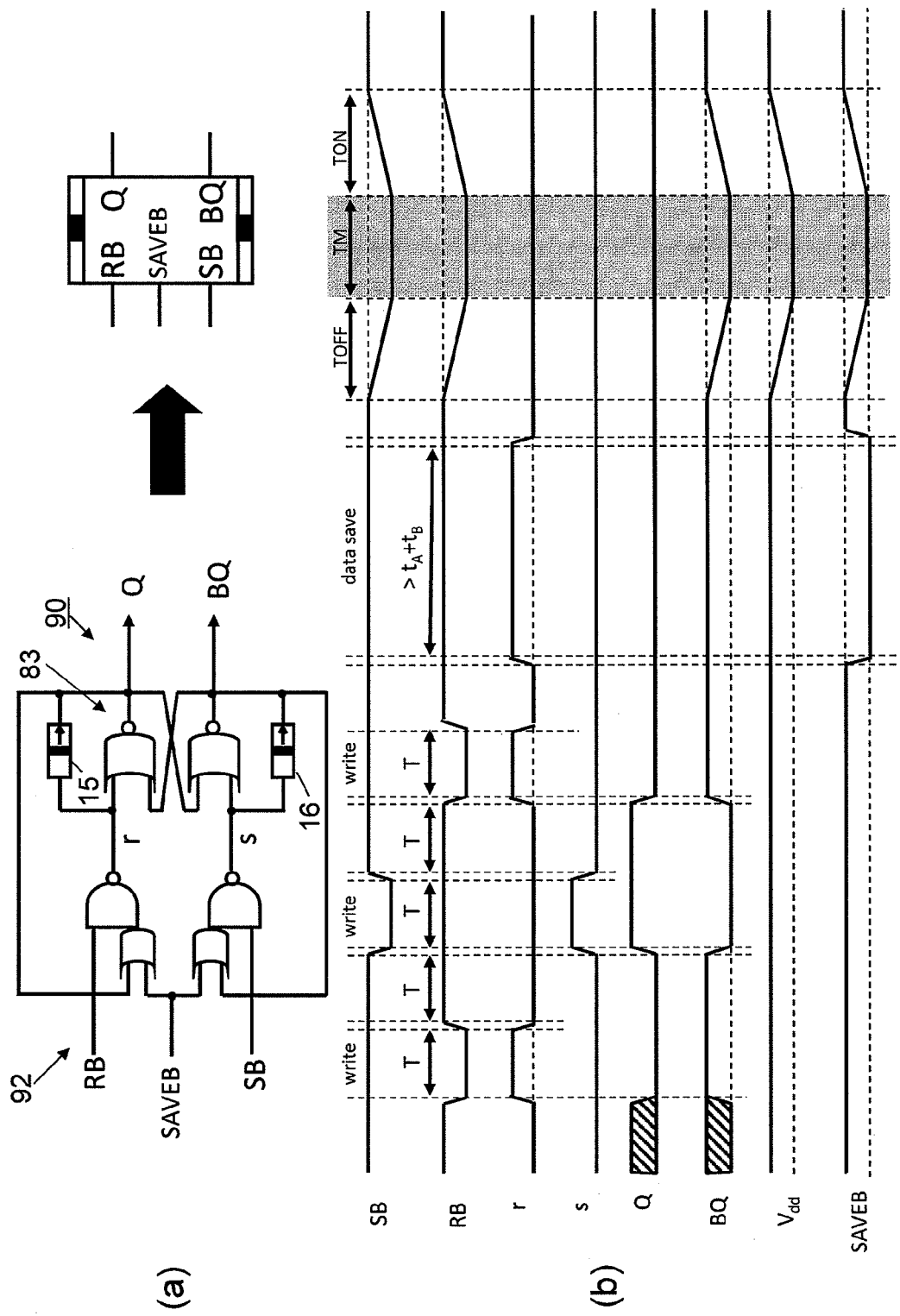
FIG. 66 shows RS flip-flop circuit equipped with auto save function, where (a) is a circuit diagram, and (b) shows typical drive waveforms.

FIG. 66 shows an RS flip-flop circuit 90 equipped with auto save function, where (a) is a circuit diagram, and (b) shows typical drive waveforms.

As shown in FIG. 66, a circuit 92 having auto save function is added to the input side of the NOR-type RS flip-flop circuit 83 in FIG. 55. Owing to this circuit, the data stored in the NOR-type RS flip-flop 83 in a volatile manner in the second operation mode is automatically written into the MTJ device pair 15, 16. Specifically, by giving a negative pulse longer than $t_A+t_B$ to the SAVEB signal before the power is interrupted as shown in FIG. 66 (b), the data is written into the MTJ device pair by the feedback of the BQ signal.

(RS Flip-Flop Circuit where MTJ Devices are Detached During Operation)

Figure 67:
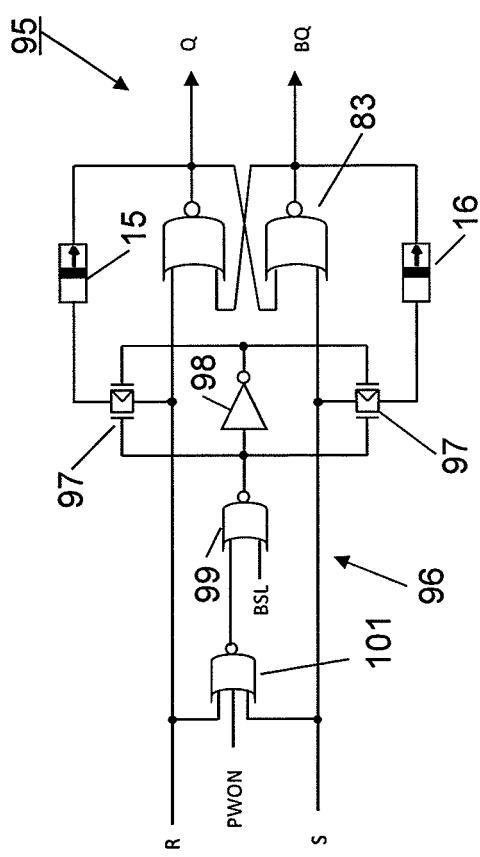
FIG. 67 is a circuit diagram of an RS flip-flop circuit where MTJ devices can be detached.

FIG. 67 is a circuit diagram of an RS flip-flop circuit 95 where MTJ devices can be detached. As shown in FIG. 67, a circuit 96, from which the MTJ devices can be detached, is added to the NOR-type RS flip-flop circuit 83 as shown in FIG. 55. The circuit 96, from which the MTJ devices can be detached, includes: a switch 97 connected to the MTJ devices 15, 16; an inverter 98 connected to this switch 97; a 2-input OR 99 connected to this inverter 98; and a 3-input OR 101 connected to this 2-input OR 99. To the input of the 2-input OR 99, the BSL signal is applied to the input of the 2-input OR 99. The R signal, the S signal, and the PWON signal are applied to the inputs of the 3-input OR 101.

Next, the operation of the above circuit will be described.

(1) In the Normal Mode

In the normal mode, the PWON signal is at the low level, and the BSL signal is at the high level. In this case, since the MTJ devices 15, 16 are detached from the input terminals R, S, the write into the MTJ devices 15, 16 is prohibited, and the circuit operates as the RS flip-flop circuit 83 made of the CMOS only.

(2) Immediately Before the Power is Turned Off

In the normal mode, the PWON signal is at the low level, and the BSL signal is at the low level. In this case, the MTJ devices 15, 16 are connected to the input terminals R, S by the positive pulse of either R or S, and the data is written into the MTJ devices 15, 16. Immediately before the power is turned off, the BSL becomes low, and at the same time, the positive pulse of R or S long enough to be written into the MTJ devices 15, 16 is input.

(3) When the Power is Turned On

When the power is turned on, the PWON signal is at the high level, and the BSL signal is at the low level. In this case, both R and S are at the low level, but the MTJ devices 15, 16 are connected to R and S because the PWON signal is at the high level, and the state stored in the MTJ devices 15, 16 is loaded to the RS flip-flop circuit.

Figure 68:
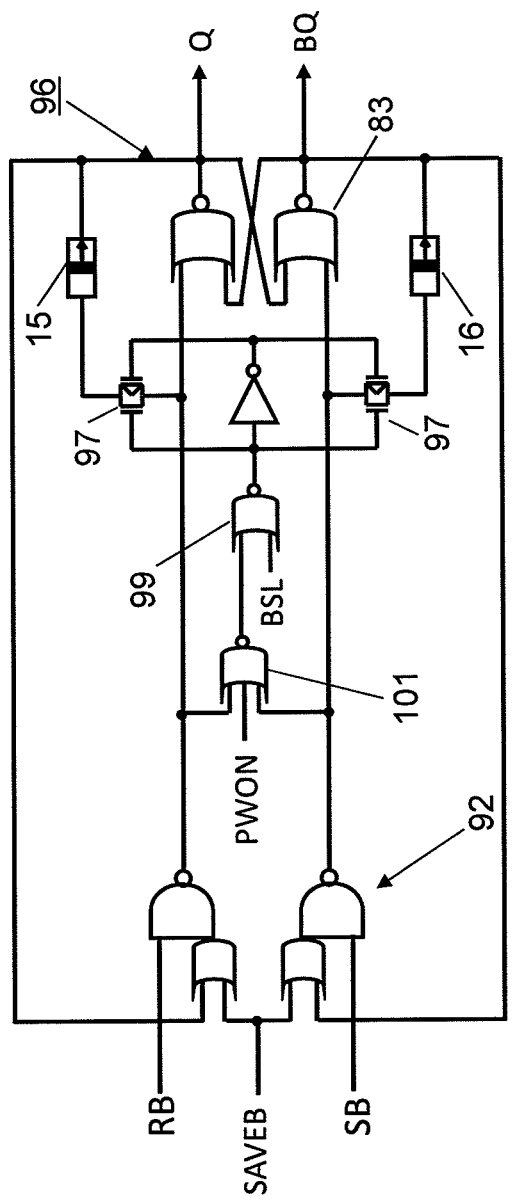
FIG. 68 is a circuit diagram of a RS flip-flop circuit equipped with auto save function.

FIG. 68 is a circuit diagram equipped with auto save function to the nonvolatile RS flip-flop circuit 95 as shown in FIG. 67. As shown in FIG. 68, the circuit having the auto save function 92 as same as in FIG. 66 is added to the input side of the RS flip-flop circuit of the nonvolatile RS flip-flop circuit 95 as shown in FIG. 67.

Figure 69:
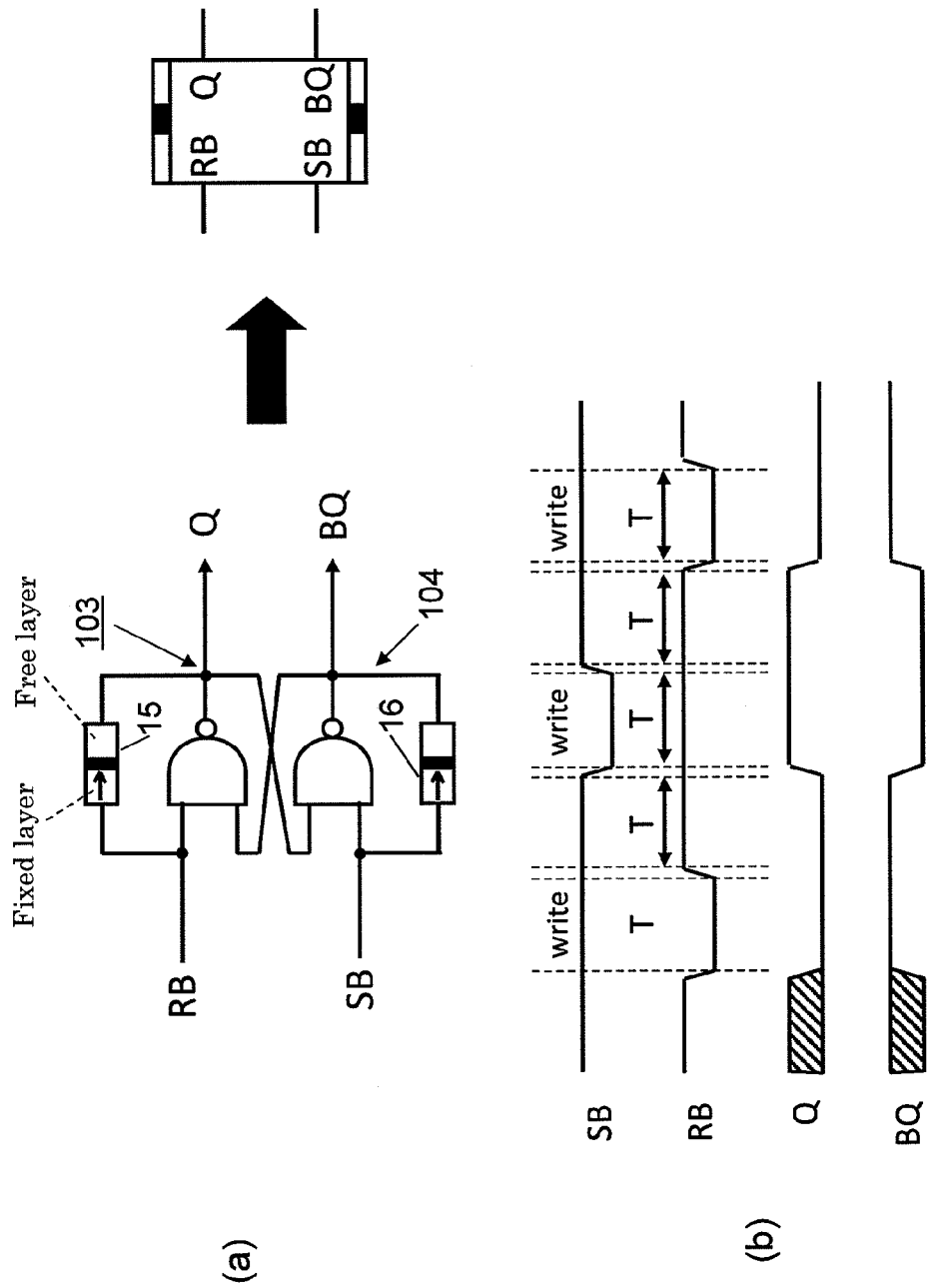
FIG. 69 shows NAND-type RS flip-flop circuit according to the third embodiment of the present invention, where (a) is a circuit diagram, and (b) shows typical drive waveforms.

FIG. 69 shows a NAND-type RS flip-flop circuit according to the third embodiment of the present invention, where (a) is a circuit diagram, and (b) shows typical drive waveforms.

As shown in FIG. 69, in the NAND-type RS flip-flop circuit 103, the first MTJ device 15 is connected in parallel to the R terminal and the Q terminal of the conventional NAND-type RS flip-flop circuit 104.

The second MTJ device 16 is connected in parallel to the S terminal and the BQ terminal of the NAND-type RS flip-flop circuit. In both of the first MTJ device 15 and the second MTJ device 16, the fixed layers are connected to the input sides. These connections are reverse to the NOR-type RS flip-flop circuit 83. According to these connections, when the power supply is turned on again, the exact data is reloaded to the NAND-type RS flip-flop circuit 103.

Modification Example of NAND-Type Flip-Flop Circuit

Figure 70:
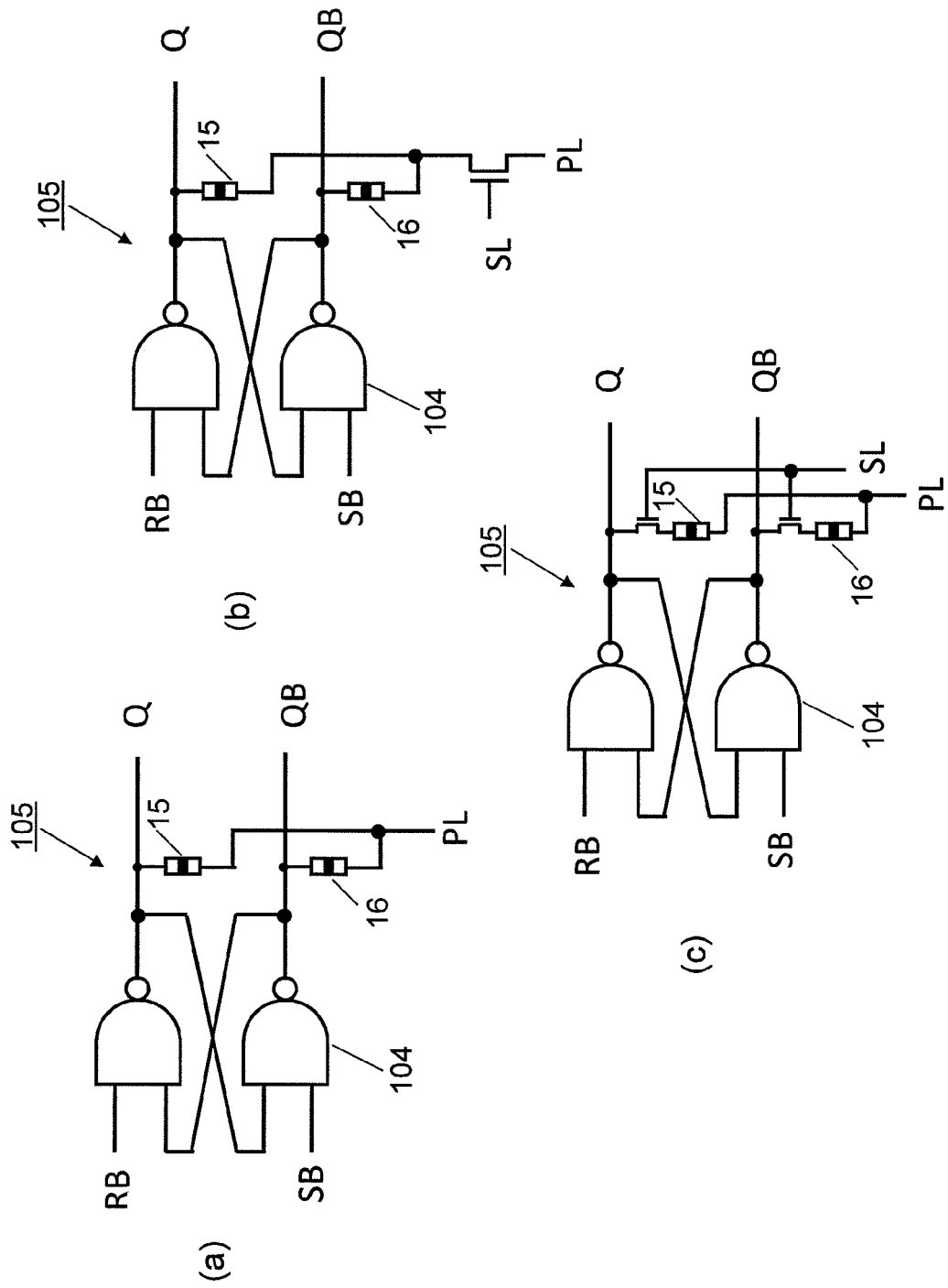
FIG. 70 shows the NAND-type flip-flop circuit according to the modification example of the present invention, where (a) is a first circuit, and (b) is a second circuit, and (c) is a third circuit.

FIG. 70 shows NAND-type flip-flop circuits according to the modification example of the present invention, where (a) is a first circuit, (b) is a second circuit, and (c) is a third circuit.

In every case of FIG. 70 (a) to (c), a NAND-type RS flip-flop circuit 105 has a structure with respect to the NAND-type RS flip-flop circuit 103 in FIG. 69 so that the first MTJ device 15 is connected in series to the Q terminal and the second MTJ device 16 is connected in series to the QB terminal. In both of the first MTJ device 15 and the second MTJ device 16, the fixed layers are connected to the output sides. The both free layers of the first MTJ device 15 and the second MTJ device 16 are connected to the PL signal.

(NAND-Type RS Flip-Flop Circuit Equipped with Auto Save Function)

Figure 71B:
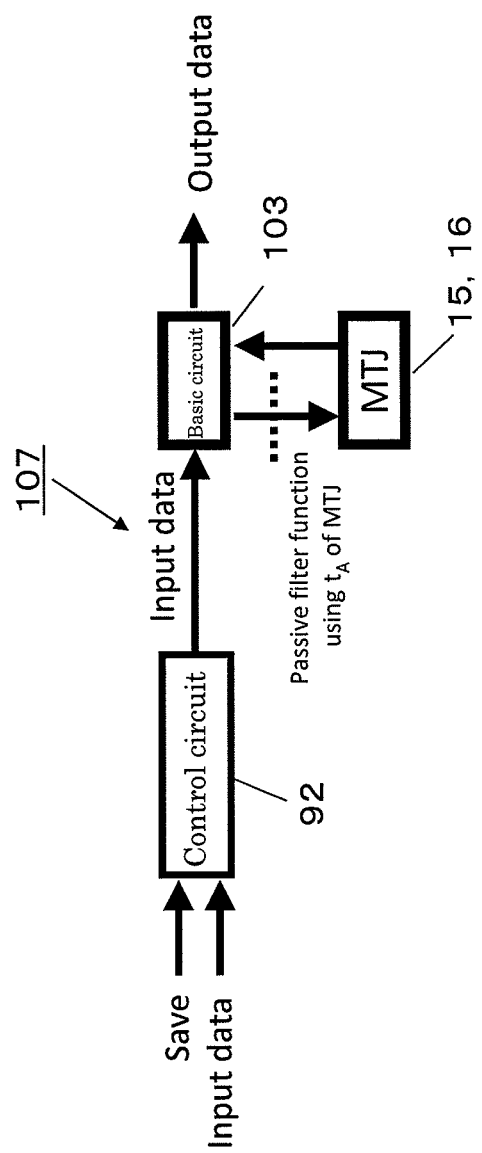
FIG. 71B is a block diagram describing the function of the NAND-type RS flip-flop circuit equipped with auto save function.

FIG. 71A is a circuit diagram of a NAND-type RS flip-flop circuit 107 equipped with auto save function, and FIG. 71B is a block diagram describing the function of the NAND-type RS flip-flop circuit 107 equipped with auto save function. As shown in FIG. 71A, to the input side of the NAND-type RS flip-flop circuit 103 in FIG. 69, the circuit 92 having auto save function is added just like the circuit as shown in FIG. 66. As shown in FIG. 71B, the circuit 92 having auto save function is the control circuit to which an input data and a Save signal to save are input. The circuit 92 outputs the input data to the NAND-type RS flip-flop circuit, which includes the basic circuit and MTJ devices 15, 16. In the NAND-type RS flip-flop circuit 107 equipped with auto save function, the structural change in the basic circuit and the MTJ devices is unnecessary by the use of the Save signal. So, the size of the control circuit is small. The power consumption of the control circuit is thus extremely low. Consequently, according to the NAND-type RS flip-flop circuit 107 equipped with auto save function of the present invention, it is possible that the circuit size of the control circuit and the power consumption can be much lower than those of the integrated circuit as shown in FIG. 134.

(D Latch)

Figure 72:
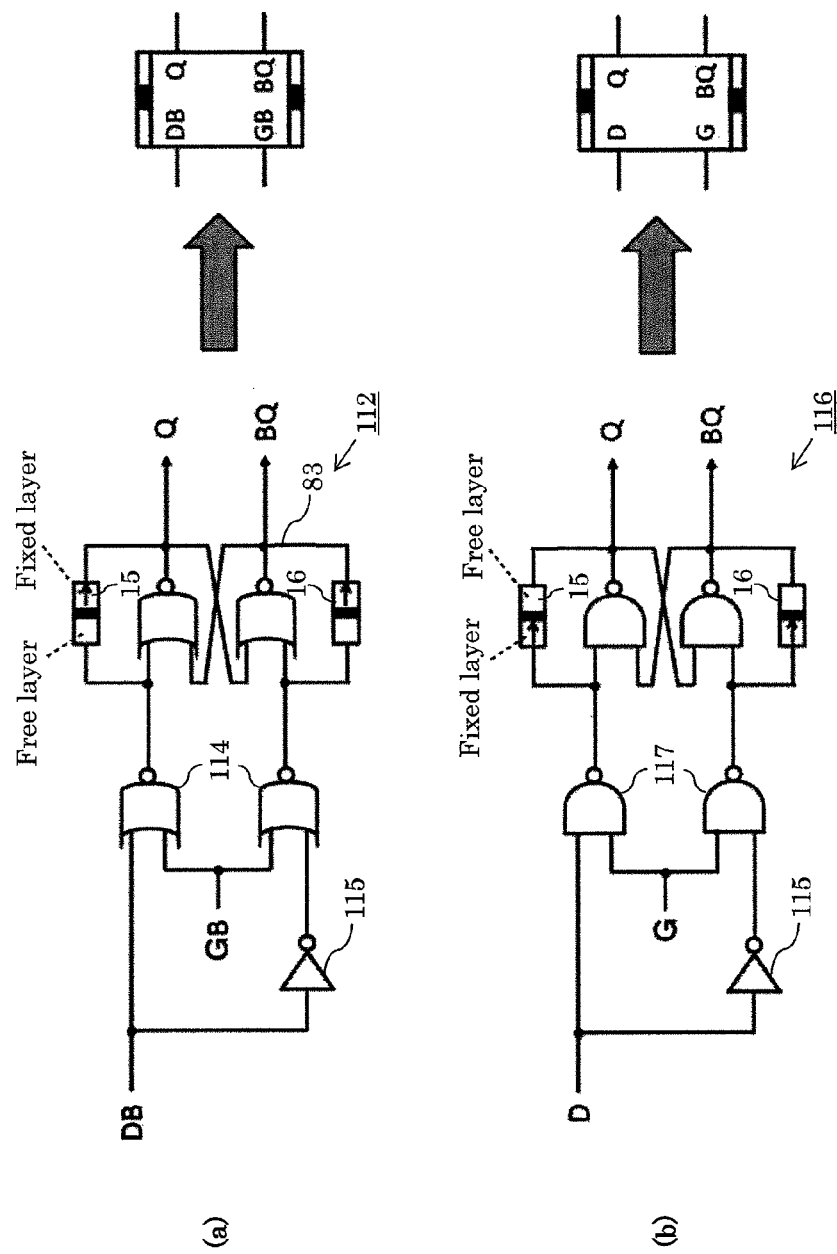
FIG. 72 shows D latch circuits, where (a) is a NOR-type circuit diagram, and (b) is a NAND-type circuit diagram.

FIG. 72 shows D latch circuits, where (a) is a NOR-type circuit diagram, and (b) is a NAND-type circuit diagram.

As shown in FIG. 72 (a), in the NOR-type D latch 112, two NORs 114 and an inverter 115 are added to the input side of the NOR-type RS flip-flop circuit 83 as shown in FIG. 55. As shown in FIG. 72 (b), in the NAND-type D latch 116, two ANDs 117 and the inverter 115 are added to the input side of the NAND-type RS flip-flop circuit 103 as shown in FIG. 69.

(D Latch Equipped with Auto Save Function)

Figure 73:
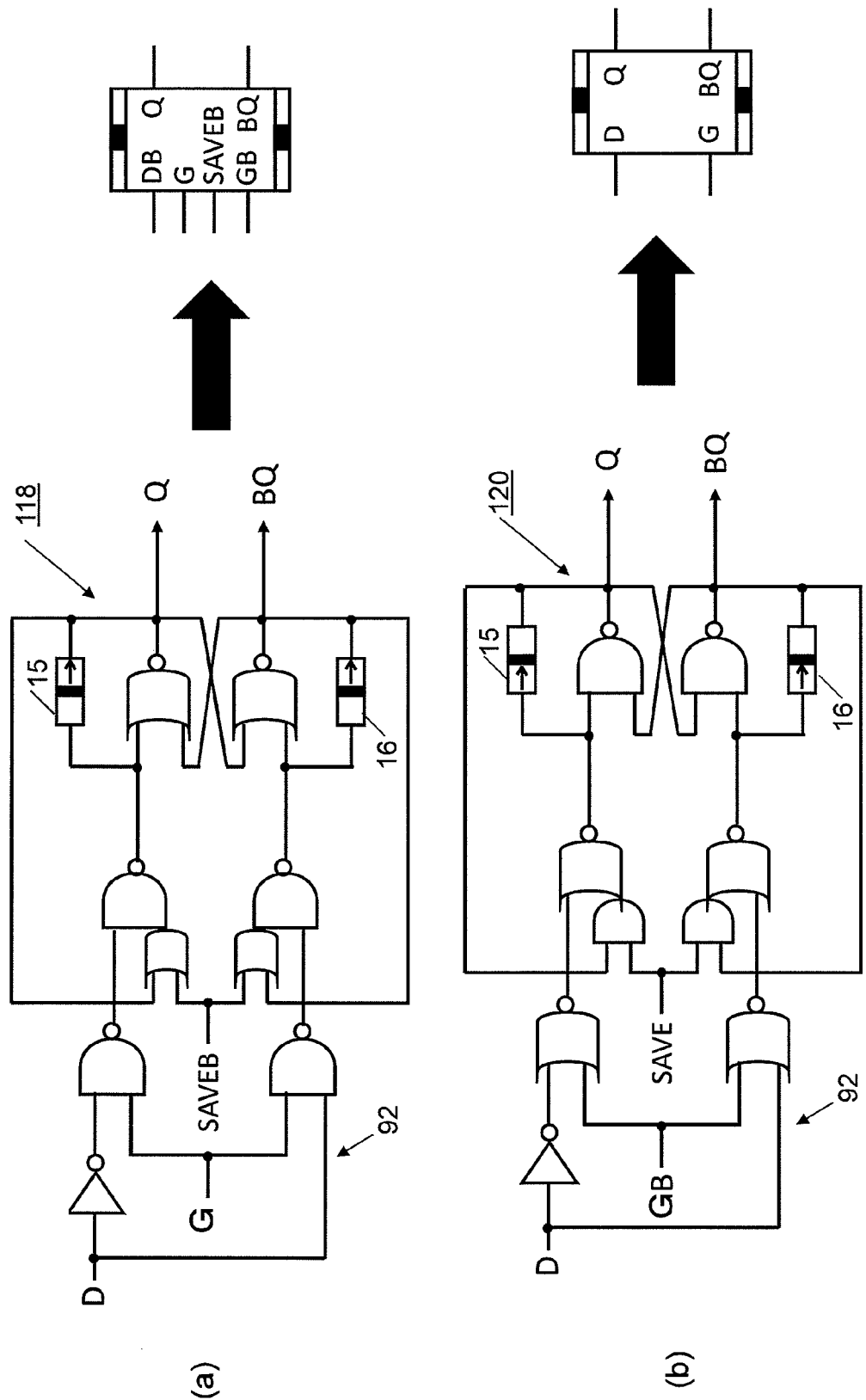
FIG. 73 shows D latch circuits equipped with auto save function, where (a) is a NOR-type circuit diagram, and (b) is a NAND-type circuit diagram.

FIG. 73 shows D latch circuits equipped with auto save function, where (a) is a NOR-type circuit diagram, and (b) is a NAND-type circuit diagram.

As shown in FIG. 73 (a), in the NOR-type D latch 118 equipped with auto save function, the circuit 92 having auto save function in FIG. 66 is added to the input side of the NOR-type D latch 112 as shown in FIG. 72 (a). As shown in FIG. 73 (b), in the NAND-type D latch 120 equipped with auto save function, the circuit 92 having auto save function as shown in FIG. 66 is added to the input side of the NAND-type D latch 116 as shown in FIG. 72 (b).

(D Flip-Flop Circuit)

Figure 74:
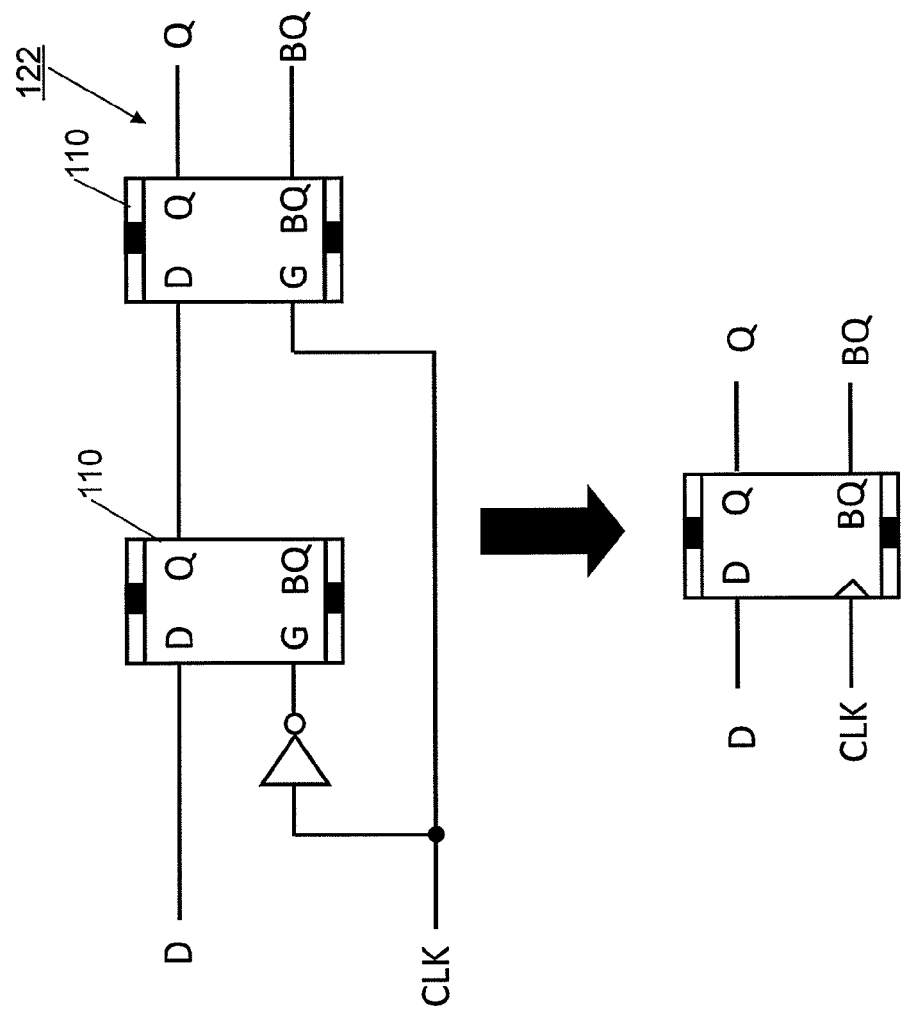
FIG. 74 is a circuit diagram of D flip-flop circuit.

FIG. 74 is a circuit diagram of a D flip-flop circuit 122. As shown in FIG. 74, the D flip-flop circuit has a structure wherein two D latches 110 are connected in cascade. The nonvolatile D flip-flop circuit 122 is constructed by providing the memory element 1B not shown in one D latch 110 or both of the D latches 110.

(Modification of D Flip-Flop Circuit)

Figure 75:
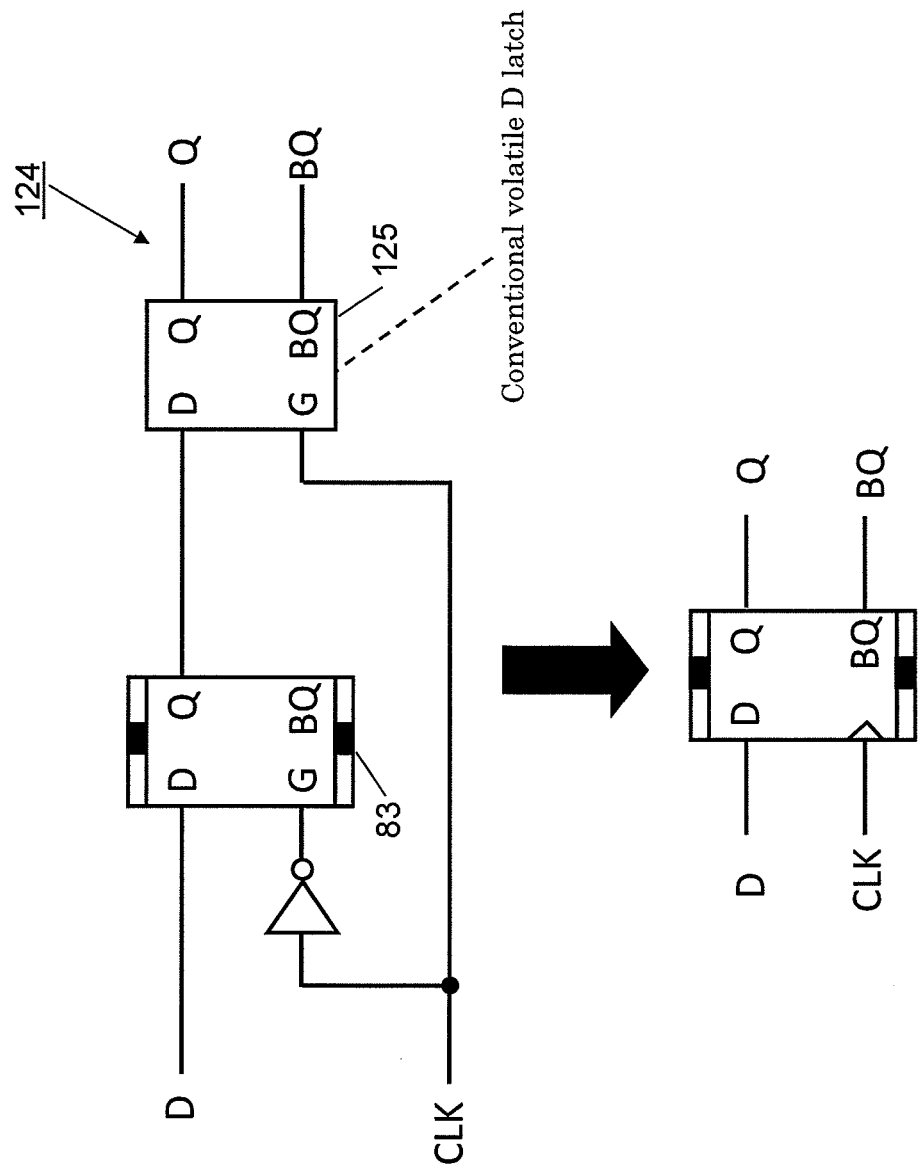
FIG. 75 is an example of circuit diagram of D flip-flop circuit.

FIG. 75 is an example of circuit diagram of a D flip-flop circuit 124. As shown in FIG. 75, the D flip-flop circuit has a structure where the left side is the D latch 83 and the right side is a conventional volatile D latch 125. This circuit is suitable to an integrated circuit or an integrated circuit system in which the power turns on at the high level of the CLK signal.

(Modification of D Flip-Flop Circuit)

Figure 76:
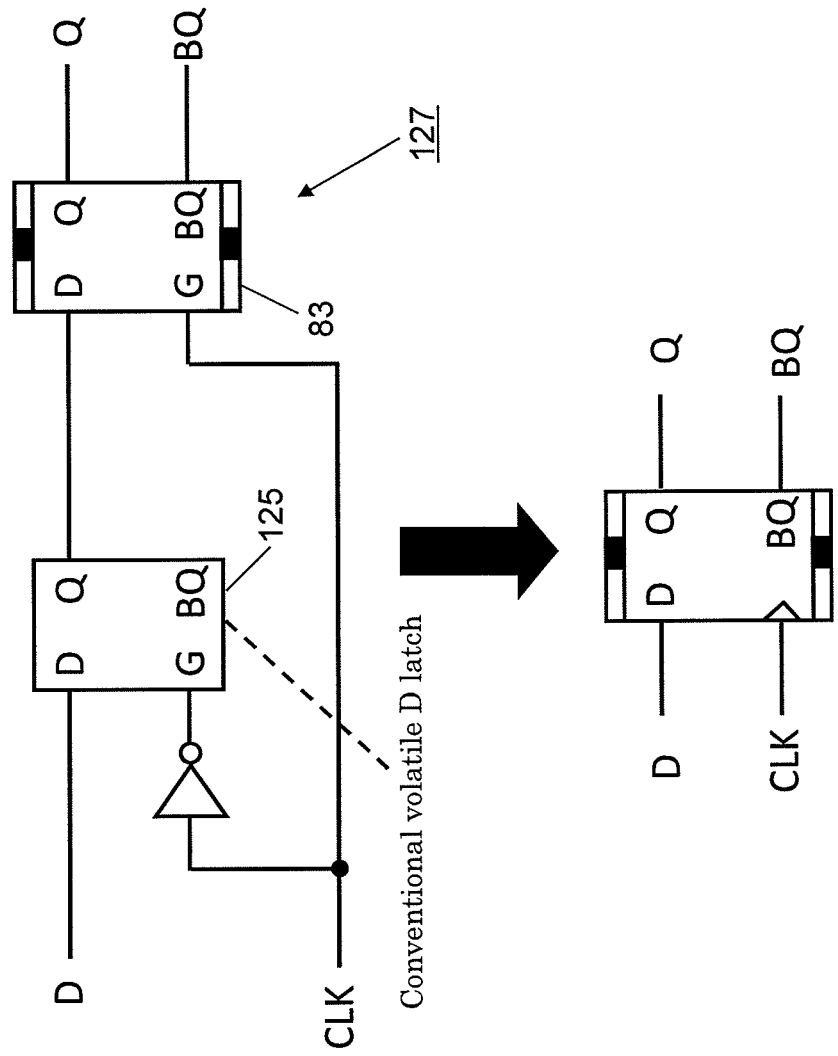
FIG. 76 is another example of circuit diagram of D flip-flop circuit.

FIG. 76 is another example of circuit diagram of a D flip-flop circuit 127. As shown in FIG. 76, the D flip-flop circuit 127 has a structure where the left side is the conventional volatile D latch 125 and the right side is the D latch 83. This circuit is suitable to an integrated circuit or an integrated circuit system in which the power turns on at the low level of the CLK signal.

(T Flip-Flop Circuit)

Figure 77:
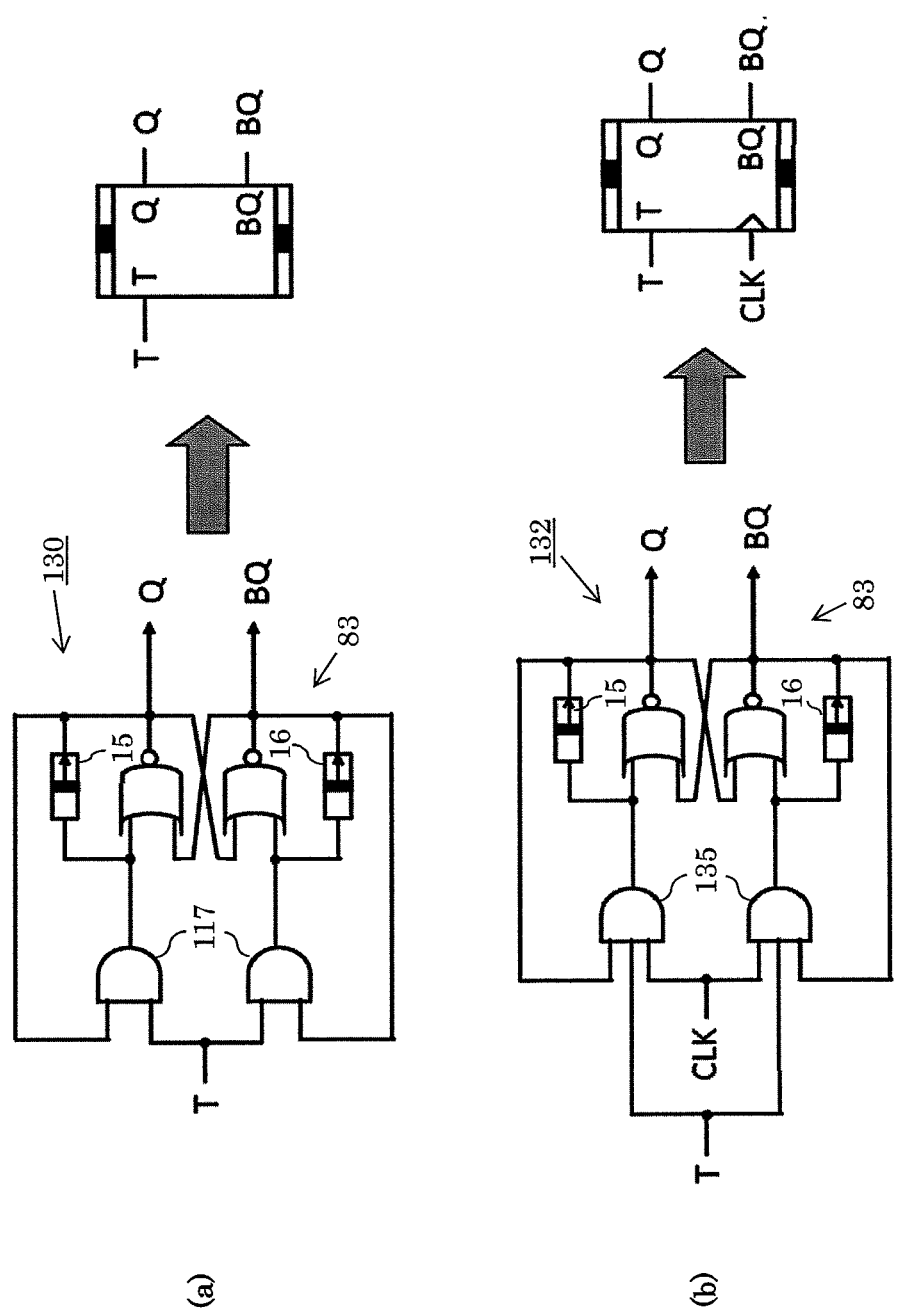
FIG. 77 shows T flip-flop circuits, where (a) is an asynchronous-type circuit diagram, and (b) is a synchronous-type circuit diagram.

FIG. 77 shows T flip-flop circuits, where (a) is an asynchronous-type circuit diagram, and (b) is a synchronous-type circuit diagram.

As shown in FIG. 77(a), an asynchronous-type T flip-flop circuit 130 has a structure where the 2-input AND 117 is inserted to each input of the NOR-type RS flip-flop circuit 83 of FIG. 55. The input is the T signal. As shown in FIG. 77(b), a synchronous-type T flip-flop circuit 132 has a structure where a 3-input AND 135 is inserted to each input of the NOR-type RS flip-flop circuit 83 of FIG. 55. The inputs are the T signal and the CLK signal.

(Modification of T Flip-Flop Circuit)

Figure 78:
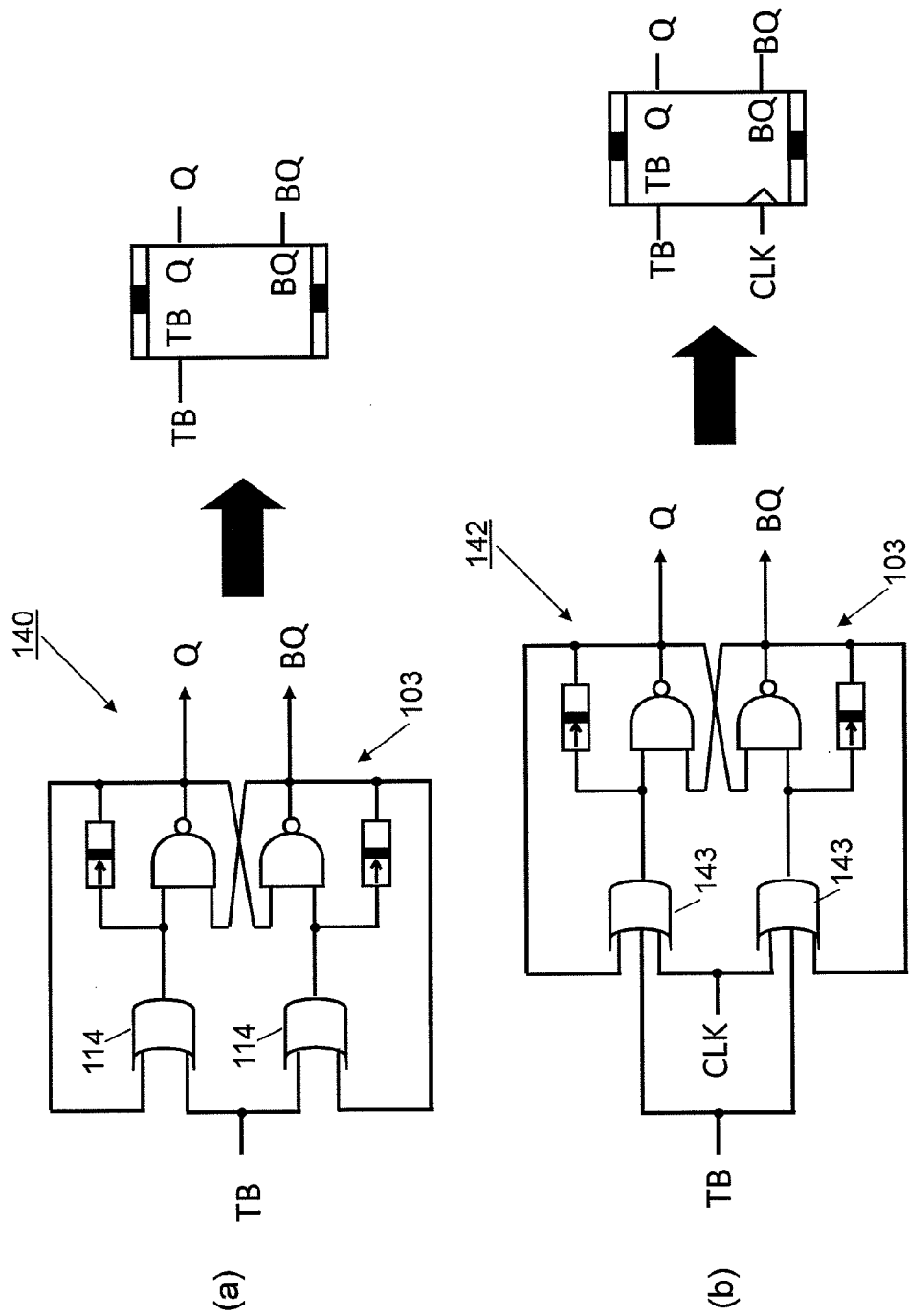
FIG. 78 shows modification of T flip-flop circuits, where (a) is an asynchronous-type circuit diagram, and (b) is a synchronous-type circuit diagram.

FIG. 78 shows the modification of T flip-flop circuits, where (a) is an asynchronous-type circuit diagram, and (b) is a synchronous-type circuit diagram. As shown in FIG. 78(a), an asynchronous-type T flip-flop circuit 140 has a structure where the 2-input OR 114 is inserted to each input of the NAND-type RS flip-flop circuit 103 of FIG. 69. The input is the TB signal. As shown in FIG. 78(b), a synchronous-type T flip-flop circuit 142 has a structure where a 3-input OR 143 is inserted to each input of the NAND-type RS flip-flop circuit 103 of FIG. 69. The inputs are the TB signal and the CLK signal.

(T Flip-Flop Circuit Equipped with Auto Save Function)

The auto save function can be provided to anyone of nonvolatile T flip-flop circuits described above.

Figure 79:
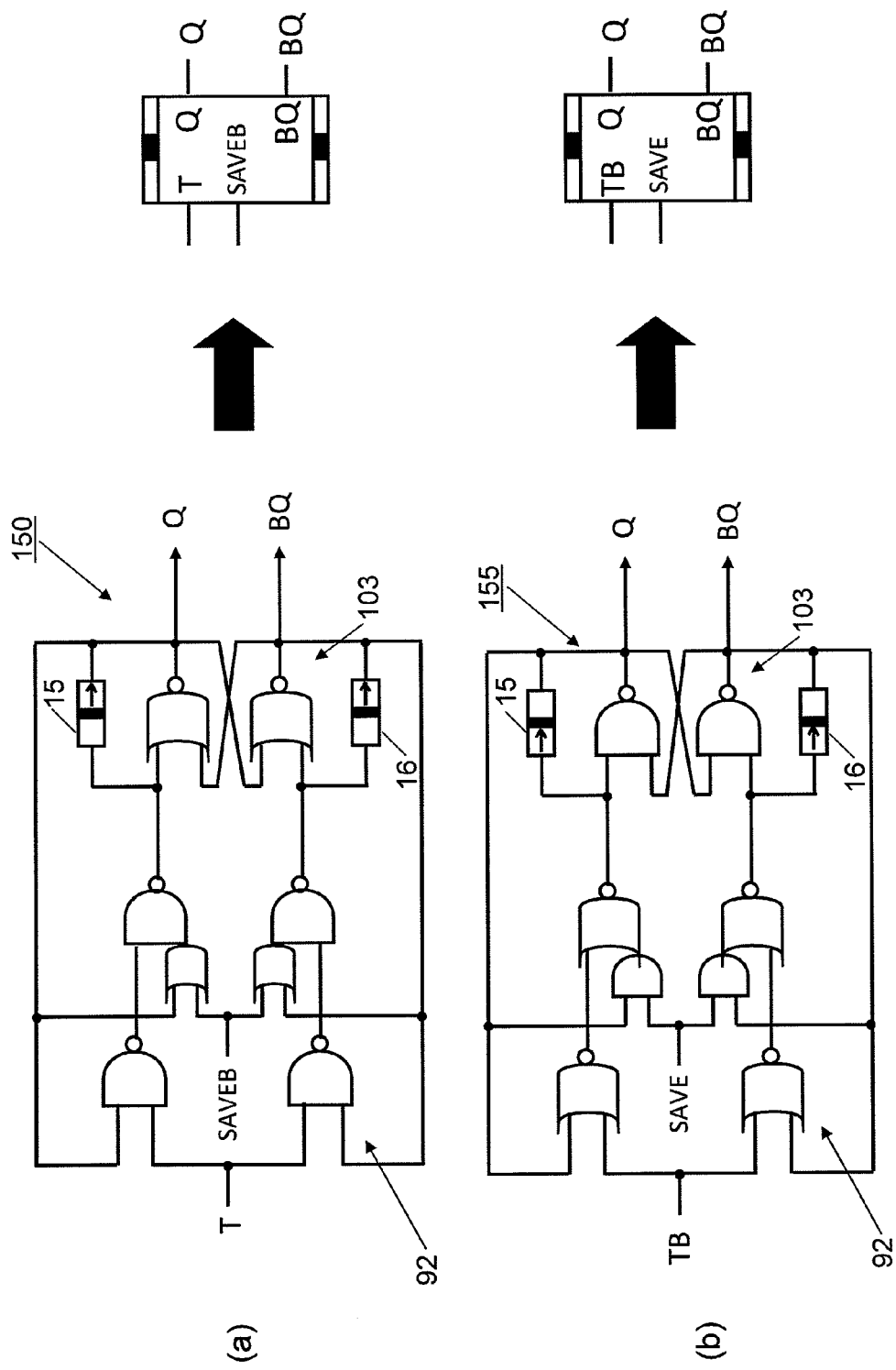
FIG. 79 shows T flip-flop circuits equipped with auto save function, where (a) is a NOR-type circuit diagram, and (b) is a NAND-type circuit diagram.

FIG. 79 shows T flip-flop circuits equipped with auto save function, where (a) is a NOR-type circuit diagram, and (b) is a NAND-type circuit diagram.

As shown in FIG. 79(a), a NOR-type T flip-flop circuit equipped with auto save function 150 has a structure where the circuit having auto save function 92 as same as the circuit of FIG. 66 is inserted to the input side of the T flip-flop circuit 130 of FIG. 77(a). As shown in FIG. 79(b), a NAND-type T flip-flop circuit equipped with auto save function 155 has a structure where the circuit having auto save function 92 as same as the circuit of FIG. 66 is inserted to the input side of the T flip-flop circuit of FIG. 77(b). These circuits are the asynchronous-type. However, the circuit having auto save function can be added to the synchronous-type T flip-flop circuit.

(NOR-Type JK Flip-Flop Circuit)

Figure 80:
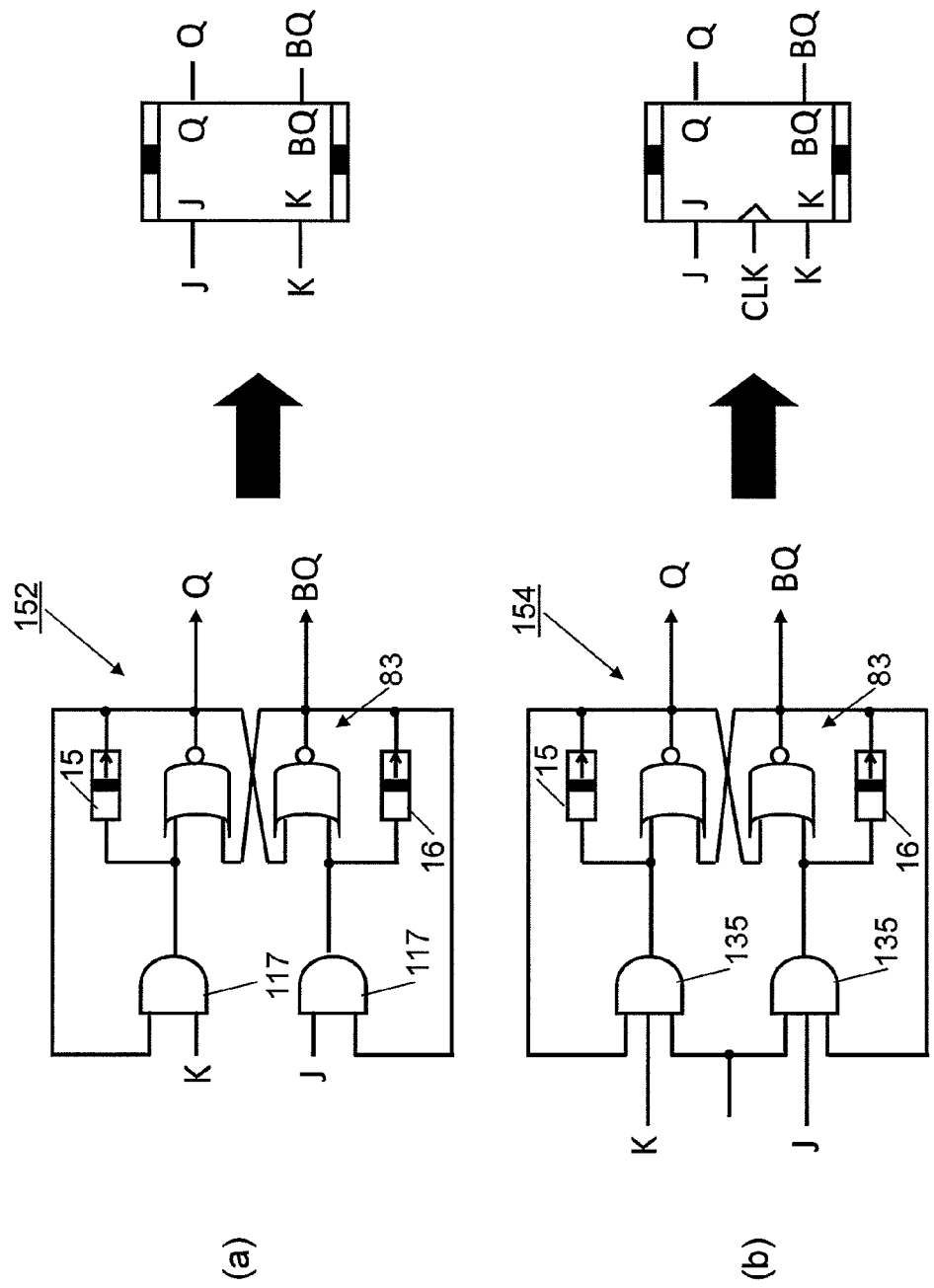
FIG. 80 shows NOR-type JK flip-flop circuits, where (a) is an asynchronous-type circuit diagram, and (b) is a synchronous-type circuit diagram.

FIG. 80 shows NOR-type JK flip-flop circuits, where (a) is an asynchronous-type circuit diagram, and (b) is a synchronous-type circuit diagram.

As shown in FIG. 80(a), an asynchronous-type NOR-type JK flip-flop circuit 152 has a structure where the 2-input AND 117 is inserted to each input of the NOR-type RS flip-flop circuit 83 of FIG. 55. The inputs are the J signal and K signal. As shown in FIG. 80(b), a synchronous-type NOR-type JK flip-flop circuit 154 has a structure where the 3-input AND 135 is inserted to each input of the NOR-type RS flip-flop circuit 83 of FIG. 55. The inputs are the J signal, the K signal and the CLK signal.

(NAND-Type JK Flip-Flop Circuit)

Figure 81:
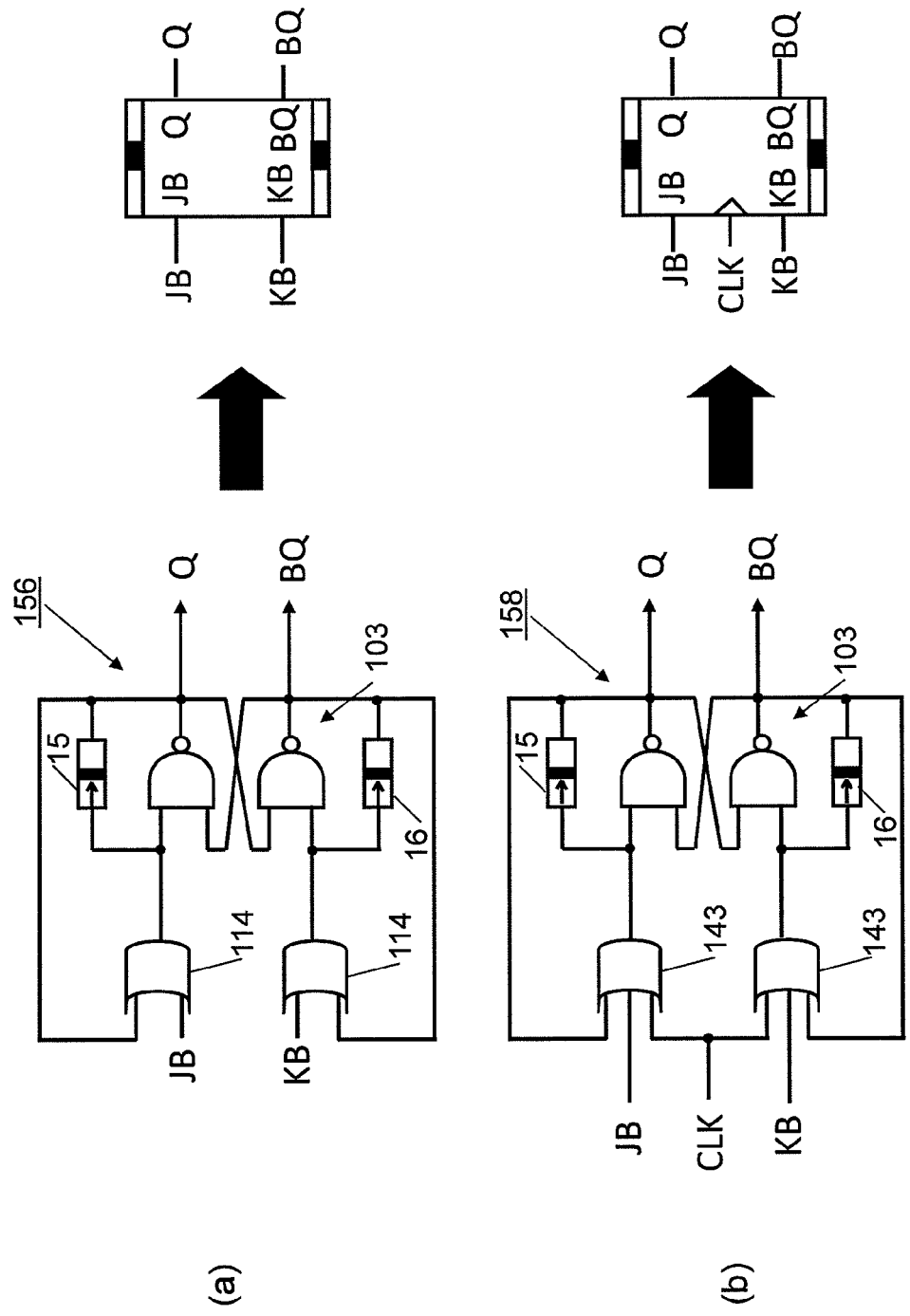
FIG. 81 shows NAND-type JK flip-flop circuits, where (a) is an asynchronous-type circuit diagram, and (b) is a synchronous-type circuit diagram.

FIG. 81 shows NAND-type JK flip-flop circuits, where (a) is an asynchronous-type circuit diagram, and (b) is a synchronous-type circuit diagram. As shown in FIG. 81(a), an asynchronous-type NAND-type JK flip-flop circuit 156 has a structure where the 2 inputs OR 114 is inserted to each input of the NAND-type RS flip-flop circuit 103 of FIG. 69. The inputs are the JB signal and the KB signal. As shown in FIG. 81 (*b*), a synchronous-type NAND-type JK flip-flop circuit 158 has a structure where the 3 inputs OR 143 is inserted to each input of the NAND-type RS flip-flop circuit of FIG. 69. The inputs are the JB signal, the KB signal and the CLK signal.

(JK Flip-Flop Circuit Equipped with Auto Save Function)

The auto save function can be provided to anyone of JK flip-flop circuits described above.

Figure 82:
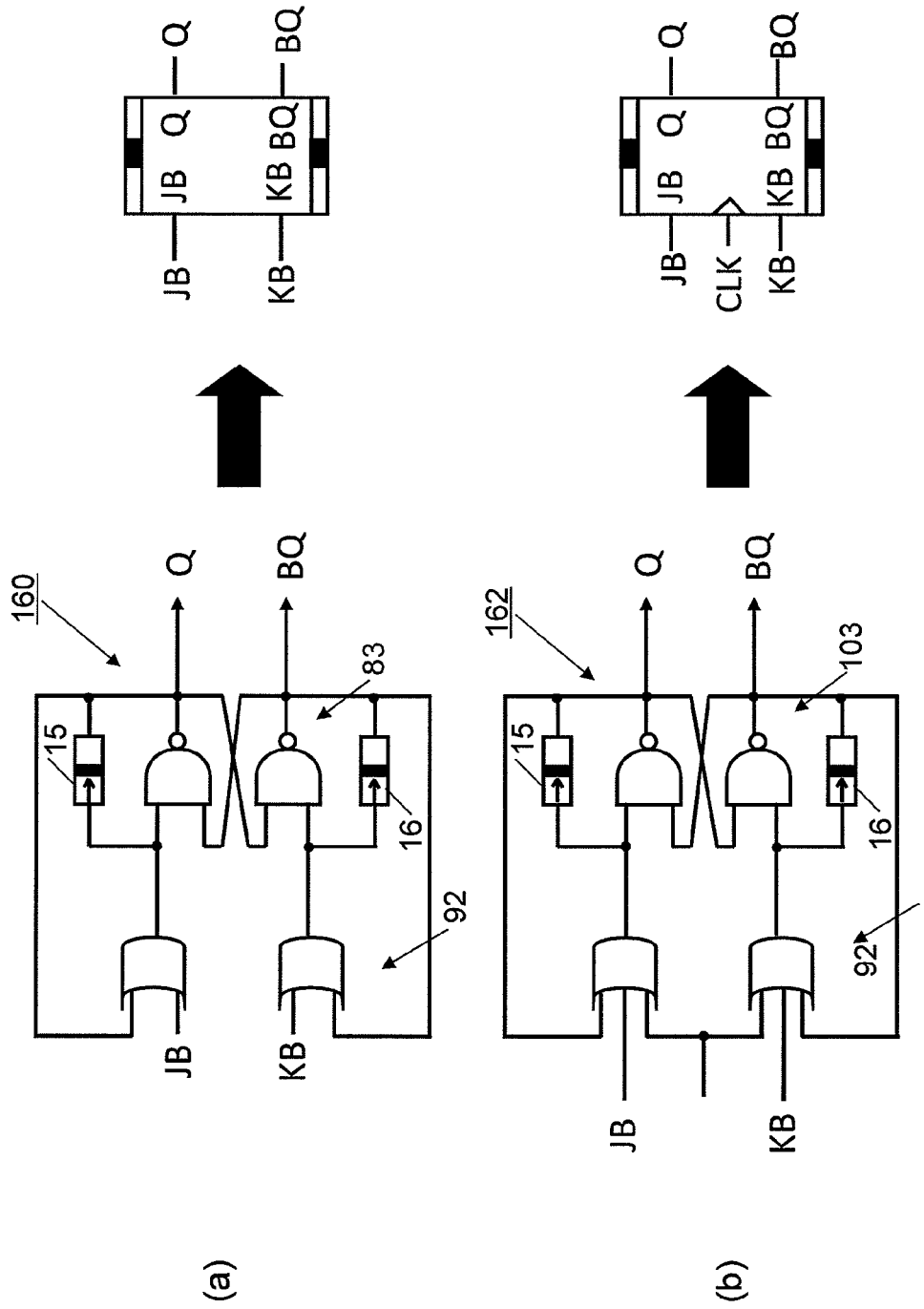
FIG. 82 shows JK flip-flop circuits equipped with auto save function, where (a) is a NOR-type circuit diagram, and (b) is a NAND-type circuit diagram.

FIG. 82 shows JK flip-flop circuits equipped with auto save function, where (a) is a NOR-type circuit diagram, and (b) is a NAND-type circuit diagram.

As shown in FIG. 82(*a*), a NOR-type JK flip-flop circuit equipped with auto save function 160 has a structure where the circuit having auto save function 92 as same as the circuit of FIG. 66 is inserted to the input of the NOR-type JK flip-flop circuit 152 of FIG. 80. As shown in FIG. 82(*b*), a NAND-type JK flip-flop circuit equipped with auto save function 162 has a structure where the circuit having auto save function 92 as same as the circuit of FIG. 71 is inserted to the input of the JK flip-flop circuit 154 of FIG. 80(*b*). These circuits are the asynchronous-type. However, the circuit having auto save function can be added to the synchronous-type T flip-flop circuit.

Fourth Embodiment

The memory element 1B can also be added to logic circuits other than the latch and flip-flop circuits described above. As examples of logic circuits, circuits wherein the memory element 1B is added to an inverter, NAND, and NOR will be described.

(Inverter)

Figure 83:
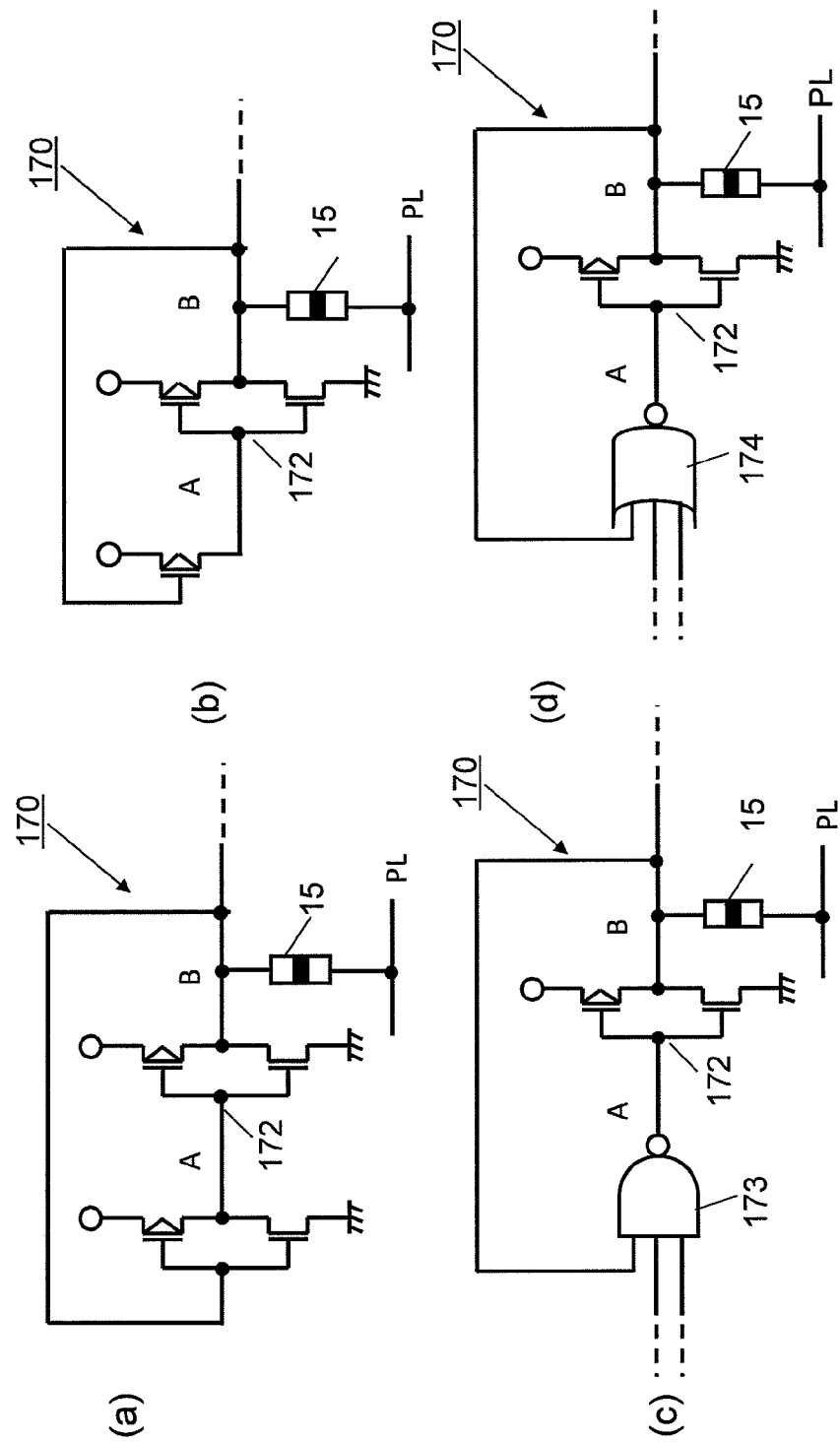
FIG. 83 (a) to (d) are circuit diagrams of an inverter according to a fourth embodiment.

FIGS. 83 (*a*) to (*d*) are circuit diagrams of an inverter 170 according to a fourth embodiment. In FIGS. 83 (*a*) to (*d*), the fixed layer of MTJ device 15 is connected as memory element 1B to the output contact point B (also called output node B, or node B) of a CMOS inverter 172. The PL signal is applied to the free layer of the MTJ device 15. The above inverter 170 has a structure where one memory element 1B is added to the output. It is basically a latch circuit, but is different from the integrated circuits in the second and the third embodiments described above which use MTJ device pair 15, 16, namely two MTJ devices, in that it uses only one MTJ device 15.

Two CMOS inverters 172 (See FIG. 83 (*a*)), or CMOS inverter 172 and NAND 173 (See FIG. 83 (*c*)), CMOS inverter 172 and NOR 174 (See FIG. 83 (*d*).) are not balanced completely. The intensity at startup of the node A, namely the magnitude of current fed to the node A from the power supply when the power is turned on, shall be between the intensity at startup of the node B in the case where the MTJ device 15 in the antiparallel (AP) state is connected to the node B and the intensity at startup of the node B in the case where the MTJ device 15 in parallel (P) state is connected to the node B.

(NAND)

FIGS. 84 (*a*) to (*c*) are circuit diagrams of a NAND 180 according to the fourth embodiment.

The circuits in FIGS. 84 (*a*) to (*c*) have a structure where one memory element 1B is added to the output node A. The circuits are basically latch circuits, but are different from the second embodiment described above etc., which use MTJ device pair 15, 16, namely two MTJ devices, in that they use only one MTJ device 15.

The inverter 24 and the NAND 182 (See FIG. 84 (*a*)), the NAND 182 and the NAND 182 (See FIG. 83 (*b*)), or the NAND 182 and the NOR 183 (See FIG. 83 (*c*).) are not balanced completely. The intensity at startup of the node A shall be between the intensity at startup of the node B in the case where the MTJ device 15 in the antiparallel (AP) state is connected to the node B and the intensity at startup of the node B in the case where the MTJ device 15 in the parallel (P) state is connected to the node B.

(Modification of NAND)

FIG. 85 shows a circuit diagram of the modification of NAND and the PL signal is not necessary. The inverter 24 and the NAND 182 (See FIG. 85 (*a*)), the NAND 182 and the NAND 182 (See FIG. 85 (*b*)), or the NAND 182 and the NOR 183 (See FIG. 85 (*c*).) are not balanced completely. The intensity at startup of the node A shall be between the intensity at startup of the node B in the case where the MTJ device 15 in the antiparallel (AP) state is connected to the node B and the intensity at startup of the node B in the case where the MTJ device 15 in the parallel (P) state is connected to the node B. Since it is not necessary to use the PL signal in this modification of NAND, there are merits that the necessary area and the power are decreased in comparison with the NAND 180 as shown in FIG. 84.

(NOR)

Figure 86:
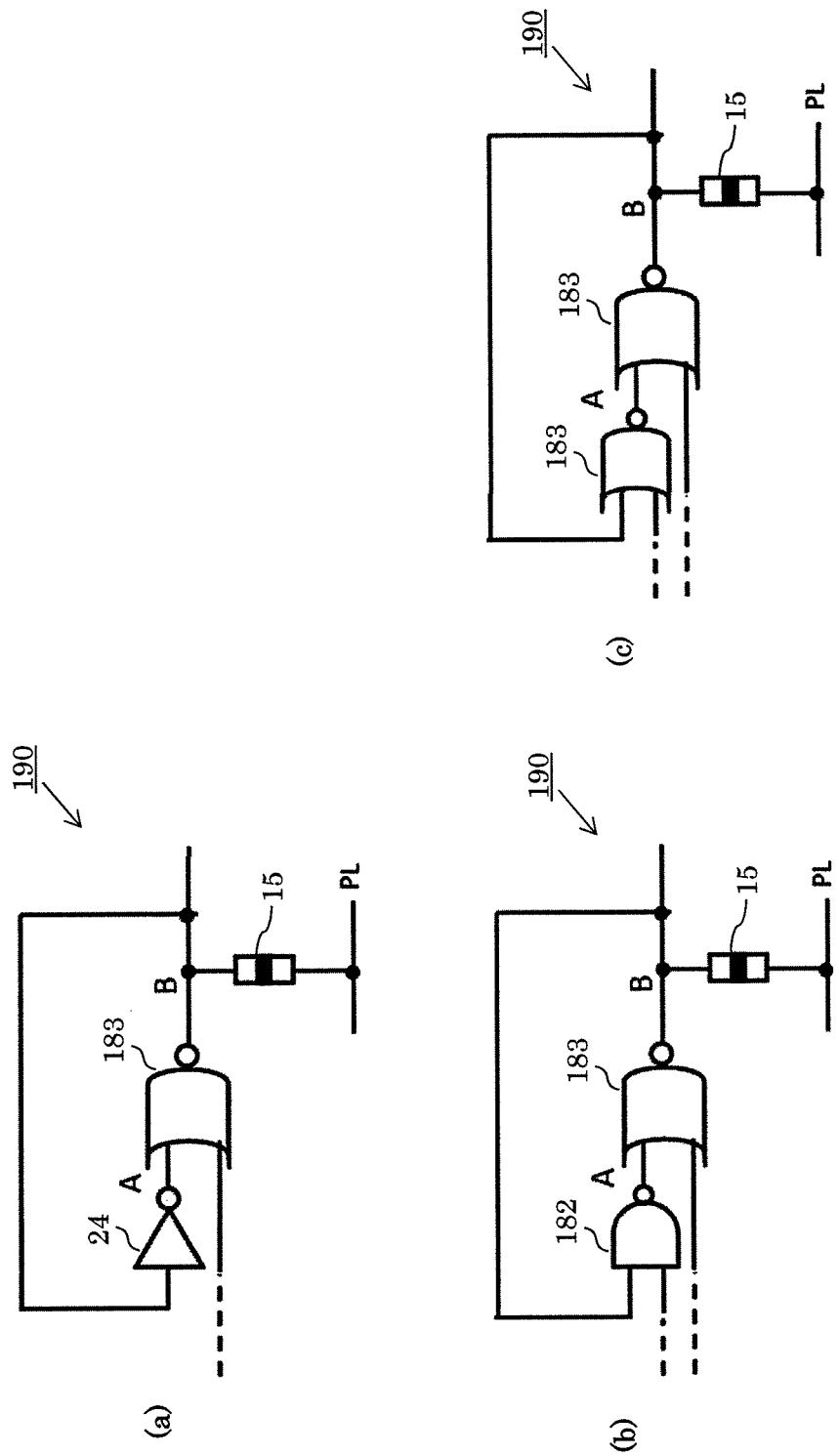
FIG. 86 (a) to (c) shows circuit diagrams of NOR according to the fourth embodiment.

FIG. 86 is a circuit diagram of a NOR 190 according to the fourth embodiment. The circuit has a structure where one memory element 15 is added to the output node A. The circuit is basically a latch circuit, but is different from the second embodiment described above, which use MTJ device pair 15, 16, namely two MTJ devices, in that only one MTJ device 15 is used.

The inverter 24 connected to the MTJ device 15 and the NOR 183 (See FIG. 86 (*a*)), the NAND 182 and the NOR 183 (See FIG. 86 (*b*)), or the NOR 183 and the NOR 183 (See FIG. 86 (*c*).) are not balanced completely. The intensity at startup of the node A shall be between the intensity at startup of the node B in the case where the MTJ device 15 in the antiparallel (AP) state is connected to the node B and the intensity at startup of the node B in the case where the MTJ device 15 in the parallel (P) state is connected to the node B.

(Modification of NOR)

Figure 87:
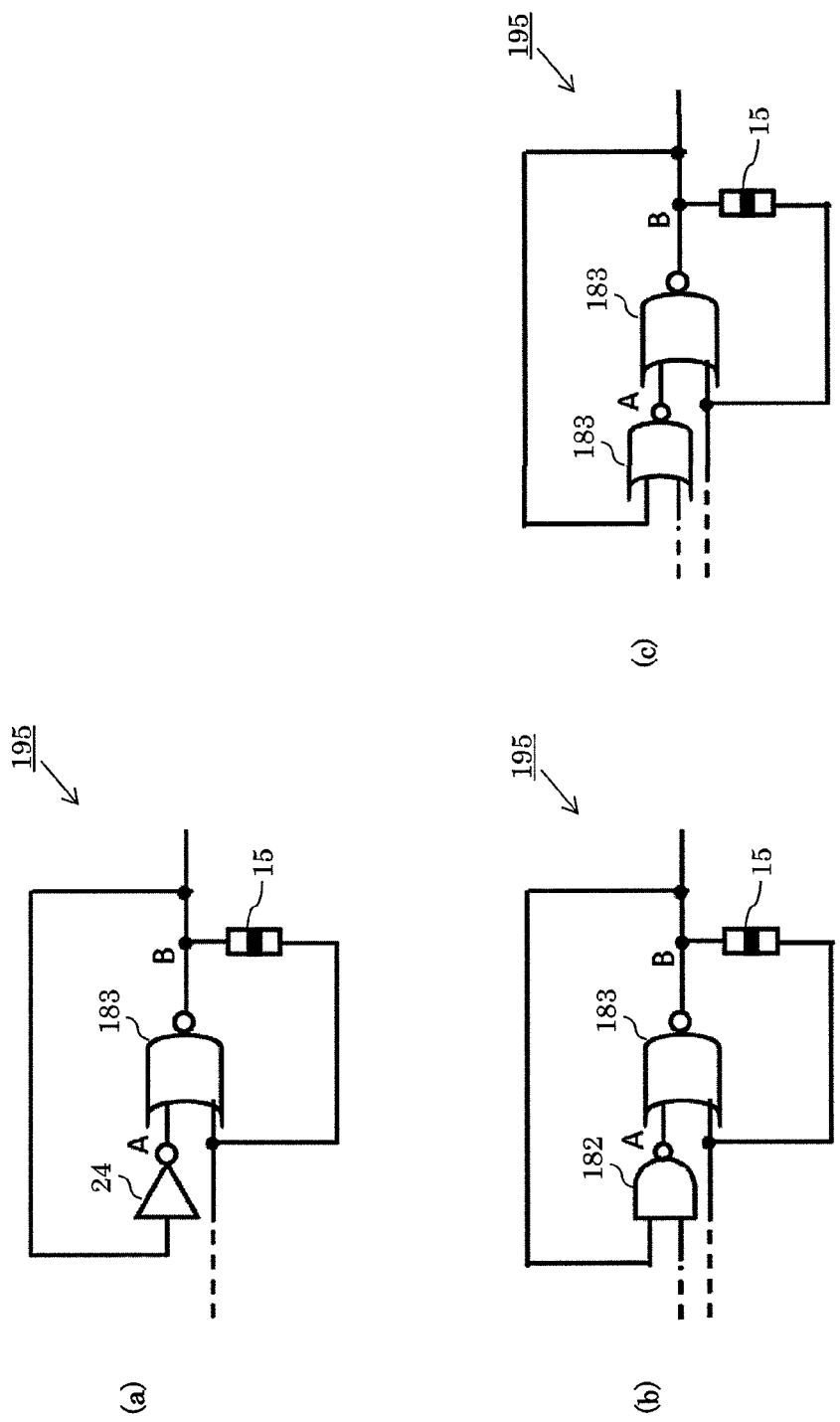
FIG. 87 is a circuit diagram of modification of NOR.

FIG. 87 is a circuit diagram of the modification of a NOR 195. The circuit has a structure where one memory element 1B is added to the output node B. The inverter 24 and the NOR 183 (See FIG. 87 (*a*)), the NAND 182 and the NOR 183 (See FIG. 87 (*b*)), or the NOR 183 and the NOR 183 (See FIG. 87 (*c*).) are not balanced completely. The intensity at startup of the node A shall be between the intensity at startup of the node B in the case where MTJ device 15 in antiparallel (AP) state is connected to the node B and the intensity at startup of the node B in the case where MTJ device 15 in parallel (P) state is connected to the node B. Since it is not necessary to use the PL signal in this modification, there are merits that the necessary area and the power are decreased in comparison with the NOR 190 as shown in FIG. 86.

Fifth Embodiment

SRAM

Figure 88:
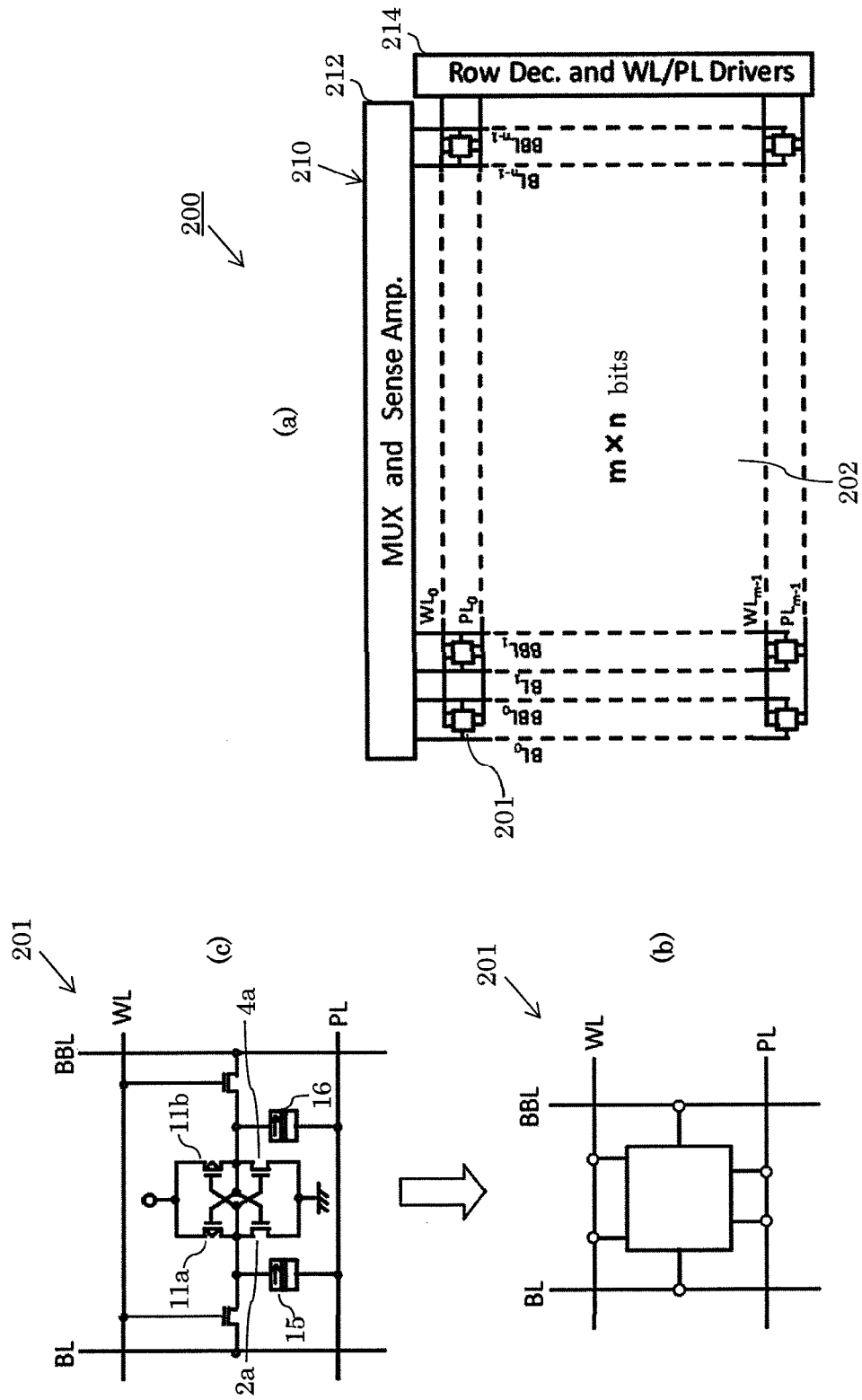
FIG. 88 shows SRAM as integrated circuit according to a fifth embodiment of the present invention, where (a) is a block diagram showing the structure of the SRAM, (b) shows a memory cell, and (c) shows the circuit of the memory cell.

FIG. 88 shows an SRAM 200 as an integrated circuit according to a fifth embodiment of the present invention, where (a) is a block diagram showing the structure of the SRAM 200, (b) shows a memory cell 201, and (c) shows the circuit of the memory cell 201.

As shown in FIGS. 88 (a) and (b), the memory cell 201 of the SRAM 200 includes: a plurality of memory cells 202 arranged in m (row)×n (column) matrix; and a peripheral circuit 210. The peripheral circuit 210 includes: an MUX and Sense circuit 212 provided on the upper side of the matrix; a low decoder circuit provided on the right side of the matrix; a word line (WL); and a plate line (PL) control circuit 214 etc.

As shown in FIG. 88 (c), the memory cell 201 includes: the conventional flip-flop circuit, which is the basic circuit; and two MTJ devices 15, 16, which are memory elements 1B.

The memory cell 201 includes: the first p-type MOSFET 11a connected to the first n-type MOSFET 2a and the first n-type MOSFET 4a; the first n-type MOSFET 3 for transfer and the first MTJ device 15 connected to the contact point (node) between the first n-type MOSFET 2a and the first p-type MOSFET 4a; the second p-type MOSFET 12a connected to the second n-type MOSFET 4a and the second n-type MOSFET 4a; and the second n-type MOSFET 5 for transfer and the second MTJ device 16 connected to the contact point (node) between the second n-type MOSFET 4a and the second p-type MOSFET 11a.

The drain of the first n-type MOSFET 2a is connected to the gate which is the input terminal of the second n-type MOSFET 4a. The drain of the second n-type MOSFET 4a is connected to the gate of the first n-type MOSFET 2a. The connection between the gate and the drain of these two n-type MOSFETs 2a, 4a is also called cross-over or cross-coupled wiring.

Similarly, the gate and the drain of the first p-type MOSFET 11a and the second p-type MOSFET 12a are connected by cross-coupled wiring.

The source of the first and the second n-type MOSFETs 2a, 4a is grounded. To the source of the first and the second n-type MOSFETs 2a, 4a, the constant voltage of 0V or other values may be applied as the ground potential.

The drain of the first n-type MOSFET 2a serves as a memory node, and is connected to the BL signal via the first n-type MOSFET 3 for transfer.

The drain of the second n-type MOSFET 4a serves as a memory node, and is connected to the BBL signal via the second n-type MOSFET 5 for transfer.

The gate of the first n-type MOSFET 3 for transfer and the gate of the second n-type MOSFET 5 for transfer are connected to the same word line, namely WL signal.

The fixed layer of the first MTJ device 15 is connected to the drain of the first n-type MOSFET 2a. The fixed layer of the second MTJ device 16 is connected to the drain of the second n-type MOSFET 4a. To the free layer of the first and the second MTJ devices 15, 16, the PL signal is applied.

Next, the operation of the memory cell 201 of the present invention will be described.

Figure 89:
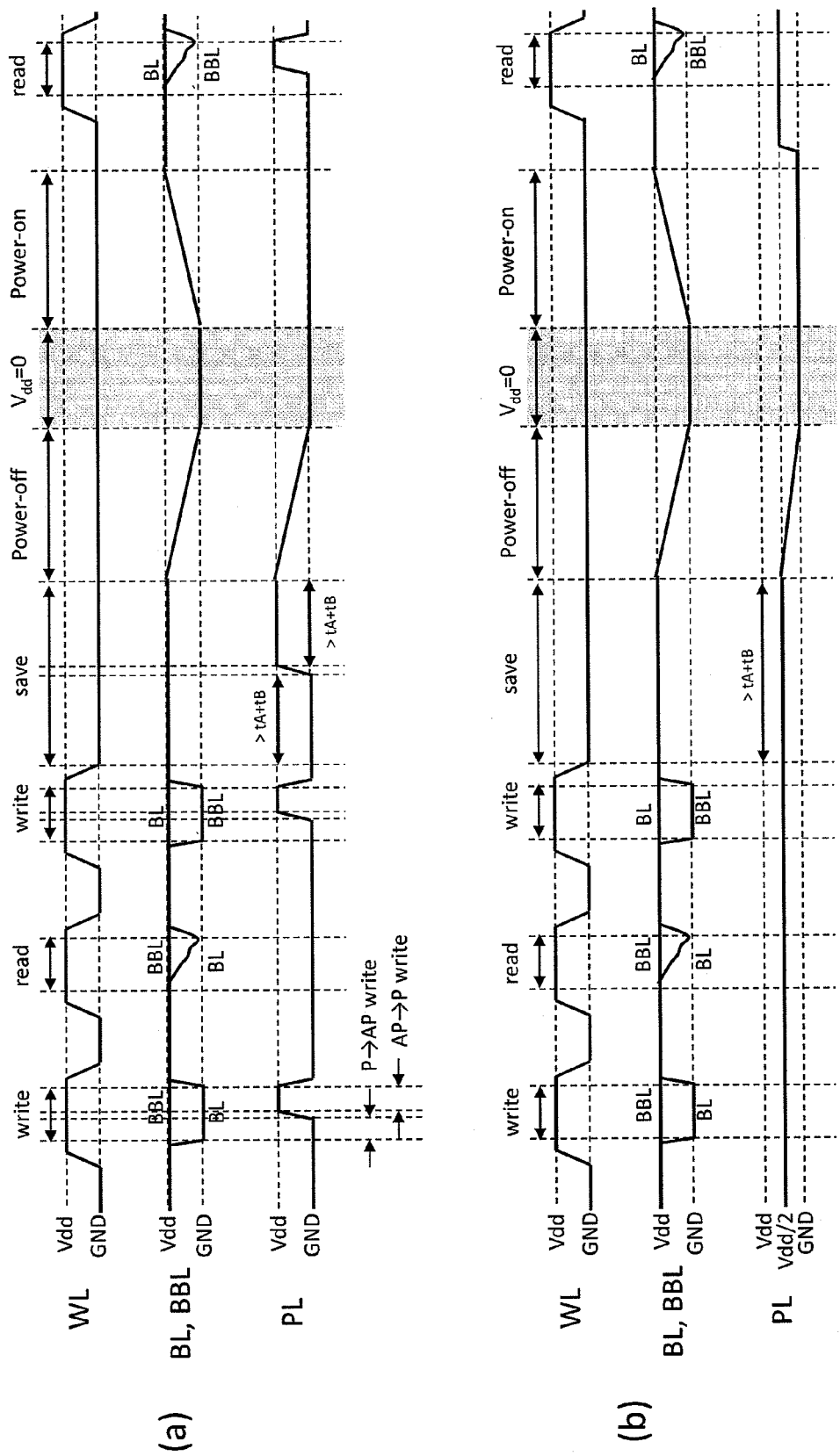
FIGS. 89 (a) and (b) are charts describing two examples of operation waveforms of the memory cell of the present invention.

FIGS. 89 (a) and (b) are charts describing two examples of operation waveforms of the memory cell 201 of the present invention.

As shown in FIG. 89 (a), the ground and the power supply voltage are sequentially applied as the PL signal, and when the write time is in the save mode where $\tau(\lambda_2/f_2) > t_A + t_B$, the data in the memory cell 201 of the SRAM 200 is written into the MTJ devices 15, 16. In this case, the WL signal is at the low level at the time of writing, and the BL and BBL signals are at the high level. In this system, the data is written into the two MTJ devices 15, 16 at different timing. In the former period where PL is at the ground level, the MTJ devices 15, 16 in the parallel state are switched into the antiparallel state, and in the latter period where PL is at the power supply voltage, the MTJ devices 15, 16 in the antiparallel state are switched into the parallel state.

FIG. 89 (b) is the time chart describing another method of writing data into the memory cell 201 of the present invention. The data may also be written into the memory cell 201 by setting the voltage of the PL signal to the midpoint potential between the power supply voltage $V_{dd}$ and the ground voltage. In the figure, the midpoint potential is represented as $V_{dd}/2$. In this method, the two MTJ devices 15, 16 can be switched simultaneously.

According to the memory cell 201 of the present invention, the data is not written into the MTJ devices 15, 16 while the SRAM 200 is in operation, and in the second operation mode before the power is turned off, the data retained in the SRAM 200 is written. The data retained in the SRAM 200 is stored in the MTJ devices 15, 16, which are memory elements. This stored data is reloaded to the flip-flop circuit of each memory cell 201 of the SRAM 200 when the SRAM 200 is rebooted.

Modification Example 1 of the Fifth Embodiment

Figure 90:
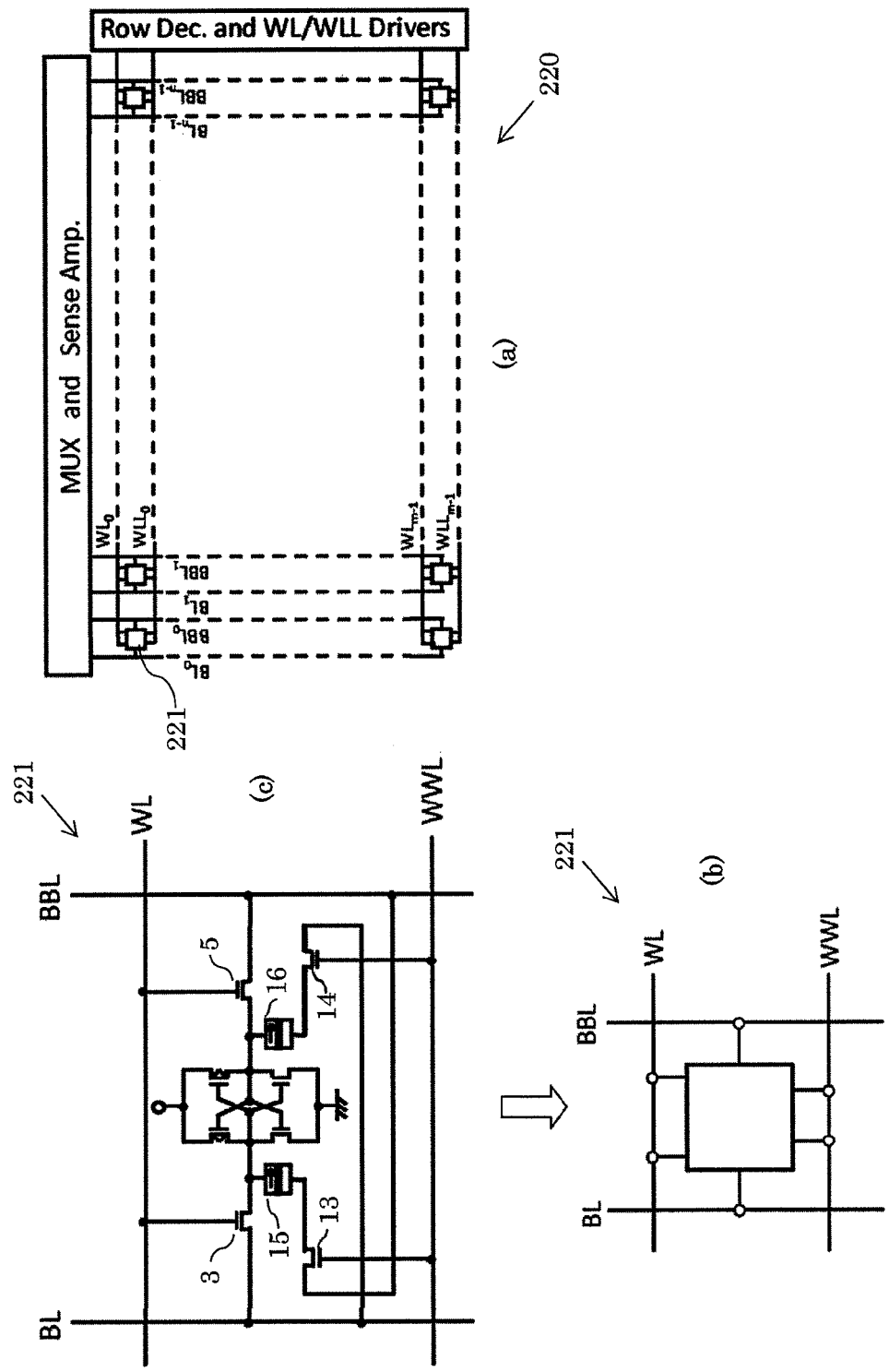
FIG. 90 shows an SRAM according to the modification example 1 of the fifth embodiment of the present invention, where (a) is a block diagram showing the structure of the SRAM, (b) shows a memory cell, and (c) shows the circuit of the memory cell.

FIG. 90 shows an SRAM 220 according to the modification example 1 of the fifth embodiment of the present invention, where (a) is a block diagram showing the structure of the SRAM 220, (b) shows a memory cell 221, and (c) shows the circuit of the memory cell 221.

As shown in FIGS. 90 (a) and (b), the memory cell 221 of the SRAM 220 has a structure that the WWL signal is applied in place of PL signal as shown in FIG. 88. As shown in FIG. 90 (c), the memory cell 221 has a structure that the third n-type MOSFET for transfer 13 and fourth n-type MOSFET 14 for transfer are added to the memory cell 201 of FIG. 88 (c).

The free layer of the first MTJ device 15 is connected to the BBL signal via the third n-type MOSFET 13 for transfer. The WWL signal is applied to the gate of the third n-type MOSFET 13 for transfer. In a similar manner, the free layer of the second MTJ device 16 is connected to the BL signal via the fourth n-type MOSFET 14 for transfer. The WWL signal is applied to the gate of the fourth n-type MOSFET 14 for transfer.

Next, the operation of the memory cell of the present invention will be described.

Figure 91:
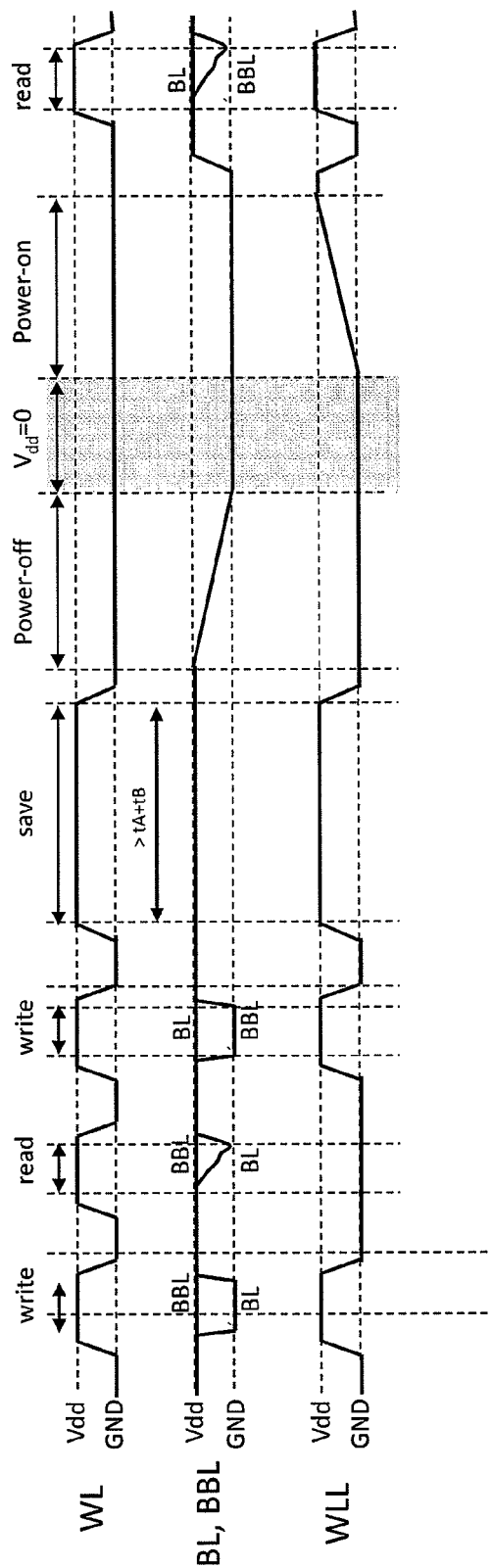
FIG. 91 is a chart describing the operation waveforms of the memory cell of the present invention.

FIG. 91 is a chart describing the operation waveforms of the memory cell 221 of the present invention.

As shown in FIG. 91, the power supply voltage ($V_{dd}$) to the ground is applied as the WWL signal. When the write time is in the save mode where $(\lambda_2/f_2) > t_A + t_B$, the data in the memory cell 221 of the SRAM 220 is written into the MTJ devices 15, 16. The WL signal is at the high level at the time of saving, and the BL and the BBL signals are at the high level.

Modification Example 2 of the Fifth Embodiment

FIG. 92 shows an SRAM 230 according to the modification example 2 of the fifth embodiment of the present invention, where (a) is a block diagram showing the structure of the SRAM 230, and (b) shows a memory cell 231.

As shown in FIGS. 92 (a) and (b), the SRAM 230 has a structure that a power conversion circuit 235 for the WWL signal and a memory circuit 237 connected to the power conversion circuit 235 are added to the SRAM 200 as shown in FIG. 88. According to this circuit configuration, the power supply $V_{WLL}$, which drives the WLL signal, may be adjusted by using the power conversion circuit 235. For example, the incubation time of the MTJ devices 15, 16 of the memory cell may be adjusted by decreasing the voltage of power supply $V_{dd}$. The voltage of the power supply $V_{WLL}$ may be programmed as the results of the measurements of the incubation time of the MTJ devices 15, 16. These results of the measurements are stored in the memory circuit 237 connected to the power conversion circuit 235.

Next, the operation of the memory cell of the present invention will be described.

Figure 93:
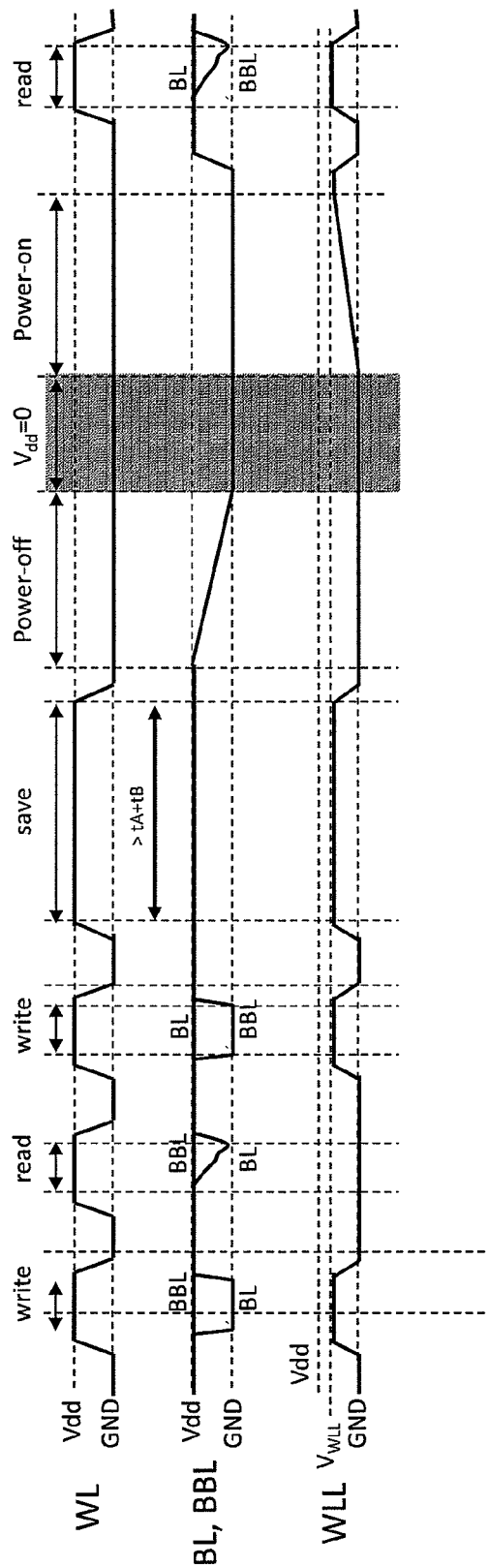
FIG. 93 is a chart describing the operation waveforms of the memory cell of the present invention.

FIG. 93 is a chart explaining the operation waveforms of the memory cell 231 of the present invention. As shown in FIG. 93, the operation is as same as shown in FIG. 88 except that the power supply voltage to ground (called as GDN), which is decreased to $V_{WLL}$ from the power supply voltage ($V_{dd}$), is applied as the WWL signal. According to this circuit configuration, the power consumption of the writing the MTJ devices 15, 16 can be reduced by adjusting the incubation time of the MTJ devices 15, 16.

Modification Example 3 of the Fifth Embodiment

Figure 94:
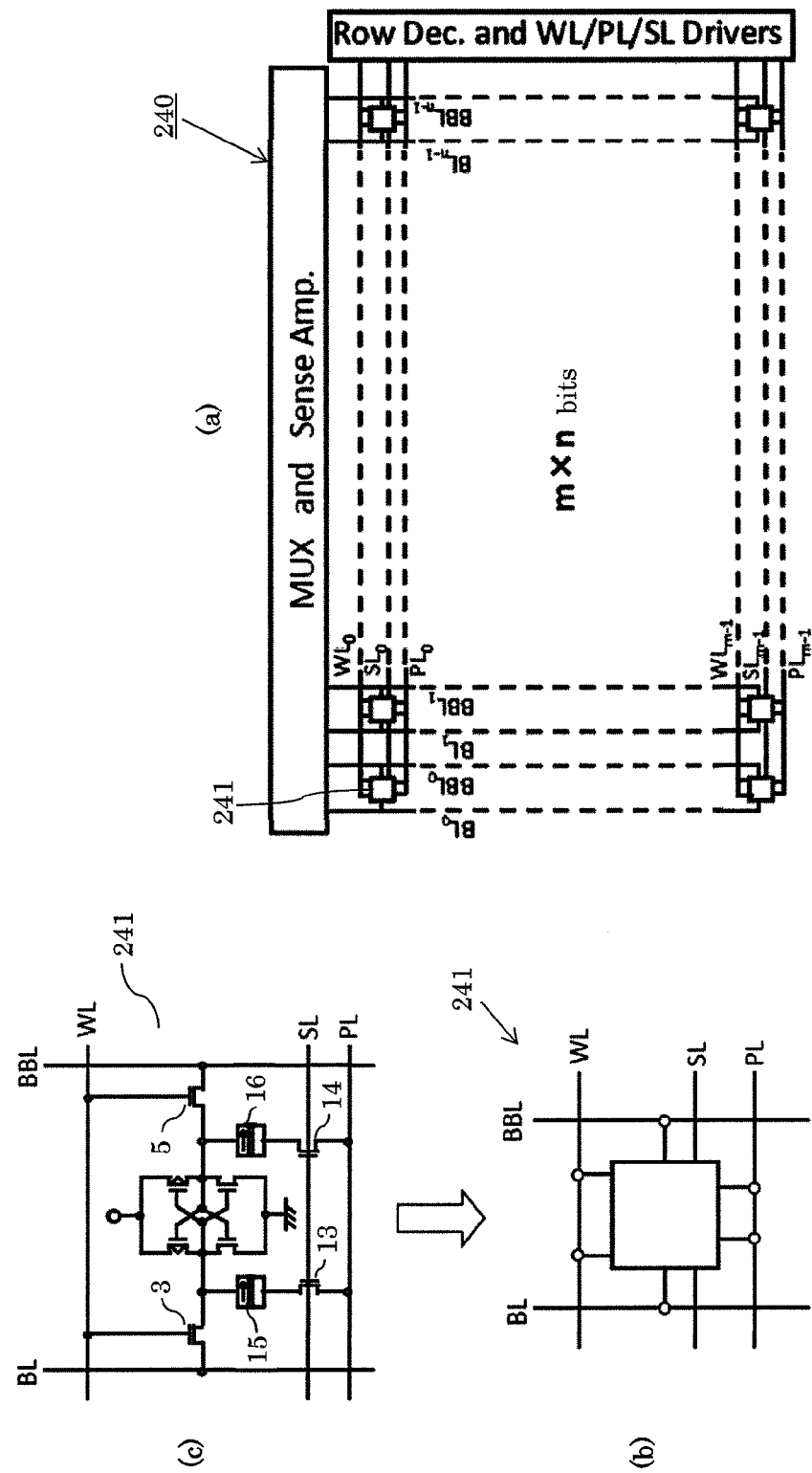
FIG. 94 shows an SRAM according to the modification example 3 of the fifth embodiment of the present invention, where (a) is a block diagram showing the structure of the SRAM, (b) shows a memory cell and (c) shows the circuit of the memory cell.

FIG. 94 shows an SRAM 240 according to the modification example 3 of the fifth embodiment of the present invention, where (a) is a block diagram showing the structure of the SRAM 240, (b) shows a memory cell 241, and (c) shows the circuit of the memory cell 241.

As shown in FIG. 94, the SRAM 240 has a structure that the third n-type MOSFET 13 for transfer, the fourth n-type MOSFET 14 for transfer, and the SL signal are added to the SRAM 200 as shown in FIG. 88. The free layer of the first MTJ device 15 is connected to the PL signal via the third n-type MOSFET 13 for transfer. The SL signal is applied to the gate of the third n-type MOSFET 13 for transfer. In a similar manner, the free layer of the second MTJ device 16 is connected to the PL signal via the fourth n-type MOSFET 14 for transfer. The SL signal is applied to the gate of the fourth n-type MOSFET 14 for transfer.

Next, the operation of the memory cell 241 of the present invention will be described.

Figure 95:
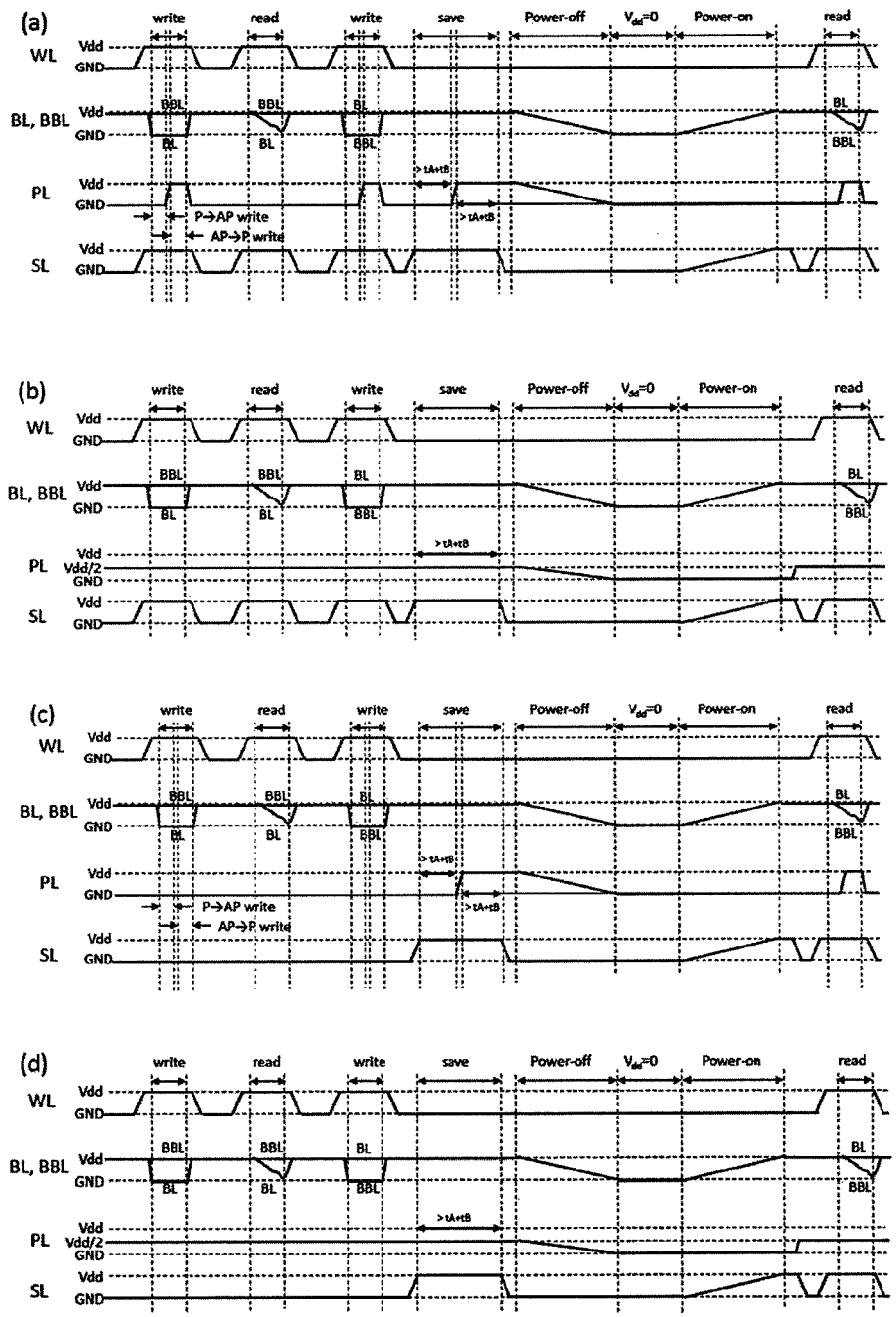
FIG. 95 (a) to (d) are charts describing the operation waveforms of the memory cell of the present invention.

FIGS. 95 (a) to (d) are charts describing the operation waveforms of the memory cell 241 of the present invention.

FIGS. 95 (a) and (b) describe the methods, when the data is written into the memory cell 241 of the SRAM 240, that the gate signal SL of the switching transistor (n-type MOSFET) provided between the MTJ devices 15, 16 is applied, and the current are flown to the MTJ devices 15, 16. The difference in (a) and (b) is as follows. In (a), the PL is moved from the GND level to the power supply voltage level at the time of writing, and the data is written into the two JTJ devices 15, 16 sequentially in two cycles. In (b), the PL level is set to a value between the GND and the power supply voltage, and the data is written into the two MTJ devices 15, 16 simultaneously in one cycle.

FIGS. 95 (c) and (d) describe a method of maintaining the gate signal SL of the switching transistor (n-type MOSFET) provided between the MTJ devices 15, 16 at the GND level at the time of writing data into the memory cell 241 of SRAM 240 not to feed current to the MTJ devices 15, 16. This system can decrease more power. The difference in (c) and (d) is as follows. In (c), the PL is moved to the GND (ground) level and the power supply voltage level at the time of writing, and data is written into the two MTJ devices 15, 16 sequentially in 2 cycles. In (d), the PL level is set at a value between the GND and the power supply voltage, and the data is written into the two MTJ devices 15, 16 simultaneously in one cycle.

Modification Example 4 of the Fifth Embodiment

FIG. 96 shows an SRAM 250 according to the modification example 4 of the fifth embodiment of the present invention, where (a) is a block diagram, and (b) shows a circuit diagram of a memory cell 251.

As shown in FIG. 96 the SRAM 250 has a structure that a power conversion circuit 255 for the SL signal and a memory circuit 257 connected to the power conversion circuit 255 are added to the SRAM 240 as shown in FIG. 94. According to this circuit configuration, the power supply $V_{SL}$, which drives the SL signal, may be adjusted by using the power conversion circuit 255. For example, the incubation time of the MTJ devices 15, 16 in the memory cell 251 may be adjusted by decreasing the voltage of the power supply $V_{dd}$. The voltage of the power supply $V_{SL}$ may be programmed as the results of the measurements of the incubation time of the MTJ devices 15, 16. These results of the measurements are stored in the memory circuit 257 connected to the power conversion circuit 255.

Next, the operation of the memory cell of the present invention will be described.

Figure 97:
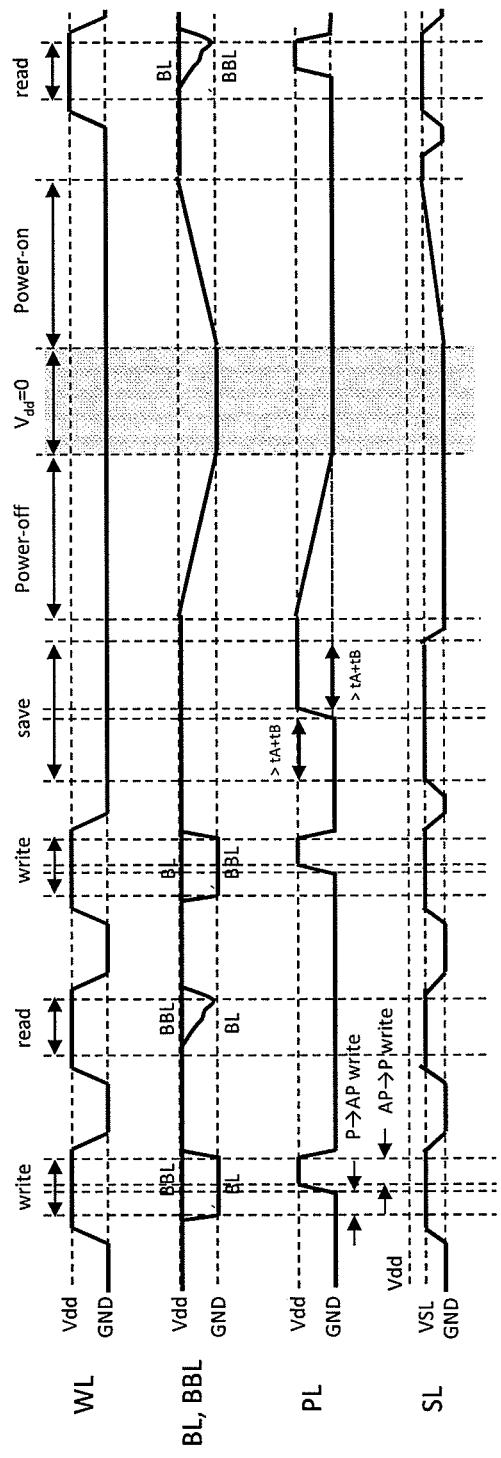
FIG. 97 is a chart describing the operation waveforms of the memory cell of the present invention.

FIG. 97 is a chart explaining the operation waveforms of the memory cell 251 of the present invention. As shown in FIG. 97, the operation is as same as shown in FIG. 95 except that the power supply voltage to the ground, which is decreased to $V_{SL}$ from the power supply voltage ($V_{dd}$), is applied as the SL signal. According to this circuit configuration, the dissipation power of writing the MTJ devices 15, 16 can be reduced by adjusting the incubation time of the MTJ devices 15, 16.

Sixth Embodiment

Binary CAM

Next, a binary content addressable memory (hereinafter called binary CAM) used for search etc. will be described as a sixth embodiment.

FIG. 98 shows the structure of memory cells of the binary CAM according to the sixth embodiment of the present invention, where (a) is a circuit diagram of a NOR-type CAM 270, and (b) is that of a NAND-type CAM 280.

A memory cell 271 of the binary NOR-type CAM 270 according to the fifth embodiment in FIG. 98 (a) includes: a bistable circuit 273 wherein two inverters 272 are connected by ring connection; the first and the second MTJ devices 15, 16 connected to each node that serves as a contact point of this bistable circuit 273; a first to a sixth n-type MOSFETs 274 for transfer connected to each node that serves as a contact point of the bistable circuit 273. The free layer of the first and the second MTJ devices 15, 16 is connected to the PL signal. A pattern WL signal, a ML signal, the SL signal and the SL signal are applied to the memory cell 271.

A memory cell 281 of a binary NAND-type CAM 280 according to the fourth embodiment in FIG. 98 (b) includes: a bistable circuit 283 wherein two inverters 282 are connected by ring connection; the first and the second MTJ devices 15, 16 connected to each node that serves as a contact point of this bistable circuit 283; and a first to a fifth n-type MOSFETs 284 for transfer connected to each node that serves as a contact point of the bistable circuit 283. The free layer 15, 16 of the first and the second MTJ devices is connected to the PL signal. The $ML_n$ signal, the $ML_{n+1}$ signal, the SL signal and the BS signal are applied to the memory cell 281.

Modification Example of the Binary CAM

FIG. 99 shows the structure of the modification example of the binary CAM memory cell according to the present invention, where (a) is a circuit diagram of a NOR-type CAM 290, and (b) is that of a NAND-type CAM 300. As shown in FIGS. 99 (a) and (b), the modification examples of the binary CAM memory cells 290,300 have structures that the search line (SL) and the bit line (BL) are separated.

(Ternary Nonvolatile CAM)

Figure 100:
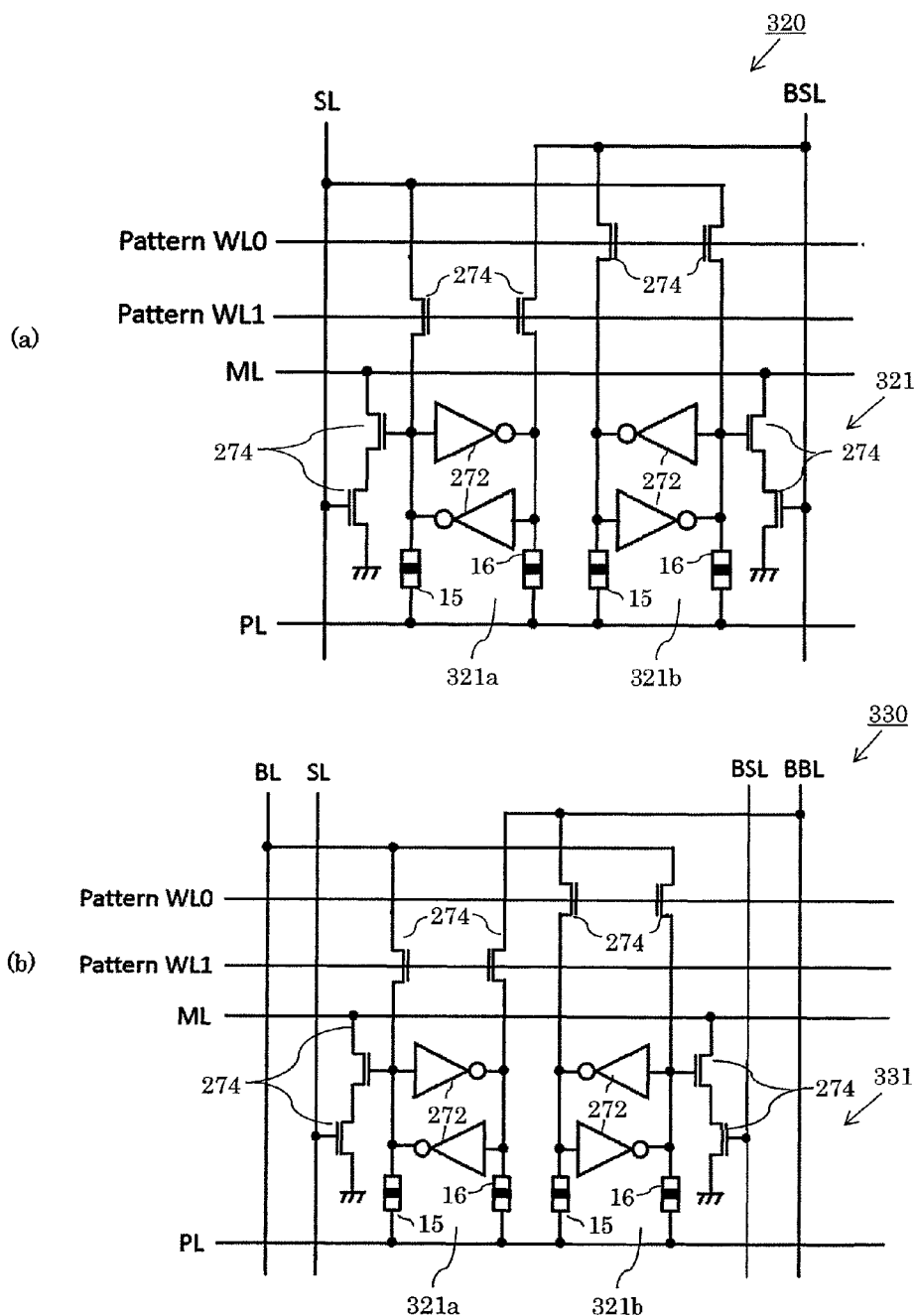
FIG. 100 shows the structure of the memory cell of the ternary nonvolatile CAM according to the sixth embodiment of the present invention, where (a) is a circuit diagram of a NOR-type CAM, and (b) is the circuit diagram of a modification example of the NOR-type CAM.

FIG. 100 shows the structure of the memory cell of the ternary nonvolatile CAM according to the sixth embodiment of the present invention, where (a) is a circuit diagram of a NOR-type CAM 320, and (b) is the circuit diagram of a modification example of the NOR-type CAM 330. The ternary content addressable memories (hereinafter called TCAM) 320, 330 handle the following three states: "0", "1", and "X".

As shown in FIG. 100 (a), a memory cell 321 of the ternary nonvolatile NOR-type CAM 320 has a structure where two memory cells of the binary CAM are laid next to each other. The left memory cell 321a is connected to the pattern WL1 signal, and the right memory cell 321b is connected to the pattern WL2 signal. As shown in FIG. 100 (a), the memory cell 321 of the ternary nonvolatile NOR-type CAM 320 has a structure where the SL and the BSL are applied. As shown in FIG. 100 (b), the memory cell 331 of the ternary nonvolatile NOR-type CAM 330 has a structure where the BL signal and the BB signal are applied in addition to the SL and the BSL in FIG. 100 (a), and the search line and the bit line are separated.

Modification Example of Ternary Nonvolatile CAM

Figure 101:
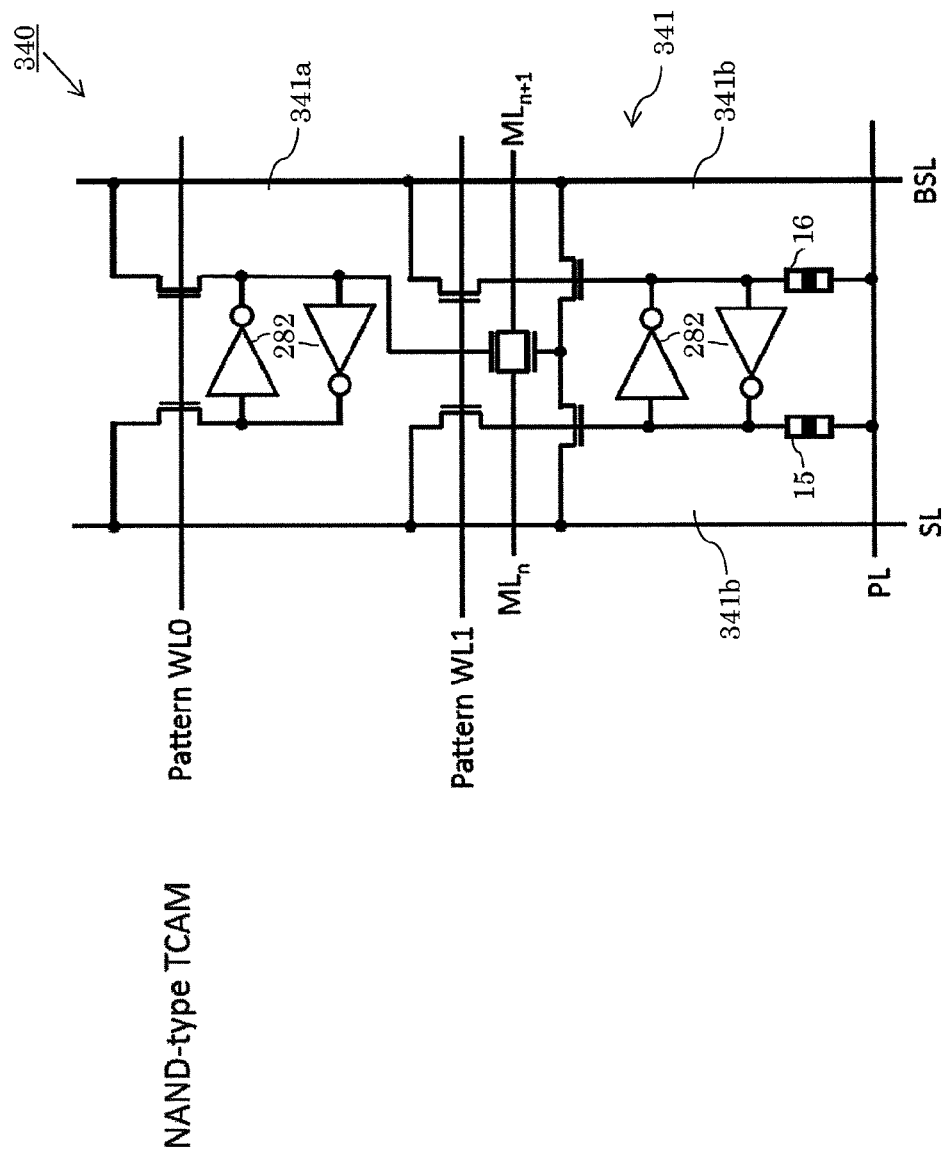
FIG. 101 is a circuit diagram of the modification example of the ternary nonvolatile NAND-type CAM of the present invention.
Figure 102:
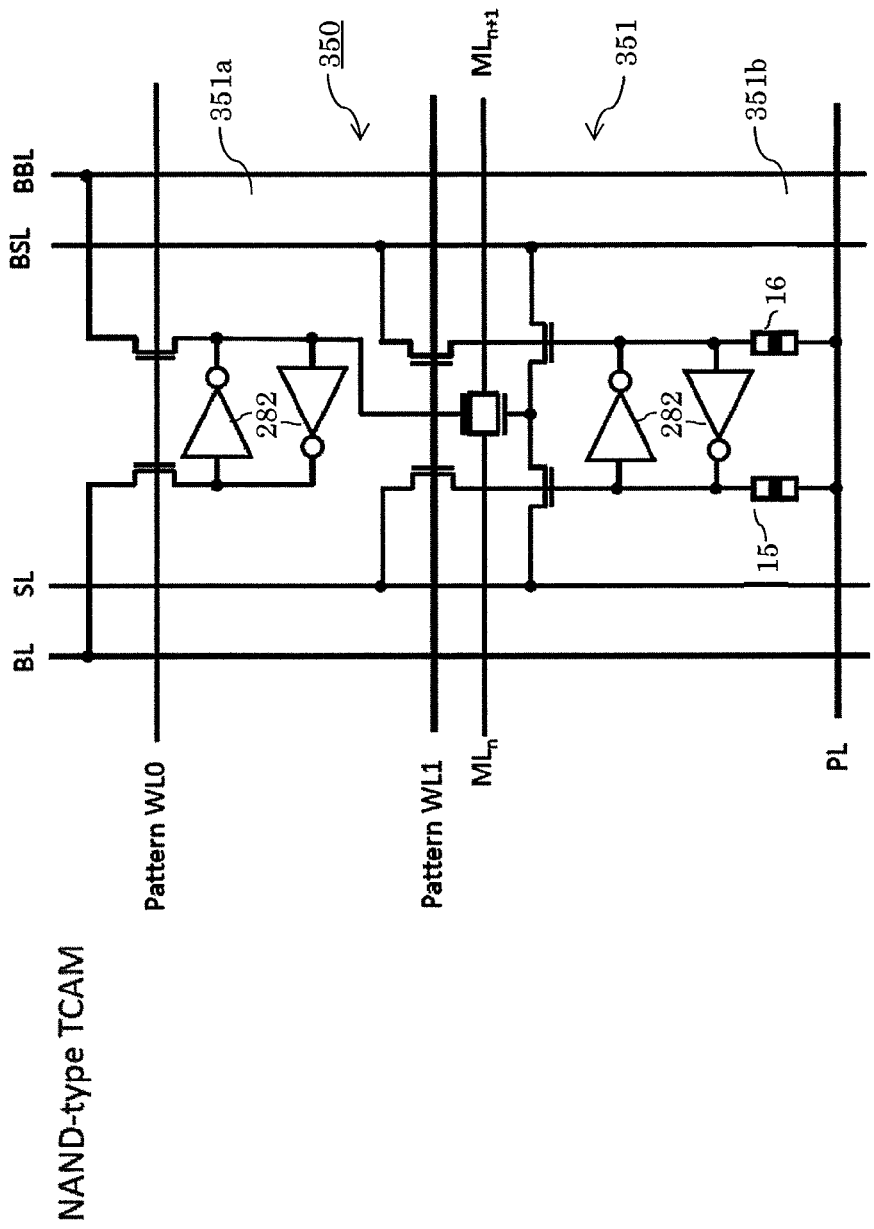
FIG. 102 is another circuit diagram of the modification example of the ternary nonvolatile NAND-type CAM of the present invention.

FIG. 101 is a circuit diagram of the modification example of a ternary nonvolatile NAND-type CAM 340 of the present invention, and FIG. 102 is a circuit diagram of the modification example of an NAND-type CAM of the ternary nonvolatile CAM 350 of the present invention.

As shown in FIG. 101, a memory cell 341 of the ternary nonvolatile NAND-type CAM 340 has a structure where two memory cells of the binary CAM are connected in series. The memory cell 341a in the upper stage, to which MTJ devices 15, 16 are not connected, is connected to the pattern WL0 signal. The memory cell 341b in the lower stage is connected to the pattern WL1 signal.

As shown in FIG. 102, a memory cell 351 of the ternary nonvolatile NOR-type CAM 350 is the same as the memory cell in FIG. 101, but has a structure where the search line (SL) and the bit line (BL) are separated.

Seventh Embodiment

FPGA

Figure 103:
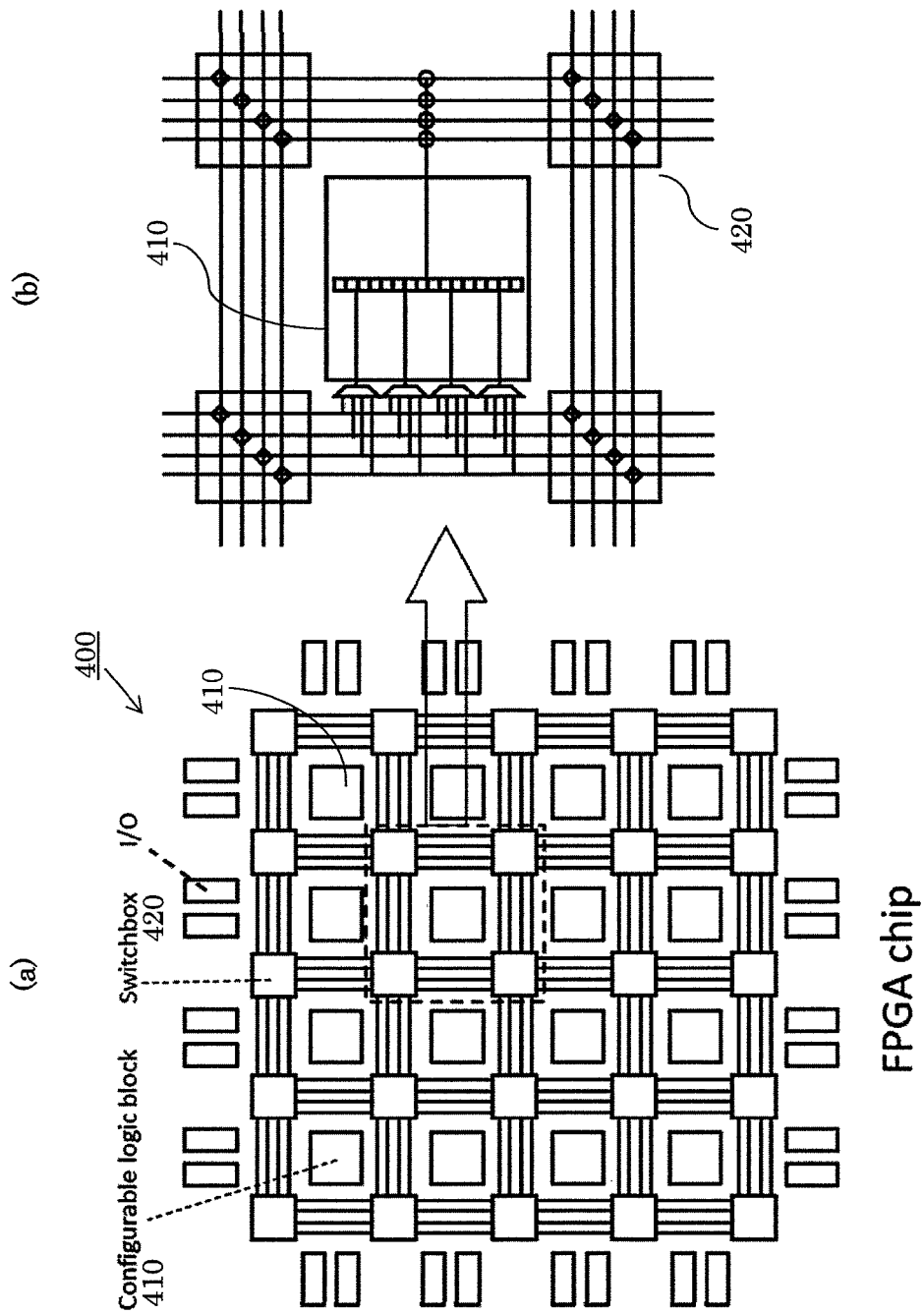
FIG. 103 shows a structure of FPGA as an integrated circuit according to a seventh embodiment of the present invention, where (a) is a block diagram showing the structure of the FPGA, and (b) is an partially magnified view of (a).

FIG. 103 shows a structure of a FPGA 400 as an integrated circuit according to a seventh embodiment of the present invention, where (a) is a block diagram showing the structure of the FPGA 400, and (b) is an partially magnified view of (a).

As shown in FIG. 103 (a), a configurable logic blocks 410, namely so-called gate arrays, of the FPGA 400 are connected via a switchbox 420. FIG. 103 (b) is a magnified view of the logic block 410 and its peripheral circuit, a switch 430.

FIG. 104 shows the specific structure of the switch 430 within the FPGA 400, where (a) is a schematic diagram of the switch 430, and (b) is a circuit diagram of the switch 430.

As shown in FIG. 104 (b), each switch 430 marked by a circle (o) in FIG. 104 (a) includes: a latch 435, which is the basic circuit, and memory element 1B such as MTJ devices 15, 16 connected to this latch 435.

The switch 430 includes: a bistable circuit 438 where two inverters 437 are connected by ring connection; the first and the second MTJ devices 15, 16 connected to each node, which is a connecting point of this bistable circuit 438; and a first to a third n-type MOSFETs 441 to 443 for transfer connected to each node, which is a connecting point of the bistable circuit 438.

The first n-type MOSFET 441 for transfer is connected to the BL signal. The second n-type MOSFET 441 is connected to the /BL signal. The gate of the first and the second n-type MOSFETs 441, 442 for transfer is connected to the WL signal. The third n-type MOSFET 442 for transfer is the MOSFET itself for switching this switch 435. The free layer of the first and the second MTJ devices 15, 16 is connected to the PL signal.

Modification Example 1 of the Seventh Embodiment

Figure 105:
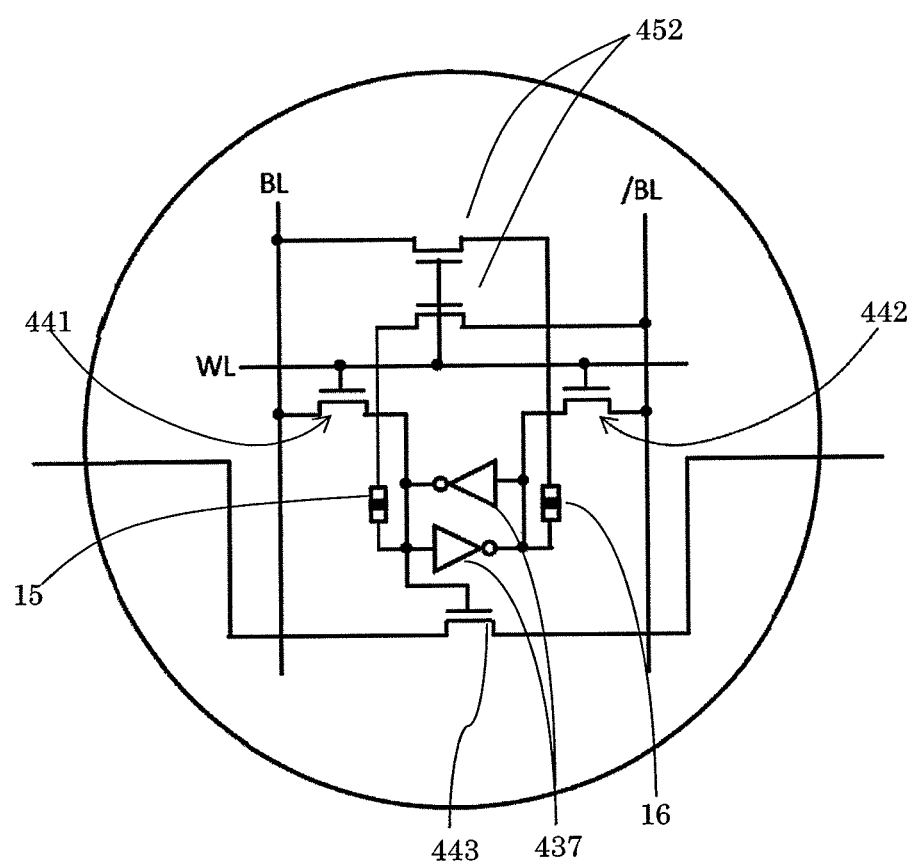
FIG. 105 shows the circuit diagram of the modification example 1 of the switch of the seventh embodiment of the present invention.

FIG. 105 shows the circuit diagram of the modification example 1 of a switch 450 of the seventh embodiment of the present invention. As shown in FIG. 105, the switch 450 has a structure that the n-type MOSFET 452 for transfer is added to the circuit as shown in FIG. 104 and the PL signal is not used.

Modification Example 2 of the Seventh Embodiment

Figure 106:
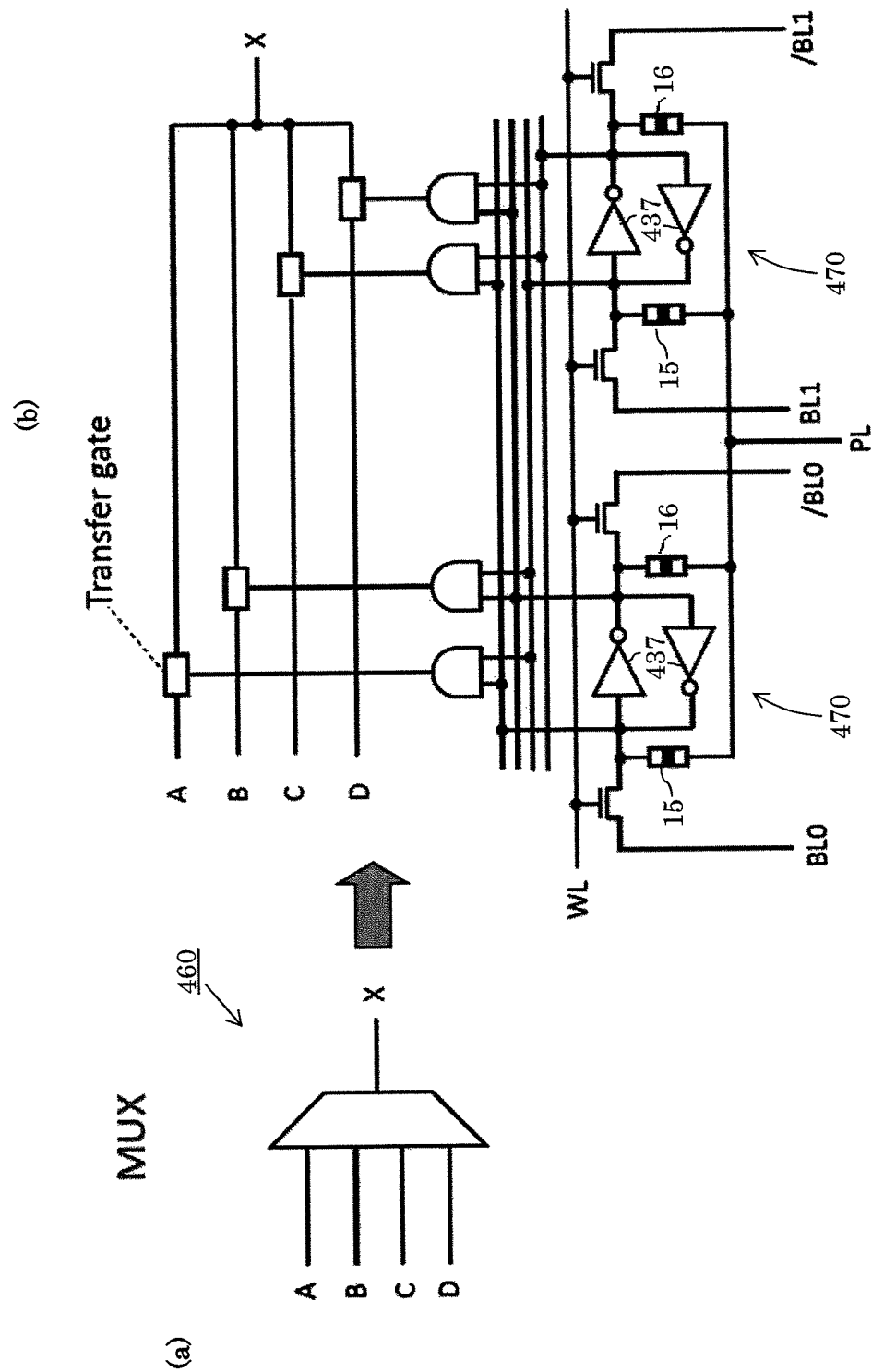
FIG. 106 shows the structure of a multiplexer (MUX) within the FPGA in the modification example 2 according to the seventh embodiment of the present invention, where (a) is a block diagram, and (b) is a circuit diagram.

FIG. 106 shows the structure of a multiplexer (MUX) 460 within the FPGA in the modification example 2 according to the seventh embodiment of the present invention, where (a) is a block diagram, and (b) is a circuit diagram. As shown in FIG. 106, the MUX 460 includes nonvolatile switches 470 using the MTJ devices 15, 16.

Modification Example 3 of the Seventh Embodiment

Figure 107:
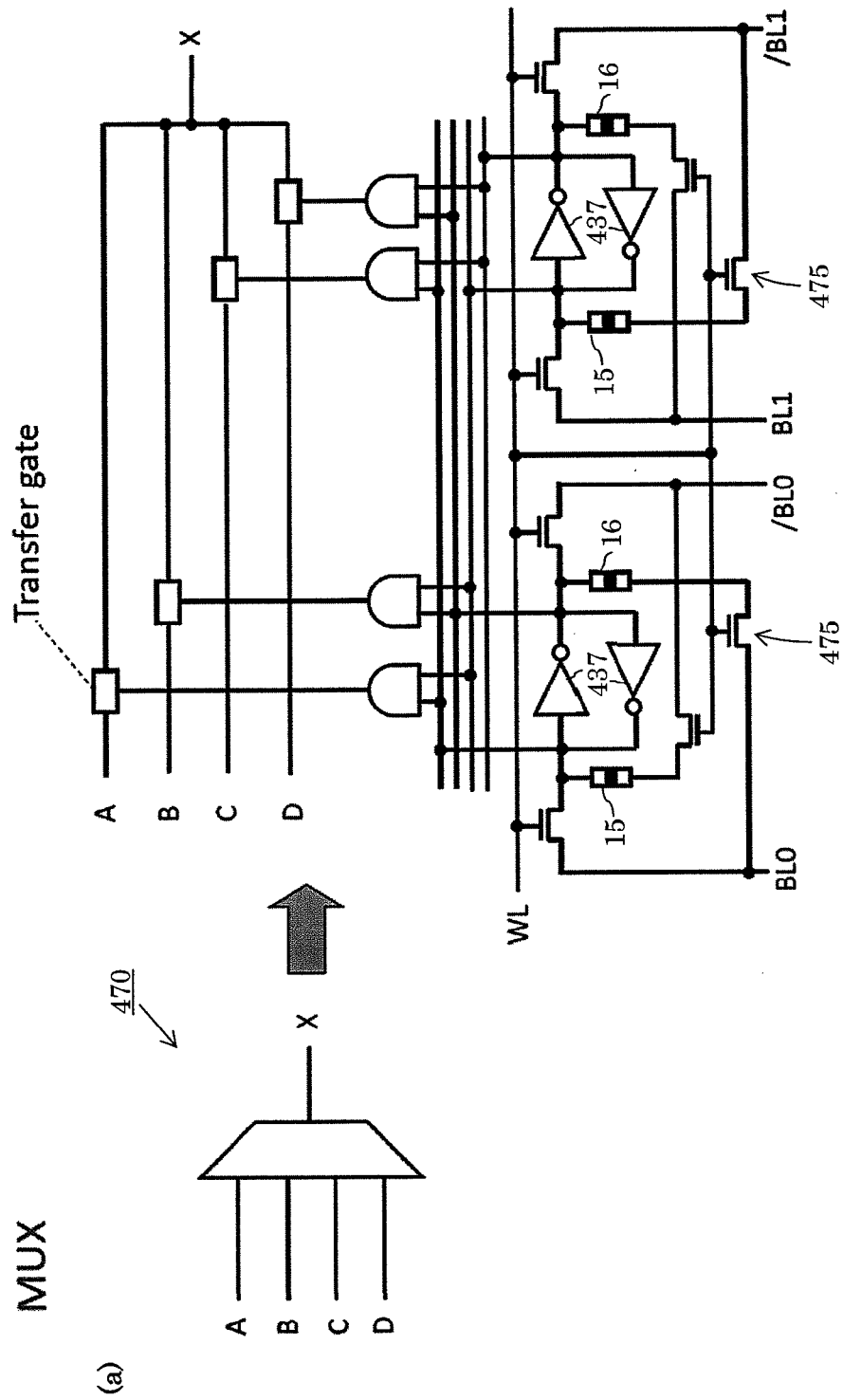
FIG. 107 shows the circuit diagram of the modification example 3 of an MUX within the FPGA in the seventh embodiment of the present invention, where (a) is a block diagram, and (b) is a circuit diagram.

FIG. 107 shows the circuit diagram of the modification example 3 of an MUX 470 within the FPGA in the seventh embodiment of the present invention, where (a) is a block diagram, and (b) is a circuit diagram. As shown in FIG. 107, the MUX 470 has a structure including the nonvolatile memory switch 475 using the MTJ devices 15, 16. Further, the PL signal is not used.

Modification Example 4 of the Seventh Embodiment

Figure 108:
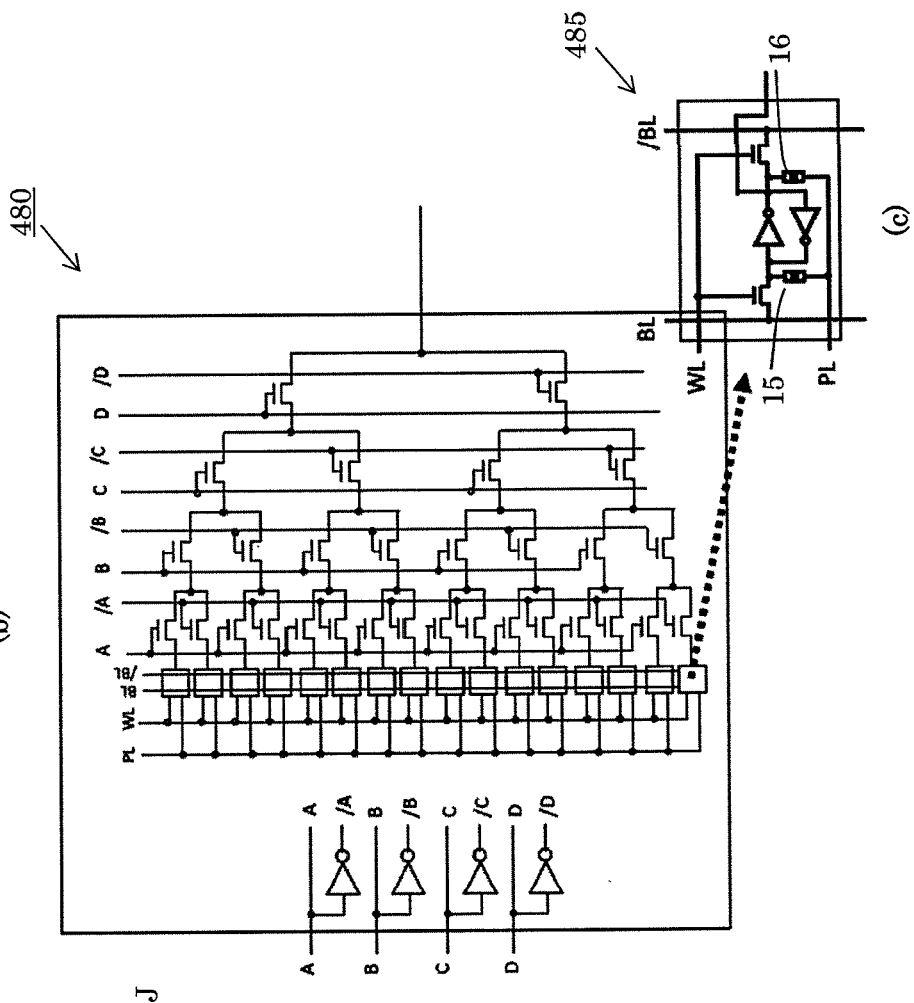
FIG. 108 shows the structure of the modification example 4 of a switch within a logic block in the FPGA in the seventh embodiment of the present invention, where (a) is a block diagram of the logic block, (b) is a circuit diagram of the logic block, and (c) is a circuit diagram of switch.

FIG. 108 shows the structure of the modification example 4 of a switch 485 within a logic block 480 in the FPGA in the seventh embodiment of the present invention, where (a) is a block diagram of the logic block 480, (b) is a circuit diagram of the logic block 480, and (c) is a circuit diagram of a switch 485.

As shown in FIG. 108, the logic block 480 has a structure including the switch 485 using the MTJ devices 15, 16. This block has a structure, so called, Table Look Up (TLU-type).

Modification Example 5 of the Seventh Embodiment

FIG. 109 shows the structure of the modification example 5 of a switch 495 within a logic block 490 in the FPGA in the seventh embodiment of the present invention, where (a) is a block diagram of the logic block 490, (b) is a circuit diagram of the logic block 490, and (c) is a circuit diagram of the switch 495. As shown in FIG. 109, the logic block 495 has a structure including the switch using the MTJ devices 15, 16. The difference in comparison with FIG. 108 is that the writing method to the MTJ devices 15, 16 is different.

Eighth Embodiment

Page Buffer

When cells having a low resistance to write such as NAND-type flush memories are used as data storage memories, the unit for writing data is 1 MB or more for applications to digital cameras, MP 3 players, videos etc., but for applications to personal computers (PC) and data centers, the minimum unit (sector) for writing of OS is 512B. Consequently, with the NAND-type flush memories, when the data is written into a cell in a unit smaller than the page length each time, the cells will degrade. To prevent this, the data is stored in a page buffer until the page becomes full, and the data is written into the cell collectively when the page becomes full.

Figure 110:
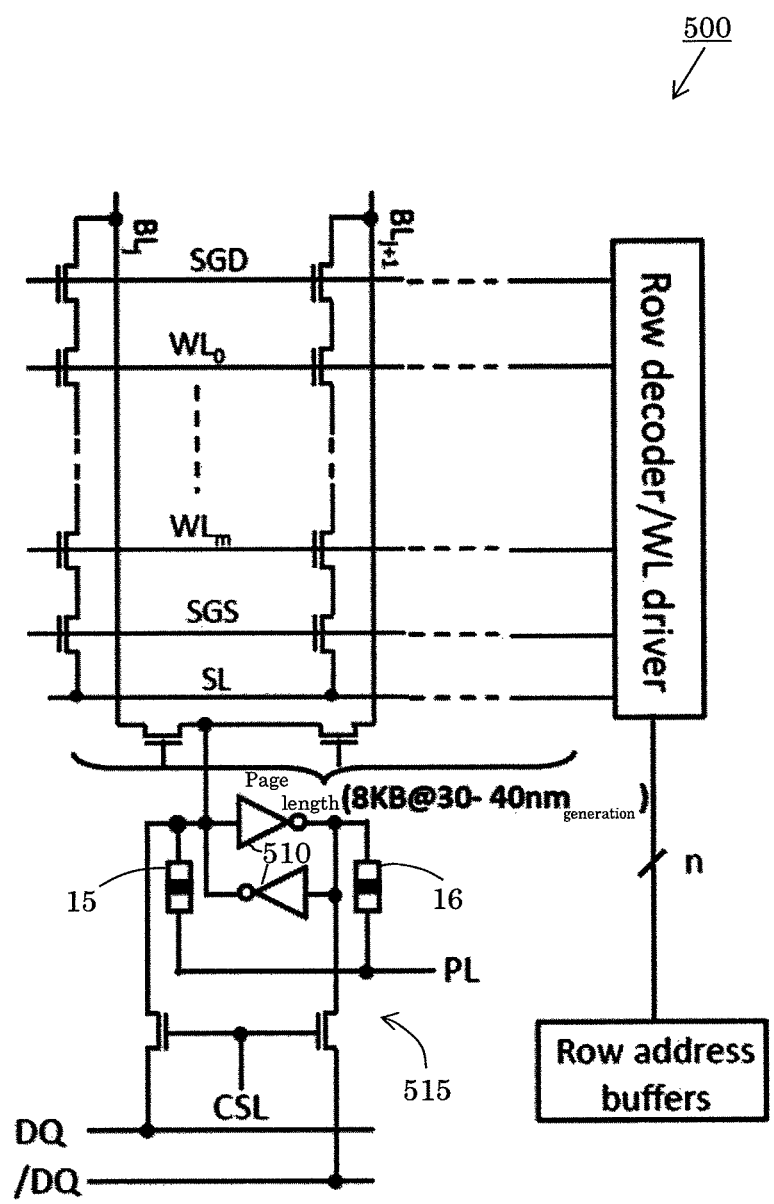
FIG. 110 is a circuit diagram of a page buffer as an integrated circuit according to an eighth embodiment of the present invention.

FIG. 110 is a circuit diagram of a page buffer 500 as an integrated circuit according to an eighth embodiment of the present invention. As shown in FIG. 110, the page buffer 500 includes a nonvolatile memory cell 515 where two MTJ devices 15, 16 are connected to a bistable circuit 510 of the present invention. According to this page buffer 500, to prevent data from being lost even if the power is interrupted, by adding memory cell 1B such as the MTJ devices 15, 16 to the page buffer 500, the data can be saved before the power is interrupted.

Modification Example of the Eighth Embodiment

Figure 111:
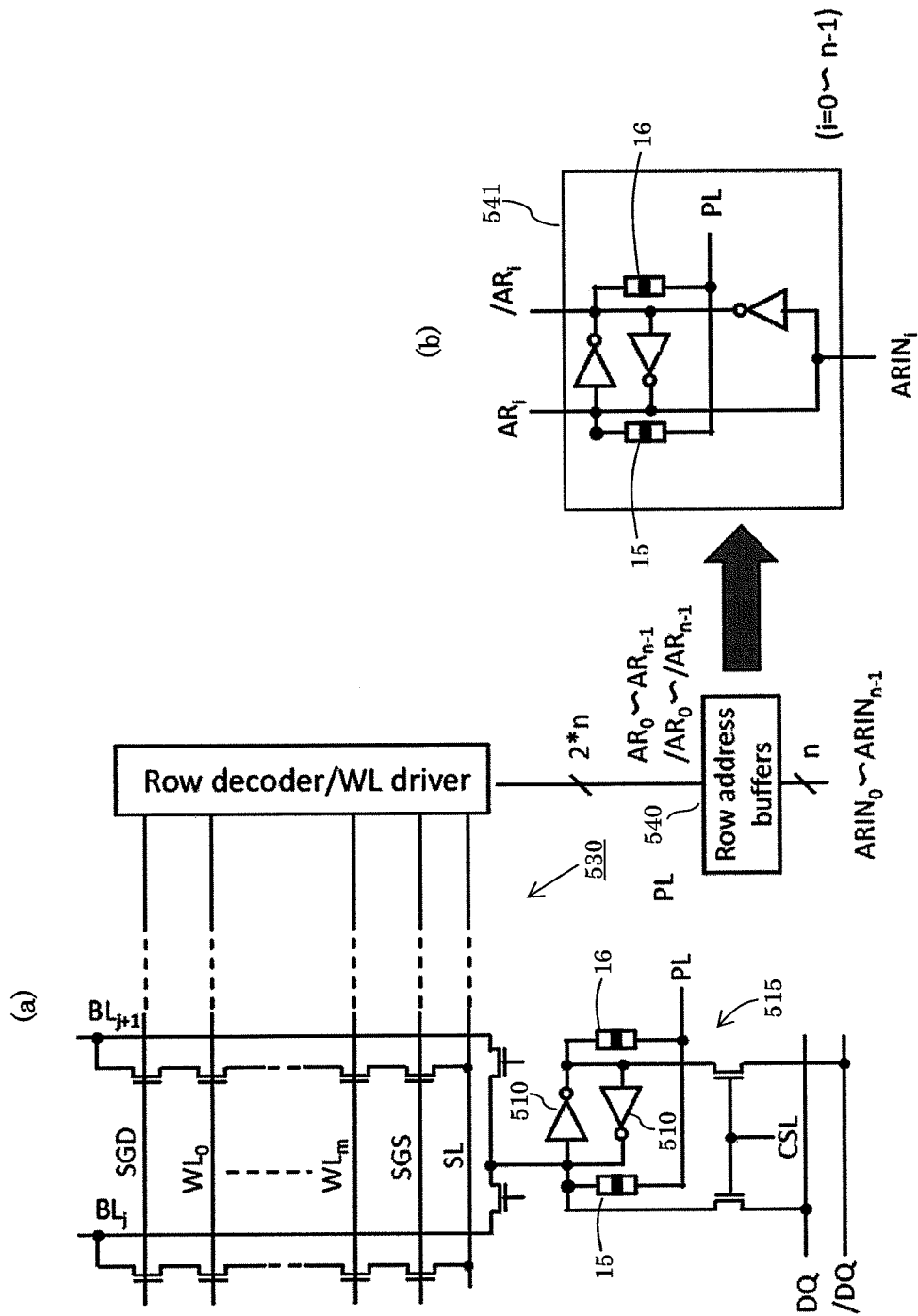
FIG. 111 shows the structure of the modification example of a page buffer in the eighth embodiment of the present invention, where (a) is a block diagram, and (b) is a circuit diagram of the memory cell of a row address buffer.

FIG. 111 shows the structure of the modification example of a page buffer 530 in the eighth embodiment of the present invention, where (a) is a block diagram, and (b) is a circuit diagram of a memory cell 541 of a row address buffer 540.

As shown in FIG. 111 (b), in the page buffer 530, the MTJ devices 15, 16 are also used in the memory cell 541 of the row address buffer 540. According to this page buffer 530, the row address before power-off can be saved to the memory device 1B such as the MTJ devices 15, 16. After the power source is supplied again, the row address is recovered, the corresponding word line is activated, and the data can be saved in the memory cell 541 of the page buffer 530.

Ninth Embodiment

System

Next, an integrated circuit system using the integrated circuit of the present invention will be described.

Figure 112:
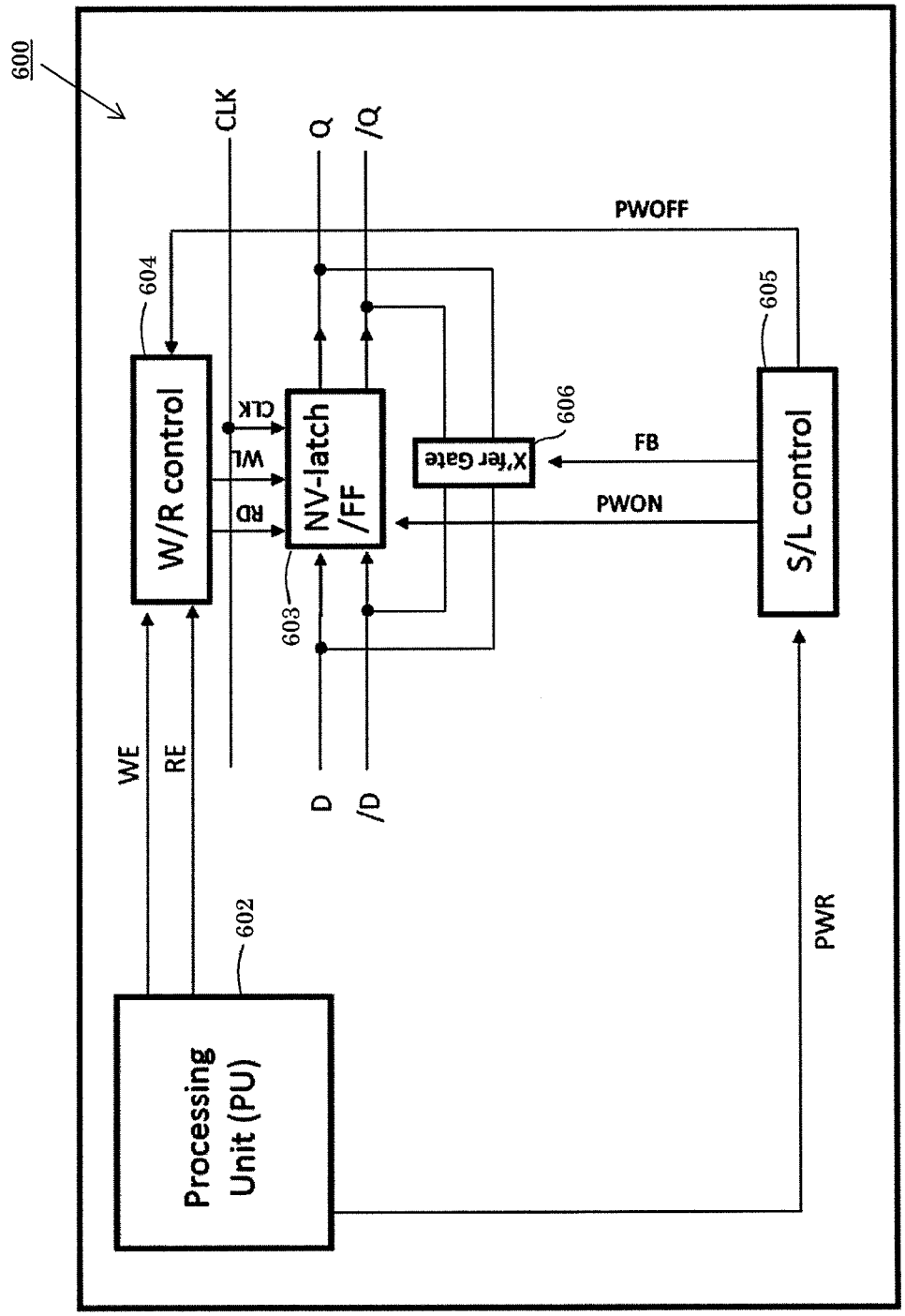
FIG. 112 is a circuit diagram of an integrated circuit system according to the ninth embodiment of the present invention.

FIG. 112 is a circuit diagram of an integrated circuit system 600 according to the ninth embodiment of the present invention. This integrated circuit system 600 includes: a central processing unit (PU) 602; a latch or flip-flop circuit 603; a write and read circuit 604; an SL control circuit 605, which is a data save and load control unit; and an X'fer gate 606. The control such as the power off and the power on is described in OS or in the application software.

With an integrated circuit system, the nonvolatile latch or the flip-flop (FF) 603 exists within the chip having the central processing unit (PU) 602 and the data save and load control unit 605 (called S/L control). When the data is written immediately before the power supply turns off, the control is performed based on the feedback of output data from the latch so that the data is written into the MTJ devices 15, 16 for a period longer than the switching time $(t_A+t_B)$ of the MTJ devices 15, 16. When the power supply is on, the central processing unit (PU) 602 and the data save and load control unit 605 are controlled so that the data is loaded from the MTJ devices 15, 16. The save and load control unit 60 may generate a signal for interrupting the power, detecting that the voltage of the power supply has decreased to below a predetermined value.

Modification Example 1 of the Ninth Embodiment

Figure 113:
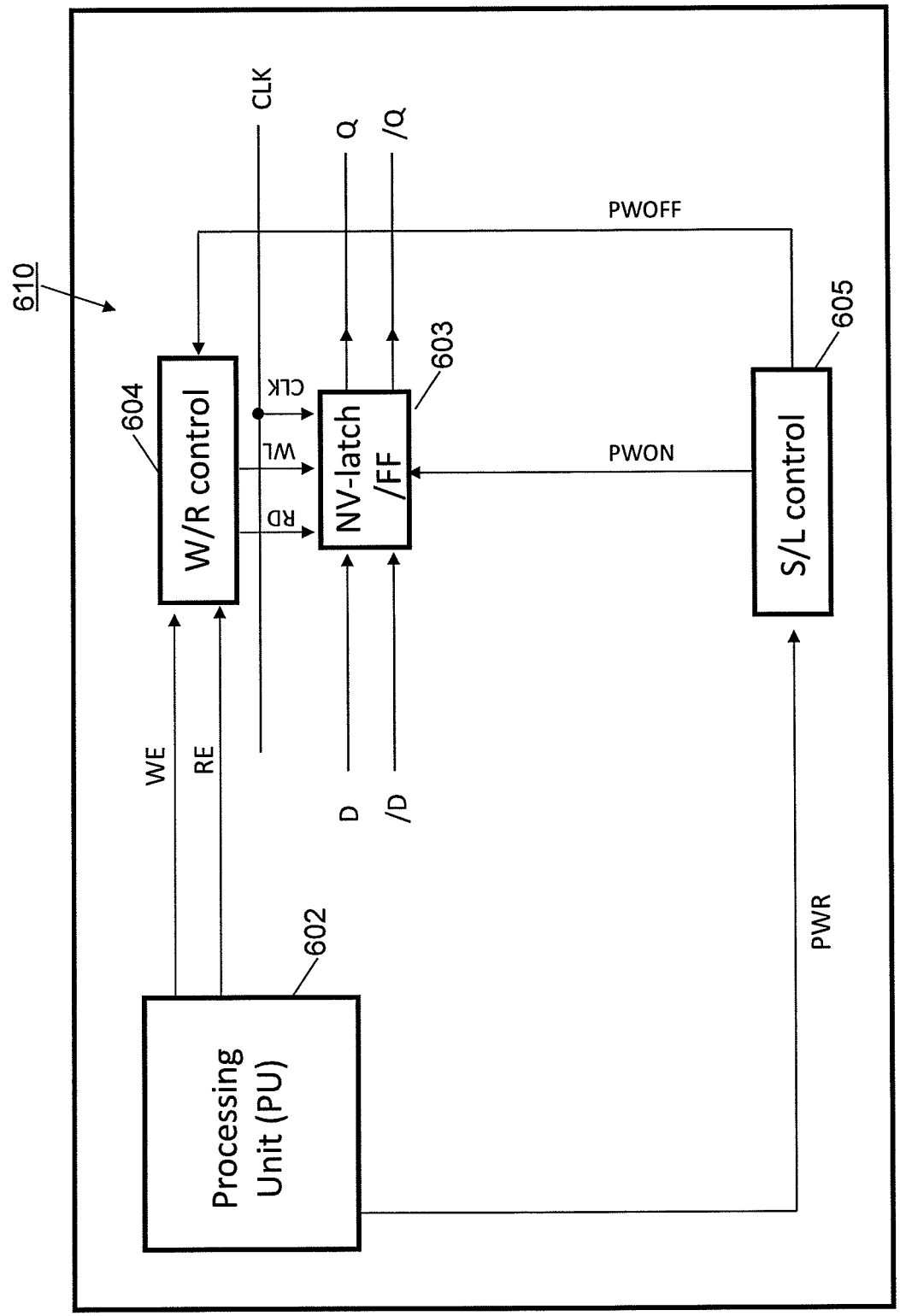
FIG. 113 is a circuit diagram of the modification example 1 of the integrated circuit system according to the ninth embodiment of the present invention.

FIG. 113 is a circuit diagram of the modification example 1 of the integrated circuit system according to the ninth embodiment of the present invention.

With the integrated circuit system 610, the nonvolatile latch or the flip-flop (FF) 603 exists within the chip having the central processing unit (PU) 602 and the data save and load control unit 605. When the data is written immediately before the power supply turns off, the control is performed so that the data is written from the central processing unit (PU) 602 into the MTJ devices 15, 16 for a period longer than the switching time $(t_A+t_B)$ of the MTJ devices 15, 16. When the power supply turns on, the central processing unit (PU) 602 and the data save and load control unit 605 are controlled so that the data is loaded from the MTJ devices 15, 16.

Modification Example 2 of the Ninth Embodiment

Figure 114:
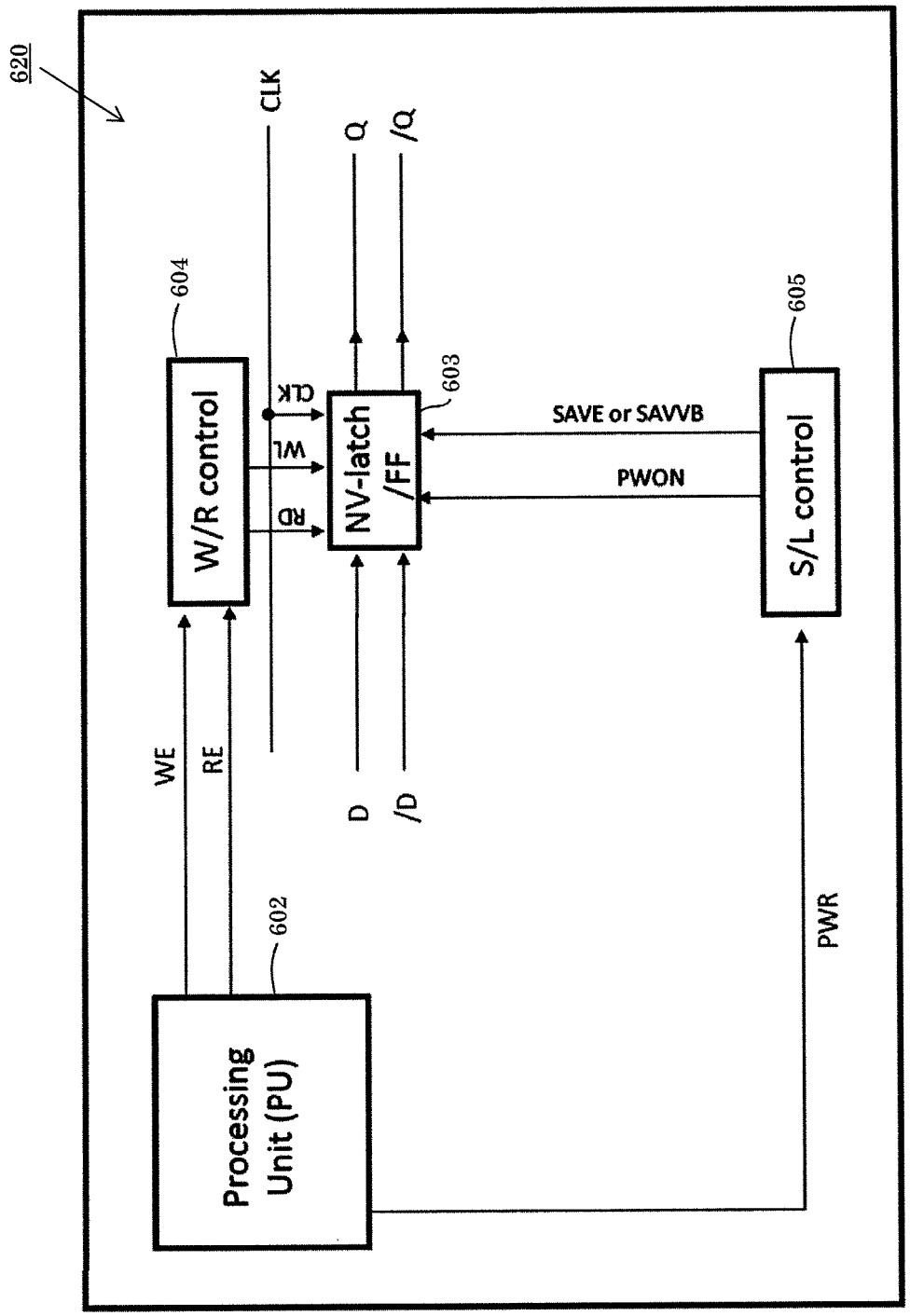
FIG. 114 is a circuit diagram of the modification example 2 of the integrated circuit system according to the ninth embodiment of the present invention.

FIG. 114 is a circuit diagram showing of the modification example 2 of the integrated circuit system according to the ninth embodiment of the present invention.

In an integrated circuit system 620, the nonvolatile latch or the nonvolatile flip-flop (NVFF) 603 exists within the chip having the central processing unit (PU) 602 and the data save and load control unit 605. The central processing unit (PU) 602 and the data save and load control unit 605 are controlled at immediately before the turn-off the power supply so that a SAVE signal or a SAVEB signal, which is longer than the switching time $(t_A+t_B)$ of the MTJ devices 15, 16, is transmitted from the data save and load control unit 605 to the nonvolatile latch or the nonvolatile flip-flop (NVFF) 603.

Modification Example 3 of the Ninth Embodiment

Figure 115:
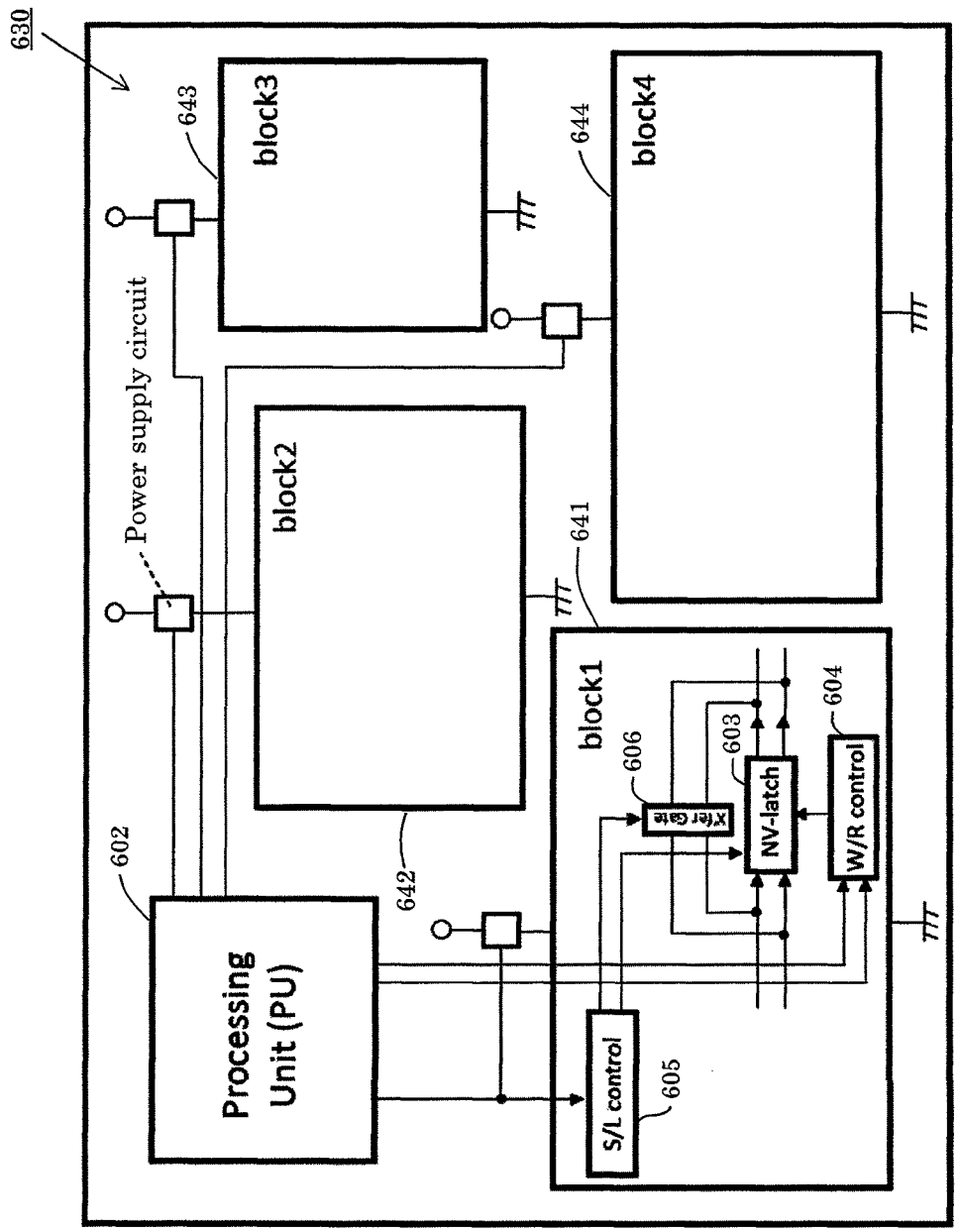
FIG. 115 is a circuit diagram of the modification example 3 of the integrated circuit system according to the ninth embodiment of the present invention.

FIG. 115 is a circuit diagram showing the modification example 3 of the integrated circuit system according to the ninth embodiment of the present invention.

An integrated circuit system 630 has a structure that there are a plural blocks 641 to 644 within the chip. The turn-on and the turn-off of the power supply of the each block can be controlled independently as shown in FIGS. 68, 112, and 113.

Modification Example 4 of the Eighth Embodiment

Figure 116:
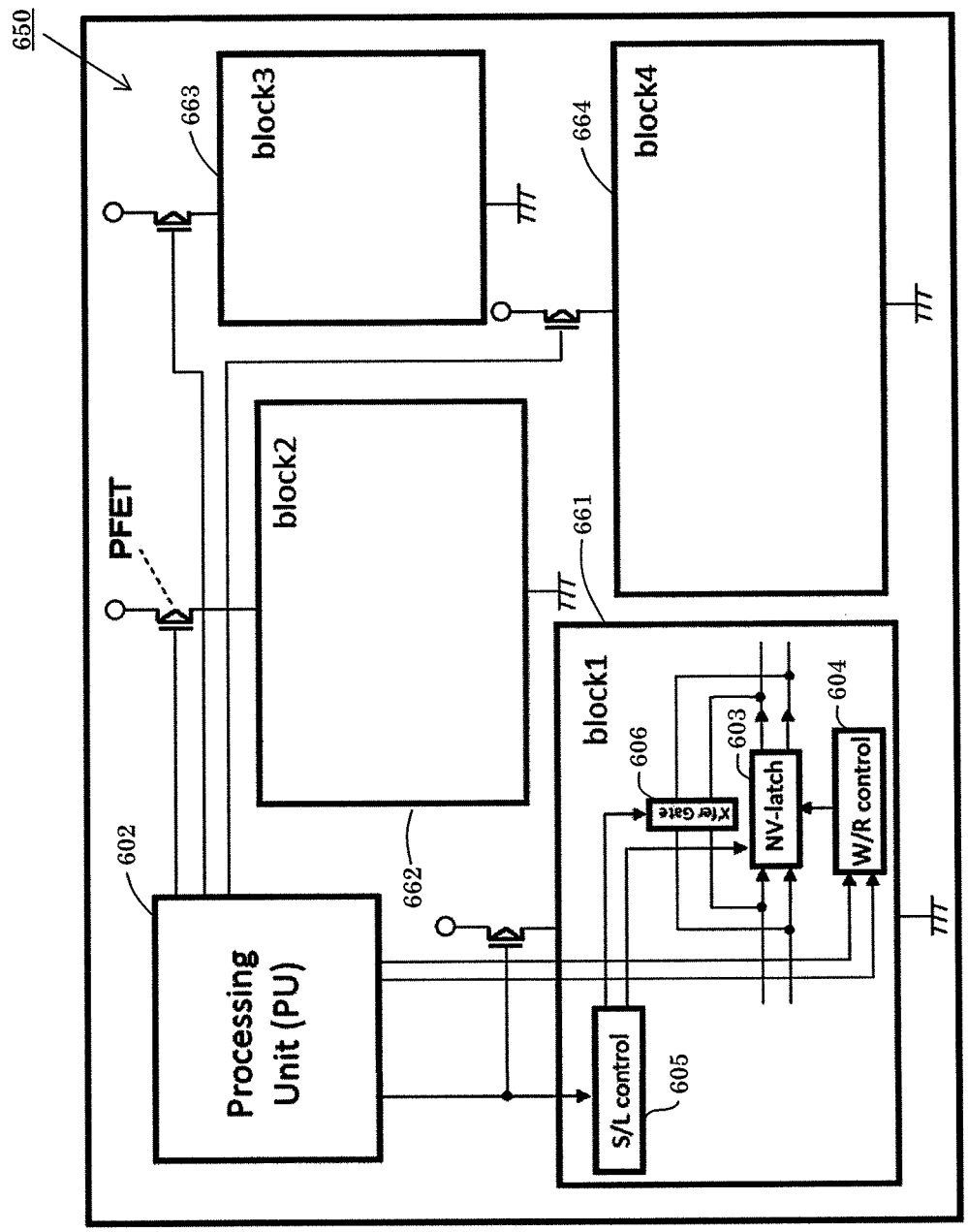
FIG. 116 is a circuit diagram of the modification example 4 of the integrated circuit system according to the ninth embodiment of the present invention.

FIG. 116 is a circuit diagram of the modification example 5 of the integrated circuit system according to the ninth embodiment of the present invention.

An integrated circuit system 650 has a structure that there are a plural blocks 661 to 664 within the chip. The central processing unit (PU) 602 and the data save and load control unit 605 of the each block can be controlled independently as shown in FIGS. 68, 112 and 113.

Modification Example 5 of the Ninth Embodiment

Figure 117:
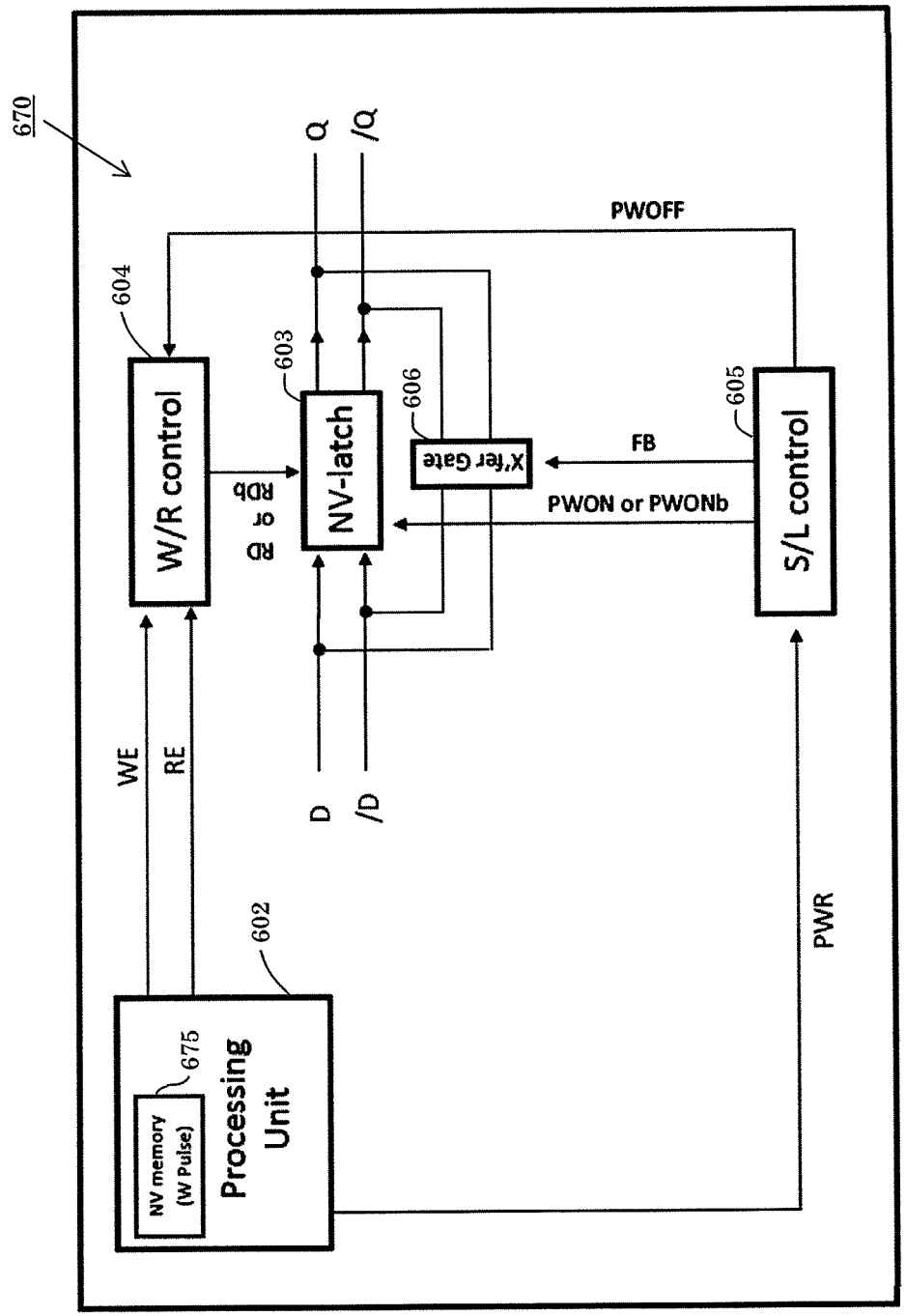

FIG. 117 is a circuit diagram of the modification example 5 of the integrated circuit system according to the ninth embodiment of the present invention.

With an integrated circuit system 670, the Write pulse width is determined by the value programmed in a nonvolatile memory (NV memory (W Pulse)) 675 provided in the chip. While the fluctuation in the switching time of the MTJ devices 15, 16 among lots, wafers, and chips is in stable state, the predetermined value can be used as the write time into the MTJ devices 15, 16. In other words, it is only necessary to store the write time in the chip.

Modification Example 6 of the Ninth Embodiment

Figure 118:
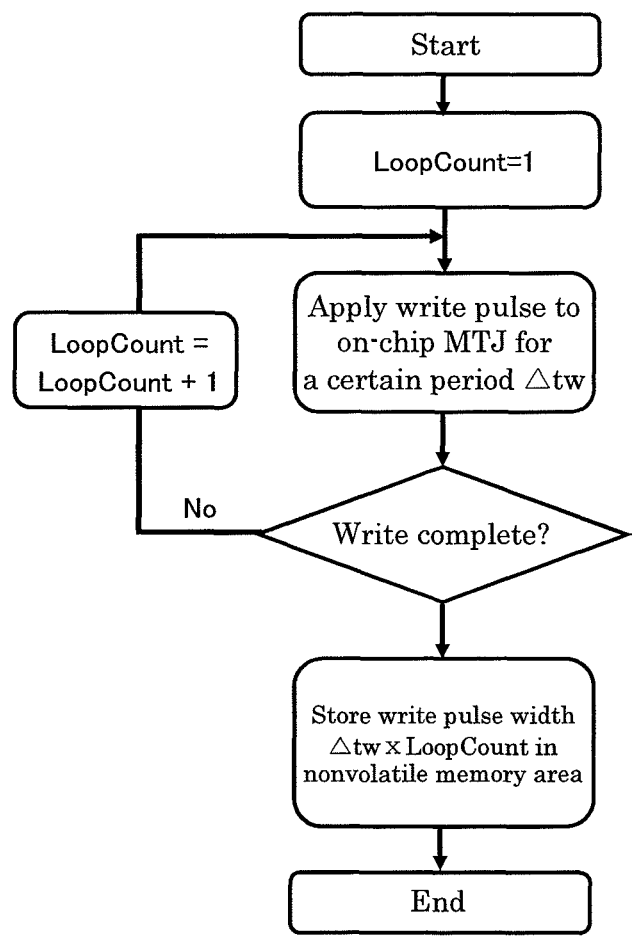

FIG. 118 is a flow chart for specifying the Write pulse width as a structure of the modification example 6 of the integrated circuit system according to the ninth embodiment of the present invention.

With the integrated circuit system, at the time of a wafer test or package test, the Write pulse width of each chip is measured for the on-chip MTJ devices 15, 16, in accordance with the flow chart as shown in FIG. 118. The result is stored in the nonvolatile memory (NV memory, (W Pulse)) 675 for exclusive use. The MTJ devices 15, 16 subjected to be measured may be MTJ devices 15, 16 within the actual circuit, or the replica MTJ devices 15, 16 provided in the chip.

In the integrated circuit system, a circuit for achieving on-chip write time measurement as shown by this flow chart may be equipped. When the integrated circuit system is a microcomputer or processor, the procedure as shown by the flow chart in FIG. 118 may be programmed in a read only memory (ROM), and the procedure in the flow chart may be started according to the command.

When the fluctuation in switching time of the MTJ devices among lots, wafers, and chips is large, the switching time may be measured by the chip to determine the write time, and it may be stored in the chip.

When the temporal fluctuation in switching time of the MTJ devices is large, the write time may be measured in the on-chip measurement circuit as required, once a day or at the time of rebooting of the system, for example, and the result may be stored in the chip.

Modification Example 7 of the Ninth Embodiment

Figure 119:
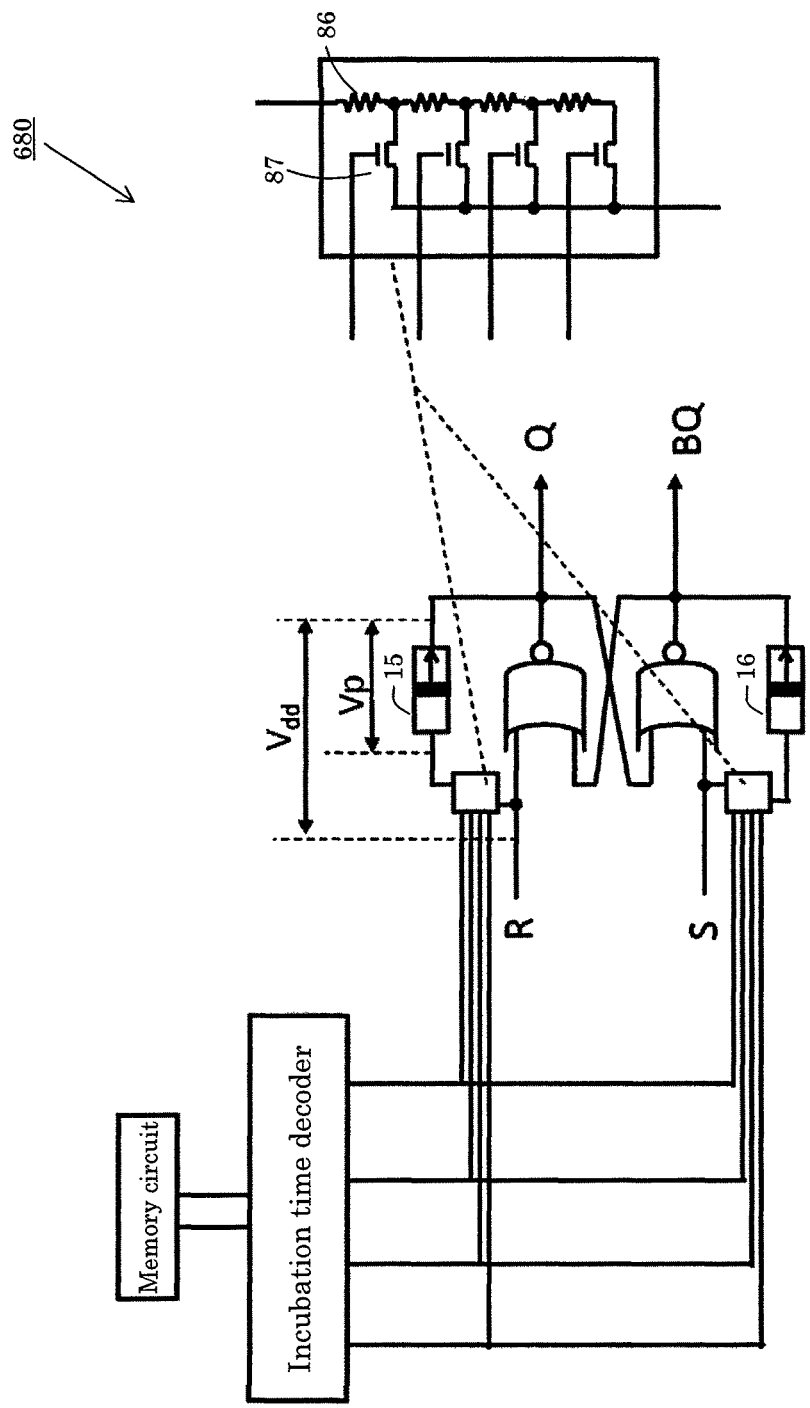

FIG. 119 is a circuit diagram of the modification example 7 of the integrated circuit system according to the ninth embodiment of the present invention.

In an integrated circuit system 680, the incubation time to be set may be determined by based on the measurement results of the relation between the program voltage and current, and the incubation time. The related resistance may be programmed to the selected memory circuit. The size and the gate voltage etc. of the resistance value 86 or the MOSFET 87, which are shown in FIG. 59 and FIG. 60 as the adjustment method of the incubation time, can be adjusted by the program mentioned above.

Modification Example 8 of the Ninth Embodiment

Figure 120:
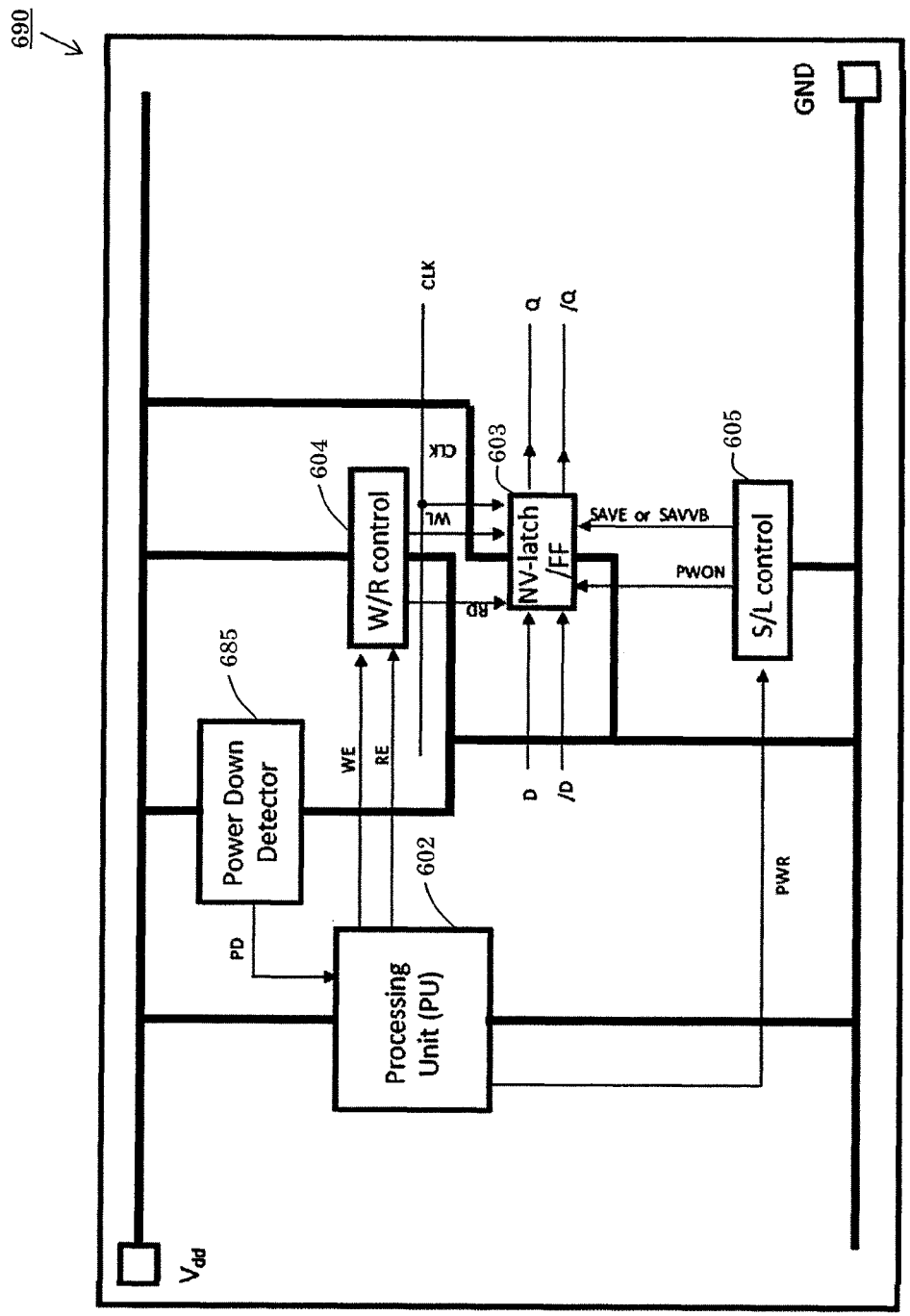

FIG. 120 is a circuit diagram of the modification example 8 of the integrated circuit system according to the ninth embodiment of the present invention. As shown in FIG. 120, an integrated circuit system 690 is an example of the system that detects the decrease in the power supply voltage automatically, and enters the second operation mode when the power supply voltage is decreases to below the predetermined value, and saves the data into MTJ devices 15, 16 (not shown), taking a time longer than $t_A+t_B$. With this integrated circuit system 690, as a circuit block for detecting decrease in power supply voltage $V_{dd}$, the following function is provided. Once a power down detector 685 detects decrease in $V_{dd}$ to lower than to below the predetermined value, the signal PD is transmitted to the central processing unit (PU) 602 to allow the central processing unit (PU) 602 to execute the second operation mode, thereby saving the data to the MTJ devices 15, 16.

The example related to the latch of the present invention will hereinafter be described in particular.

Example

Figure 121:
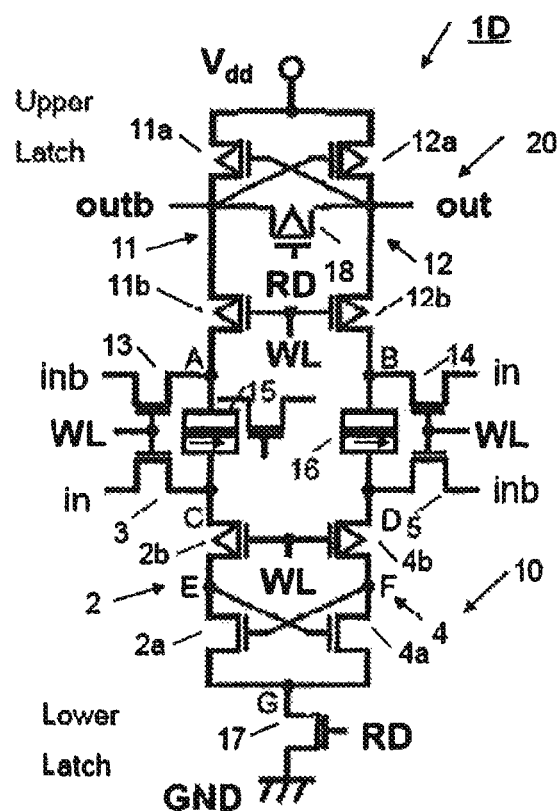

FIG. 121 is a circuit diagram showing the latch as the basic structure of a semiconductor memory device 1D of the present invention.

As shown in FIG. 121, the semiconductor memory device 1D of the present invention includes: the first latch 10; the spin-injection-type MTJ devices 15, 16 connected to the first latch 10; and the second latch 20 connected to the spin-injection-type MTJ devices 15, 16. In the spin-injection-type MTJ devices 15, 16, the data is written at the operation frequency lower than that of the first latch 10 and/or the second latch 20. The first latch 10 is also called a lower latch, and the second latch 20 is also called an upper latch.

The first latch 10 includes: the first circuit 2; the first n-type MOSFET 3 for transfer connected to the first circuit 2; the second circuit 4; and the second n-type MOSFET 5 for transfer connected to the second circuit 4. The first circuit 2 includes: the first n-type MOSFET 2a for driving; and the first p-type MOSFET 2b. The second circuit 4 includes: the second n-type MOSFET 4a for driving; and the second p-type MOSFET 4b.

The second latch 20 includes: the third circuit 11; the third n-type MOSFET 13 for transfer connected to the third circuit 11; the fourth circuit 12; and the fourth n-type MOSFET 14 for transfer connected to the fourth circuit 12. The third circuit 11 includes: the first p-type MOSFET 11a for driving; and the third p-type MOSFET 11b. The fourth circuit 12 includes: the second p-type MOSFET 12a for driving; and the fourth p-type MOSFET 12b.

The n-type MOSFET 17 is connected between the first latch 10 and the ground. The drain of the n-type MOSFET 17 is connected to the sources of the first n-type MOSFET 2a for driving and the second n-type MOSFET 4a. The source of the n-type MOSFET 17 is connected to the ground. The RD signal is applied to the gate of the n-type MOSFET 17.

The p-type MOSFET 18 is connected between the output terminals out and outb of the second latch 20. The drain of the p-type MOSFET 18 is connected to the output terminal outb. The source of the p-type MOSFET 18 is connected to the output terminal out. The RD signal is applied to the gate of the p-type MOSFET 18.

The first spin-injection-type MTJ device 15 is connected between the first p-type MOSFET 2b and the third p-type MOSFET 11b. The fixed layer, which is one end of the first spin-injection-type MTJ device 15, is connected to the drain of the first p-type MOSFET 2b. The free layer, which is the other end of the first spin-injection-type MTJ device 15, is connected to the source of the third p-type MOSFET 11b.

In the first spin-injection-type MTJ device 15, the layer between the fixed layer and the free layer is the tunnel barrier layer.

The second spin-injection-type MTJ device 16 is connected between the second p-type MOSFET 4b and the fourth p-type MOSFET 12b. The fixed layer, which is an end of the second spin-injection-type MTJ device 16, is connected to the drain of the fourth p-type MOSFET 12b. The free layer, which is the other end of the second spin-injection-type MTJ device 16, is connected to the source of the fourth p-type MOSFET 12b.

Further, in the second spin-injection-type MTJ device 16, the layer between the fixed layer and the free layer is the tunnel barrier layer.

The drain of the first n-type MOSFET 2a for driving is connected to the gate, i.e. an input terminal, of the second n-type MOSFET 4b for driving. The drain of the second n-type MOSFET 4a for driving is connected to the gate, i.e. an input terminal, of the first n-type MOSFET 2a for driving. The connections between the drains and the gates of these first and second n-type MOSFETs 2a, 4a for driving is called a cross-over or a cross-coupled wiring.

The so-called volatile latch circuit is constructed by the first circuit 2 and the second circuit 4 having above described configuration.

The in signal is applied to the output terminal of the first circuit 2 via the first n-type MOSFET 3 for transfer. The inb signal is applied to the output terminal of the second circuit 4 via the second n-type MOSFET 5 for transfer.

The gates of the first, second, third, and fourth n-type MOSFETs 3, 5, 13, 14 for transfer are connected to the same WL signal. The in signal is applied to the sources of the first and the fourth n-type MOSFETs 3, 14 for transfer. The inb signal is applied to the sources of the second and the third n-type MOSFETs 5, 13 for transfer.

Next, the MTJ device used for semiconductor memory device 1D will be described.

The write current of the MTJ devices 15, 16 can be decreased with the scaling of devices, and thus the devices can be fabricated on the same substrate along with a CMOS integrated circuit formed on a Si substrate etc., which is an advantage.

Figure 122:
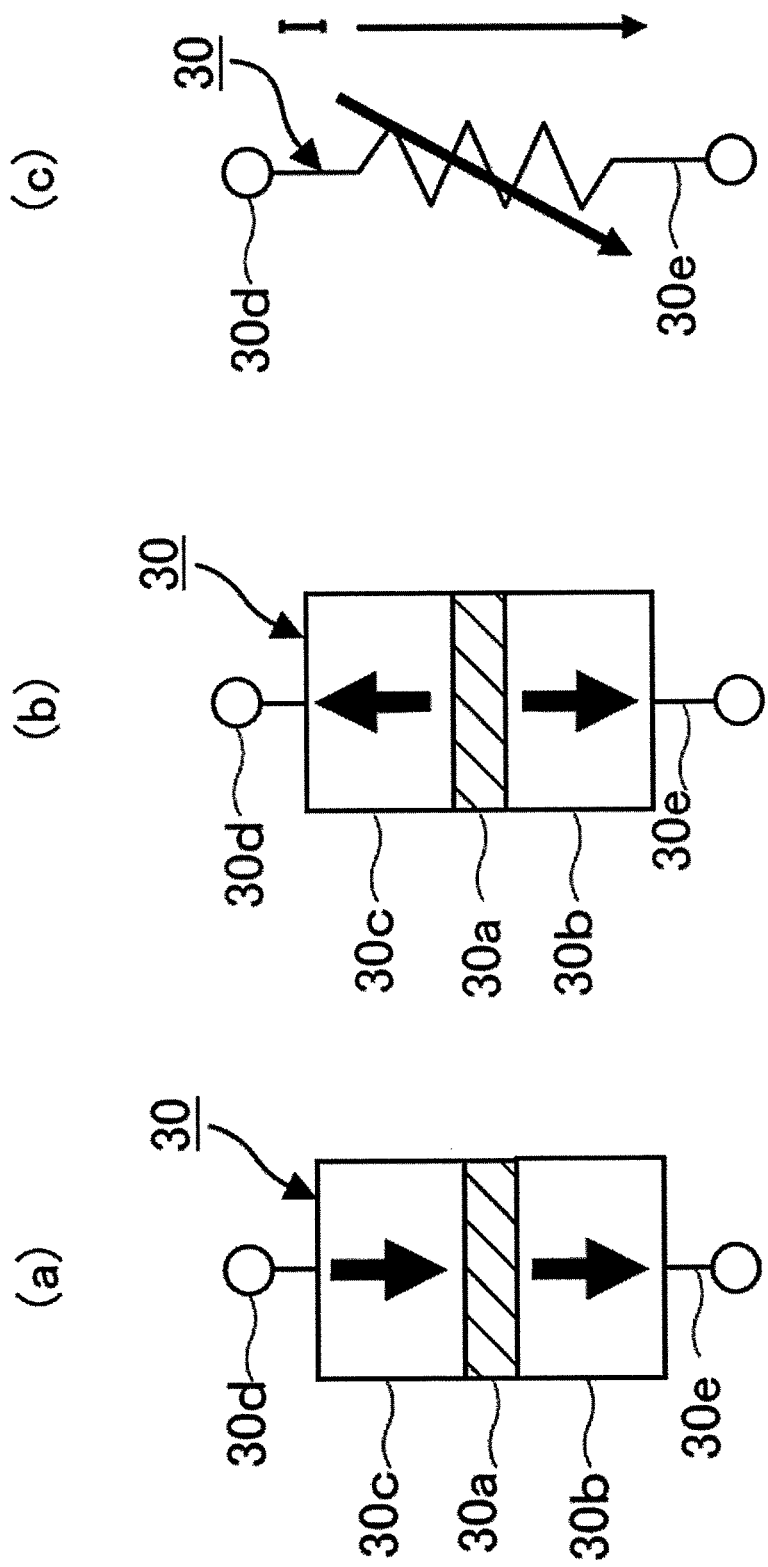
Figure 123:
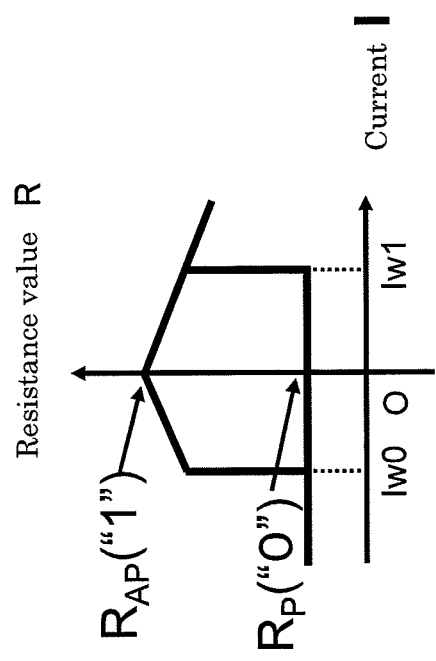

FIG. 122 is a chart showing the structure of an MTJ device 30, where (a) shows a case where the magnetization direction of the fixed layer 30b and that of the free layer 30c are in a parallel state in the MTJ device 30, (b) shows a case where they are in an antiparallel state in the MTJ device 30, and (c) is an equivalent circuit diagram. FIG. 123 is a chart showing the change in resistance of the MTJ device 30.

As shown in FIGS. 122 (a) and (b), the MTJ device 30 includes: the ferromagnetic fixed layer 30b; and the ferromagnetic free layer 30c both of which are separated by the tunnel barrier layer 30a. The magnetization direction, namely the spin orientation, of the fixed layer 30b is fixed to the direction as shown by a downward arrow and this layer is also called a ferromagnetic fixed layer. The magnetization direction of the free layer 30c is not fixed, and this layer is also called a ferromagnetic free layer. The tunnel barrier layer 30a is formed with an MgO or $Al_2O_3$ thin film. The fixed layer 30b and the free layer 30c are formed with one or more layers made of a ferromagnetic body such as iron (Fe) and cobalt (Co), or an alloy of such ferromagnetic bodies. Further, as shown in FIG. 122, an upper electrode 30d is formed on the free layer 30c and a lower electrode 30e is formed on the fixed layer 30b.

The resistance value of the MTJ device 30 changes in accordance with the relative magnetization direction of the fixed layer 30b and the free layer 30c. This change in resistance is called tunnel magnetoresistance effect. As a parameter for evaluating this change in resistance, the tunnel magnetoresistance ratio (TMR ratio) is an important parameter of the MTJ device 30.

As shown in FIG. 122 (a), the state where the magnetization direction of the fixed layer 30b and that of the free layer 30c are identical is called the parallel state, where the resistance value of the MTJ device 30 becomes the minimum. The resistance value of the MTJ device 30 is represented as $R_P$.

As shown in FIG. 122 (b), the state where the magnetization direction of the fixed layer 30b and that of the free layer 30c are in reverse is called the antiparallel state, where the resistance value of the MTJ device 30 becomes the maxim. The resistance value of the MTJ device 30 is represented as $R_{AP}$. By controlling the magnetization state of the free layer 30c so that it becomes parallel or antiparallel with respect to the fixed layer 30b, "0" or "1" can be recorded, or written.

The TMR ratio is represented by expression (1) as shown below.

$$\text{TMR ratio } (\%) = (R_{AP} - R_P)/R_P \times 100(\%) \qquad (1)$$

Next, the operation principle of the MTJ device 30 will be described.

As shown in FIG. 122 (c), to write data from the antiparallel state to the parallel state, a current (I) is applied in a direction from the free layer 30c to the fixed layer 30b. In this case, electrons flow in a direction reverse to that of the current. Consequently, a large number of spins are injected from the fixed layer 30b to the free layer 30c. The spin-polarized current causes magnetization of the free layer 30c to occur, and the magnetization of the free layer 30c is reversed in the same direction as the fixed layer 30b, causing the parallel state to be reached.

Reversely, in order to write the data from the parallel state to the antiparallel state, the current is fed in the direction from the fixed layer 30b to the free layer 30c. The injected spins are compensated in the free layer 30c, but the electrons having reflected on the tunnel barrier layer 30a have magnetization in the direction reverse to that of the free layer 30c. The spins having reflected on the tunnel barrier layer 30a reverse the magnetization of the free layer 30c, causing the antiparallel state to be reached. As described above, with the spin injection system, by reversing the direction of the current fed to the MTJ device 30, the magnetization direction of the free layer 30c is reversed, which is also called as the spin-injection flux reversal.

As shown in FIG. 123, in the MTJ device 30, the magnetization direction of the free layer 30c is reversed with respect to the magnetization direction of the fixed layer 30b depending on the direction of the current to be fed, and when the magnetization direction is parallel to each other, magnetic resistance (Rp) becomes small.

Meanwhile, the magnetization direction of the free layer 30c becomes antiparallel to the magnetization direction of the fixed layer 30b, the magnetic resistance ($R_{AP}$) increases. As described above, the MTJ device 30 is a variable resistance element having two different resistance values depending on the state of magnetization of the free layer 30c.

As a method for reversing magnetization of the free layer 30c, other than the spin injection system, the magnetic write system of prior art is available. Magnetic field can be applied by providing the current wiring for generating external magnetic field near the MTJ device 30, and feeding current to this wiring. In the spin injection system, since the flux reversal of the free layer 30c can be achieved using the current fed to the MTJ device 30, the external magnetic field is unnecessary. Consequently, the current wiring for generating the external magnetic field is unnecessary. Furthermore, when the area of the MTJ device 30 is scaled, the current necessary for flux reversal by spin injection also decreases.

(Switching Speed of STT-MTJ)

The time-resolved switching characteristics of the in-plane magnetization-type MTJ devices (i-MTJ devices) 15, 16 and the perpendicular magnetization-type MTJ devices (p-MTJ device) 15, 16 of the semiconductor memory device in FIG. 121 were measured. In this case, the i-MTJ devices 15, 16 are magnetized on the surface perpendicular to the current fed to the MTJ device. The p-MTJ devices 15, 16 are magnetized in the direction of flow of current fed to the MTJ device, or in the reverse direction.

FIG. 27 is a circuit diagram for measuring switching characteristics of i-MTJ and p-MTJ devices 15, 16. The 20-GHz sampling oscilloscope was used to measure the switching. In this case, to switch the MTJ devices 15, 16 from the antiparallel state to the parallel state, the positive voltage pulse is applied to the free layer, and to switch the MTJ devices 15, 16 in reverse direction, the negative voltage pulse is applied.

FIG. 28 shows switching characteristics of the MTJ devices 15, 16, where (a) shows the p-MTJ device, and (b) shows the i-MTJ device.

As shown in FIGS. 28 (a) and (b), the attention was paid to the incubation time ($t_A$) and the transit time ($t_B$). The incubation time ($t_A$) is defined as the period from the startup of the pulse to the start of the switching. The transit time ($t_B$) is defined as the period from the start to the end of the switching.

FIG. 29 shows the dependency of switching characteristics of MTJ devices 15, 16 on write voltage Vp, where (a) shows the dependency of incubation time ($t_A$), and (b) shows that of the transit time ($t_B$).

As shown in FIGS. 29 (a) and (b), $t_A$ of the p-MTJ devices 15, 16 can be made to be shorter than 1 ns for the write voltage (Vp) exceeding 0.9 V, and over the entire Vp, it is shorter than that of i-MTJ devices 15, 16 by more than two order. However, $t_B$ of the p-MTJ devices 15, 16 remains constant at approximately 10 ns, and does not decrease even if Vp increases. Meanwhile, $t_B$ of the i-MTJ remains constant at approximately 1 ns.

As described above, $t_B$ of the 100-nm p-MTJ devices 15, 16 cannot be shorter than 10 ns, meaning that the operating frequency of the p-MTJ devices 15, 16 is limited to 100 MHz. Consequently, to operate the semiconductor memory device 1D at 100 MHz, the technology for interaction between the CMOS integrated circuit and the MTJ devices 15, 16 is necessary.

As shown in FIG. 29 (a), since $t_A$ changes logarithmically with respect to Vp, the setting of this $t_A$ can be achieved by decreasing the write voltage.

However, the operating frequency of the p-MTJ devices 15, 16 is limited to 100 MHz as described above. Furthermore, in order to write the data into the MTJ devices 15, 16 at high speed, the write voltage must also be increased, which increases power consumption significantly. In addition, at high-speed operation, the occurrence of errors also increases.

Next, the operation of the semiconductor memory device 1D of the present invention will be described.

Figure 124:
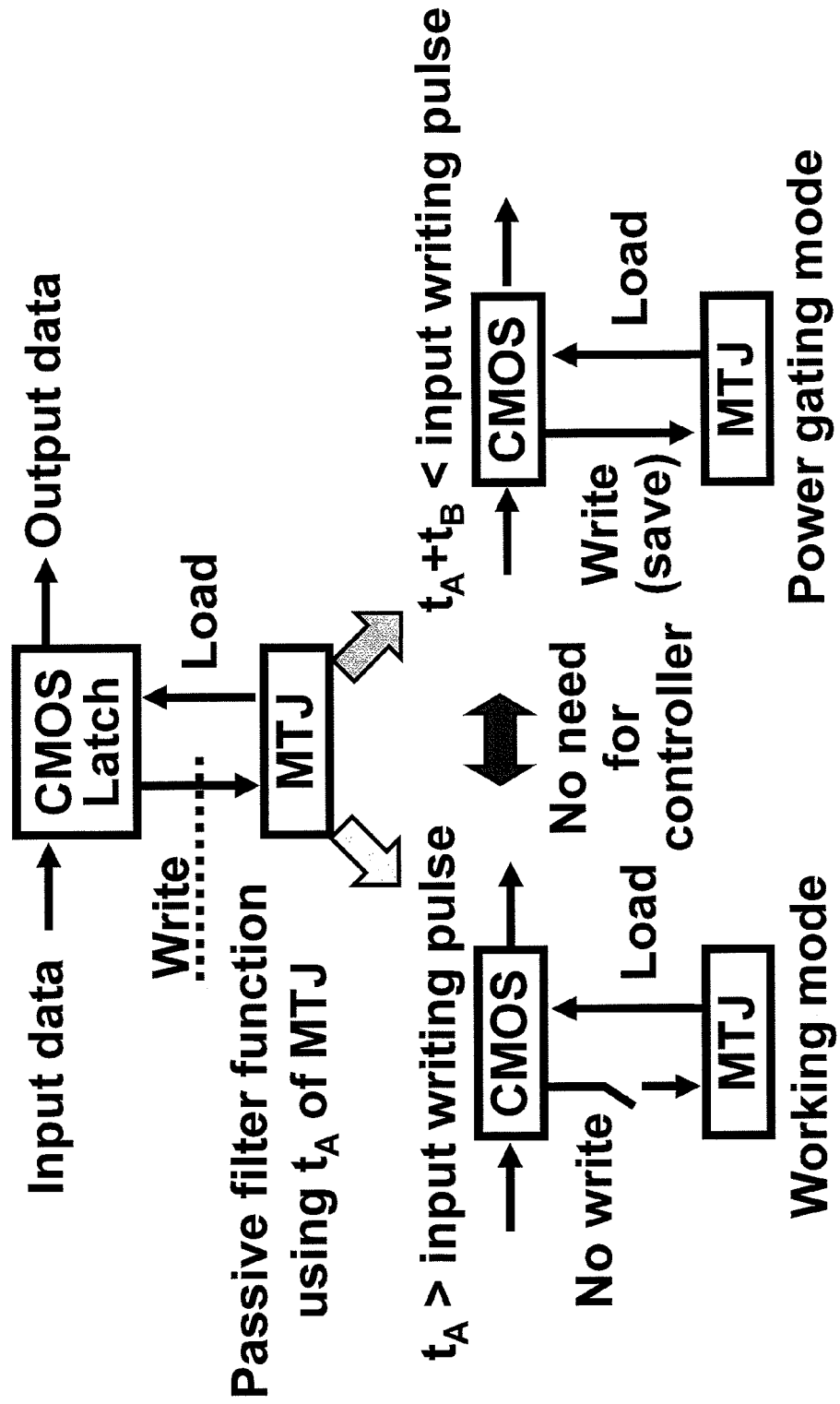

FIG. 19 is a time chart describing the operation of the semiconductor memory device 1D of the present invention, FIG. 124 is a chart schematically showing the operation of the semiconductor memory device 1D of the present invention, FIG. 21 is a chart schematically showing the relation between the operating point of the semiconductor memory device 1D of the present invention and current, and FIG. 22 is a time chart showing the operation mode of the semiconductor memory device 1D of the present invention.

(1) High Frequency (Write and Read Operations where the Write Time is Shorter than the Sum of the Incubation Time and the Transit Time of the MTJ Devices 15, 16)

In the Write cycle as shown in FIG. 19, the complementary data pair, which input into in and inb in the Write cycle, is output to out and outb in the same polarity in the next Read cycle. Further, at high frequency as shown in FIG. 124, since the write time of this case is shorter than the sum of the incubation time and the transit time, data is not written into the MTJ device pair 15, 16.

(2) Low Frequency (Write Operation where the Write Time is Longer than the Sum of the Incubation Time and the Transit Time of the MTJ Device)

This is the case where the Write period is longer than $t_A+t_B$ in FIG. 19. The operation in this case is the same as the above, except that the data is written into MTJ devices 15, 16 in the second operation mode although data is not rewritten into MTJ devices 15, 16 in the first operation mode described above (See FIG. 124 and FIG. 21). Specifically, for example, when the second operation mode is executed while in=the high level and inb=the low level are maintained, the data is written into the right MTJ device 16 in FIG. 19 in parallel state (the low resistance state) and into the left MTJ device 15 in non-parallel state (the high resistance state), respectively.

With the semiconductor memory device 1D of the present invention, the data immediately before $V_{dd}$ is interrupted is saved, namely stored, in the MTJ devices.

(3) Power Off Operation (During the Third Operation Mode)

In this period, no other special operation is necessary except for turning off the power.

(4) Operation at the Time of Turning on the Power (During the Fourth Operation Mode)

In this period, the data is loaded from the MTJ device pair 15, 16 to the CMOS latch circuit.

As shown in FIG. 22, with the semiconductor memory device 1D of the present invention, by allowing $t_A$ to be longer than ½f, two operations can be achieved, namely storing data in the MTJ devices before the power is interrupted, and reloading the data stored in the MTJ devices to the latches 10, 20 in the upper and the lower stages when the power is turned on again.

(Features of the Present Invention)

In order to increase the operating frequency (f) of the upper-stage and lower-stage latches 10, 20 to 100 MHz or higher, the semiconductor memory device 1D of the present invention has a new structure where the low-pass filter function is provided in natural manner between the CMOS integrated circuit and the MTJ devices 15, 16 by using the incubation time of the switching of the MTJ devices 15, 16. As shown in FIG. 124, with the semiconductor memory device 1D, the input data is latched in the CMOS integrated circuit during operation, and the latched data is written into the MTJ devices 15, 16 before the power supply voltage is interrupted. This semiconductor memory device 1D does not require a switching control circuit between the two modes.

It was found that the transit time of the p-MTJ devices 15, 16 for performing the perpendicular magnetic recording is longer than the i-MTJ devices 15, 16 for performing the horizontal magnetic recording. The semiconductor memory device 1D of the present invention operates at high speed without overhead of the operation power, similar to the CMOS integrated circuit, and the switching errors of the MTJ devices 15, 16 can be ignored.

The semiconductor memory device 1D of the present invention has the following excellent characteristics compared to the circuits in the conventional example 1 (See FIG. 133) and the conventional example 2 (See FIG. 134).

(1) It operates at the same operating frequency of the CMOS integrated circuit without being limited by the switching speed of the MTJ devices 15, 16.

(2) It consumes the low power because the high-speed write into the MTJ devices is not performed in the operation synchronized with input data in operation mode (working mode).

(3) Since the write into the MTJ devices 15, 16 before the power interruption is performed at low speed, switching errors of the MTJ devices 15, 16 can be suppressed significantly.

(4) By using the incubation time ($t_A$) of the MTJ devices 15, 16, the simple circuit can be structured without controlling of switching between the working mode and the writing mode before the power interruption where the data is written into the MTJ devices 15, 16. The above features are summarized in Table 1 as shown above.

According to the semiconductor memory device 1D of the present invention, a so-called MTJ/CMOS hybrid integrated circuit, which is operated at the high speed, the low power, negligible errors and the low cost, can be achieved.

(Manufacturing Method)

Next, the manufacturing method of the integrated circuit 1D of the present invention will be described.

First, the circuits other than the MTJ devices 15, 16 of the integrated circuit 1D are formed by the CMOS process on the substrate made of the semiconductor such as Si, and then the spin-injection-type MTJ devices 15, 16 are formed.

Specifically, the spin-injection-type MTJ devices 15, 16 are formed as described below.

After the circuits etc. are formed by the CMOS process, the node C and the node D of the circuits 2, 4 are exposed, then the fixed layers, the tunnel barrier layer, and the free layer, which will become the MTJ devices 15, 16, are formed in this order on the electrode of the node C and that of the node D. The uppermost layers of the MTJ devices 15, 16 are the free layers. The free layer may be formed by depositing a plurality of ferromagnetic layers.

Next, an interconnection insulating layer is deposited on the entire surface of the substrate, and holes are formed on the free layers of the MTJ devices 15, 16 and the node A and the node B of the semiconductor memory device 1D by using the photolithography and the etching of the interconnection insulation layer.

Then, a metal film of the predetermined thickness is deposited on the interconnection insulation layer by the sputtering method, etc. The materials other than the metal film that connects the free layer of the MTJ devices 15, 16 and node A and node B of the semiconductor memory device 1D are removed by selective etching. In this process, the MTJ devices 15, 16 are connected to node A and node B of the integrated circuit 1D.

The above described manufacturing method may be applied to the manufacturing the integrated circuit 1C in FIG. 17 and the integrated circuit 40 in FIG. 30. The circuit can be fabricated by allowing the uppermost layer of the MTJ devices 15, 16 to be the fixed layer, when the uppermost layer of the MTJ devices 15, 16 is a free layer, the circuit can be realized by supplying the power line $V_{dd}$ to the electrode (the fixed layer) on the bottom side of the MTJ devices using the bottom wiring.

Lastly, a protective film (a passivation film) is formed.

The normal thin film deposition methods such as the evaporation method, the MBE method, and the laser abrasion method can be used to deposit each material described above in addition to the sputtering and CVD methods. The optical exposure and the EB exposure can be used for the masking process to form electrodes with specified shapes and wirings of the integrated circuit.

(Fabricated Semiconductor Memory Device and its Characteristics)

The semiconductor memory device 1D of the present invention was fabricated by using the minimum feature size of 90 nm.

Figure 125:
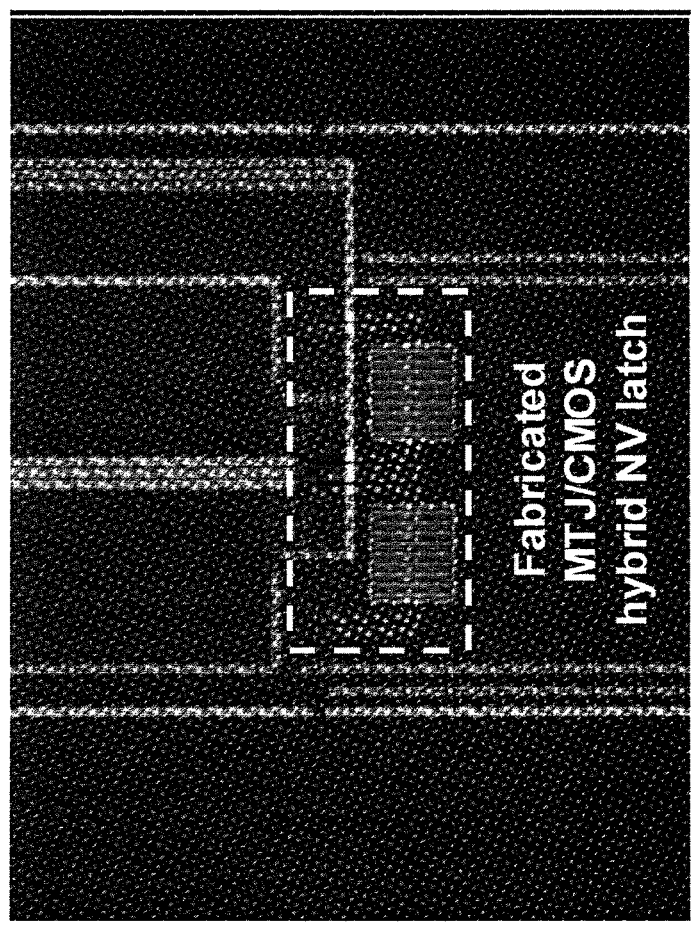

FIG. 125 shows a scanning electron microscopic (SEM) image of the surface of the fabricated semiconductor memory device 1D. As shown in FIG. 125, the MTJ devices 15, 16 are provided in the upper part of the CMOS circuit of the semiconductor memory device 1D.

Figure 126:
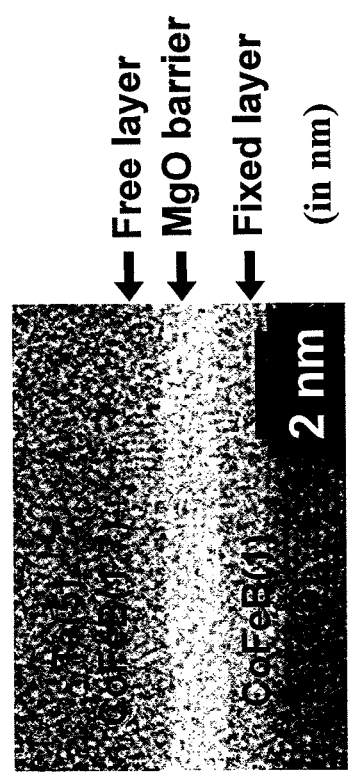

FIG. 126 is a TEM image of the cross section of the p-MTJ device 15. As shown in FIG. 126, in the p-MTJ device 15, Ta (5 nm), Ru (10 nm), CoFeB (0.9 nm), MgO (0.95 nm), CoFeB (1.5 nm), Ta (5 nm), and Ru (5 nm) are deposited in this order. The values in the parentheses represent the thickness of each layer.

Figure 127:
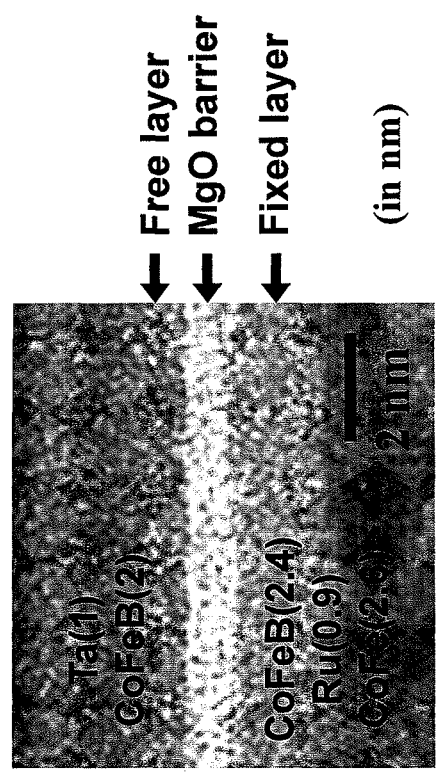

FIG. 127 is a TEM image of the cross section of the i-MTJ device 15. As shown in FIG. 127, in the i-MTJ device 15, Ta (5 nm), Pt—Mn (20 nm), CoFe (2.6 nm), Ru (0.9 nm), CoFeB (2.4 nm), MgO (1.09 nm), CoFeB (1.7 nm), Ta (1 nm), and Ru (7 nm) are deposited in this order from the bottom.

After each layer was deposited, the i-MTJ device 15 and the p-MTJ device 15 were respectively fabricated into 100×200 $nm^2$ and 100 nmφ.

FIG. 128 shows input waveforms obtained by observing the operation of the fabricated semiconductor memory device 1D using the oscilloscope, where (a) shows the case of 30 MHz, and (b) shows the case of 600 MHz. As shown in FIG. 128, by setting the read immediately after the write, the semiconductor memory device 1D operates properly independent of the state of the MTJ devices 15, 16. This is because that in the reading operation, the retained input data can be latched by the upper and the lower latch circuits 10, 20 immediately by the parasitic capacitance in the input node.

As shown in FIG. 128 (a), for the input pattern repeated alternately as (0, 1, 0), the operation at 30 MHz of the nonvolatile (NV) latch of the prototype semiconductor memory device 1D has been succeeded.

In this case, since the MTJ is under the condition $t_A+t_B$<write cycle $(T_W)=\frac{1}{2}f$, the Switching Actually Occurs.

As shown in FIG. 128 (b), with 600 MHz, the MTJ does not operate even if the write voltage (Vp) is applied.

FIG. 129 is a time chart showing the operation observed when the data to be input to the fabricated semiconductor memory device 1D is changed, where (a) shows the case of 30 MHz, and (b) shows the case of 600 MHz.

As shown in FIG. 129, the proper data for the input pattern "1, 1, 1, 1, 1, 1, 1, 0" was observed at 30 MHz and 600 MHz. The data shows that the NV latch of the prototype semiconductor memory device 1D of the present invention operates even if a writing error occurs to the MTJ due to back-hopping phenomenon, etc.

FIG. 130 is a chart showing the dependency on Vp of the latching probability of the prototype semiconductor memory device 1D and the switching probability of the MTJ devices 15, 16.

As shown in FIG. 130, it is obvious that the latching probability of the prototype semiconductor memory device 1D does not degrade even if Vp decreases to 0.3 V. In other words, it does not degrade even if the switching probability of the MTJ devices 15, 16 decrease. In this case, the measured MTJ devices were fabricated on the same wafer according to the same design rule as the MTJ devices 15, 16 embedded in the semiconductor memory device 1D. The probability of the two cases indicates that data is written in repetitive switching experiment of 50 times in write time, namely write pulse, of 17 ns. This write time, 17 ns, indicates that the MTJ device operates at a frequency of 30 MHz.

FIG. 131 shows time charts related to the power supply control of the prototype semiconductor memory device 1D. The left magnified view shows the case where the power is turned off, and the right magnified view shows the case where the power is turned on again. FIG. 131 shows that the latch of the semiconductor memory device 1D performs high-speed power gating operation. The time required to turn off the power is 0.8 µs. The data stored in the MTJ devices 15, 16 was successfully reloaded into the latch circuit in 1.5 µs, the time required for startup.

Based on the results described above, by using the incubation time of switching of the MTJ devices 15, 16, the semiconductor memory device 1D, which integrates CMOS latch and MTJ devices 15, 16, for overcoming limitation of frequency to approximately 100 MHz in this span of 10 ns was achieved. According to the semiconductor memory device 1D of the present invention, it was fabricated by the CMOS process, where the minimum feature size was 90 nm, and by the 100-nm MTJ device process after the CMOS process, and the operation speed of 600 MHz was achieved. This speed, which has never been obtained, is sufficient to achieve synchronization with the operation of CMOS LSI.

Furthermore, the prototype semiconductor memory device 1D exhibited stable operation where the data is stored in the MTJ devices 15, 16 before it is power-gated, and thus switching errors were suppressed significantly.

The present invention is not limited to the examples described above, but various modifications are allowed within the scope of the claims of the present invention. Needless to say, they are all included in the scope of the present invention.

What is claimed is:

1. An integrated circuit, comprising:
a memory element where write into the memory element occurs when specified period τ has elapsed after a write signal is input to the integrated circuit; and
a basic circuit including elementary devices that constitute a circuit, the basic circuit having a data retaining function, wherein an operation frequency $f_1$ in a first operation mode of memory access of the basic circuit satisfies the following relation:

$$\tau > \lambda_1/f_1 (0 < \lambda_1 \leq 1)$$

wherein $\lambda_1$ represents the ratio of time when write into the basic circuit is being performed in a cycle of the first operation mode $(1/f_1)$ of memory access of the basic circuit.

2. The integrated circuit as set forth in claim 1, wherein the memory element has a second operation mode having a frequency $f_2$ that satisfies the relation $\tau < \lambda_2/f_2 (0 < \lambda_2 \leq 1)$,
wherein $\lambda_2$ represents the ratio of time when write into the memory element is being performed in a cycle of the second operation mode $(1/f_2)$ of memory access of the basic circuit.

3. The integrated circuit as set forth in claim 2, further comprising:
a control circuit,
wherein operation frequency $f_1$ in the first operation mode during memory access of the basic circuit satisfies the relation $\tau > \lambda_1/f_1$, and
the second operation mode having frequency $f_2$ that satisfies the relation $\tau < \lambda_2/f_2$ is started by inputting a signal for giving recognition that power supply voltage is to be interrupted into the control circuit.

4. The integrated circuit as set forth in claim 3, wherein a circuit configuration of the basic circuit is not changed by the signal for starting the second operation mode.

5. The integrated circuit as set forth in claim 2, wherein a third operation mode where the power is turned off and a fourth operation mode where the power is turned on are provided, and in the fourth operation mode, data stored in the memory element during the second operation mode is read out into the basic circuit and retained.

6. The integrated circuit as set forth in claim 5, wherein the second operation mode is executed before the third operation mode.

7. The integrated circuit as set forth in claim 3, wherein the second operation mode is started when a decrease in a power supply voltage to below a predetermined value is detected.

8. The integrated circuit as set forth in claim 3, wherein the signal for the interrupting of the power supply voltage is generated when the decrease in the power supply voltage to below a predetermined value is detected.

9. The integrated circuit as set forth in claim 1, wherein the integrated circuit is divided into a plurality of blocks, a power supply voltage exclusive for each block is supplied, and an operation mode for each block is controlled independently.

10. A system integrated circuit comprising:
the integrated circuit or a plurality of the integrated circuits as set for in claim 1, wherein the memory element includes a nonvolatile memory element for storing the data of the basic circuit, and a plurality of instructions for operating the system integrated circuits are stored in the nonvolatile memory element, these instructions including instructions for turning off and turning on the power for each integrated circuit.

11. A system integrated circuit comprising:
the integrated circuit or a plurality of the integrated circuits as set for in claim 5, wherein the memory element includes a nonvolatile memory element for storing the data of the basic circuit, and
by detecting that each of the integrated circuits does not perform memory access for a certain period, the second operation mode for turning off the power of the integrated circuit is executed, and when an instruction for executing memory access of the integrated circuit whose power is currently off is issued, the fourth operation mode is executed.

12. The integrated circuit as set forth in claim 5,
wherein by detecting that the voltage of the power supply has decreased to below a predetermined value, a signal for interrupting the power is generated.

13. A system integrated circuit comprising:
the integrated circuit or a plurality of the integrated circuits as set forth in claim 1,
wherein the memory element includes a nonvolatile memory element for storing the data of the basic circuit, and
each of the plurality of circuit blocks within a chip has a memory storing a plurality of instructions including an instruction for turning off the power and an instruction for turning on the power, and a function of controlling the supply of power by each block.

14. A system integrated circuit comprising:
the integrated circuit or a plurality of the integrated circuits as set forth in claim 9,
wherein the memory element includes a nonvolatile memory element for storing the data of the basic circuit, and
each of the plurality of circuit blocks within a chip has a function of controlling the supply of power, and by detecting that each of the blocks does not perform memory access for longer than a certain period, the second operation mode for turning off the power for that block is executed, and when an instruction for executing memory access of the block whose power remains off is issued, the fourth operation mode is executed.

15. A system integrated circuit comprising:
the integrated circuit or a plurality of the integrated circuits as set forth in claim 5,
wherein the memory element includes a nonvolatile memory element for storing the data of the basic circuit, and
by detecting that the power has decreased to below a predetermined value, the second operation mode for turning off the power for the integrated circuit is executed, and when an instruction for executing memory access of the integrated circuit whose power is currently off is issued, the fourth operation mode is executed.

16. The integrated circuit as set forth in claim 1,
wherein the memory element is a resistance random access memory.

17. The integrated circuit as set forth in claim 1,
wherein the memory element is a spin-injection-type MTJ device.

18. The integrated circuit as set forth in claim 17,
wherein the magnetization direction of the spin-injection-type MTJ device is mostly the direction of the plane on which the integrated circuit is formed.

19. The integrated circuit as set forth in claim 17,
wherein the magnetization direction of the spin-injection-type MTJ device is the direction mostly perpendicular to the plane on which the integrated circuit is formed.

20. The integrated circuit as set forth in claim 1,
wherein the memory element is a phase-change-type memory element.

21. The integrated circuit as set forth in claim 2, further comprising:
a control circuit,
wherein the first operation mode, the second operation mode, a third operation mode where a power is turned off, and a fourth operation mode where the power is turned on are provided,
the basic circuit includes a latch or a flip-flop,
the memory element includes a spin-injection-type MTJ device,
wherein the control circuit prevents a through-current from flowing into the spin-injection-type MTJ device in the first operation mode, and
wherein the control circuit executes the second operation mode by outputting a clock having frequency $f_2$ before the third operation mode to interrupt the power supply voltage, thereby flowing current to the spin-injection-type MTJ device to rewrite.

22. The integrated circuit as set forth in claim 2, further comprising:
a control circuit,
wherein the first operation mode, the second operation mode, a third operation mode where a power is turned off, and a fourth operation mode where the power is turned on are provided,
the basic circuit includes a latch or a flip-flop,
the memory element includes a spin-injection-type MTJ device,
wherein the control circuit and the basic circuit are connected by a data line, which inputs an input data output from the control circuit,
wherein the control circuit executes the second operation mode by inputting a SAVE signal before the third operation mode to interrupt the power supply.

23. A semiconductor memory device, comprising:
a first latch;
a second latch;
a first spin-injection-type MTJ device connected to the first latch and the second latch, the first spin-injection-type MTJ device being provided between the first latch and the second latch; and
a second spin-injection-type MTJ device connected to the first latch and the second latch, the second spin-injection-type MTJ device being provided between the first latch and the second latch,
wherein the semiconductor memory device has a first operation mode, wherein data is written to the first and/or second latch at a first operation frequency, and the first and second spin-injection-type MTJ devices are not written at the first operation frequency, and has a second operation mode, wherein the spin-injection-type MTJ devices are written at an operation frequency lower than the first operation frequency.

24. The semiconductor memory device as set forth in claim 23, wherein a third operation mode where the power is turned off and a fourth operation mode where the power is turned on are provided, and in the fourth operation mode, data stored in the spin-injection-type MTJ device is read into the first latch and/or the second latch and retained.

25. The semiconductor memory device as set forth in claim 23,
   wherein the spin-injection-type MTJ device is an in-plane magnetization-type MTJ device.

26. The semiconductor memory device as set forth in claim 23,
   wherein the spin-injection-type MTJ device is a perpendicular magnetization-type MTJ device.

* * * * *